US012621964B2

(12) United States Patent
Rodriguez et al.

(10) Patent No.: US 12,621,964 B2
(45) Date of Patent: May 5, 2026

(54) INTERCHANGEABLE COOLANT-CALIBRATED IN-RACK COOLANT DISTRIBUTION UNITS IN DATACENTER COOLING SYSTEMS

(71) Applicant: Nvidia Corporation, Santa Clara, CA (US)

(72) Inventors: Jeremy Rodriguez, Santa Cruz, CA (US); Ali Heydari, Albany, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1121 days.

(21) Appl. No.: 17/568,274

(22) Filed: Jan. 4, 2022

(65) Prior Publication Data

US 2023/0217632 A1 Jul. 6, 2023

(51) Int. Cl.
*H05K 7/20* (2006.01)

(52) U.S. Cl.
CPC ..... *H05K 7/20836* (2013.01); *H05K 7/20272* (2013.01); *H05K 7/20818* (2013.01)

(58) Field of Classification Search
CPC ........... H05K 7/20836; H05K 7/20272; H05K 7/20818; H05K 7/20709; H05K 7/20536; H05K 7/2029; H05K 7/20
See application file for complete search history.

(56) References Cited

U.S. PATENT DOCUMENTS

| | | | | |
|---|---|---|---|---|
| 5,970,731 A * | 10/1999 | Hare | .................. | H05K 7/20354 62/196.4 |
| 2007/0167125 A1* | 7/2007 | Rasmussen | .......... | H05K 7/2079 454/184 |
| 2014/0102672 A1* | 4/2014 | Campbell | .......... | H05K 7/20836 165/104.19 |
| 2021/0267095 A1 | 8/2021 | Heydari | | |
| 2021/0378150 A1 | 12/2021 | Heydari | | |

OTHER PUBLICATIONS

Shao, Wei, et al. "Operation optimization of liquid cooling systems in data centers by the heat current method and artificial neural network." Journal of Thermal Science 29 (2020): 1063-1075. (Year: 2020).*
International Search Report and Written Opinion for International Application No. PCT/US2023/010084, mailed Apr. 18, 2023, 13 Pages.

* cited by examiner

*Primary Examiner* — Robert J Eom
(74) *Attorney, Agent, or Firm* — Lowenstien Sandler LLP

(57) ABSTRACT

Systems and methods for cooling a datacenter are disclosed. In at least one embodiment, a plurality of in-rack coolant distribution units (IRCDUs) include a first IRCDU and a second IRCDU that are interchangeable within a rack depending on a type of coolant to be provided to a rack from a coolant distribution unit (CDU), so that a first IRCDU that is calibrated to a first coolant can distribute a first coolant and a second IRCDU that is calibrated to a second coolant can distribute a second coolant to a rack manifold of a rack.

11 Claims, 48 Drawing Sheets

DATA CENTER
800

COMPUTER
SYSTEM
1200

USB STICK 1220

PROCESSING
UNIT
1230

615

USB
INTERFACE
LOGIC 1250

USB
INTERFACE
1240

COMPUTER
1210

GRAPHICS
PROCESSOR
1510

VERTEX PROCESSOR
1505

615

FRAGMENT
PROCESSOR
1515A

615

FRAGMENT
PROCESSOR
1515C

615

FRAGMENT
PROCESSOR
1515N-1

615

FRAGMENT
PROCESSOR
1515B

615

FRAGMENT
PROCESSOR
1515D

615

FRAGMENT
PROCESSOR
1515N

615

MMU
1520A

MMU
1520B

CACHE
1525A

CACHE
1525B

INTERCONNECT
1530A

INTERCONNECT
1530B

GRAPHICS
PROCESSOR
1540

INTER-CORE TASK MANAGER
(e.g., THREAD DISPATCHER)
1545

| SHADER CORE 1555A | SHADER CORE 1555C | SHADER CORE 1555E | SHADER CORE 1555N-1 |
|---|---|---|---|
| 615 | 615 | 615 | 615 |

| SHADER CORE 1555B | SHADER CORE 1555D | SHADER CORE 1555F | SHADER CORE 1555N |
|---|---|---|---|
| 615 | 615 | 615 | 615 |

TILING UNIT 1558

| MMU 1520A | MMU 1520B |
|---|---|
| CACHE 1525A | CACHE 1525B |
| INTERCONNECT 1530A | INTERCONNECT 1530B |

GRAPHICS CORE
1600

FROM PIPELINE MANAGER 1832

1900

P2P GPU
LINKS
1919

GPGPU
1906A
615

GPGPU
1906B
615

GPGPU
1906C
615

GPGPU
1906D
615

HOST INTERFACE SWITCH
1904

PROCESSOR
1902
615

To/From XBar

General Processing
Cluster (GPC) 3100

Pipeline Manager
3102

PRE-ROP
3104

MPC
3110

Primitive
Engine
3112

SM
3114

615

Raster Engine
3108

DPC(V)
3106

WDX
3116

MMU 3118

To/From XBar

To/From Xbar

INTERCHANGEABLE COOLANT-CALIBRATED IN-RACK COOLANT DISTRIBUTION UNITS IN DATACENTER COOLING SYSTEMS

FIELD

At least one embodiment pertains to cooling systems, including systems and methods for operating those cooling systems. In at least one embodiment, such a cooling system can be utilized in a datacenter containing one or more racks or computing servers.

BACKGROUND

Datacenter cooling systems use fans to circulate air through server components. Certain supercomputers or other high capacity computers may use water or other cooling systems instead of air-cooling systems to draw heat away from the server components or racks of the datacenter to an area external to the datacenter. The cooling systems may include a chiller within the datacenter area, which may include area external to the datacenter itself. Further, the area external to the datacenter may include a cooling tower or other external heat exchanger that receives heated coolant from the datacenter and that disperses the heat by forced air or other means to the environment (or an external cooling medium). The cooled coolant is recirculated back into the datacenter. The chiller and the cooling tower together form a chilling facility.

DETAILED DESCRIPTION

Figure 1:
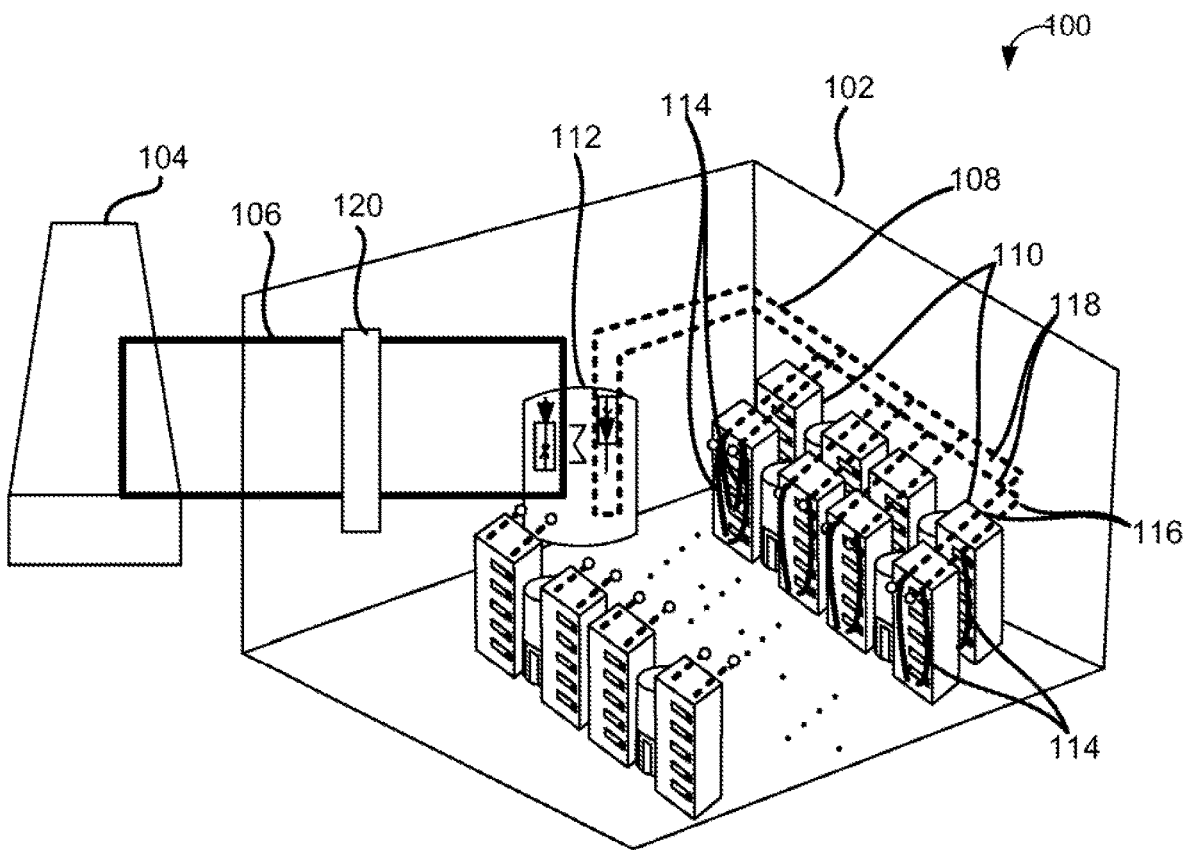
FIG. 1 illustrates an exemplary datacenter cooling system subject to improvements described in at least one embodiment.

In at least one embodiment, an exemplary datacenter 100 can be utilized as illustrated in FIG. 1, which has a cooling system subject to improvements described herein. In at least one embodiment, numerous specific details are set forth to provide a thorough understanding, but concepts herein may be practiced without one or more of these specific details. In at least one embodiment, datacenter cooling systems can respond to sudden high heat requirements caused by changing computing-loads in present day computing components. In at least one embodiment, as these requirements are subject to change or tend to range from a minimum to a maximum of different cooling requirements, these requirements must be met in an economical manner, using an appropriate cooling system. In at least one embodiment, for moderate to high cooling requirements, liquid cooling system may be used. In at least one embodiment, high cooling requirements are economically satisfied by localized immersion cooling. In at least one embodiment, these different cooling requirements also reflect different heat features of a datacenter. In at least one embodiment, heat generated from these components, servers, and racks are cumulatively referred to as a heat feature or a cooling requirement as cooling requirement must address a heat feature entirely.

In at least one embodiment, a datacenter liquid cooling system is disclosed. In at least one embodiment, this datacenter cooling system addresses heat features in associated computing or datacenter devices, such as in graphics processing units (GPUs), in switches, in dual inline memory module (DIMMs), or central processing units (CPUs). In at least one embodiment, these components may be referred to herein as high heat density computing components. Furthermore, in at least one embodiment, an associated computing or datacenter device may be a processing card having one or more GPUs, switches, or CPUs thereon. In at least one embodiment, each of GPUs, switches, and CPUs may be a heat generating feature of a computing device. In at least one embodiment, a GPU, a CPU, or a switch may have one or more cores, and each core may be a heat generating feature.

In at least one embodiment, interchangeable coolant-calibrated in-rack coolant distribution units (IRCDUs) in datacenter cooling systems is disclosed. In at least one embodiment, such IRCDUs include at least a first IRCDU and a second IRCDU that are interchangeable with respect to a rack and that can distribute a first coolant or a second coolant, respectively, to a rack depending on a type of coolant to be provided to a rack from a coolant distribution unit (CDU) of a datacenter cooling system. In at least one embodiment, a first IRCDU has first sensors and first ingredient canisters calibrated to a first coolant and a second IRCDU has second sensors and second ingredient canisters calibrated to a second coolant. In at least one embodiment, as each coolant type may have different physical and chemical properties, such IRCDUs allow end-users to easily adapt racks to specific types of coolant already provided from a CDU without installing or calibrating sensors, plumbing, and other features to requirements of a coolant existing in a datacenter cooling system.

In at least one embodiment, such IRCDUs can address issues where, depending on a type of coolant (such as PG25, PG33, deionized water (DI water), or other coolants), sensors and other features were required to enable such coolants to be used with specific manufacture-rated cold plates or components. In at least one embodiment, such manufacture-rated cold plates or components may dictate properties, including temperatures ranges addressable, of a coolant supported. In at least one embodiment, such IRCDUs can address issues that are specific to physical and chemical properties of each type of coolant. In at least one embodiment, IRCDUs are interchangeable in a rack to address physical and chemical changes of different types of coolant that could not be addressed otherwise till a CDU is taken offline.

In at least one embodiment, IRCDUs are interchangeably installed within a rack to receive coolant from a CDU. In at least one embodiment, individual ones of such IRCDUs can address induvial ones of different types of coolant provided from a CDU to a rack. In at least one embodiment, each IRCDU is a modular component, such as in a form-factor of a 1U-3U server tray or box, that is interchangeable within a rack with other IRCDUs and that include therein coolant components calibrated to a specific known coolant. In at least one embodiment, such a modular component may include sensors, plumbing, and ingredient canisters that are all calibrated to a single type of coolant. In at least one embodiment, if a specific coolant is used in a CDU, a specific IRCDU calibrated to such a specific coolant may be used to receive a coolant from a CDU and distribute it from an IRCDU. In at least one embodiment, this enables a specific IRCDU to adjust physical or chemical properties of a specific coolant using specific coolant components because it can include ingredient canisters within it to provide such coolant ingredients to adjust physical or chemical properties of a coolant flow.

In at least one embodiment, each ingredient canister may be provided with a coolant ingredient. In at least one embodiment, such a coolant ingredient may be propylene glycol, ethylene glycol, a corrosion inhibitor, demineralized water, and distilled water. In at least one embodiment, specific concentrations of each of at least propylene glycol, ethylene glycol, and a corrosion inhibitor may be provided in each ingredient canister so that such specific concentrations are calibrated to a specific coolant. In at least one embodiment, such specific concentrations can be used to adjust a specific coolant when a pH property change is sensed or determined of a specific coolant. In at least one embodiment, other changes that may be sensed or determined and addressed by specific coolant ingredients include, a composition of coolant components already within a coolant flow, a viscosity of such a specific coolant, a specific heat, a specific gravity, a reserve alkalinity, a freezing point, a boiling point, and a density. In at least one embodiment, these changes are physical and chemical property changes that may be addressed by a coolant ingredient dispensed from specific ingredient canisters.

In at least one embodiment, such IRCDUs in a datacenter cooling systems can therefore include at least a first IRCDU and a second IRCDU that are interchangeable and that can distribute a first coolant or a second coolant, respectively, to a rack depending on a type of coolant to be provided to such a rack from a coolant distribution unit (CDU). In at least one embodiment, PG25 is a coolant provided from a CDU, where such a coolant is a combination of at least propylene glycol at 25% weight concentration with demineralized water or distilled water forming a remaining part of such a coolant. In at least one embodiment, a pH property of such a coolant may be a neutral or close to neutral pH, but if it is sensed that pH change has occurred, demineralized water or distilled water from a ingredient canister may be provided to adjust a pH property of such a coolant. In at least one embodiment, if a coolant is based in part on ethylene glycol, then ingredient canisters may also include ethylene glycol at a same or a higher concentration, along with other coolant ingredients, such a demineralized water and distilled water to address adjustments required.

In at least one embodiment, therefore, an IRCDU may be specific to propylene glycol or to ethylene glycol, but may other coolants may also require specific IRCDUs having specific coolant components therein, including ingredient canisters and sensors that are calibrated to such specific coolants. In at least one embodiment, sensors, such as a pH sensor may be calibrated to each specific coolant and so an IRCDU may be installed in a rack in a plug-and-play manner with coolant components calibrated to a coolant from a CDU, so that it can receive such coolant and provide such coolant from within an IRCDU with any adjustments to be made from a ingredient canister depending on sensed or determined physical or chemical property changes.

In at least one embodiment, therefore, a first IRCDU has first sensors and first ingredient canisters calibrated to a first coolant and a second IRCDU has second sensors and second ingredient canisters calibrated to a second coolant. In at least one embodiment, as each coolant type has different physical and chemical properties, such IRCDUs allow end-users to easily adapt racks to specific types of coolant already provided from a CDU without installing or calibrating coolant components, including sensors, plumbing, and other features to specific requirements of specific coolants.

In at least one embodiment, an exemplary datacenter 100 can be utilized as illustrated in FIG. 1, which has a cooling system subject to improvements described herein. In at least one embodiment, a datacenter 100 may be one or more rooms 102 having racks 110 and auxiliary equipment to house one or more servers on one or more server trays. In at least one embodiment, a datacenter 100 is supported by a cooling tower 104 located external to a datacenter 100. In at least one embodiment, a cooling tower 104 dissipates heat from within a datacenter 100 by acting on a primary cooling loop 106. In at least one embodiment, a cooling distribution unit (CDU) 112 is used between a primary cooling loop 106 and a second or secondary cooling loop 108 to enable extraction of heat from a second or secondary cooling loop 108 to a primary cooling loop 106. In at least one embodiment, a secondary cooling loop 108 can access various plumbing into a server tray as required, in an aspect. In at least one embodiment, loops 106, 108 are illustrated as line drawings, but a person of ordinary skill would recognize that one or more plumbing features may be used. In at least one embodiment, flexible polyvinyl chloride (PVC) pipes may be used along with associated plumbing to move fluid along in each provided loop 106; 108. In at least one embodiment, one or more coolant pumps may be used to maintain pressure differences within coolant loops 106, 108 to enable movement of coolant according to temperature sensors in various locations, including in a room, in one or more racks 110, and/or in server boxes or server trays within one or more racks 110.

In at least one embodiment, coolant in a primary cooling loop 106 and in a secondary cooling loop 108 may be at least water and an additive. In at least one embodiment, an additive may be glycol or propylene glycol. In operation, in at least one embodiment, each of a primary and a secondary cooling loops may have their own coolant. In at least one embodiment, coolant in secondary cooling loops may be proprietary to requirements of components in a server tray or in associated racks 110. In at least one embodiment, a CDU 112 is capable of sophisticated control of coolants, independently or concurrently, within provided coolant loops 106, 108. In at least one embodiment, a CDU may be adapted to control flow rate of coolant so that coolant is appropriately distributed to extract heat generated within associated racks 110. In at least one embodiment, more flexible tubing 114 is provided from a secondary cooling loop 108 to enter each server tray to provide coolant to electrical and/or computing components therein.

In at least one embodiment, tubing 118 that forms part of a secondary cooling loop 108 may be referred to as room manifolds. Separately, in at least one embodiment, further tubing 116 may extend from row manifold tubing 118 and may also be part of a secondary cooling loop 108 but may be referred to as row manifolds. In at least one embodiment, coolant tubing 114 enters racks as part of a secondary cooling loop 108 but may be referred to as rack cooling manifold within one or more racks. In at least one embodiment, row manifolds 116 extend to all racks along a row in a datacenter 100. In at least one embodiment, plumbing of a secondary cooling loop 108, including coolant manifolds 118, 116, and 114 may be improved by at least one embodiment herein. In at least one embodiment, a chiller 120 may be provided in a primary cooling loop within datacenter 102 to support cooling before a cooling tower. In at least one embodiment, additional cooling loops that may exist in a primary control loop and that provide cooling external to a rack and external to a secondary cooling loop, may be taken together with a primary cooling loop and is distinct from a secondary cooling loop, for this disclosure.

In at least one embodiment, in operation, heat generated within server trays of provided racks 110 may be transferred to a coolant exiting one or more racks 110 via flexible tubing of a row manifold 114 of a second cooling loop 108. In at least one embodiment, second coolant (in a secondary cooling loop 108) from a CDU 112, for cooling provided racks 110, moves towards one or more racks 110 via provided tubing. In at least one embodiment, second coolant from a CDU 112 passes from on one side of a room manifold having tubing 118, to one side of a rack 110 via a row manifold 116, and through one side of a server tray via different tubing 114. In at least one embodiment, spent or returned second coolant (or exiting second coolant carrying heat from computing components) exits out of another side of a server tray (such as enter left side of a rack and exits right side of a rack for a server tray after looping through a server tray or through components on a server tray). In at least one embodiment, spent second coolant that exits a server tray or a rack 110 comes out of different side (such as exiting side) of tubing 114 and moves to a parallel, but also exiting side of a row manifold 116. In at least one embodiment, from a row manifold 116, spent second coolant moves in a parallel portion of a room manifold 118 and is going in an opposite direction than incoming second coolant (which may also be renewed second coolant), and towards a CDU 112.

In at least one embodiment, spent second coolant exchanges its heat with a primary coolant in a primary cooling loop 106 via a CDU 112. In at least one embodiment, spent second coolant may be renewed (such as relatively cooled when compared to a temperature at a spent second coolant stage) and ready to be cycled back to through a second cooling loop 108 to one or more computing components. In at least one embodiment, various flow and temperature control features in a CDU 112 enable control of heat exchanged from spent second coolant or flow of second coolant in and out of a CDU 112. In at least one embodiment, a CDU 112 may be also able to control a flow of primary coolant in primary cooling loop 106.

Figure 2:
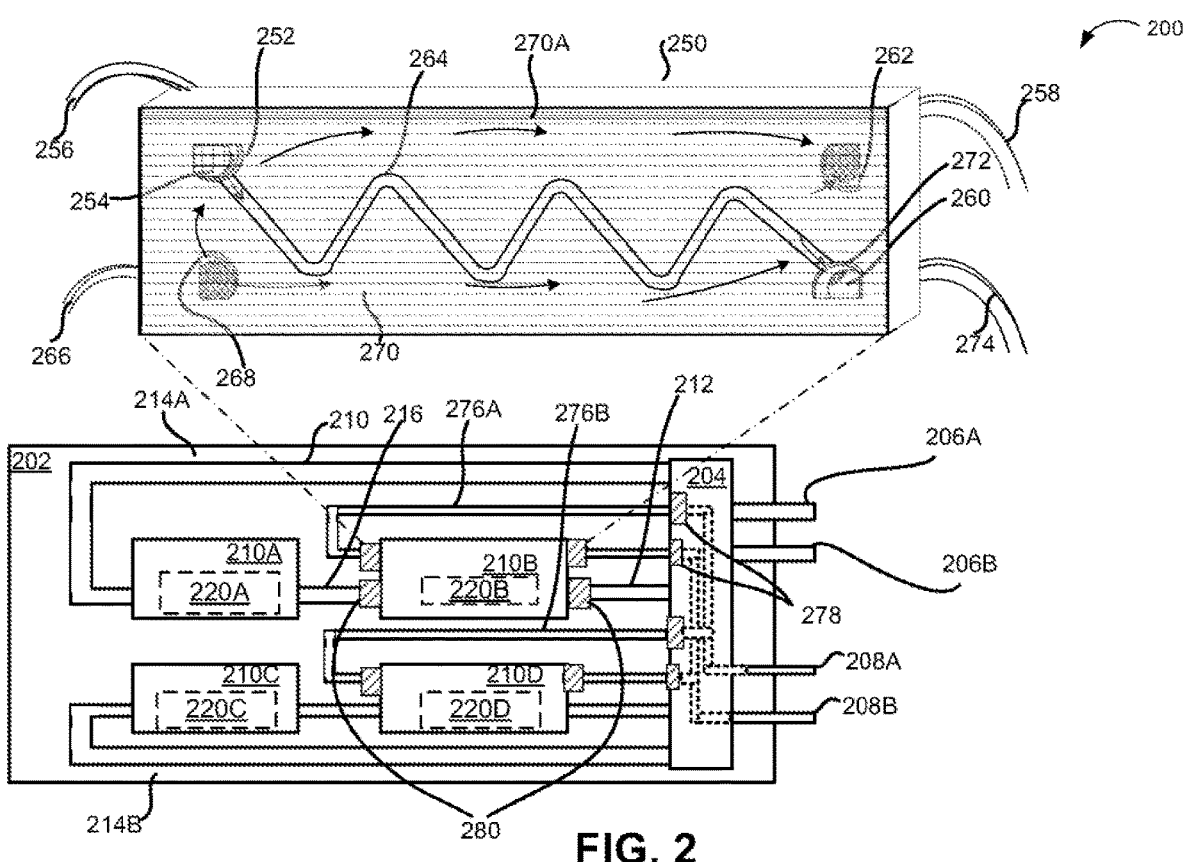
FIG. 2 illustrates server-level features associated with interchangeable coolant-calibrated in-rack coolant distribution units for a datacenter cooling system, according to at least one embodiment.

In at least one embodiment, server-level features 200 as illustrated in FIG. 2 can be associated with interchangeable coolant-calibrated in-rack coolant distribution units (IRCDUs). In at least one embodiment, server-level features 200 include a server tray or box 202. In at least one embodiment, a server tray or box 202 includes a server manifold 204 to be intermediately coupled between provided cold plates 210A-D of a server tray or box 202 and rack manifolds of a rack hosting a server tray or box 202. In at least one embodiment, a server tray or box 202 includes one or more cold plates 210A-D associated with one or more computing or datacenter components or devices 220A-D. In at least one embodiment, one or more cold plates 210A-D may be used for plates having capability to support two different types of coolants via provisions, such as first tubes 270B or using fins or second tubes 270A, where such features enable distinct coolant flows without mixing different coolants.

In at least one embodiment, one or more server-level cooling loops 214A, B may be provided between a server manifold 204 and one or more colds plates 210A-D for dual coolant cold plates. In at least one embodiment, each server-level cooling loop 214A; B includes an inlet line 210 and an outlet line 212. In at least one embodiment, when there are series configured cold plates 210A, B, an intermediate line 216 may be provided. In at least one embodiment, for interchangeable coolant-calibrated IRCDUs, different paths, via provided lines 276A, may be established between channels (illustrated as broken lines) within a dual coolant manifold 204 adapted to pass a first coolant through different provided lines 206A, B and a second coolant through provided lines 208A, B associated with such provided channels.

In at least one embodiment, one or more cold plates 210A-D may only support a singular coolant and may use singular features of fins or tubes to allow coolant to flow there through. In at least one embodiment, one or more cold plates 210A-D, when adapted for dual coolant, may support distinct ports and channels for a secondary coolant of a secondary cooling loop associated with an IRCDU and a CDU and for a local coolant circulated from a local coolant source that may or may not circulate through an IRCDU. In at least one embodiment, fluid, such as secondary coolant, for cooling may be provided to a server manifold 204 via provided inlet and outlets 206A, 206B. In at least one embodiment, local coolant for cooling may be provided to a server manifold 204 via provided inlet and outlets 208A, 208B. In at least one embodiment, all such manifolds, lines, or loops may be terminated using flow controllers having mechanical coupling and electrical coupling features. In at least one embodiment, electrical coupling features enable at least one processor to control aspects of interchangeable coolant-calibrated in-rack coolant distribution units, including for one or more flow controllers associated therewith.

In at least one embodiment, a server tray 202 is an immersive-cooled server tray that may be flooded by fluid. In at least one embodiment, a fluid for an immersive-cooled server tray may be a dielectric engineered fluid capable of being used in an immersive-cooled server. In at least one embodiment, a secondary coolant or local coolant may be used to cool engineered fluid. In at least one embodiment, a local coolant may be used to cool engineered fluid when a primary cooling loop associated with a secondary cooling loop circulating a secondary coolant has failed or is failing. In at least one embodiment, at least one cold plate therefore has ports for a secondary cooling loop and for interchangeable coolant-calibrated in-rack coolant distribution units and can support a secondary coolant that is activated in an event of a failure in a primary cooling loop. In at least one embodiment, multiple IRCDUs may be installed in a rack to enable a switch from a secondary coolant to a local coolant, which each coolant being of a different type.

In at least one embodiment, at least one dual cooling cold plate 210B; 250 may be configured to work alongside regular cold plates 210A, C, D. In at least one embodiment, a three-dimensional (3D) blow-up illustration (cold plate 250) provides internal detail of at least some features that may be included in a dual cooling cold plate or a regular cold plate. In at least one embodiment, a tear-through of a cold plate 250 illustrates microchannels 270, 270A. In at least one embodiment, distinct second section may be provided side-by-side and having a set of tubing 264. In at least one embodiment, a local coolant-enabled cold plate may have one set of tubing 264 and no microchannels 270, 270A therein or may have only such microchannels 270, 270A and no tubing 264 therein.

In at least one embodiment, a dual cooling cold plate 250 has distinct paths 264, 270 for secondary coolant of a secondary cooling loop and for local coolant from a local cooling source, both interfacing through interchangeable coolant-calibrated IRCDUs. In at least one embodiment, in a use case of an immersive-cooled server, fluid that may be a dielectric engineered fluid may be adapted for both, a cold plate application and an immersive-cooled server tray application. In at least one embodiment, some microchannels 270 are paths provided by fins 270A or other such aspects that raise internally and perpendicularly to a base of a cold plate section, and that have gaps therebetween for coolant or fluid flow. In at least one embodiment, some microchannels 270, 270A are fluid pathways in a different cold plate section of a cold plate 250.

In at least one embodiment, reference to a cold plate, along with its dual cooling features, may imply a reference to a cold plate that can support at least two types of cooling loops, unless otherwise stated. In at least one embodiment, both types of colds plates receive at least secondary coolant for cooling, but one type can support both, a secondary cooling loop or a local cooling loop, along with interchangeable coolant-calibrated IRCDUs providing plug-and-play installation capability for a rack to support any type of coolant. In at least one embodiment, a standard coolant, such as facility water may be used in a secondary cooling loop.

In at least one embodiment, a fluid, such as secondary coolant or local coolant may only support cold plate usage and may not be available for immersive cooling. In at least one embodiment, each type of cold plate receives coolant from interchangeable coolant-calibrated IRCDUs that may be calibrated to different secondary or local coolant from respective local cooling loops or other cooling loops interfacing with a primary cooling loop. In at least one embodiment, in situations where different fluids (such as secondary coolants and local coolants) are used in a datacenter cooling system, then a secondary or local cooling loop may be suited for a dual cooling cold plate, along with interchangeable coolant-calibrated IRCDUs, so that different channels may be used for each of a local coolant and for different secondary or local coolants.

In at least one embodiment, a dual cooling cold plate 250 is adapted to receive a two types of fluids (such as a secondary coolant and a local coolant) and to keep two types of fluids distinct from each other via their distinct ports 252, 272; 268, 262 and their distinct paths 264, 270, such as by distinct sections separated by gaskets and plates (such as in a gasket type cold plate). In at least one embodiment, fluid lines 256, 258, 266, 274 are associated with such ports 225, 262, 268, 272, via respective flow controllers. In at least one embodiment, each distinct path is a cooling path. In at least one embodiment, fluid (such as a local coolant) from a local coolant source and a secondary coolant may be provided simultaneously to address additional cooling requirements. In at least one embodiment, distinct ports and paths may support different sources that may be provided to address a higher cooling requirement from an associated computing device.

In at least one embodiment, a dual-cooling cold plate 250 includes ports 252, 272 to receive local coolant into a cold plate 250, to enable such local coolant to pass through a set of tubes 264, and to enable such local coolant to pass out of a cold plate 250. In at least one embodiment, a dual-cooling cold plate 250 includes ports 268, 262 to receive a secondary or local coolant into a cold plate 250 and to pass a local or secondary coolant out of a cold plate 250. In at least one embodiment, ports 252, 272 may have valve covers 254, 260 that may be directional, and pressure controlled to enable flow of local coolant or local coolant through a cold plate 250.

In at least one embodiment, such valve covers may be controlled in a manner to allow to a determined flow rate or flow volume of coolant there through. In at least one embodiment, opening of such valve covers enables sufficient liquid flow through a valve part of a flow controller and into a set of tubes or microchannels of a cold plate. In at least one embodiment, valve covers may be associated with all provided ports of a cold plate. In at least one embodiment, provided valve covers 254, 260 are mechanical features of associated flow controllers that also have corresponding electronic features (such as at least one processor to execute instructions stored in associated memory and to control mechanical features for associated flow controllers).

In at least one embodiment, each valve may be actuated by an electronic feature of an associated flow controller. In at least one embodiment, electronic and mechanical features of provided flow controllers are integrated. In at least one embodiment, electronic and mechanical features of provided flow controllers are physically distinct. In at least one embodiment, reference to flow controllers may be to one or more of provided electronic and mechanical features or to their union but is at least in reference to features enabling control of flow of coolant or fluid through each cold plate or an immersion-cooled server tray or box.

In at least one embodiment, electronic features of provided flow controllers receive control signals and assert control over mechanical features. In at least one embodiment, electronic features of provided flow controllers may be actuators or other electronic parts of other similar electromechanical features. In at least one embodiment, flow pumps may be used as flow controllers. In at least one embodiment, impellers, pistons, or bellows may be mechanical features, and an electronic motor and circuitry form electronic features of provided flow controllers.

In at least one embodiment, circuitry of provided flow controllers may include processors, memories, switches, sensors, and other components, altogether forming electronic features of provided flow controllers. In at least one embodiment, provided ports 252, 262, 272, 268 of provided flow controllers are adapted to either allow entry or to allow egress of an immersive fluid. In at least one embodiment, flow controllers 280 (capable of acting as an expansion valve) may be associated with fluid lines 276A, B (also 256, 274) that enable entry and egress of a local coolant to a cold plate 210B, D. In at least one embodiment, other flow controllers may be similarly associated with coolant lines 210, 216, 212 (also 266, 258) to enable entry and egress of a secondary coolant to a cold plate 210B, D.

In at least one embodiment, local coolant enters provided fluid lines 276A, B via dedicated inlet and outlet lines 208A, B. In at least one embodiment, a server manifold 204 is adapted with channels therein (illustrated by dotted or broken lines) to support distinct paths to distinct fluid lines 276A, B (also 256, 274) and to any remaining loops 214A, B that are associated with secondary coolant inlet and outlet lines 206A, B. In at least one embodiment, there may be multiple manifolds to support different local coolants and secondary coolant distinctly through different interchangeable coolant-calibrated IRCDUs. In at least one embodiment, there may be multiple manifolds to support entry and egress, distinctly, for each of interchangeable coolant-calibrated IRCDUs having support for local coolant or for secondary coolant. In at least one embodiment, interchangeable coolant-calibrated IRCUDs may be used singularly with a local coolant source and without a secondary cooling loop or CDU.

Figure 3:
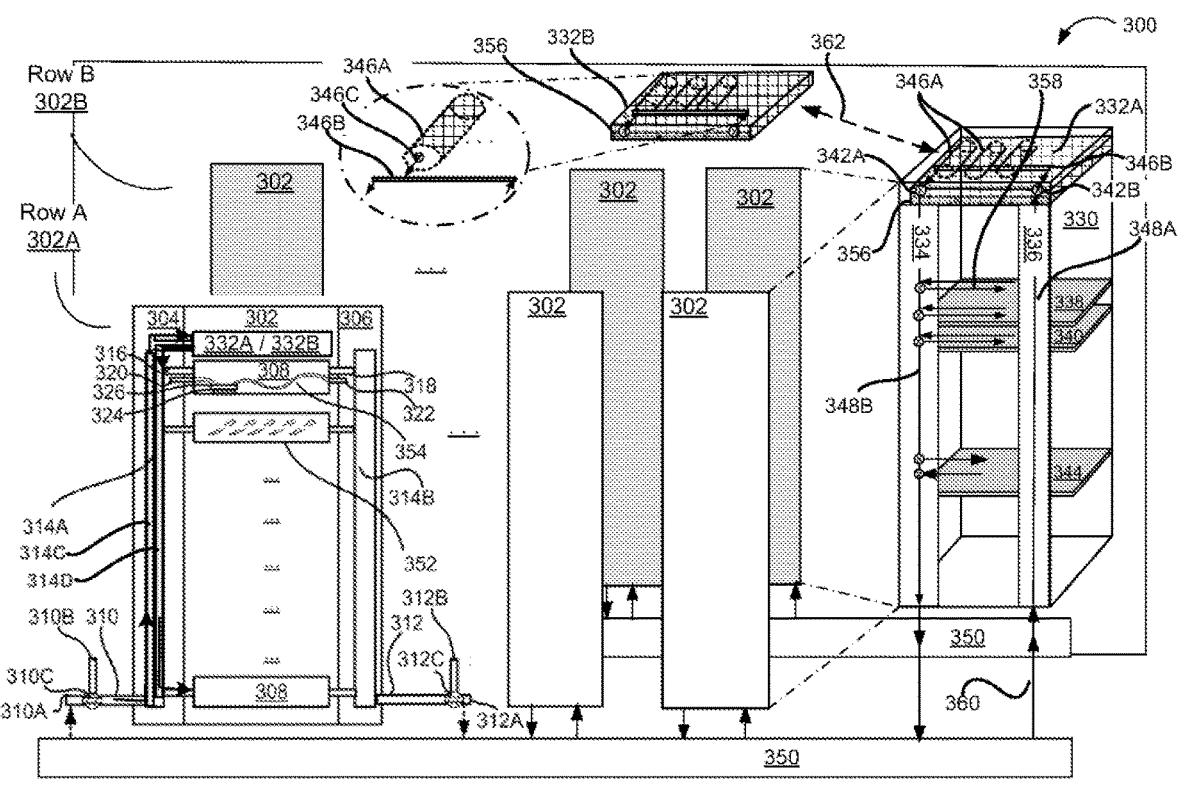
FIG. 3 illustrates rack-level features associated with interchangeable coolant-calibrated in-rack coolant distribution units for a datacenter cooling system, according to at least one embodiment.

In at least one embodiment, FIG. 3 illustrates rack-level features 300 associated with interchangeable coolant-calibrated in-rack coolant distribution units for a datacenter cooling system. In at least one embodiment, such rack-level features 300 include one or more racks 302 in one or more rows (such as, row A 302A and row B 302B). In at least one embodiment, each row 302A, B may be associated with its own cooling manifold 350 associated with a secondary coolant for dual coolant cold plates, although single coolant cold plate may be supported as well. In at least one embodiment, all such cold plates interface with a interchangeable coolant-calibrated IRCDUs that may be enabled for one or all of such racks 302 in FIG. 3. In at least one embodiment, some server trays or boxes 344 may be associated with coolant-based cooling, while other server tray or boxes 338, 340 may be associated with a local coolant-based cooling, so there may be multiple different coolant-calibrated IRCDUs in each rack 302 or in each row 302A, 302B.

In at least one embodiment, a cold plate 326 is within a rack 302, which allows secondary or local coolant from a row cooling manifold 350 to enter into and exit from rack cooling manifolds 314A, 314B. In at least one embodiment, secondary or local coolant flows from a coolant distribution unit (CDU), through a row cooling manifold 350, through an inlet 310A of a rack 302, through a flow controller 310C adapted to switch between coolant or local coolant flows (such as, from two different CDUs or from a CDU and a local coolant source), through an inlet 310, and into a rack cooling manifold 314A.

In at least one embodiment, a rack cooling manifold 314A may include distinct rack cooling sub-manifolds or channels therein representing an inlet side 314C and a supply side 314D. In at least one embodiment, a secondary or local coolant flows through an inlet side 314C a rack cooling manifold 314A to IRCDU 332A or 332B that is selected and that is installed based in part on a type of a coolant from a CDU or a local coolant source. In at least one embodiment, an IRCDU 332A or 332B can be interchangeably 362 installed to a rack 330; 302 to supply a coolant via a supply side 314D of a rack cooling manifold 314A. In at least one embodiment, distinct rack cooling manifold may be on an inlet side, a supply side, and an outlet side.

In at least one embodiment, a supply side 314D of a rack cooling manifold 314A supplies coolant that may be adjusted by an IRCDU 332A or 332B to a further inlet 316 of a server tray or box 308, to a cold plate 326 of an associated computing device 324, out of an outlet 318 of a server tray or box 308, through a rack cooling manifold representing an outlet side 314B, into a further outlet 312, through a flow controller 312C, and out of an outlet line 312A to a row cooling manifold 350 that may be a same or a different row cooling manifold than an inlet side row cooling manifold. Further, a row cooling manifold 350, like a rack cooling manifold 314A; B, may have different channels or sub-manifolds therein to support inlet and outlet flows. In at least one embodiment, a flow controller of a cold plate may be controlled from within an IRCDU using a processor associated with an IRCDU 332A or 332B.

In at least one embodiment, for a cold plate 326, local coolant flow many be caused to occur via an inlet or inlet lines 310B, 310 of a rack 302, through a channel of a rack cooling manifold 314A or a dedicated local coolant manifold having an inlet side and a supply side, through direct lines 320, 354, 322 to a cold plate 326, and out of outlet lines 312, 312B of a rack 302. In at least one embodiment, as in a secondary cooling loop, a local coolant may also flow to an IRCDU 332A or 332B that is selected based in part on a type of a local coolant. In at least one embodiment, an adjusted local coolant may then flow through such direct lines 320, 354, 322 provided for a local coolant distinct form a secondary coolant.

In at least one embodiment, such direct lines may be available within each of a server trays or boxes 308 of a rack 302 and may also be available within an immersive server 352 of a rack 302. In at least one embodiment, such direct lines are all local coolant paths for a local coolant flow through based at least in part on a cooling requirement of at least one computing device 324. In at least one embodiment, flow controllers, as discussed in reference to FIG. 2 are provided in association with a server tray or box 308 to enable such local coolant flow. In at least one embodiment, a flow controller 310C, 312C may be a diverter flow controller or representative of distinct flow controllers for each type of cooling, such as local coolant cooling and secondary coolant cooling.

In at least one embodiment, FIG. 3 also illustrates further details in a rack 330 that may be also found in racks 302. In at least one embodiment, a rack 330 may include one or more IRCDUs 332A or 332B to be associated with a rack 330. In at least one embodiment, at least a first IRCDU 332A and a second IRCDU 332B can distribute a first coolant and a second coolant, respectively, to a rack manifold 348A of a rack 330. In at least one embodiment, a first IRCDU 332A can include first coolant components, such as ingredient canisters 346A, first flow controllers 342A associated with coolant flow to one or more cold plates 326, second flow controllers 346C associated with an ingredient flow from such ingredient canisters 346A, sensors 356, and at least one mixing manifold 346B. In at least one embodiment, at least one of such first coolant components may be calibrated to a first coolant. In at least one embodiment, similarly, a second IRCDU 332B may include similar second coolant components, but at least one of which being calibrated to a second coolant. In at least one embodiment, a first IRCDU 332A and a second IRCDU 332B are interchangeable within a rack 330 based in part on a type of coolant to be provided to a rack 330 from a coolant distribution unit (CDU), such as a CDU 406 in FIG. 4.

In at least one embodiment, at least one processor may be provided within an IRCDU 332A or 332B or external to an IRCDU 332A or 332B, such as in part of a building management system (BMS) to control aspects of an IRCDU 332A or 332B, such as to control one or more of first or second flow controllers 342A, 346C associated there with. In at least one embodiment, such at least one processor can be associated with such flow controllers of a first IRCDU and a second IRCDU by a plug-in connection following installation of one or both of such IRCDUs into a rack 330. In at least one embodiment, such at least one processor can determine a cooling requirement associated with at least one computing device 324 and can cause one or more of a number of flow controllers 342A to distribute a first coolant or a second coolant for a cold plate 326, where such a cold plate 326 may be associated with a cooling requirement.

In at least one embodiment, such provided first or second coolant is an adjusted coolant following dispensing of an ingredient into a first coolant or a second coolant in responsive a chemical or physical property change determined by sensors 356 within a respective IRCDU. In at least one embodiment, such sensors 356 may include a pH property sensor, a composition sensor, a viscosity sensor, a specific gravity sensor, a specific heat sensor, a reserve alkalinity sensor (that may be part of a pH sensor), a freezing point sensor, a boiling point sensor, and a density sensor. In at least one embodiment, these sensors are all calibrated to a type of a coolant used, such as PG25, PG33, ethylene glycol, or other coolants that may all have specific values for chemical and physical properties referenced by a pH property, a composition, a viscosity, a specific gravity, a specific heat, a reserve alkalinity, a freezing point, a boiling point, and a density. In at least one embodiment, such specific values may be working values that are intended for each type of coolant to function as it is intended in removing heat from a cold plate.

In at least one embodiment, at least one processor can also be associated with a plurality of ingredient canisters 346A that each include a different coolant ingredient. In at least one embodiment, such association may be with one or more sensors 356 within an IRCDU 332A or 332B and with one or more second flow controllers 346C, which are responsible to administer or dispense an individual ingredient into a coolant flow. In at least one embodiment, individual ones of different coolant ingredients may be calibrated to a first coolant or a second coolant, depending on an IRCDU it is contained within. In at least one embodiment a thermal transfer property of a coolant may be adjusted so that a coolant from a CDU, such as a PG-based coolant, has a specific heat that replicates an intended specific heat of a suitable coolant, such as DI water, for one or more cold plates that support DI water. In at least one embodiment, as such, components of a PG-based coolant may be adjusted to result in an intended specific heat for a PG-based coolant.

In at least one embodiment, at least one processor can be associated with a number of ingredient canisters 346A having different coolant components that are each calibrated for a first coolant or a second coolant and that are suitably located in a first IRCDU or a second IRCDU. In at least one embodiment, this may be so that, based in part on a type of a coolant, a first IRCDU or a second IRCDU may be selected and installed within a rack 330 to perform sensing, adjustment, and other actions without excessive downtimes that would have otherwise been required by shutting down a CDU that may be coupled to multiple racks 302 only to change a component or a server of one of such racks 302.

In at least one embodiment, at least one processor can be used to determine a chemical or physical property of a first coolant or a second coolant that flows there through (such as through an internal manifold 346B that may be accessed by one or more sensors 356). In at least one embodiment, such coolant flow is from a CDU and may have changed physically or chemically over time due to evaporation or wear and tear. In at least one embodiment, such at least one processor can dispense an individual one of different coolant ingredients to a first coolant or to a second coolant based in part on a determination of a chemical or physical property of a first coolant or a second coolant. In at least one embodiment, a signal provided by at least one processor can cause a second flow controller 346C (that is distinct from a flow controller 342A for distribution of a coolant) to administer or dispense such one or more different coolant ingredients into a coolant flow. In at least one embodiment, water or propylene glycol may be dispensed to adjust a pH or density of a PG25 or PG33 type coolant, when a change away from an intended working range of pH or density is determined for such a coolant.

In at least one embodiment, a number of sensors 356 may be within an first IRCDU and within a second IRCDU. In at least one embodiment, individual ones of a number of sensors 356 may be calibrated to a first coolant or a second coolant to enable determination of a chemical or physical property of a first coolant or a second coolant without a need to make adjustments to such sensors 356 based in part on a type of coolant to be provided for cooling in a existing datacenter cooling system.

In at least one embodiment, at least one processor can receive sensor inputs from such multiple sensors 356 of an IRCDU. In at least one embodiment, at least one processor can determine a chemical or physical property of a first coolant or a second coolant. In at least one embodiment, at least one processor can dispense an individual one of different coolant ingredients, from one or more first ingredient canisters 346A of a first IRCDU 332A to a first coolant or from one or more of second ingredient canisters 346A of a second IRCDU 332B for a second coolant.

In at least one embodiment, one or more neural networks may be configured to receive sensor inputs from multiple sensors 356 and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

In at least one embodiment, at least one processor can receive sensor inputs from a number of sensors 356 of an IRCDU. In at least one embodiment, such at least one processor can be used to determine a chemical or physical property of a first coolant or a second coolant, including a change thereto. In at least one embodiment, such at least one processor can then enable a flow rate for a first coolant or a second coolant, using a first flow controller 342A, in response to a cooling requirement associated with at least one cold plate 326. In at least one embodiment, other flow controllers may be associated with cold plates 326 or with a rack cooling manifold 334 at a supply side 348B to control supply 358 of a coolant to different server trays or boxes 338, 340, 344. In at least one embodiment, this enables equal distribution of coolant at an intended working temperature to server trays or boxes far from an IRCDU as ones close to an IRCDU.

In at least one embodiment, an inlet side 348A of a rack cooling manifold is illustrated on another side of a rack 330 than in a rack 302. In at least one embodiment, however, such inlet and supply sides may be on a same side, with a common outlet side. In at least one embodiment, however, outlet side of a coolant may flow into an supply sides 348B if such a supply side can handle raises in temperature from at least a part of heat removed from a cold plate. In at least one embodiment, if a returning coolant temperature is too high, it may be outlet to an outlet side that exits a rack and into an outlet part of a row cooling manifold 350 for cooling via a CDU and an associated chilling tower.

In at least one embodiment, a number of first sensors are in a first IRCDU and a number of second sensors are in a second IRCDU. In at least one embodiment, all such first and second sensors are calibrated for independent ones of first chemical and physical properties of a first coolant and of second chemical and physical properties of a first coolant. In at least one embodiment, this is so that they are able to trigger adjustment from their respective ingredient canisters depending on what is sensed and determined from a coolant flow that is specific to either first chemical and physical properties or second chemical and physical properties.

In at least one embodiment, a processor may include one or more circuits and may be associated with one or more of a first and a second IRCDUs 332A and 332B to perform such adjustments and monitoring features described throughout herein. In at least one embodiment, such IRCDUs are interchangeable 362 within a rack 330 based in part on a type of coolant to be provided to a rack 330 from a coolant distribution unit (CDU). In at least one embodiment, such one or more circuits can determine a cooling requirement for at least one computing device in a rack 330. In at least one embodiment, such a processor can address a cooling requirement from a first IRCDU 332A or a second IRCDU 332B by allowing flow of a first coolant or a second coolant to a cold plate 326. In at least one embodiment, a first IRCDU 332A can include first sensors 356 and first ingredient canisters 346A that are all calibrated to a first coolant. In at least one embodiment, a second IRCDU 332B can include second sensors 356 and second ingredient canisters calibrated to a second coolant.

In at least one embodiment, such a processor can include an output to provide signals for a number of first or second flow controllers 342A or 346C. In at least one embodiment, signals provided a first flow controller 342A enables such flow controllers to distribute a first coolant or a second coolant for a cold plate 326 associated with a cooling requirement. In at least one embodiment, a processor can also include an input to receive sensor inputs from first sensors or second sensors, generally referenced as sensors 356. In at least one embodiment, such a processor can determine a chemical or physical property of a first coolant or of a second coolant. In at least one embodiment, such a processor can cause dispensation of an individual one of different coolant ingredients, from first ingredient canisters 346A of a first IRCDU 332A to a first coolant or from second ingredient canisters 346A of a second IRCDU 332B to a second coolant.

In at least one embodiment, one or more neural networks may be provided within such a processor to receive sensor inputs and to infer a chemical or physical property of a first coolant or of a second coolant. In at least one embodiment, at least one logic unit of a processor used herein can determine a chemical or physical property of a first coolant or a second coolant from provided sensor inputs of a first sensors or second sensors within a first IRCDU 332A or a second IRCDU 332B. In at least one embodiment, such a processor can then cause dispensation of an individual one of different coolant components, from first ingredient canisters 346A of a first IRCDU 332A to a first coolant or from second ingredient canisters 346A of a second IRCDU 332B to a second coolant.

Figure 4:
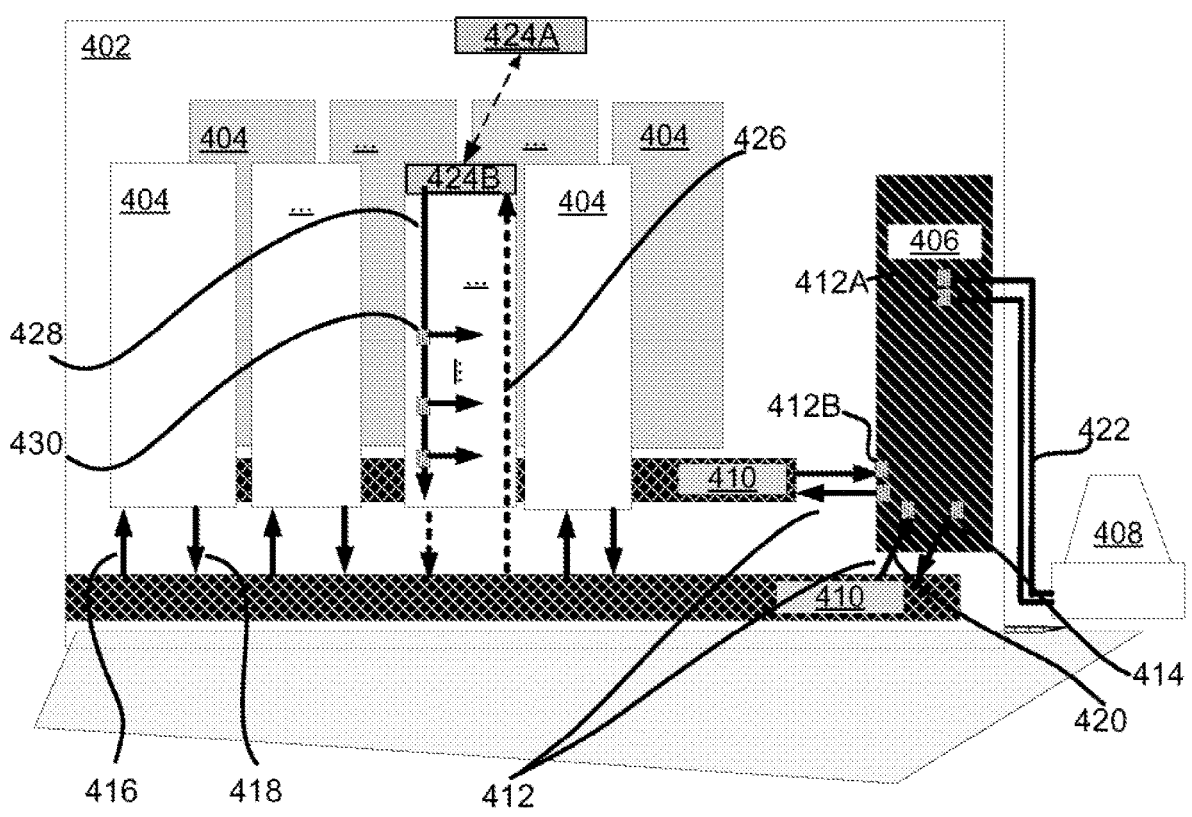
FIG. 4 illustrates datacenter-level features associated with interchangeable coolant-calibrated in-rack coolant distribution units for a datacenter cooling system, according to at least one embodiment.

In at least one embodiment, datacenter-level features 400 as illustrated in FIG. 4 can be associated with interchangeable coolant-calibrated in-rack coolant distribution units in a datacenter cooling system. In at least one embodiment, datacenter-level features 400, within a datacenter 402, may include racks 404 for hosting one or more server trays or boxes therein and one or more interchangeable coolant-calibrated in-rack coolant distribution units 424A, 424B therein, where at least one or more interchangeable coolant-calibrated IRCDUs 424A, 424B may be associated with a secondary cooling loop 412 and a primary cooling loop 422 having a CDU 406 there between.

In at least one embodiment, one or more secondary cooling row manifolds 410 may be provided for distributing secondary coolant from a CDU 406 to such one or more interchangeable coolant-calibrated IRCDUs 424A, 424B. In at least one embodiment, one or more primary cooling row manifolds (such as piping or lines making up part of a primary cooling loop 422) may be provided for distributing primary coolant to a CDU 406 from a chilling facility 408. In at least one embodiment, various flow controllers 412A, B (also in other FIGS. herein), and inlet and outlet lines 412, 414, 416, 418 are provided for coolant distribution associated with a CDU 406. In at least one embodiment, distinct supply and outlet lines 428 and inlet lines 426 are illustrated for one or more interchangeable coolant-calibrated IRCDUs 424A, 424B to receive and distribute coolant to a rack 404.

Figure 13A:
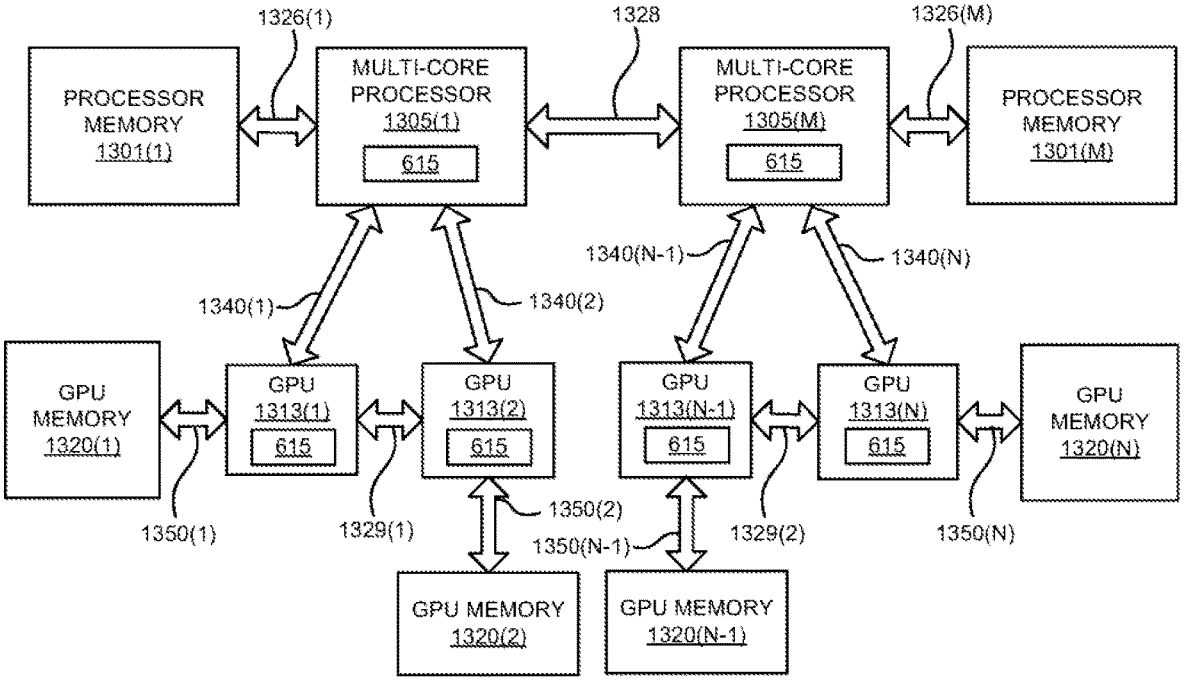
FIG. 13A illustrates a computer system, according to at least one embodiment.
Figure 16A:
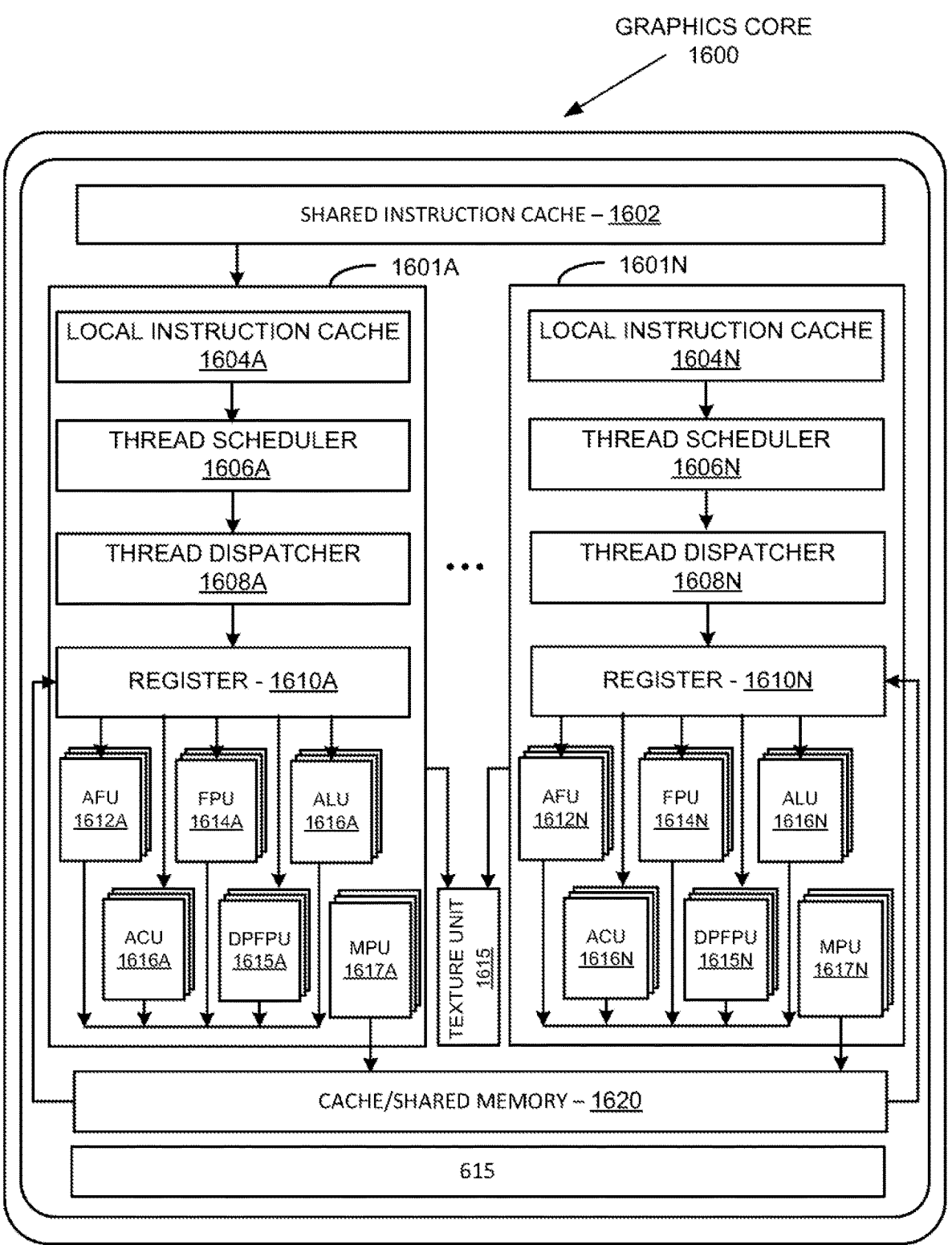
FIGS. 16A, 16B illustrate additional exemplary graphics processor logic according to at least one embodiment.
Figure 16B:
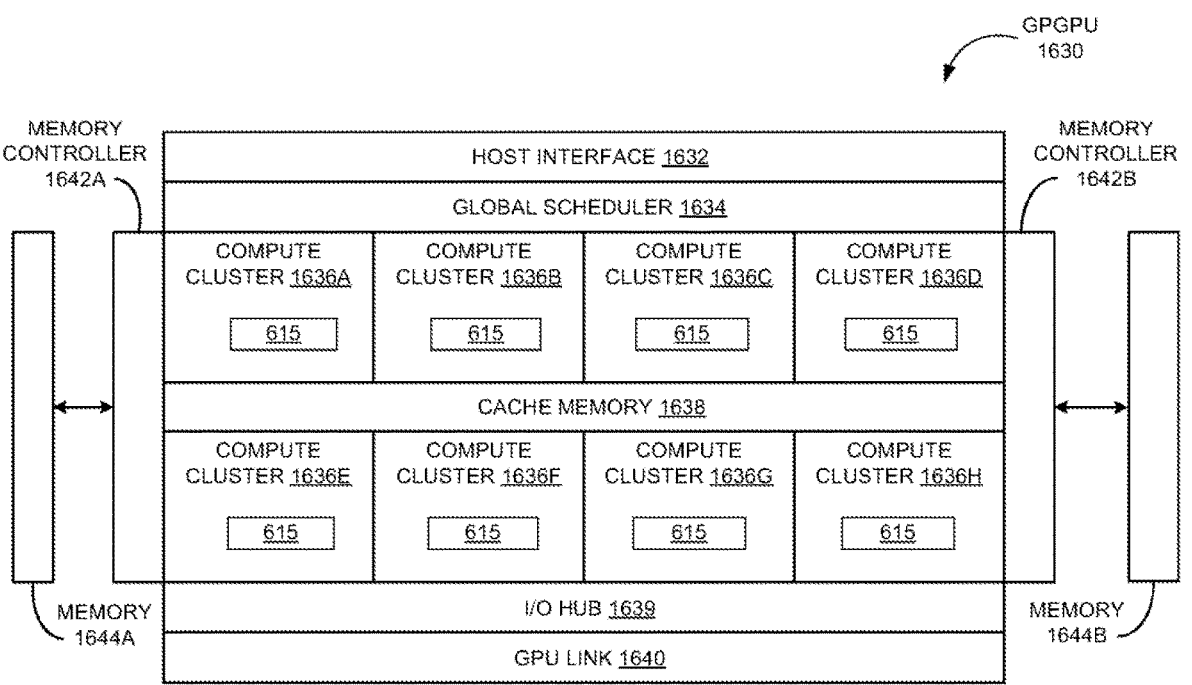

In at least one embodiment, a processor, as described in embodiments with respect to FIGS. 1-5 may be as illustrated in FIGS. 13A, 16A, 16B and as discussed in reference to these Figures. In at least one embodiment, such a processor can include at least one logic unit (such as described in reference to FIG. 16A) to determine a temperature associated with a cooling requirement and to determine a chemical or physical property of a first coolant or a second coolant. In at least one embodiment, a processor can cause one or more flow controllers to dispense an individual one of different coolant ingredients to a first coolant or to a second coolant or to provide coolant responsive to a cooling requirement.

In at least one embodiment, one or more neural networks may be provided within at least one processor to receive sensor inputs and to infer a cooling requirement from computing devices or aspects of a datacenter cooling system. In at least one embodiment, one or more neural networks may infer a failure of a secondary cooling loop or a primary cooling loop. In at least one embodiment, one or more circuits of a processor may cause one or more flow controllers to cause a coolant flow from an IRCDU. In at least one embodiment, based in part on sensor inputs associated with one or more sensors of an IRCDU, one or more circuits of a processor may cause one or more flow controllers associated with ingredient canisters to adjust physical or chemical properties of a coolant flow.

In at least one embodiment, at least one logic unit of a processor (such as described in reference to FIGS. 13A, 16A, 16B) can determine a temperature associated with a computing device, a cold plate, or a secondary coolant. In at least one embodiment, such determination may be to at least a cold plate or to a computing device. In at least one embodiment, at least one logic unit can determine an average temperature from multiple computing devices. In at least one embodiment, at least one logic unit can cause at least one flow controller 430 to provide coolant-based cooling for multiple computing devices, where such coolant may be adjusted coolant.

In at least one embodiment, each of at least one processor described throughout FIGS. 1-4 has inference and/or training logic 615 (such as in FIGS. 6A, 6B) that may include, without limitation, code and/or data storage to store forward and/or output weight and/or input/output data, and/or other parameters to configure neurons or layers of a neural network trained and/or used for inferencing in aspects of one or more embodiments. In at least one embodiment, training logic 615 may include, or be coupled to code and/or data storage to store graph code or other software to control timing and/or order, in which weight and/or other parameter information may be to be loaded to configure, logic, including integer and/or floating point units (collectively, arithmetic logic units (ALUs). In at least one embodiment, code, such as graph code, loads weight or other parameter information into processor ALUs based on an architecture of a neural network to which such code corresponds. In at least one embodiment, code and/or data storage 601 stores weight parameters and/or input/output data of each layer of a neural network trained or used in conjunction with one or more embodiments during forward propagation of input/output data and/or weight parameters during training and/or inferencing using aspects of one or more embodiments. In at least one embodiment, any portion of code and/or data storage 601 may be included with other on-chip or off-chip data storage, including a processor's L1, L2, or L3 cache or system memory.

In at least one embodiment, an inference and/or training logic 615 of at least one processor may be part of a building management system (BMS) for controlling flow controllers at one or more of a server-level, a rack-level, and a row-level. In at least one embodiment, a determination to engage a flow controller may be provided to one or more neural networks of an inference and/or training logic 615 to cause one or more neural networks to infer which flow controllers to gracefully engage or disengage for coolant requirements for one or more cold plates, servers, or racks from either a CDU or interchangeable coolant-calibrated in-rack coolant distribution units of a datacenter cooling system.

Figure 5:
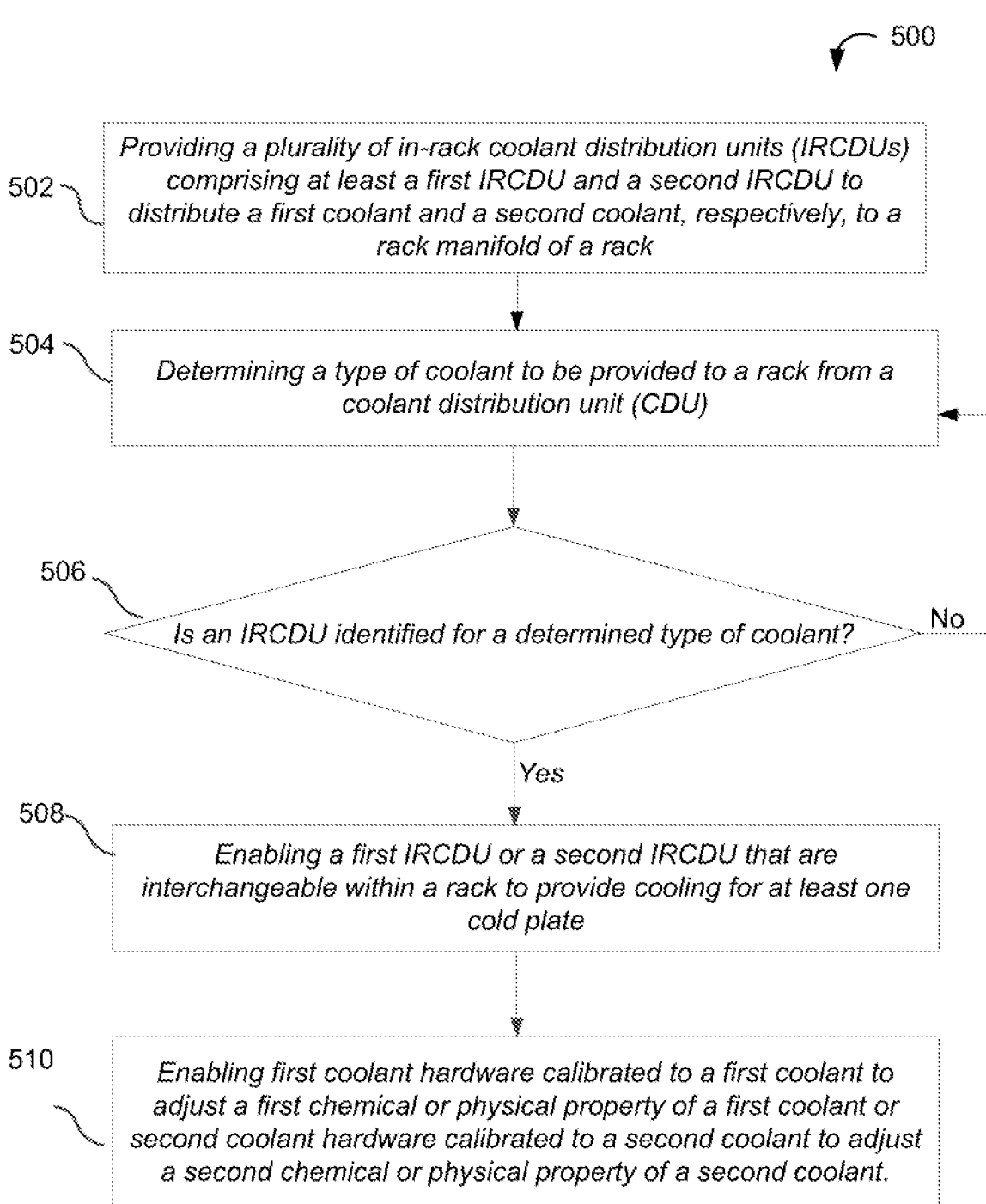
FIG. 5 illustrates a method associated with a datacenter cooling system of FIGS. 2-4, according to at least one embodiment.

FIG. 5 illustrates a method 500 associated with a datacenter cooling system of FIGS. 2-4, according to at least one embodiment. In at least one embodiment, a method 500 includes a step for providing (502) a number of in-rack coolant distribution units (IRCDUs) having at least a first IRCDU and a second IRCDU to distribute a first coolant and a second coolant, respectively, to a rack manifold of a rack. In at least one embodiment, such a method 500 includes a further step for determining (504) a type of coolant to be provided to a rack from a coolant distribution unit (CDU). In at least one embodiment, a verification step 506 verifies that an IRCDU can be identified for a determined type of coolant, such as a first IRCDU or a second IRCDU.

In at least one embodiment, such a method 500 includes a further step for enabling (508) a first IRCDU or a second IRCDU that are interchangeable within a rack, based in part on a type of coolant, to provide cooling for at least one cold plate. In at least one embodiment, such an enabling (508) step may be by providing first or second coolant from a first or a second IRCDU depending on which has been identified and installed to a rack having such at least one cold plate.

In at least one embodiment, such a method 500 includes a further step for enabling (510) first coolant components calibrated to a first coolant to adjust a first chemical or physical property of a first coolant or second coolant components calibrated to a second coolant to adjust a second chemical or physical property of a second coolant.

In at least one embodiment, such a method 500 includes a further step or a sub-step for determining, using at least one processor, a cooling requirement associated with at least one computing device. In at least one embodiment, such at least one computing device may be associated with at least one cold plate. In at least one embodiment, such a method 500 includes a further step or a sub-step for causing one or more of a number of flow controllers to distribute a first coolant or a second coolant for a cold plate associated with such a cooling requirement.

In at least one embodiment, such a method 500 includes a further step or a sub-step for determining, using at least one processor, a first chemical or physical property of a first coolant or a second chemical or physical property of a second coolant. In at least one embodiment, such a method 500 includes a further step or a sub-step for causing one or more flow controllers to dispense an individual one of different coolant ingredients from one or more first coolant canisters of first coolant components, in a first IRCDU, to a first coolant that is flowing through a coolant manifold. In at least one embodiment, such a method 500 includes a further step or a sub-step for causing one or more flow controllers to dispense an individual one of different coolant ingredients from one or more second coolant canisters of second coolant components, in a second IRCDU, to a second coolant that is flow through a coolant manifold. In at least one embodiment, an individual one of such different coolant ingredients may be dispensed to cause an adjustment to a first chemical or physical property of a first coolant or to cause an adjustment to a second chemical or physical property of a second coolant.

In at least one embodiment, such a method 500 includes a further step or a sub-step for determining, using individual ones of a number of sensors in a first IRCDU that is calibrated to a first coolant or in a second IRCDU that is calibrated to a second coolant, a first chemical or physical property of a first coolant or a second chemical or physical property of a second coolant. In at least one embodiment, such first chemical and physical property and such second chemical and physical property may include one or more of: a pH property, a composition, a viscosity, a specific gravity, a reserve alkalinity, a freezing point, a boiling point, and a density.

Inference and Training Logic

Figure 6A:
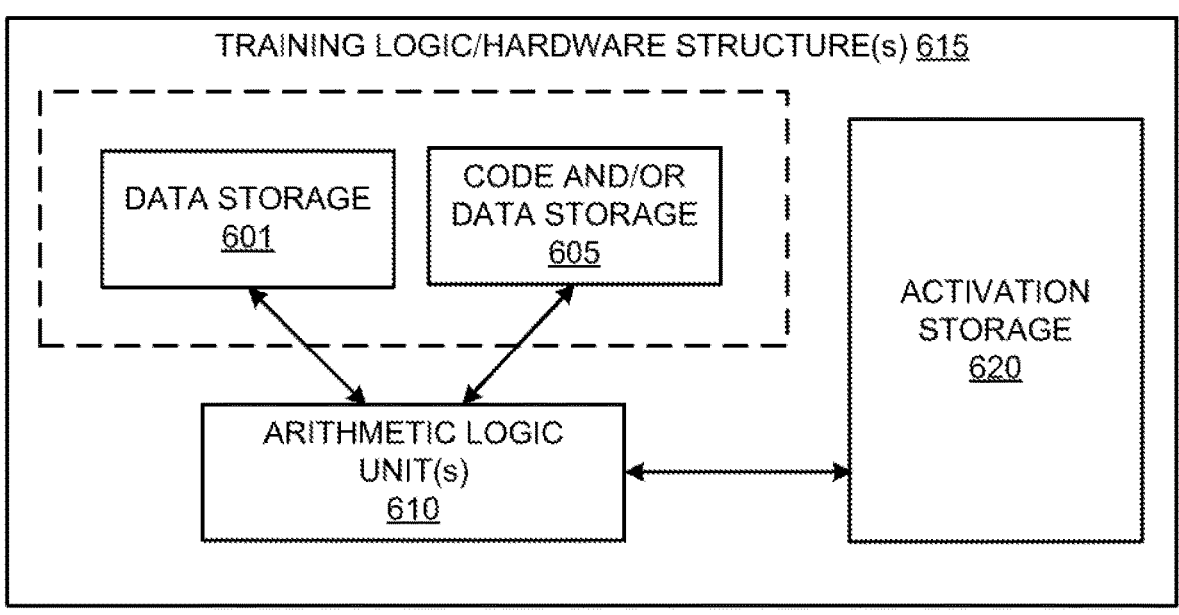
FIG. 6A illustrates inference and/or training logic, according to at least one embodiment.

FIG. 6A illustrates inference and/or training logic 615 used to perform inferencing and/or training operations associated with one or more embodiments. Details regarding inference and/or training logic 615 are provided below in conjunction with FIGS. 6A and/or 6B.

In at least one embodiment, inference and/or training logic 615 may include, without limitation, code and/or data storage 601 to store forward and/or output weight and/or input/output data, and/or other parameters to configure neurons or layers of a neural network trained and/or used for inferencing in aspects of one or more embodiments. In at least one embodiment, training logic 615 may include, or be coupled to code and/or data storage 601 to store graph code or other software to control timing and/or order, in which weight and/or other parameter information is to be loaded to configure, logic, including integer and/or floating point units (collectively, arithmetic logic units (ALUs)). In at least one embodiment, code, such as graph code, loads weight or other parameter information into processor ALUs based on an architecture of a neural network to which such code corresponds. In at least one embodiment, code and/or data storage 601 stores weight parameters and/or input/output data of each layer of a neural network trained or used in conjunction with one or more embodiments during forward propagation of input/output data and/or weight parameters during training and/or inferencing using aspects of one or more embodiments. In at least one embodiment, any portion of code and/or data storage 601 may be included with other on-chip or off-chip data storage, including a processor's L1, L2, or L3 cache or system memory.

In at least one embodiment, any portion of code and/or data storage 601 may be internal or external to one or more processors or other hardware logic devices or circuits. In at least one embodiment, code and/or code and/or data storage 601 may be cache memory, dynamic randomly addressable memory ("DRAM"), static randomly addressable memory ("SRAM"), non-volatile memory (e.g., flash memory), or other storage. In at least one embodiment, a choice of whether code and/or code and/or data storage 601 is internal or external to a processor, for example, or comprising DRAM, SRAM, flash or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 615 may include, without limitation, a code and/or data storage 605 to store backward and/or output weight and/or input/output data corresponding to neurons or layers of a neural network trained and/or used for inferencing in aspects of one or more embodiments. In at least one embodiment, code and/or data storage 605 stores weight parameters and/or input/output data of each layer of a neural network trained or used in conjunction with one or more embodiments during backward propagation of input/output data and/or weight parameters during training and/or inferencing using aspects of one or more embodiments. In at least one embodiment, training logic 615 may include, or be coupled to code and/or data storage 605 to store graph code or other software to control timing and/or order, in which weight and/or other parameter information is to be loaded to configure, logic, including integer and/or floating point units (collectively, arithmetic logic units (ALUs)).

In at least one embodiment, code, such as graph code, causes the loading of weight or other parameter information into processor ALUs based on an architecture of a neural network to which such code corresponds. In at least one embodiment, any portion of code and/or data storage 605 may be included with other on-chip or off-chip data storage, including a processor's L1, L2, or L3 cache or system memory. In at least one embodiment, any portion of code and/or data storage 605 may be internal or external to one or more processors or other hardware logic devices or circuits. In at least one embodiment, code and/or data storage 605 may be cache memory, DRAM, SRAM, non-volatile memory (e.g., flash memory), or other storage. In at least one embodiment, a choice of whether code and/or data storage 605 is internal or external to a processor, for example, or comprising DRAM, SRAM, flash memory or some other storage type may depend on available storage on-chip versus off-chip, latency requirements of training and/or inferencing functions being performed, batch size of data used in inferencing and/or training of a neural network, or some combination of these factors.

In at least one embodiment, code and/or data storage 601 and code and/or data storage 605 may be separate storage structures. In at least one embodiment, code and/or data storage 601 and code and/or data storage 605 may be a combined storage structure. In at least one embodiment, code and/or data storage 601 and code and/or data storage 605 may be partially combined and partially separate. In at least one embodiment, any portion of code and/or data storage 601 and code and/or data storage 605 may be included with other on-chip or off-chip data storage, including a processor's L1, L2, or L3 cache or system memory.

In at least one embodiment, inference and/or training logic 615 may include, without limitation, one or more arithmetic logic unit(s) ("ALU(s)") 610, including integer and/or floating point units, to perform logical and/or mathematical operations based, at least in part on, or indicated by, training and/or inference code (e.g., graph code), a result of which may produce activations (e.g., output values from layers or neurons within a neural network) stored in an activation storage 620 that are functions of input/output and/or weight parameter data stored in code and/or data storage 601 and/or code and/or data storage 605. In at least one embodiment, activations stored in activation storage 620 are generated according to linear algebraic and or matrix-based mathematics performed by ALU(s) 610 in response to performing instructions or other code, wherein weight values stored in code and/or data storage 605 and/or data storage 601 are used as operands along with other values, such as bias values, gradient information, momentum values, or other parameters or hyperparameters, any or all of which may be stored in code and/or data storage 605 or code and/or data storage 601 or another storage on or off-chip.

In at least one embodiment, ALU(s) 610 are included within one or more processors or other hardware logic devices or circuits, whereas in another embodiment, ALU(s) 610 may be external to a processor or other hardware logic device or circuit that uses them (e.g., a co-processor). In at least one embodiment, ALUs 610 may be included within a processor's execution units or otherwise within a bank of ALUs accessible by a processor's execution units either within same processor or distributed between different processors of different types (e.g., central processing units, graphics processing units, fixed function units, etc.). In at least one embodiment, code and/or data storage 601, code and/or data storage 605, and activation storage 620 may share a processor or other hardware logic device or circuit, whereas in another embodiment, they may be in different processors or other hardware logic devices or circuits, or some combination of same and different processors or other hardware logic devices or circuits. In at least one embodiment, any portion of activation storage 620 may be included with other on-chip or off-chip data storage, including a processor's L1, L2, or L3 cache or system memory. Furthermore, inferencing and/or training code may be stored with other code accessible to a processor or other hardware logic or circuit and fetched and/or processed using a processor's fetch, decode, scheduling, execution, retirement and/or other logical circuits.

In at least one embodiment, activation storage 620 may be cache memory, DRAM, SRAM, non-volatile memory (e.g., flash memory), or other storage. In at least one embodiment, activation storage 620 may be completely or partially within or external to one or more processors or other logical circuits. In at least one embodiment, a choice of whether activation storage 620 is internal or external to a processor, for example, or comprising DRAM, SRAM, flash memory or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 615 illustrated in FIG. 6A may be used in conjunction with an application-specific integrated circuit ("ASIC"), such as a TensorFlow® Processing Unit from Google, an inference processing unit (IPU) from Graphcore™, or a Nervana® (e.g., "Lake Crest") processor from Intel Corp. In at least one embodiment, inference and/or training logic 615 illustrated in FIG. 6A may be used in conjunction with central processing unit ("CPU") hardware, graphics processing unit ("GPU") hardware or other hardware, such as field programmable gate arrays ("FPGAs").

Figure 6B:
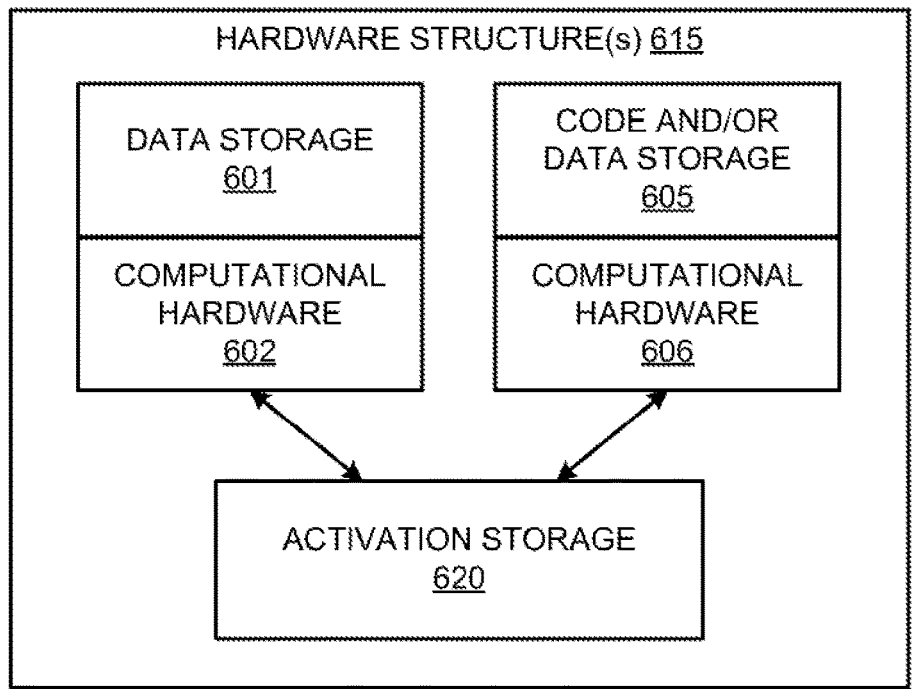
FIG. 6B illustrates inference and/or training logic, according to at least one embodiment.

FIG. 6B illustrates inference and/or training logic 615, according to at least one embodiment. In at least one embodiment, inference and/or training logic 615 may include, without limitation, hardware logic in which computational resources are dedicated or otherwise exclusively used in conjunction with weight values or other information corresponding to one or more layers of neurons within a neural network. In at least one embodiment, inference and/or training logic 615 illustrated in FIG. 6B may be used in conjunction with an application-specific integrated circuit (ASIC), such as TensorFlow® Processing Unit from Google, an inference processing unit (IPU) from Graphcore™, or a Nervana® (e.g., "Lake Crest") processor from Intel Corp. In at least one embodiment, inference and/or training logic 615 illustrated in FIG. 6B may be used in conjunction with central processing unit (CPU) hardware, graphics processing unit (GPU) hardware or other hardware, such as field programmable gate arrays (FPGAs). In at least one embodiment, inference and/or training logic 615 includes, without limitation, code and/or data storage 601 and code and/or data storage 605, which may be used to store code (e.g., graph code), weight values and/or other information, including bias values, gradient information, momentum values, and/or other parameter or hyperparameter information. In at least one embodiment illustrated in FIG. 6B, each of code and/or data storage 601 and code and/or data storage 605 is associated with a dedicated computational resource, such as computational hardware 602 and computational hardware 606, respectively. In at least one embodiment, each of computational hardware 602 and computational hardware 606 comprises one or more ALUs that perform mathematical functions, such as linear algebraic functions, only on information stored in code and/or data storage 601 and code and/or data storage 605, respectively, result of which is stored in activation storage 620.

In at least one embodiment, each of code and/or data storage 601 and 605 and corresponding computational hardware 602 and 606, respectively, correspond to different layers of a neural network, such that resulting activation from one storage/computational pair 601/602 of code and/or data storage 601 and computational hardware 602 is provided as an input to a next storage/computational pair 605/606 of code and/or data storage 605 and computational hardware 606, in order to mirror a conceptual organization of a neural network. In at least one embodiment, each of storage/computational pairs 601/602 and 605/606 may correspond to more than one neural network layer. In at least one embodiment, additional storage/computation pairs (not shown) subsequent to or in parallel with storage/computation pairs 601/602 and 605/606 may be included in inference and/or training logic 615.

Neural Network Training and Deployment

Figure 7:
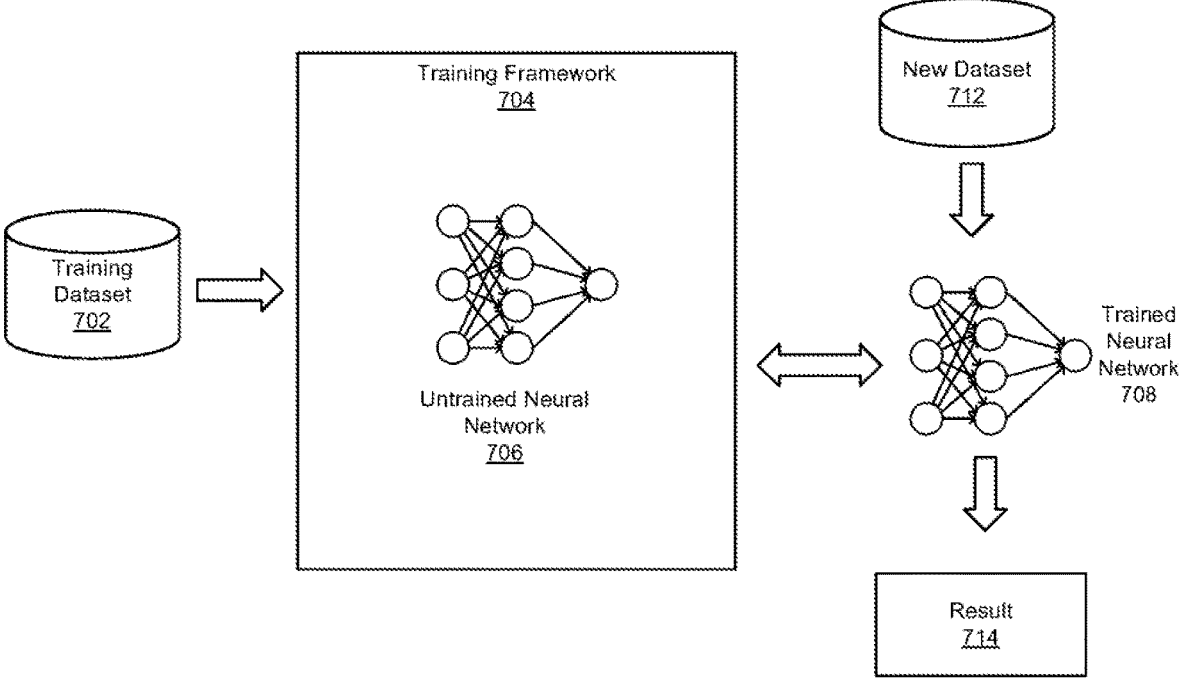
FIG. 7 illustrates training and deployment of a neural network, according to at least one embodiment.

FIG. 7 illustrates training and deployment of a deep neural network, according to at least one embodiment. In at least one embodiment, untrained neural network 706 is trained using a training dataset 702. In at least one embodiment, training framework 704 is a PyTorch framework, whereas in other embodiments, training framework 704 is a Tensor-Flow, Boost, Caffe, Microsoft Cognitive Toolkit/CNTK, MXNet, Chainer, Keras, Deeplearning4j, or other training framework. In at least one embodiment, training framework 704 trains an untrained neural network 706 and enables it to be trained using processing resources described herein to generate a trained neural network 708. In at least one embodiment, weights may be chosen randomly or by pre-training using a deep belief network. In at least one embodiment, training may be performed in either a supervised, partially supervised, or unsupervised manner.

In at least one embodiment, untrained neural network 706 is trained using supervised learning, wherein training dataset 702 includes an input paired with a desired output for an input, or where training dataset 702 includes input having a known output and an output of neural network 706 is manually graded. In at least one embodiment, untrained neural network 706 is trained in a supervised manner and processes inputs from training dataset 702 and compares resulting outputs against a set of expected or desired outputs. In at least one embodiment, errors are then propagated back through untrained neural network 706. In at least one embodiment, training framework 704 adjusts weights that control untrained neural network 706. In at least one embodiment, training framework 704 includes tools to monitor how well untrained neural network 706 is converging towards a model, such as trained neural network 708, suitable to generating correct answers, such as in result 714, based on input data such as a new dataset 712. In at least one embodiment, training framework 704 trains untrained neural network 706 repeatedly while adjust weights to refine an output of untrained neural network 706 using a loss function and adjustment algorithm, such as stochastic gradient descent. In at least one embodiment, training framework 704 trains untrained neural network 706 until untrained neural network 706 achieves a desired accuracy. In at least one embodiment, trained neural network 708 can then be deployed to implement any number of machine learning operations.

In at least one embodiment, untrained neural network 706 is trained using unsupervised learning, wherein untrained neural network 706 attempts to train itself using unlabeled data. In at least one embodiment, unsupervised learning training dataset 702 will include input data without any associated output data or "ground truth" data. In at least one embodiment, untrained neural network 706 can learn groupings within training dataset 702 and can determine how individual inputs are related to untrained dataset 702. In at least one embodiment, unsupervised training can be used to generate a self-organizing map in trained neural network 708 capable of performing operations useful in reducing dimensionality of new dataset 712. In at least one embodiment, unsupervised training can also be used to perform anomaly detection, which allows identification of data points in new dataset 712 that deviate from normal patterns of new dataset 712.

In at least one embodiment, semi-supervised learning may be used, which is a technique in which in training dataset 702 includes a mix of labeled and unlabeled data. In at least one embodiment, training framework 704 may be used to perform incremental learning, such as through transferred learning techniques. In at least one embodiment, incremental learning enables trained neural network 708 to adapt to new dataset 712 without forgetting knowledge instilled within trained neural network 708 during initial training.

In at least one embodiment, training framework 704 is a framework processed in connection with a software development toolkit such as an OpenVINO (Open Visual Inference and Neural network Optimization) toolkit. In at least one embodiment, an OpenVINO toolkit is a toolkit such as those developed by Intel Corporation of Santa Clara, CA.

In at least one embodiment, OpenVINO is a toolkit for facilitating development of applications, specifically neural network applications, for various tasks and operations, such as human vision emulation, speech recognition, natural language processing, recommendation systems, and/or variations thereof. In at least one embodiment, OpenVINO supports neural networks such as convolutional neural networks (CNNs), recurrent and/or attention-based nueral networks, and/or various other neural network models. In at least one embodiment, OpenVINO supports various software libraries such as OpenCV, OpenCL, and/or variations thereof.

In at least one embodiment, OpenVINO supports neural network models for various tasks and operations, such as classification, segmentation, object detection, face recognition, speech recognition, pose estimation (e.g., humans and/or objects), monocular depth estimation, image inpainting, style transfer, action recognition, colorization, and/or variations thereof.

In at least one embodiment, OpenVINO comprises one or more software tools and/or modules for model optimization, also referred to as a model optimizer. In at least one embodiment, a model optimizer is a command line tool that facilitates transitions between training and deployment of neural network models. In at least one embodiment, a model optimizer optimizes neural network models for execution on various devices and/or processing units, such as a GPU, CPU, PPU, GPGPU, and/or variations thereof. In at least one embodiment, a model optimizer generates an internal representation of a model, and optimizes said model to generate an intermediate representation. In at least one embodiment, a model optimizer reduces a number of layers of a model. In at least one embodiment, a model optimizer removes layers of a model that are utilized for training. In at least one embodiment, a model optimizer performs various neural network operations, such as modifying inputs to a model (e.g., resizing inputs to a model), modifying a size of inputs of a model (e.g., modifying a batch size of a model), modifying a model structure (e.g., modifying layers of a model), normalization, standardization, quantization (e.g., converting weights of a model from a first representation, such as floating point, to a second representation, such as integer), and/or variations thereof.

In at least one embodiment, OpenVINO comprises one or more software libraries for inferencing, also referred to as an inference engine. In at least one embodiment, an inference engine is a C++ library, or any suitable programming language library. In at least one embodiment, an inference engine is utilized to infer input data. In at least one embodiment, an inference engine implements various classes to infer input data and generate one or more results. In at least one embodiment, an inference engine implements one or more API functions to process an intermediate representation, set input and/or output formats, and/or execute a model on one or more devices.

In at least one embodiment, OpenVINO provides various abilities for heterogeneous execution of one or more neural network models. In at least one embodiment, heterogeneous execution, or heterogeneous computing, refers to one or more computing processes and/or systems that utilize one or more types of processors and/or cores. In at least one embodiment, OpenVINO provides various software functions to execute a program on one or more devices. In at least one embodiment, OpenVINO provides various software functions to execute a program and/or portions of a program on different devices. In at least one embodiment, OpenVINO provides various software functions to, for example, run a first portion of code on a CPU and a second portion of code on a GPU and/or FPGA. In at least one embodiment, OpenVINO provides various software functions to execute one or more layers of a neural network on one or more devices (e.g., a first set of layers on a first device, such as a GPU, and a second set of layers on a second device, such as a CPU).

In at least one embodiment, OpenVINO includes various functionality similar to functionalities associated with a CUDA programming model, such as various neural network model operations associated with frameworks such as TensorFlow, PyTorch, and/or variations thereof. In at least one embodiment, one or more CUDA programming model operations are performed using OpenVINO. In at least one embodiment, various systems, methods, and/or techniques described herein are implemented using OpenVINO.

Data Center

Figure 8:
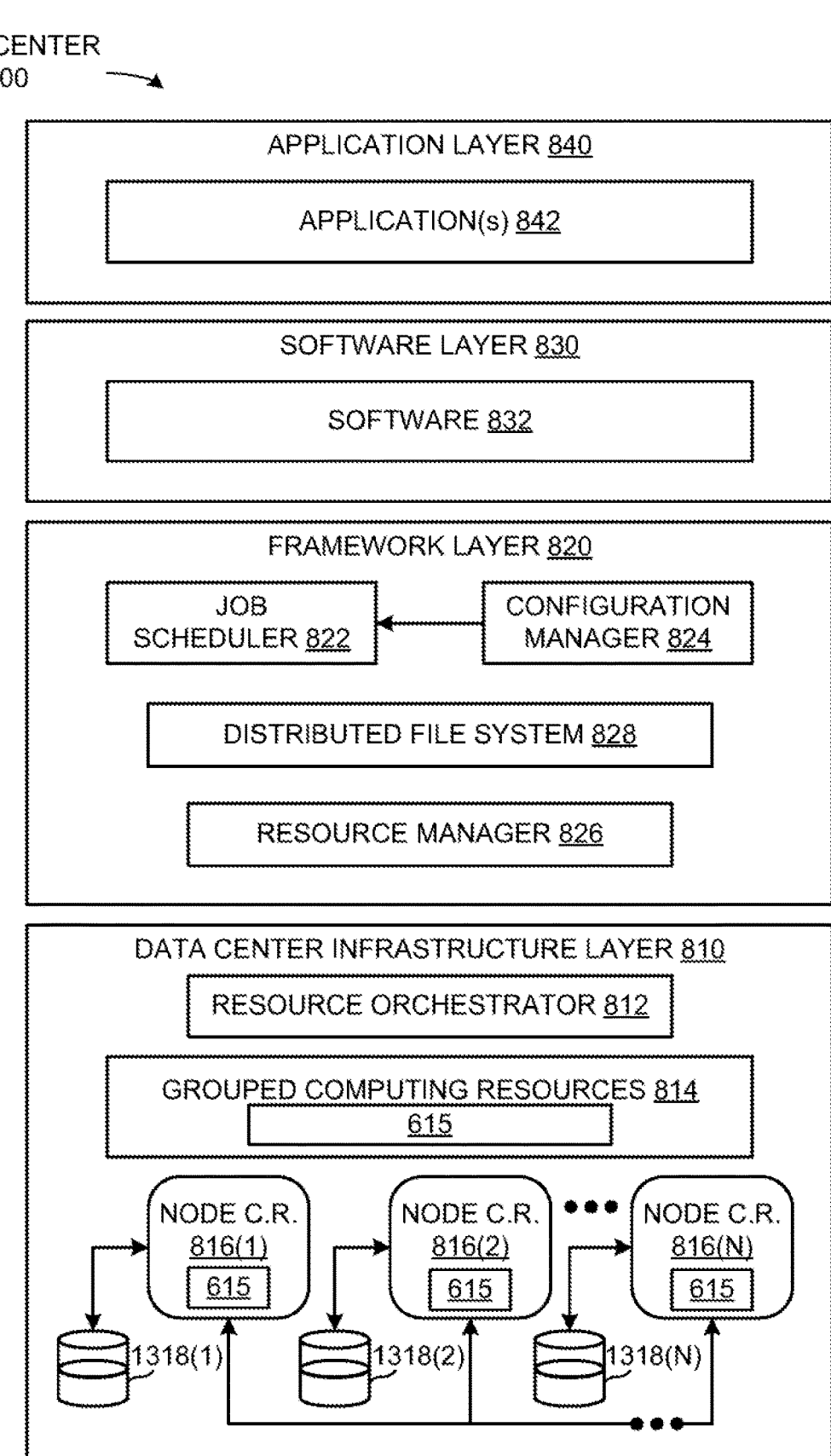
FIG. 8 illustrates an example data center system, according to at least one embodiment.

FIG. 8 illustrates an example data center 800, in which at least one embodiment may be used. In at least one embodiment, data center 800 includes a data center infrastructure layer 810, a framework layer 820, a software layer 830 and an application layer 840.

In at least one embodiment, as shown in FIG. 8, data center infrastructure layer 810 may include a resource orchestrator 812, grouped computing resources 814, and node computing resources ("node C.R.s") 816(1)-816(N), where "N" represents a positive integer (which may be a different integer "N" than used in other figures). In at least one embodiment, node C.R.s 816(1)-816(N) may include, but are not limited to, any number of central processing units ("CPUs") or other processors (including accelerators, field programmable gate arrays (FPGAs), graphics processors, etc.), memory storage devices 818(1)-818(N) (e.g., dynamic read-only memory, solid state storage or disk drives), network input/output ("NW I/O") devices, network switches, virtual machines ("VMs"), power modules, and cooling modules, etc. In at least one embodiment, one or more node C.R.s from among node C.R.s 816(1)-816(N) may be a server having one or more of above-mentioned computing resources.

In at least one embodiment, grouped computing resources 814 may include separate groupings of node C.R.s housed within one or more racks (not shown), or many racks housed in data centers at various geographical locations (also not shown). In at least one embodiment, separate groupings of node C.R.s within grouped computing resources 814 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 812 may configure or otherwise control one or more node C.R.s 816(1)-816(N) and/or grouped computing resources 814. In at least one embodiment, resource orchestrator 812 may include a software design infrastructure ("SDI") management entity for data center 800. In at least one embodiment, resource orchestrator 612 may include hardware, software or some combination thereof.

In at least one embodiment, as shown in FIG. 8, framework layer 820 includes a job scheduler 822, a configuration manager 824, a resource manager 826 and a distributed file system 828. In at least one embodiment, framework layer 820 may include a framework to support software 832 of software layer 830 and/or one or more application(s) 842 of application layer 840. In at least one embodiment, software 832 or application(s) 842 may respectively include web-based service software or applications, such as those provided by Amazon Web Services, Google Cloud and Microsoft Azure. In at least one embodiment, framework layer 820 may be, but is not limited to, a type of free and open-source software web application framework such as Apache Spark™ (hereinafter "Spark") that may utilize distributed file system 828 for large-scale data processing (e.g., "big data"). In at least one embodiment, job scheduler 822 may include a Spark driver to facilitate scheduling of workloads supported by various layers of data center 800. In at least one embodiment, configuration manager 824 may be capable of configuring different layers such as software layer 830 and framework layer 820 including Spark and distributed file system 828 for supporting large-scale data processing. In at least one embodiment, resource manager 826 may be capable of managing clustered or grouped computing resources mapped to or allocated for support of distributed file system 828 and job scheduler 822. In at least one embodiment, clustered or grouped computing resources may include grouped computing resources 814 at data center infrastructure layer 810. In at least one embodiment, resource manager 826 may coordinate with resource orchestrator 812 to manage these mapped or allocated computing resources.

In at least one embodiment, software 832 included in software layer 830 may include software used by at least portions of node C.R.s 816(1)-816(N), grouped computing resources 814, and/or distributed file system 828 of framework layer 820. In at least one embodiment, one or more types of software may include, but are not limited to, Internet web page search software, e-mail virus scan software, database software, and streaming video content software.

In at least one embodiment, application(s) 842 included in application layer 840 may include one or more types of applications used by at least portions of node C.R.s 816(1)-816(N), grouped computing resources 814, and/or distributed file system 828 of framework layer 820. In at least one embodiment, one or more types of applications may include, but are not limited to, any number of a genomics application, a cognitive compute, application and a machine learning application, including training or inferencing software, machine learning framework software (e.g., PyTorch, TensorFlow, Caffe, etc.) or other machine learning applications used in conjunction with one or more embodiments.

In at least one embodiment, any of configuration manager 824, resource manager 826, and resource orchestrator 812 may implement any number and type of self-modifying actions based on any amount and type of data acquired in any technically feasible fashion. In at least one embodiment, self-modifying actions may relieve a data center operator of data center 800 from making possibly bad configuration decisions and possibly avoiding underutilized and/or poor performing portions of a data center.

In at least one embodiment, data center 800 may include tools, services, software or other resources to train one or more machine learning models or predict or infer information using one or more machine learning models according to one or more embodiments described herein. For example, in at least one embodiment, a machine learning model may be trained by calculating weight parameters according to a neural network architecture using software and computing resources described above with respect to data center 800. In at least one embodiment, trained machine learning models corresponding to one or more neural networks may be used to infer or predict information using resources described above with respect to data center 800 by using weight parameters calculated through one or more training techniques described herein.

In at least one embodiment, data center may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as image recognition, speech recognition, or other artificial intelligence services.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in system FIG. 8 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Computer Systems

Figure 9:
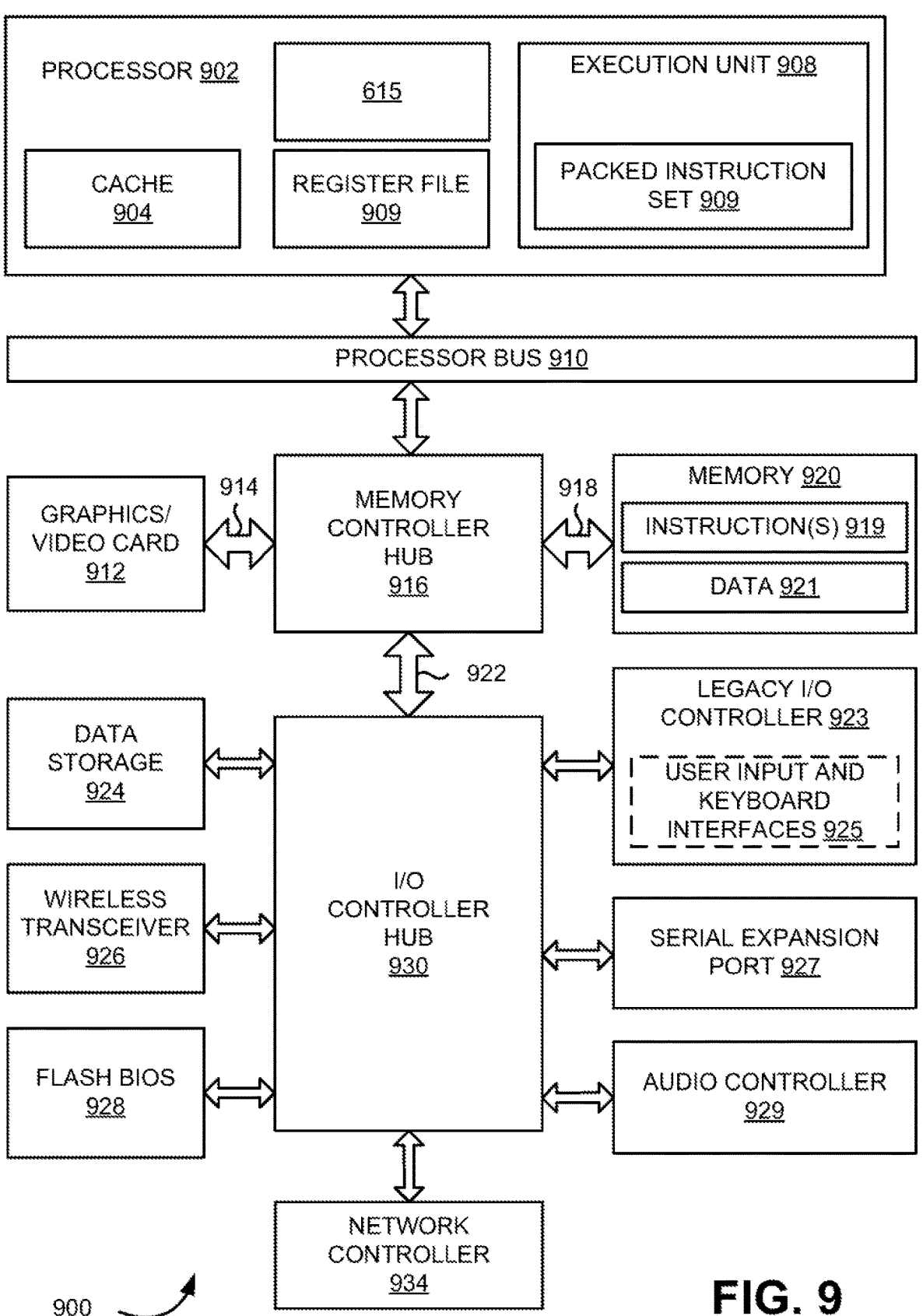
FIG. 9 is a block diagram illustrating a computer system, according to at least one embodiment.

FIG. 9 is a block diagram illustrating an exemplary computer system, which may be a system with interconnected devices and components, a system-on-a-chip (SOC) or some combination thereof formed with a processor that may include execution units to execute an instruction, according to at least one embodiment. In at least one embodiment, a computer system 900 may include, without limitation, a component, such as a processor 902 to employ execution units including logic to perform algorithms for process data, in accordance with present disclosure, such as in embodiment described herein. In at least one embodiment, computer system 900 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 900 may execute a version of WINDOWS operating system available from Microsoft Corporation of Redmond, Wash., although other operating systems (UNIX and Linux, for example), embedded software, and/or graphical user interfaces, may also be used.

Embodiments may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor ("DSP"), system on a chip, network computers ("NetPCs"), set-top boxes, network hubs, wide area network ("WAN") switches, or any other system that may perform one or more instructions in accordance with at least one embodiment.

In at least one embodiment, computer system 900 may include, without limitation, processor 902 that may include, without limitation, one or more execution units 908 to perform machine learning model training and/or inferencing according to techniques described herein. In at least one embodiment, computer system 900 is a single processor desktop or server system, but in another embodiment, computer system 900 may be a multiprocessor system. In at least one embodiment, processor 902 may include, without limitation, a complex instruction set computer ("CISC") microprocessor, a reduced instruction set computing ("RISC") microprocessor, a very long instruction word ("VLIW") microprocessor, a processor implementing a combination of instruction sets, or any other processor device, such as a digital signal processor, for example. In at least one embodiment, processor 902 may be coupled to a processor bus 910 that may transmit data signals between processor 902 and other components in computer system 900.

In at least one embodiment, processor 902 may include, without limitation, a Level 1 ("L1") internal cache memory ("cache") 904. In at least one embodiment, processor 902 may have a single internal cache or multiple levels of internal cache. In at least one embodiment, cache memory may reside external to processor 902. Other embodiments may also include a combination of both internal and external caches depending on particular implementation and needs. In at least one embodiment, a register file 906 may store different types of data in various registers including, without limitation, integer registers, floating point registers, status registers, and an instruction pointer register.

In at least one embodiment, execution unit 908, including, without limitation, logic to perform integer and floating point operations, also resides in processor 902. In at least one embodiment, processor 902 may also include a microcode ("ucode") read only memory ("ROM") that stores microcode for certain macro instructions. In at least one embodiment, execution unit 908 may include logic to handle a packed instruction set 909. In at least one embodiment, by including packed instruction set 909 in an instruction set of a general-purpose processor, along with associated circuitry to execute instructions, operations used by many multimedia applications may be performed using packed data in processor 902. In at least one embodiment, many multimedia applications may be accelerated and executed more efficiently by using a full width of a processor's data bus for performing operations on packed data, which may eliminate a need to transfer smaller units of data across that processor's data bus to perform one or more operations one data element at a time.

In at least one embodiment, execution unit 908 may also be used in microcontrollers, embedded processors, graphics devices, DSPs, and other types of logic circuits. In at least one embodiment, computer system 900 may include, without limitation, a memory 920. In at least one embodiment, memory 920 may be a Dynamic Random Access Memory ("DRAM") device, a Static Random Access Memory ("SRAM") device, a flash memory device, or another memory device. In at least one embodiment, memory 920 may store instruction(s) 919 and/or data 921 represented by data signals that may be executed by processor 902.

In at least one embodiment, a system logic chip may be coupled to processor bus 910 and memory 920. In at least one embodiment, a system logic chip may include, without limitation, a memory controller hub ("MCH") 916, and processor 902 may communicate with MCH 916 via processor bus 910. In at least one embodiment, MCH 916 may provide a high bandwidth memory path 918 to memory 920 for instruction and data storage and for storage of graphics commands, data and textures. In at least one embodiment, MCH 916 may direct data signals between processor 902, memory 920, and other components in computer system 900 and to bridge data signals between processor bus 910, memory 920, and a system I/O interface 922. In at least one embodiment, a system logic chip may provide a graphics port for coupling to a graphics controller. In at least one embodiment, MCH 916 may be coupled to memory 920 through high bandwidth memory path 918 and a graphics/video card 912 may be coupled to MCH 916 through an Accelerated Graphics Port ("AGP") interconnect 914.

In at least one embodiment, computer system 900 may use system I/O interface 922 as a proprietary hub interface bus to couple MCH 916 to an I/O controller hub ("ICH") 930. In at least one embodiment, ICH 930 may provide direct connections to some I/O devices via a local I/O bus. In at least one embodiment, a local I/O bus may include, without limitation, a high-speed I/O bus for connecting peripherals to memory 920, a chipset, and processor 902. Examples may include, without limitation, an audio controller 929, a firmware hub ("flash BIOS") 928, a wireless transceiver 926, a data storage 924, a legacy I/O controller 923 containing user input and keyboard interfaces 925, a serial expansion port 927, such as a Universal Serial Bus ("USB") port, and a network controller 934. In at least one embodiment, data storage 924 may comprise a hard disk drive, a floppy disk drive, a CD-ROM device, a flash memory device, or other mass storage device.

In at least one embodiment, FIG. 9 illustrates a system, which includes interconnected hardware devices or "chips", whereas in other embodiments, FIG. 9 may illustrate an exemplary SoC. In at least one embodiment, devices illustrated in FIG. 9 may be interconnected with proprietary interconnects, standardized interconnects (e.g., PCIe) or some combination thereof. In at least one embodiment, one or more components of computer system 900 are interconnected using compute express link (CXL) interconnects.

Inference and/or training logic 615 are used to perform inferencing and/or training operations associated with one or more embodiments. Details regarding inference and/or training logic 615 are provided herein in conjunction with FIGS.

6A and/or 6B. In at least one embodiment, inference and/or training logic 615 may be used in system FIG. 9 for inferencing or predicting operations based, at least in part, on weight parameters calculated using neural network training operations, neural network functions and/or architectures, or neural network use cases described herein.

In at least one embodiment, one or more neural networks of a computer system 900 may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 10:
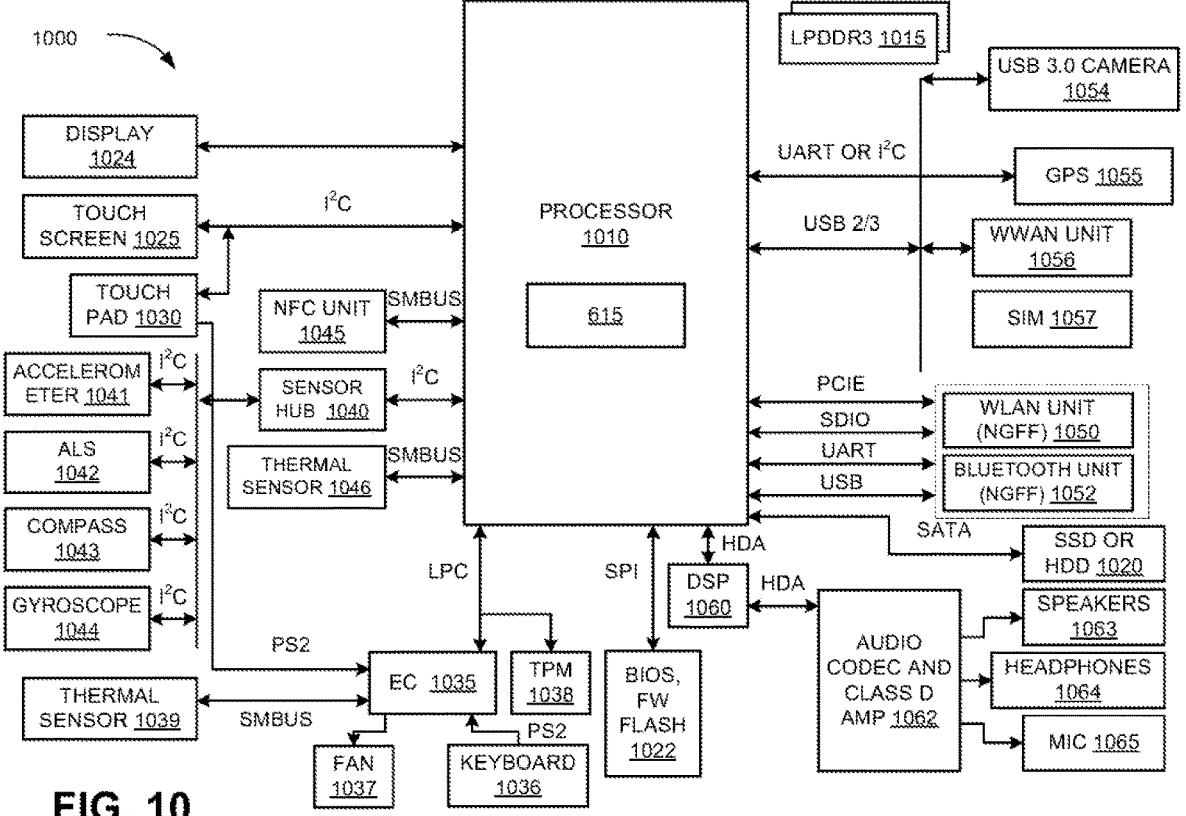
FIG. 10 is a block diagram illustrating a computer system, according to at least one embodiment.

FIG. 10 is a block diagram illustrating an electronic device 1000 for utilizing a processor 1010, according to at least one embodiment. In at least one embodiment, electronic device 1000 may be, for example and without limitation, a notebook, a tower server, a rack server, a blade server, a laptop, a desktop, a tablet, a mobile device, a phone, an embedded computer, or any other suitable electronic device.

In at least one embodiment, electronic device 1000 may include, without limitation, processor 1010 communicatively coupled to any suitable number or kind of components, peripherals, modules, or devices. In at least one embodiment, processor 1010 is coupled using a bus or interface, such as a I²C bus, a System Management Bus ("SMBus"), a Low Pin Count (LPC) bus, a Serial Peripheral Interface ("SPI"), a High Definition Audio ("HDA") bus, a Serial Advance Technology Attachment ("SATA") bus, a Universal Serial Bus ("USB") (versions 1, 2, 3, etc.), or a Universal Asynchronous Receiver/Transmitter ("UART") bus. In at least one embodiment, FIG. 10 illustrates a system, which includes interconnected hardware devices or "chips", whereas in other embodiments, FIG. 10 may illustrate an exemplary SoC. In at least one embodiment, devices illustrated in FIG. 10 may be interconnected with proprietary interconnects, standardized interconnects (e.g., PCIe) or some combination thereof. In at least one embodiment, one or more components of FIG. 10 are interconnected using compute express link (CXL) interconnects.

In at least one embodiment, FIG. 10 may include a display 1024, a touch screen 1025, a touch pad 1030, a Near Field Communications unit ("NFC") 1045, a sensor hub 1040, a thermal sensor 1046, an Express Chipset ("EC") 1035, a Trusted Platform Module ("TPM") 1038, BIOS/firmware/flash memory ("BIOS, FW Flash") 1022, a DSP 1060, a drive 1020 such as a Solid State Disk ("SSD") or a Hard Disk Drive ("HDD"), a wireless local area network unit ("WLAN") 1050, a Bluetooth unit 1052, a Wireless Wide Area Network unit ("WWAN") 1056, a Global Positioning System (GPS) unit 1055, a camera ("USB 3.0 camera") 1054 such as a USB 3.0 camera, and/or a Low Power Double Data Rate ("LPDDR") memory unit ("LPDDR3") 1015 implemented in, for example, an LPDDR3 standard. These components may each be implemented in any suitable manner.

In at least one embodiment, other components may be communicatively coupled to processor 1010 through components described herein. In at least one embodiment, an accelerometer 1041, an ambient light sensor ("ALS") 1042, a compass 1043, and a gyroscope 1044 may be communicatively coupled to sensor hub 1040. In at least one embodiment, a thermal sensor 1039, a fan 1037, a keyboard 1036, and touch pad 1030 may be communicatively coupled to EC 1035. In at least one embodiment, speakers 1063, headphones 1064, and a microphone ("mic") 1065 may be communicatively coupled to an audio unit ("audio codec and class D amp") 1062, which may in turn be communicatively coupled to DSP 1060. In at least one embodiment, audio unit 1062 may include, for example and without limitation, an audio coder/decoder ("codec") and a class D amplifier. In at least one embodiment, a SIM card ("SIM") 1057 may be communicatively coupled to WWAN unit 1056. In at least one embodiment, components such as WLAN unit 1050 and Bluetooth unit 1052, as well as WWAN unit 1056 may be implemented in a Next Generation Form Factor ("NGFF").

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in system FIG. 10 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the system of FIG. 10 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 11:
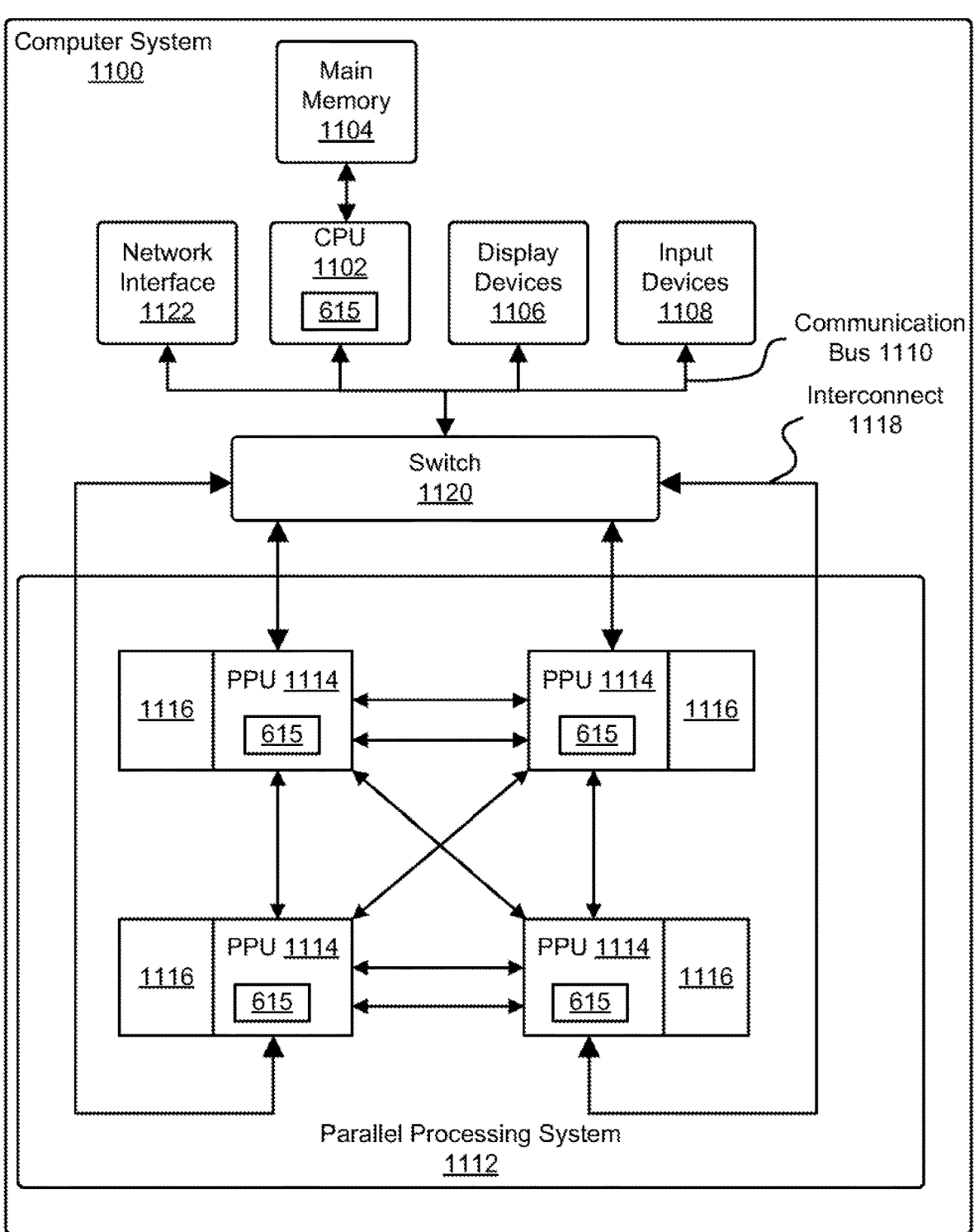
FIG. 11 illustrates a computer system, according to at least one embodiment.

FIG. 11 illustrates a computer system 1100, according to at least one embodiment. In at least one embodiment, computer system 1100 is configured to implement various processes and methods described throughout this disclosure.

In at least one embodiment, computer system 1100 comprises, without limitation, at least one central processing unit ("CPU") 1102 that is connected to a communication bus 1110 implemented using any suitable protocol, such as PCI ("Peripheral Component Interconnect"), peripheral component interconnect express ("PCI-Express"), AGP ("Accelerated Graphics Port"), HyperTransport, or any other bus or point-to-point communication protocol(s). In at least one embodiment, computer system 1100 includes, without limitation, a main memory 1104 and control logic (e.g., implemented as hardware, software, or a combination thereof) and data are stored in main memory 1104, which may take form of random access memory ("RAM"). In at least one embodiment, a network interface subsystem ("network interface") 1122 provides an interface to other computing devices and networks for receiving data from and transmitting data to other systems with computer system 1100.

In at least one embodiment, computer system 1100, in at least one embodiment, includes, without limitation, input devices 1108, a parallel processing system 1112, and display devices 1106 that can be implemented using a conventional cathode ray tube ("CRT"), a liquid crystal display ("LCD"), a light emitting diode ("LED") display, a plasma display, or other suitable display technologies. In at least one embodiment, user input is received from input devices 1108 such as keyboard, mouse, touchpad, microphone, etc. In at least one embodiment, each module described herein can be situated on a single semiconductor platform to form a processing system.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in system FIG. 11 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the system of FIG. 11 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 12:
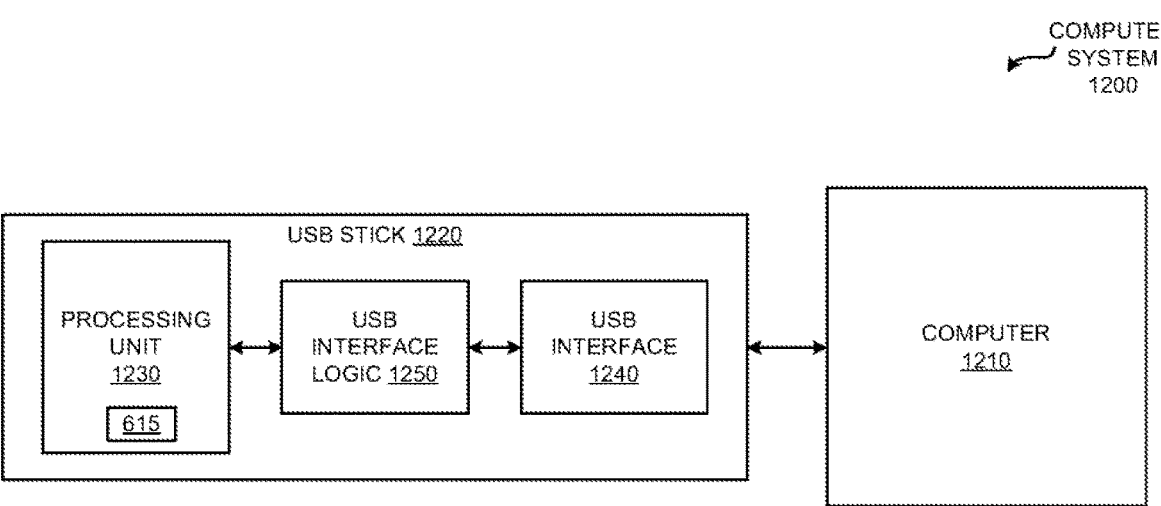
FIG. 12 illustrates a computer system, according to at least one embodiment.

FIG. 12 illustrates a computer system 1200, according to at least one embodiment. In at least one embodiment, computer system 1200 includes, without limitation, a computer 1210 and a USB stick 1220. In at least one embodiment, computer 1210 may include, without limitation, any number and type of processor(s) (not shown) and a memory (not shown). In at least one embodiment, computer 1210 includes, without limitation, a server, a cloud instance, a laptop, and a desktop computer.

In at least one embodiment, USB stick 1220 includes, without limitation, a processing unit 1230, a USB interface 1240, and USB interface logic 1250. In at least one embodiment, processing unit 1230 may be any instruction execution system, apparatus, or device capable of executing instructions. In at least one embodiment, processing unit 1230 may include, without limitation, any number and type of processing cores (not shown). In at least one embodiment, processing unit 1230 comprises an application specific integrated circuit ("ASIC") that is optimized to perform any amount and type of operations associated with machine learning. For instance, in at least one embodiment, processing unit 1230 is a tensor processing unit ("TPC") that is optimized to perform machine learning inference operations. In at least one embodiment, processing unit 1230 is a vision processing unit ("VPU") that is optimized to perform machine vision and machine learning inference operations.

In at least one embodiment, USB interface 1240 may be any type of USB connector or USB socket. For instance, in at least one embodiment, USB interface 1240 is a USB 3.0 Type-C socket for data and power. In at least one embodiment, USB interface 1240 is a USB 3.0 Type-A connector. In at least one embodiment, USB interface logic 1250 may include any amount and type of logic that enables processing unit 1230 to interface with devices (e.g., computer 1210) via USB connector 1240.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in system FIG. 12 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the system of FIG. 12 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

FIG. 13A illustrates an exemplary architecture in which a plurality of GPUs 1310(1)-1310(N) is communicatively coupled to a plurality of multi-core processors 1305(1)-1305 (M) over high-speed links 1340(1)-1340(N) (e.g., buses, point-to-point interconnects, etc.). In at least one embodiment, high-speed links 1340(1)-1340(N) support a communication throughput of 4 GB/s, 30 GB/s, 80 GB/s or higher. In at least one embodiment, various interconnect protocols may be used including, but not limited to, PCIe 4.0 or 5.0 and NVLink 2.0. In various figures, "N" and "M" represent positive integers, values of which may be different from FIG. to figure. In at least one embodiment, one or more GPUs in a plurality of GPUs 1310(1)-1310(N) includes one or more graphics cores (also referred to simply as "cores") 1600 as disclosed in FIGS. 16A and 16B. In at least one embodiment, one or more graphics cores 1600 may be referred to as streaming multiprocessors ("SMs"), stream processors ("SPs"), stream processing units ("SPUs"), compute units ("CUs"), execution units ("EUs"), and/or slices, where a slice in this context can refer to a portion of processing resources in a processing unit (e.g., 16 cores, a ray tracing unit, a thread director or scheduler).

In addition, and in at least one embodiment, two or more of GPUs 1310 are interconnected over high-speed links 1329(1)-1329(2), which may be implemented using similar or different protocols/links than those used for high-speed links 1340(1)-1340(N). Similarly, two or more of multi-core processors 1305 may be connected over a high-speed link 1328 which may be symmetric multi-processor (SMP) buses operating at 20 GB/s, 30 GB/s, 120 GB/s or higher. Alternatively, all communication between various system components shown in FIG. 13A may be accomplished using similar protocols/links (e.g., over a common interconnection fabric).

In at least one embodiment, each multi-core processor 1305 is communicatively coupled to a processor memory 1301(1)-1301(M), via memory interconnects 1326(1)-1326 (M), respectively, and each GPU 1310(1)-1310(N) is communicatively coupled to GPU memory 1320(1)-1320(N) over GPU memory interconnects 1350(1)-1350(N), respectively. In at least one embodiment, memory interconnects 1326 and 1350 may utilize similar or different memory access technologies. By way of example, and not limitation, processor memories 1301(1)-1301(M) and GPU memories 1320 may be volatile memories such as dynamic random access memories (DRAMs) (including stacked DRAMs), Graphics DDR SDRAM (GDDR) (e.g., GDDR5, GDDR6), or High Bandwidth Memory (HBM) and/or may be non-volatile memories such as 3D XPoint or Nano-Ram. In at least one embodiment, some portion of processor memories 1301 may be volatile memory and another portion may be non-volatile memory (e.g., using a two-level memory (2LM) hierarchy).

As described herein, although various multi-core processors 1305 and GPUs 1310 may be physically coupled to a particular memory 1301, 1320, respectively, and/or a unified memory architecture may be implemented in which a virtual system address space (also referred to as "effective address" space) is distributed among various physical memories. For example, processor memories 1301(1)-1301(M) may each comprise 64 GB of system memory address space and GPU memories 1320(1)-1320(N) may each comprise 32 GB of system memory address space resulting in a total of 256 GB addressable memory when M=2 and N=4. Other values for N and M are possible.

Figure 13B:
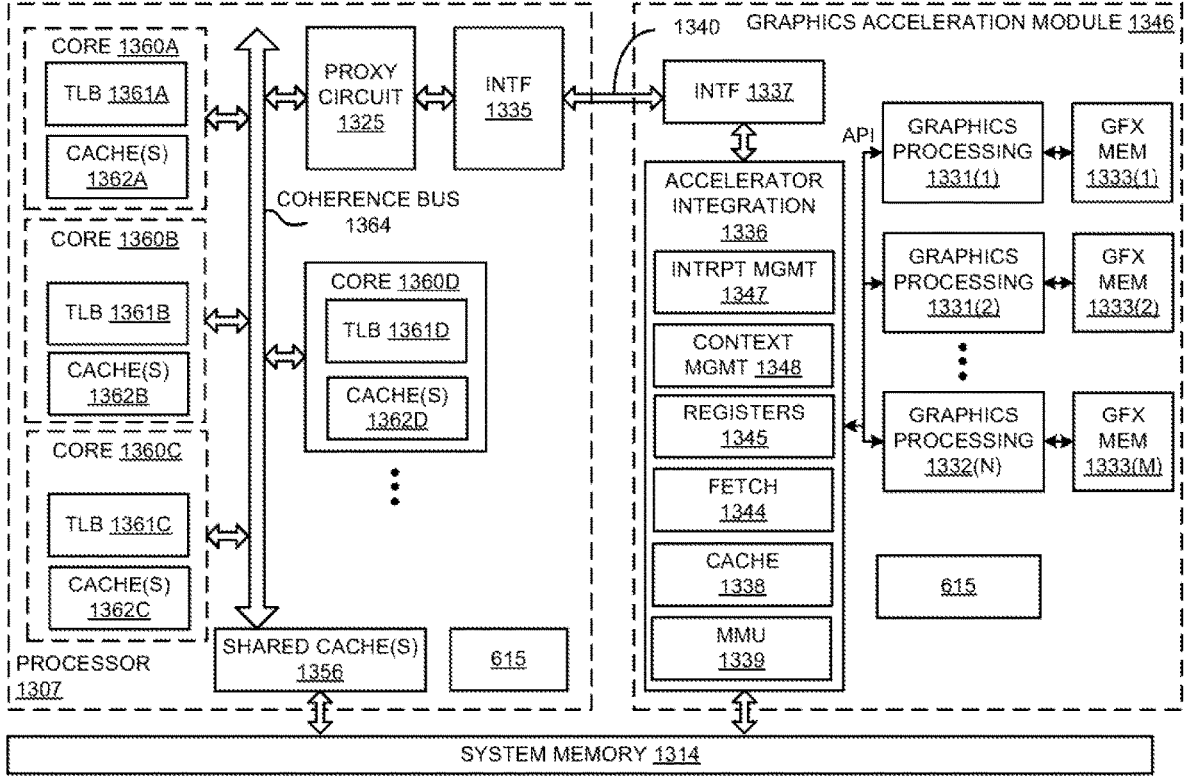
FIG. 13B illustrates a computer system, according to at least one embodiment.

FIG. 13B illustrates additional details for an interconnection between a multi-core processor 1307 and a graphics acceleration module 1346 in accordance with one exemplary embodiment. In at least one embodiment, graphics acceleration module 1346 may include one or more GPU chips integrated on a line card which is coupled to processor 1307 via high-speed link 1340 (e.g., a PCIe bus, NVLink, etc.). In at least one embodiment, graphics acceleration module 1346 may alternatively be integrated on a package or chip with processor 1307.

In at least one embodiment, processor 1307 includes a plurality of cores 1360A-1360D (which may be referred to as "execution units"), each with a translation lookaside buffer ("TLB") 1361A-1361D and one or more caches 1362A-1362D. In at least one embodiment, cores 1360A-1360D may include various other components for executing instructions and processing data that are not illustrated. In at least one embodiment, caches 1362A-1362D may comprise Level 1 (L1) and Level 2 (L2) caches. In addition, one or more shared caches 1356 may be included in caches 1362A-1362D and shared by sets of cores 1360A-1360D. For example, one embodiment of processor 1307 includes 24 cores, each with its own L1 cache, twelve shared L2 caches, and twelve shared L3 caches. In this embodiment, one or more L2 and L3 caches are shared by two adjacent cores. In at least one embodiment, processor 1307 and graphics acceleration module 1346 connect with system memory 1314, which may include processor memories 1301(1)-1301 (M) of FIG. 13A.

In at least one embodiment, coherency is maintained for data and instructions stored in various caches 1362A-1362D, 1356 and system memory 1314 via inter-core communication over a coherence bus 1364. In at least one embodiment, for example, each cache may have cache coherency logic/circuitry associated therewith to communicate to over coherence bus 1364 in response to detected reads or writes to particular cache lines. In at least one embodiment, a cache snooping protocol is implemented over coherence bus 1364 to snoop cache accesses.

In at least one embodiment, a proxy circuit 1325 communicatively couples graphics acceleration module 1346 to coherence bus 1364, allowing graphics acceleration module 1346 to participate in a cache coherence protocol as a peer of cores 1360A-1360D. In particular, in at least one embodiment, an interface 1335 provides connectivity to proxy circuit 1325 over high-speed link 1340 and an interface 1337 connects graphics acceleration module 1346 to high-speed link 1340.

In at least one embodiment, an accelerator integration circuit 1336 provides cache management, memory access, context management, and interrupt management services on behalf of a plurality of graphics processing engines 1331 (1)-1331(N) of graphics acceleration module 1346. In at least one embodiment, graphics processing engines 1331 (1)-1331(N) may each comprise a separate graphics processing unit (GPU). In at least one embodiment, plurality of graphics processing engines 1331(1)-1331(N) of graphics acceleration module 1346 include one or more graphics cores 1600 as discussed in connection with FIGS. 16A and 16B. In at least one embodiment, graphics processing engines 1331(1)-1331(N) alternatively may comprise different types of graphics processing engines within a GPU, such as graphics execution units, media processing engines (e.g., video encoders/decoders), samplers, and blit engines. In at least one embodiment, graphics acceleration module 1346 may be a GPU with a plurality of graphics processing engines 1331(1)-1331(N) or graphics processing engines 1331(1)-1331(N) may be individual GPUs integrated on a common package, line card, or chip.

In at least one embodiment, accelerator integration circuit 1336 includes a memory management unit (MMU) 1339 for performing various memory management functions such as virtual-to-physical memory translations (also referred to as effective-to-real memory translations) and memory access protocols for accessing system memory 1314. In at least one embodiment, MMU 1339 may also include a translation lookaside buffer (TLB) (not shown) for caching virtual/effective to physical/real address translations. In at least one embodiment, a cache 1338 can store commands and data for efficient access by graphics processing engines 1331(1)-1331(N). In at least one embodiment, data stored in cache 1338 and graphics memories 1333(1)-1333(M) is kept coherent with core caches 1362A-1362D, 1356 and system memory 1314, possibly using a fetch unit 1344. As mentioned, this may be accomplished via proxy circuit 1325 on behalf of cache 1338 and memories 1333(1)-1333(M) (e.g., sending updates to cache 1338 related to modifications/ accesses of cache lines on processor caches 1362A-1362D, 1356 and receiving updates from cache 1338).

In at least one embodiment, a set of registers 1345 store context data for threads executed by graphics processing engines 1331(1)-1331(N) and a context management circuit 1348 manages thread contexts. For example, context management circuit 1348 may perform save and restore operations to save and restore contexts of various threads during contexts switches (e.g., where a first thread is saved and a second thread is stored so that a second thread can be execute by a graphics processing engine). For example, on a context switch, context management circuit 1348 may store current register values to a designated region in memory (e.g., identified by a context pointer). It may then restore register values when returning to a context. In at least one embodiment, an interrupt management circuit 1347 receives and processes interrupts received from system devices.

In at least one embodiment, virtual/effective addresses from a graphics processing engine 1331 are translated to real/physical addresses in system memory 1314 by MMU 1339. In at least one embodiment, accelerator integration circuit 1336 supports multiple (e.g., 4, 8, 16) graphics accelerator modules 1346 and/or other accelerator devices. In at least one embodiment, graphics accelerator module

1346 may be dedicated to a single application executed on processor 1307 or may be shared between multiple applications. In at least one embodiment, a virtualized graphics execution environment is presented in which resources of graphics processing engines 1331(1)-1331(N) are shared with multiple applications or virtual machines (VMs). In at least one embodiment, resources may be subdivided into "slices" which are allocated to different VMs and/or applications based on processing requirements and priorities associated with VMs and/or applications.

In at least one embodiment, accelerator integration circuit 1336 performs as a bridge to a system for graphics acceleration module 1346 and provides address translation and system memory cache services. In addition, in at least one embodiment, accelerator integration circuit 1336 may provide virtualization facilities for a host processor to manage virtualization of graphics processing engines 1331(1)-1331 (N), interrupts, and memory management.

In at least one embodiment, because hardware resources of graphics processing engines 1331(1)-1331(N) are mapped explicitly to a real address space seen by host processor 1307, any host processor can address these resources directly using an effective address value. In at least one embodiment, one function of accelerator integration circuit 1336 is physical separation of graphics processing engines 1331(1)-1331(N) so that they appear to a system as independent units.

In at least one embodiment, one or more graphics memories 1333(1)-1333(M) are coupled to each of graphics processing engines 1331(1)-1331(N), respectively and N=M. In at least one embodiment, graphics memories 1333(1)-1333 (M) store instructions and data being processed by each of graphics processing engines 1331(1)-1331(N). In at least one embodiment, graphics memories 1333(1)-1333(M) may be volatile memories such as DRAMs (including stacked DRAMs), GDDR memory (e.g., GDDR5, GDDR6), or HBM, and/or may be non-volatile memories such as 3D XPoint or Nano-Ram.

In at least one embodiment, to reduce data traffic over high-speed link 1340, biasing techniques can be used to ensure that data stored in graphics memories 1333(1)-1333 (M) is data that will be used most frequently by graphics processing engines 1331(1)-1331(N) and preferably not used by cores 1360A-1360D (at least not frequently). Similarly, in at least one embodiment, a biasing mechanism attempts to keep data needed by cores (and preferably not graphics processing engines 1331(1)-1331(N)) within caches 1362A-1362D, 1356 and system memory 1314.

Figure 13C:
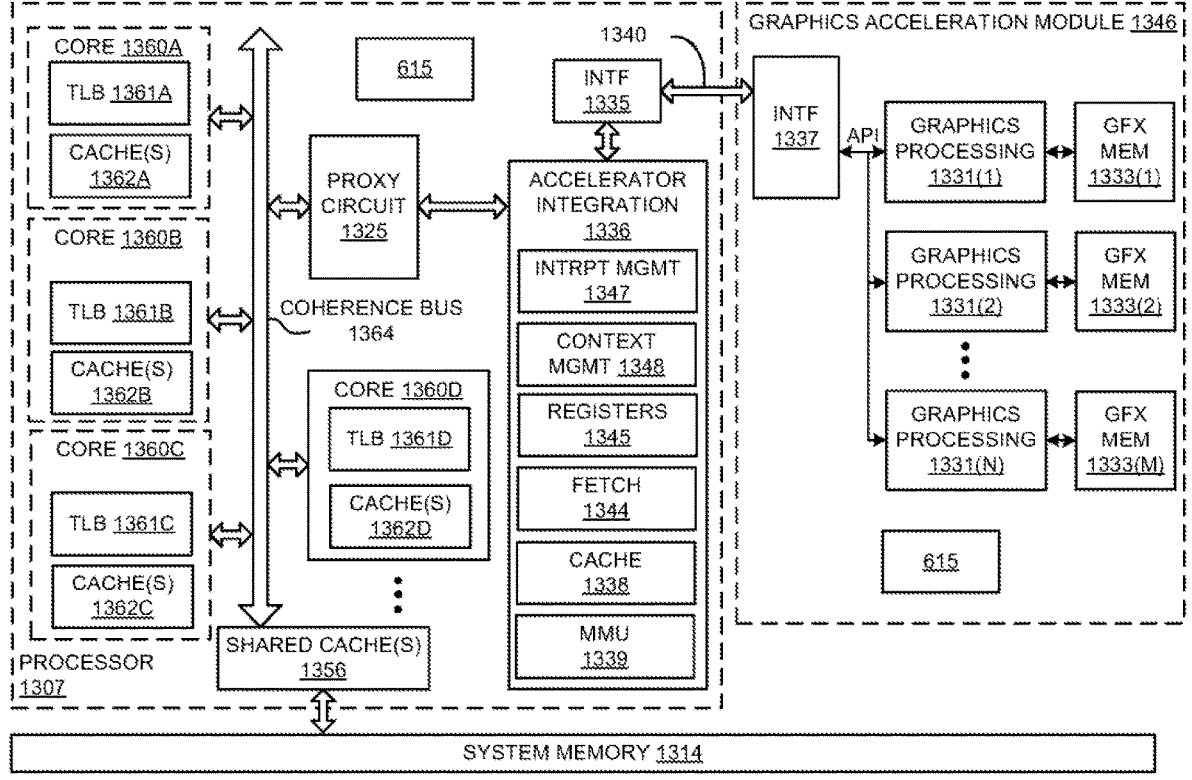
FIG. 13C illustrates a computer system, according to at least one embodiment.

FIG. 13C illustrates another exemplary embodiment in which accelerator integration circuit 1336 is integrated within processor 1307. In this embodiment, graphics processing engines 1331(1)-1331(N) communicate directly over high-speed link 1340 to accelerator integration circuit 1336 via interface 1337 and interface 1335 (which, again, may be any form of bus or interface protocol). In at least one embodiment, accelerator integration circuit 1336 may perform similar operations as those described with respect to FIG. 13B, but potentially at a higher throughput given its close proximity to coherence bus 1364 and caches 1362A-1362D, 1356. In at least one embodiment, an accelerator integration circuit supports different programming models including a dedicated-process programming model (no graphics acceleration module virtualization) and shared programming models (with virtualization), which may include programming models which are controlled by accelerator integration circuit 1336 and programming models which are controlled by graphics acceleration module 1346.

In at least one embodiment, graphics processing engines 1331(1)-1331(N) are dedicated to a single application or process under a single operating system. In at least one embodiment, a single application can funnel other application requests to graphics processing engines 1331(1)-1331 (N), providing virtualization within a VM/partition.

In at least one embodiment, graphics processing engines 1331(1)-1331(N), may be shared by multiple VM/application partitions. In at least one embodiment, shared models may use a system hypervisor to virtualize graphics processing engines 1331(1)-1331(N) to allow access by each operating system. In at least one embodiment, for single-partition systems without a hypervisor, graphics processing engines 1331(1)-1331(N) are owned by an operating system. In at least one embodiment, an operating system can virtualize graphics processing engines 1331(1)-1331(N) to provide access to each process or application.

In at least one embodiment, graphics acceleration module 1346 or an individual graphics processing engine 1331(1)-1331(N) selects a process element using a process handle. In at least one embodiment, process elements are stored in system memory 1314 and are addressable using an effective address to real address translation technique described herein. In at least one embodiment, a process handle may be an implementation-specific value provided to a host process when registering its context with graphics processing engine 1331(1)-1331(N) (that is, calling system software to add a process element to a process element linked list). In at least one embodiment, a lower 16-bits of a process handle may be an offset of a process element within a process element linked list.

Figure 13D:
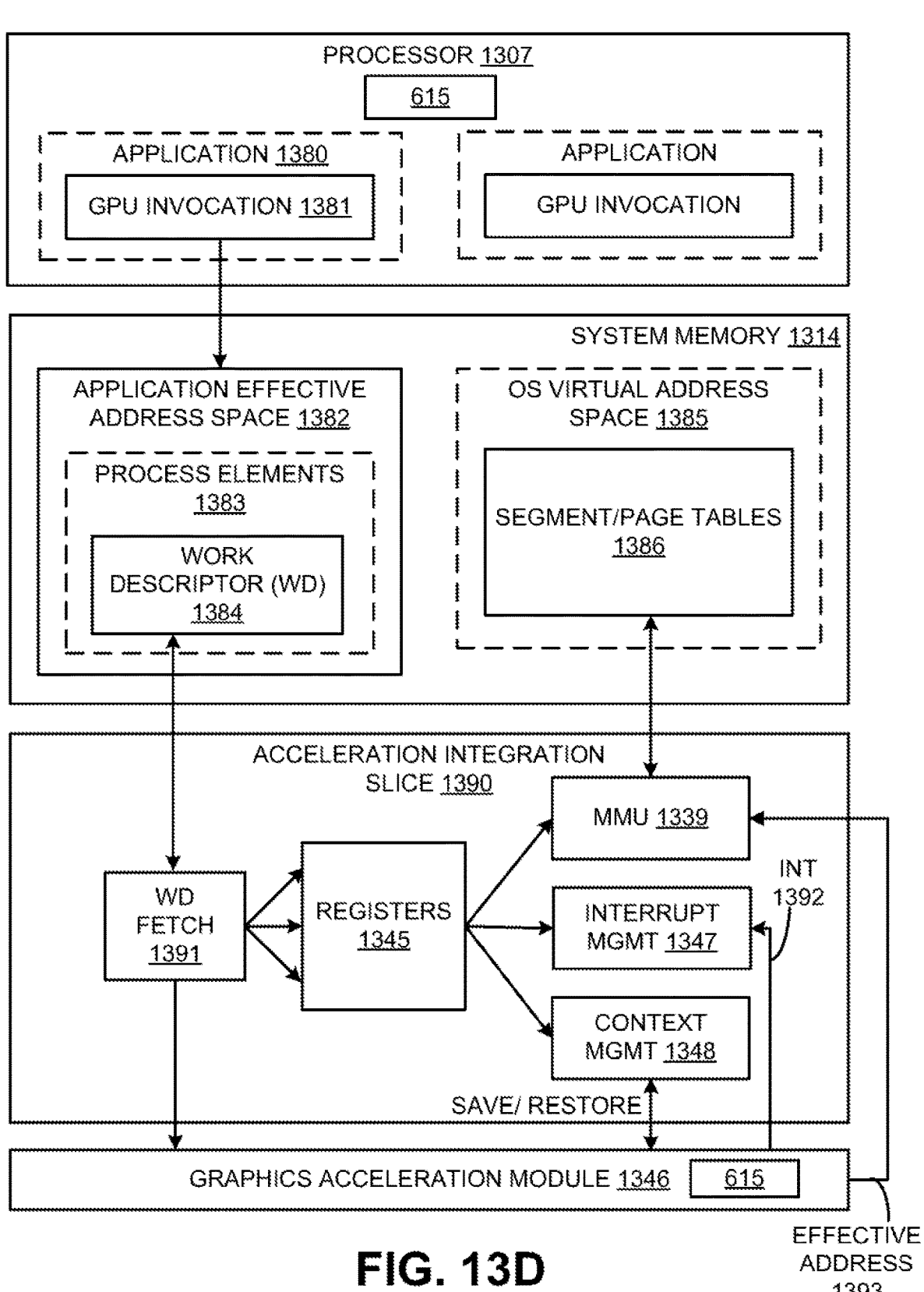
FIG. 13D illustrates a computer system, according to at least one embodiment.

FIG. 13D illustrates an exemplary accelerator integration slice 1390. In at least one embodiment, a "slice" comprises a specified portion of processing resources of accelerator integration circuit 1336. In at least one embodiment, an application is effective address space 1382 within system memory 1314 stores process elements 1383. In at least one embodiment, process elements 1383 are stored in response to GPU invocations 1381 from applications 1380 executed on processor 1307. In at least one embodiment, a process element 1383 contains process state for corresponding application 1380. In at least one embodiment, a work descriptor (WD) 1384 contained in process element 1383 can be a single job requested by an application or may contain a pointer to a queue of jobs. In at least one embodiment, WD 1384 is a pointer to a job request queue in an application's effective address space 1382.

In at least one embodiment, graphics acceleration module 1346 and/or individual graphics processing engines 1331 (1)-1331(N) can be shared by all or a subset of processes in a system. In at least one embodiment, an infrastructure for setting up process states and sending a WD 1384 to a graphics acceleration module 1346 to start a job in a virtualized environment may be included.

In at least one embodiment, a dedicated-process programming model is implementation-specific. In at least one embodiment, in this model, a single process owns graphics acceleration module 1346 or an individual graphics processing engine 1331. In at least one embodiment, when graphics acceleration module 1346 is owned by a single process, a hypervisor initializes accelerator integration circuit 1336 for an owning partition and an operating system initializes accelerator integration circuit 1336 for an owning process when graphics acceleration module 1346 is assigned.

In at least one embodiment, in operation, a WD fetch unit 1391 in accelerator integration slice 1390 fetches next WD 1384, which includes an indication of work to be done by one or more graphics processing engines of graphics acceleration module 1346. In at least one embodiment, data from WD 1384 may be stored in registers 1345 and used by MMU 1339, interrupt management circuit 1347 and/or context management circuit 1348 as illustrated. For example, one embodiment of MMU 1339 includes segment/page walk circuitry for accessing segment/page tables 1386 within an OS virtual address space 1385. In at least one embodiment, interrupt management circuit 1347 may process interrupt events 1392 received from graphics acceleration module 1346. In at least one embodiment, when performing graphics operations, an effective address 1393 generated by a graphics processing engine 1331(1)-1331(N) is translated to a real address by MMU 1339.

In at least one embodiment, registers 1345 are duplicated for each graphics processing engine 1331(1)-1331(N) and/or graphics acceleration module 1346 and may be initialized by a hypervisor or an operating system. In at least one embodiment, each of these duplicated registers may be included in an accelerator integration slice 1390. Exemplary registers that may be initialized by a hypervisor are shown in Table 1.

TABLE 1

| Hypervisor Initialized Registers | |
| --- | --- |
| Register # | Description |
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by an operating system are shown in Table 2.

TABLE 2

| Operating System Initialized Registers | |
| --- | --- |
| Register # | Description |
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

In at least one embodiment, each WD 1384 is specific to a particular graphics acceleration module 1346 and/or graphics processing engines 1331(1)-1331(N). In at least one embodiment, it contains all information required by a graphics processing engine 1331(1)-1331(N) to do work, or it can be a pointer to a memory location where an application has set up a command queue of work to be completed.

Figure 13E:
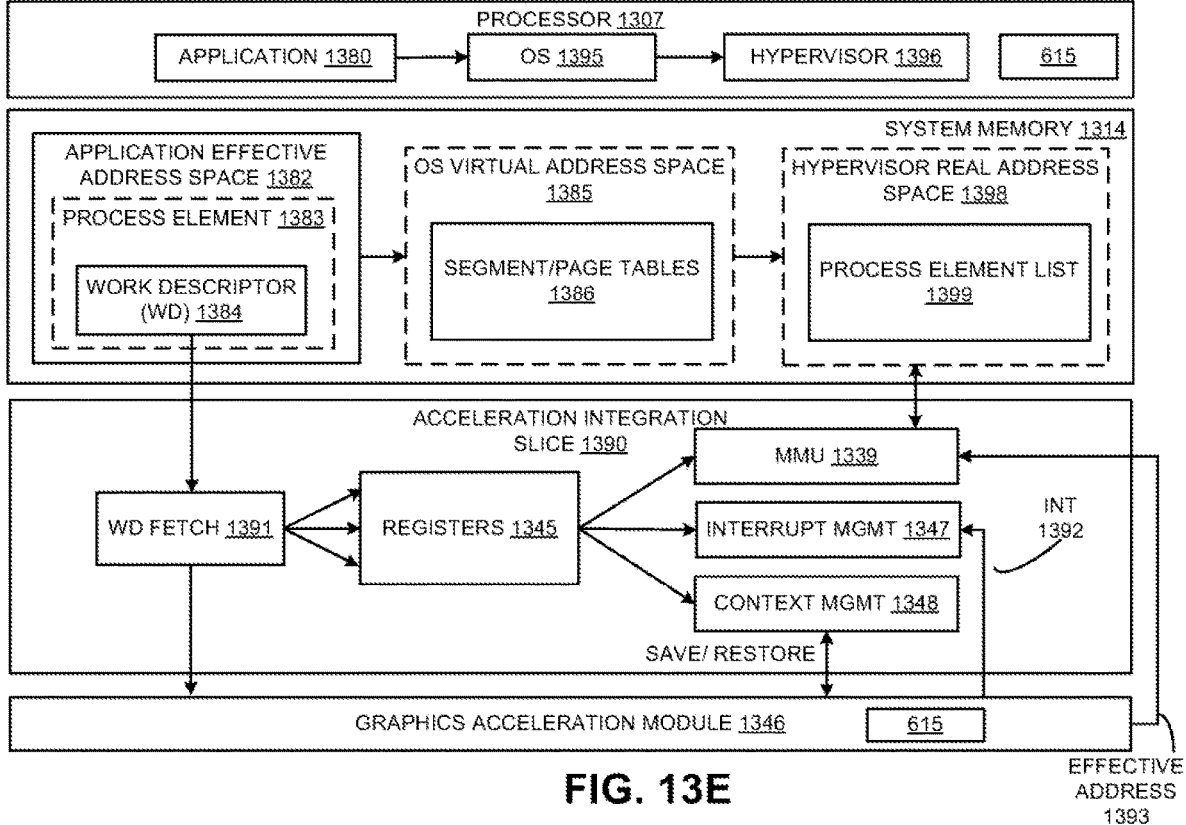
FIGS. 13E and 13F illustrate a shared programming model, according to at least one embodiment.

FIG. 13E illustrates additional details for one exemplary embodiment of a shared model. This embodiment includes a hypervisor real address space 1398 in which a process element list 1399 is stored. In at least one embodiment, hypervisor real address space 1398 is accessible via a hypervisor 1396 which virtualizes graphics acceleration module engines for operating system 1395.

In at least one embodiment, shared programming models allow for all or a subset of processes from all or a subset of partitions in a system to use a graphics acceleration module 1346. In at least one embodiment, there are two programming models where graphics acceleration module 1346 is shared by multiple processes and partitions, namely time-sliced shared and graphics directed shared.

In at least one embodiment, in this model, system hypervisor 1396 owns graphics acceleration module 1346 and makes its function available to all operating systems 1395. In at least one embodiment, for a graphics acceleration module 1346 to support virtualization by system hypervisor 1396, graphics acceleration module 1346 may adhere to certain requirements, such as (1) an application's job request must be autonomous (that is, state does not need to be maintained between jobs), or graphics acceleration module 1346 must provide a context save and restore mechanism, (2) an application's job request is guaranteed by graphics acceleration module 1346 to complete in a specified amount of time, including any translation faults, or graphics acceleration module 1346 provides an ability to preempt processing of a job, and (3) graphics acceleration module 1346 must be guaranteed fairness between processes when operating in a directed shared programming model.

In at least one embodiment, application 1380 is required to make an operating system 1395 system call with a graphics acceleration module type, a work descriptor (WD), an authority mask register (AMR) value, and a context save/restore area pointer (CSRP). In at least one embodiment, graphics acceleration module type describes a targeted acceleration function for a system call. In at least one embodiment, graphics acceleration module type may be a system-specific value. In at least one embodiment, WD is formatted specifically for graphics acceleration module 1346 and can be in a form of a graphics acceleration module 1346 command, an effective address pointer to a user-defined structure, an effective address pointer to a queue of commands, or any other data structure to describe work to be done by graphics acceleration module 1346.

In at least one embodiment, an AMR value is an AMR state to use for a current process. In at least one embodiment, a value passed to an operating system is similar to an application setting an AMR. In at least one embodiment, if accelerator integration circuit 1336 (not shown) and graphics acceleration module 1346 implementations do not support a User Authority Mask Override Register (UAMOR), an operating system may apply a current UAMOR value to an AMR value before passing an AMR in a hypervisor call. In at least one embodiment, hypervisor 1396 may optionally apply a current Authority Mask Override Register (AMOR) value before placing an AMR into process element 1383. In at least one embodiment, CSRP is one of registers 1345 containing an effective address of an area in an application's effective address space 1382 for graphics acceleration module 1346 to save and restore context state. In at least one embodiment, this pointer is optional if no state is required to be saved between jobs or when a job is preempted. In at least one embodiment, context save/restore area may be pinned system memory.

Upon receiving a system call, operating system 1395 may verify that application 1380 has registered and been given authority to use graphics acceleration module 1346. In at least one embodiment, operating system 1395 then calls hypervisor 1396 with information shown in Table 3.

TABLE 3

| OS to Hypervisor Call Parameters | |
| --- | --- |
| Parameter # | Description |
| 1 | A work descriptor (WD) |
| 2 | An Authority Mask Register (AMR) value (potentially masked) |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | Virtual address of storage segment table pointer (SSTP) |
| 7 | A logical interrupt service number (LISN) |

In at least one embodiment, upon receiving a hypervisor call, hypervisor 1396 verifies that operating system 1395 has registered and been given authority to use graphics acceleration module 1346. In at least one embodiment, hypervisor 1396 then puts process element 1383 into a process element linked list for a corresponding graphics acceleration module 1346 type. In at least one embodiment, a process element may include information shown in Table 4.

TABLE 4

| Process Element Information | |
| --- | --- |
| Element # | Description |
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | Virtual address of storage segment table pointer (SSTP) |
| 7 | A logical interrupt service number (LISN) |
| 8 | Interrupt vector table, derived from hypervisor call parameters |
| 9 | A state register (SR) value |
| 10 | A logical partition ID (LPID) |
| 11 | A real address (RA) hypervisor accelerator utilization record pointer |
| 12 | Storage Descriptor Register (SDR) |

In at least one embodiment, hypervisor initializes a plurality of accelerator integration slice 1390 registers 1345.

Figure 13F:
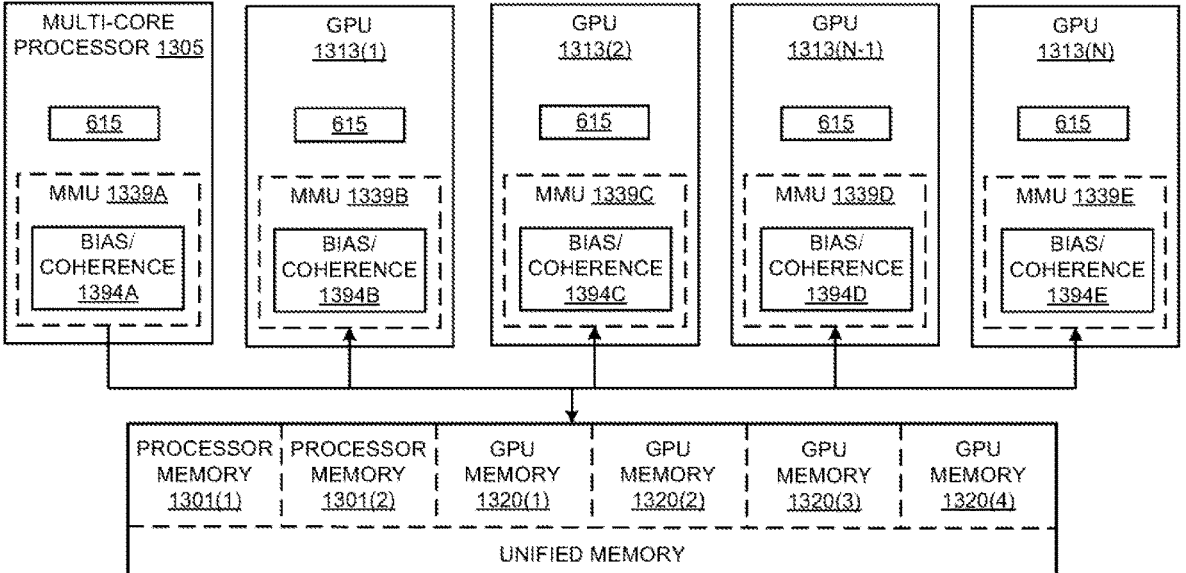

As illustrated in FIG. 13F, in at least one embodiment, a unified memory is used, addressable via a common virtual memory address space used to access physical processor memories 1301(1)-1301(N) and GPU memories 1320(1)-1320(N). In this implementation, operations executed on GPUs 1310(1)-1310(N) utilize a same virtual/effective memory address space to access processor memories 1301(1)-1301(M) and vice versa, thereby simplifying programmability. In at least one embodiment, a first portion of a virtual/effective address space is allocated to processor memory 1301(1), a second portion to second processor memory 1301(N), a third portion to GPU memory 1320(1), and so on. In at least one embodiment, an entire virtual/effective memory space (sometimes referred to as an effective address space) is thereby distributed across each of processor memories 1301 and GPU memories 1320, allowing any processor or GPU to access any physical memory with a virtual address mapped to that memory.

In at least one embodiment, bias/coherence management circuitry 1394A-1394E within one or more of MMUs 1339A-1339E ensures cache coherence between caches of one or more host processors (e.g., 1305) and GPUs 1310 and implements biasing techniques indicating physical memories in which certain types of data should be stored. In at least one embodiment, while multiple instances of bias/coherence management circuitry 1394A-1394E are illustrated in FIG. 13F, bias/coherence circuitry may be implemented within an MMU of one or more host processors 1305 and/or within accelerator integration circuit 1336.

One embodiment allows GPU memories 1320 to be mapped as part of system memory, and accessed using shared virtual memory (SVM) technology, but without suffering performance drawbacks associated with full system cache coherence. In at least one embodiment, an ability for GPU memories 1320 to be accessed as system memory without onerous cache coherence overhead provides a beneficial operating environment for GPU offload. In at least one embodiment, this arrangement allows software of host processor 1305 to setup operands and access computation results, without overhead of tradition I/O DMA data copies. In at least one embodiment, such traditional copies involve driver calls, interrupts and memory mapped I/O (MMIO) accesses that are all inefficient relative to simple memory accesses. In at least one embodiment, an ability to access GPU memories 1320 without cache coherence overheads can be critical to execution time of an offloaded computation. In at least one embodiment, in cases with substantial streaming write memory traffic, for example, cache coherence overhead can significantly reduce an effective write bandwidth seen by a GPU 1310. In at least one embodiment, efficiency of operand setup, efficiency of results access, and efficiency of GPU computation may play a role in determining effectiveness of a GPU offload.

In at least one embodiment, selection of GPU bias and host processor bias is driven by a bias tracker data structure. In at least one embodiment, a bias table may be used, for example, which may be a page-granular structure (e.g., controlled at a granularity of a memory page) that includes 1 or 2 bits per GPU-attached memory page. In at least one embodiment, a bias table may be implemented in a stolen memory range of one or more GPU memories 1320, with or without a bias cache in a GPU 1310 (e.g., to cache frequently/recently used entries of a bias table). Alternatively, in at least one embodiment, an entire bias table may be maintained within a GPU.

In at least one embodiment, a bias table entry associated with each access to a GPU attached memory 1320 is accessed prior to actual access to a GPU memory, causing following operations. In at least one embodiment, local requests from a GPU 1310 that find their page in GPU bias are forwarded directly to a corresponding GPU memory 1320. In at least one embodiment, local requests from a GPU that find their page in host bias are forwarded to processor 1305 (e.g., over a high-speed link as described herein). In at least one embodiment, requests from processor 1305 that find a requested page in host processor bias complete a request like a normal memory read. Alternatively, requests directed to a GPU-biased page may be forwarded to a GPU 1310. In at least one embodiment, a GPU may then transition a page to a host processor bias if it is not currently using a page. In at least one embodiment, a bias state of a page can be changed either by a software-based mechanism, a hardware-assisted software-based mechanism, or, for a limited set of cases, a purely hardware-based mechanism.

In at least one embodiment, one mechanism for changing bias state employs an API call (e.g., OpenCL), which, in turn, calls a GPU's device driver which, in turn, sends a message (or enqueues a command descriptor) to a GPU directing it to change a bias state and, for some transitions, perform a cache flushing operation in a host. In at least one embodiment, a cache flushing operation is used for a transition from host processor 1305 bias to GPU bias, but is not for an opposite transition.

In at least one embodiment, cache coherency is maintained by temporarily rendering GPU-biased pages uncacheable by host processor 1305. In at least one embodiment, to access these pages, processor 1305 may request access from GPU 1310, which may or may not grant access right away. In at least one embodiment, thus, to reduce communication between processor 1305 and GPU 1310 it is beneficial to ensure that GPU-biased pages are those which are required by a GPU but not host processor 1305 and vice versa.

Hardware structure(s) 615 are used to perform one or more embodiments. Details regarding a hardware structure(s) 615 may be provided herein in conjunction with FIGS. 6A and/or 6B.

Figure 14:
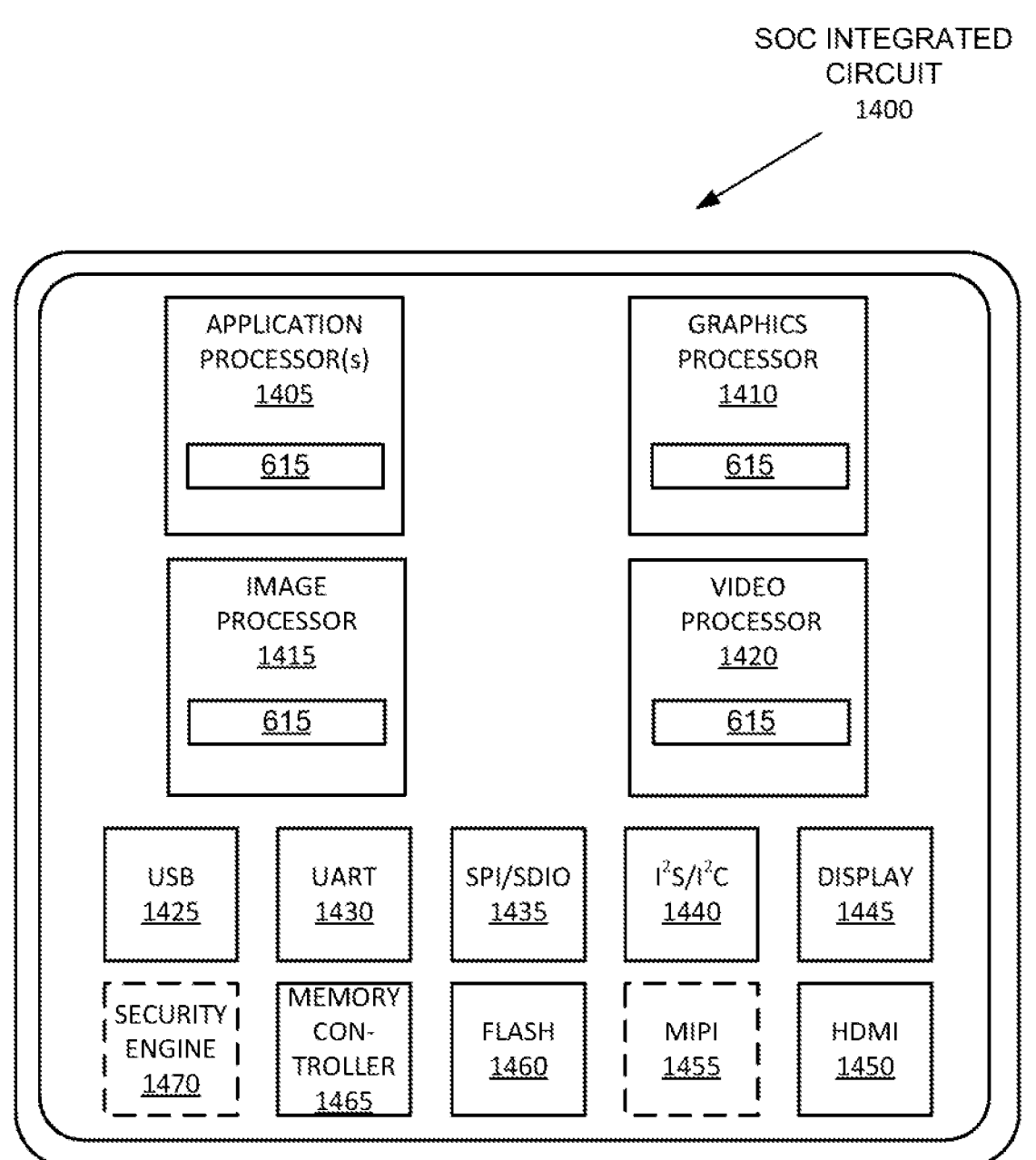
FIG. 14 illustrates exemplary integrated circuits and associated graphics processors, according to at least one embodiment.

FIG. 14 illustrates exemplary integrated circuits and associated graphics processors that may be fabricated using one or more IP cores, according to various embodiments described herein. In addition to what is illustrated, other logic and circuits may be included in at least one embodiment, including additional graphics processors/cores, peripheral interface controllers, or general-purpose processor cores.

FIG. 14 is a block diagram illustrating an exemplary system on a chip integrated circuit 1400 that may be fabricated using one or more IP cores, according to at least one embodiment. In at least one embodiment, integrated circuit 1400 includes one or more application processor(s) 1405 (e.g., CPUs), at least one graphics processor 1410, and may additionally include an image processor 1415 and/or a video processor 1420, any of which may be a modular IP core. In at least one embodiment, integrated circuit 1400 includes peripheral or bus logic including a USB controller 1425, a UART controller 1430, an SPI/SDIO controller 1435, and an I$^2$S/I$^2$2C controller 1440. In at least one embodiment, integrated circuit 1400 can include a display device 1445 coupled to one or more of a high-definition multimedia interface (HDMI) controller 1450 and a mobile industry processor interface (MIPI) display interface 1455. In at least one embodiment, storage may be provided by a flash memory subsystem 1460 including flash memory and a flash memory controller. In at least one embodiment, a memory interface may be provided via a memory controller 1465 for access to SDRAM or SRAM memory devices. In at least one embodiment, some integrated circuits additionally include an embedded security engine 1470.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in integrated circuit 1400 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the integrated circuit 1400 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 15A:
FIGS. 15A, 15B illustrate exemplary integrated circuits and associated graphics processors, according to at least one embodiment.
Figure 15B:
Figure 15B:
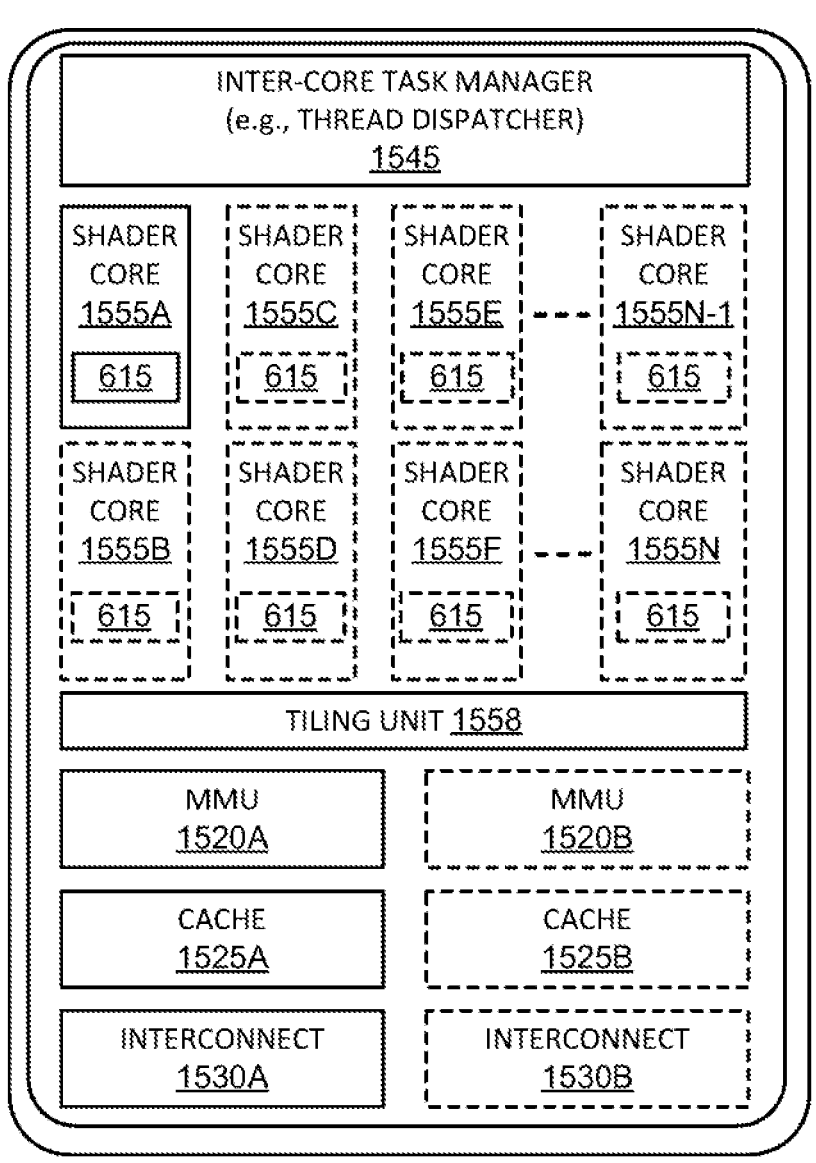

FIGS. 15A-15B illustrate exemplary integrated circuits and associated graphics processors that may be fabricated using one or more IP cores, according to various embodiments described herein. In addition to what is illustrated, other logic and circuits may be included in at least one embodiment, including additional graphics processors/cores, peripheral interface controllers, or general-purpose processor cores.

FIGS. 15A-15B are block diagrams illustrating exemplary graphics processors for use within an SoC, according to embodiments described herein. FIG. 15A illustrates an exemplary graphics processor 1510 of a system on a chip integrated circuit that may be fabricated using one or more IP cores, according to at least one embodiment. FIG. 15B illustrates an additional exemplary graphics processor 1540 of a system on a chip integrated circuit that may be fabricated using one or more IP cores, according to at least one embodiment. In at least one embodiment, graphics processor 1510 of FIG. 15A is a low power graphics processor core. In at least one embodiment, graphics processor 1540 of FIG. 15B is a higher performance graphics processor core. In at least one embodiment, each of graphics processors 1510, 1540 can be variants of graphics processor 1410 of FIG. 14.

In at least one embodiment, graphics processor 1510 includes a vertex processor 1505 and one or more fragment processor(s) 1515A-1515N (e.g., 1515A, 1515B, 1515C, 1515D, through 1515N-1, and 1515N). In at least one embodiment, graphics processor 1510 can execute different shader programs via separate logic, such that vertex processor 1505 is optimized to execute operations for vertex shader programs, while one or more fragment processor(s) 1515A-1515N execute fragment (e.g., pixel) shading operations for fragment or pixel shader programs. In at least one embodiment, vertex processor 1505 performs a vertex processing stage of a 3D graphics pipeline and generates primitives and vertex data. In at least one embodiment, fragment processor (s) 1515A-1515N use primitive and vertex data generated by vertex processor 1505 to produce a framebuffer that is displayed on a display device. In at least one embodiment, fragment processor(s) 1515A-1515N are optimized to execute fragment shader programs as provided for in an OpenGL API, which may be used to perform similar operations as a pixel shader program as provided for in a Direct 3D API.

In at least one embodiment, graphics processor 1510 additionally includes one or more memory management units (MMUs) 1520A-1520B, cache(s) 1525A-1525B, and circuit interconnect(s) 1530A-1530B. In at least one embodiment, one or more MMU(s) 1520A-1520B provide for virtual to physical address mapping for graphics processor 1510, including for vertex processor 1505 and/or fragment processor(s) 1515A-1515N, which may reference vertex or image/texture data stored in memory, in addition to vertex or image/texture data stored in one or more cache(s) 1525A-1525B. In at least one embodiment, one or more MMU(s) 1520A-1520B may be synchronized with other MMUs within a system, including one or more MMUs associated with one or more application processor(s) 1405, image processors 1415, and/or video processors 1420 of FIG. 14, such that each processor 1405-1420 can participate in a shared or unified virtual memory system. In at least one embodiment, one or more circuit interconnect(s) 1530A-1530B enable graphics processor 1510 to interface with other IP cores within SoC, either via an internal bus of SoC or via a direct connection.

In at least one embodiment, graphics processor 1540 includes one or more shader core(s) 1555A-1555N (e.g., 1555A, 1555B, 1555C, 1555D, 1555E, 1555F, through 1555N-1, and 1555N) as shown in FIG. 15B, which provides for a unified shader core architecture in which a single core or type or core can execute all types of programmable shader code, including shader program code to implement vertex shaders, fragment shaders, and/or compute shaders. In at least one embodiment, a number of shader cores can vary. In at least one embodiment, graphics processor 1540 includes an inter-core task manager 1545, which acts as a thread dispatcher to dispatch execution threads to one or more shader cores 1555A-1555N and a tiling unit 1558 to accelerate tiling operations for tile-based rendering, in which rendering operations for a scene are subdivided in image space, for example to exploit local spatial coherence within a scene or to optimize use of internal caches.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in integrated circuit 15A and/or 15B for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the integrated circuit 15A and/or 15B and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

FIGS. 16A-16B illustrate additional exemplary graphics processor logic according to embodiments described herein. FIG. 16A illustrates a graphics core 1600 that may be included within graphics processor 1410 of FIG. 14, in at least one embodiment, and may be a unified shader core 1555A-1555N as in FIG. 15B in at least one embodiment. FIG. 16B illustrates a highly-parallel general-purpose graphics processing unit ("GPGPU") 1630 suitable for deployment on a multi-chip module in at least one embodiment.

In at least one embodiment, graphics core 1600 includes a shared instruction cache 1602, a texture unit 1618, and a cache/shared memory 1620 (e.g., including L1, L2, L3, last level cache, or other caches) that are common to execution resources within graphics core 1600. In at least one embodiment, graphics core 1600 can include multiple slices 1601A-1601N or a partition for each core, and a graphics processor can include multiple instances of graphics core 1600. In at least one embodiment, each slice 1601A-1601N refers to graphics core 1600. In at least one embodiment, slices 1601A-1601N have sub-slices, which are part of a slice 1601A-1601N. In at least one embodiment, slices 1601A-1601N are independent of other slices or dependent on other slices. In at least one embodiment, slices 1601A-1601N can include support logic including a local instruction cache 1604A-1604N, a thread scheduler (sequencer) 1606A-1606N, a thread dispatcher 1608A-1608N, and a set of registers 1610A-1610N. In at least one embodiment, slices 1601A-1601N can include a set of additional function units (AFUs 1612A-1612N), floating-point units (FPUs 1614A-1614N), integer arithmetic logic units (ALUs 1616A-1616N), address computational units (ACUs 1613A-1613N), double-precision floating-point units (DPFPUs 1615A-1615N), and matrix processing units (MPUs 1617A-1617N).

In at least one embodiment, each slice 1601A-1601N includes one or more engines for floating point and integer vector operations and one or more engines to accelerate convolution and matrix operations in AI, machine learning, or large dataset workloads. In at least one embodiment, one or more slices 1601A-1601N include one or more vector engines to compute a vector (e.g., compute mathematical operations for vectors). In at least one embodiment, a vector engine can compute a vector operation in 16-bit floating point (also referred to as "FP16"), 32-bit floating point (also referred to as "FP32"), or 64-bit floating point (also referred to as "FP64"). In at least one embodiment, one or more slices 1601A-1601N includes 16 vector engines that are paired with 16 matrix math units to compute matrix/tensor operations, where vector engines and math units are exposed via matrix extensions. In at least one embodiment, a slice a specified portion of processing resources of a processing unit, e.g., 16 cores and a ray tracing unit or 8 cores, a thread scheduler, a thread dispatcher, and additional functional units for a processor. In at least one embodiment, graphics core 1600 includes one or more matrix engines to compute matrix operations, e.g., when computing tensor operations.

In at least one embodiment, one or more slices 1601A-1601N includes one or more ray tracing units to compute ray tracing operations (e.g., 16 ray tracing units per slice slices 1601A-1601N). In at least one embodiment, a ray tracing unit computes ray traversal, triangle intersection, bounding box intersect, or other ray tracing operations.

In at least one embodiment, one or more slices 1601A-1601N includes a media slice that encodes, decodes, and/or transcodes data; scales and/or format converts data; and/or performs video quality operations on video data.

In at least one embodiment, one or more slices 1601A-1601N are linked to L2 cache and memory fabric, link connectors, high-bandwidth memory (HBM) (e.g., HBM2e, HDM3) stacks, and a media engine. In at least one embodiment, one or more slices 1601A-1601N include multiple cores (e.g., 16 cores) and multiple ray tracing units (e.g., 16) paired to each core. In at least one embodiment, one or more slices 1601A-1601N has one or more L1 caches. In at least one embodiment, one or more slices 1601A-1601N include one or more vector engines; one or more instruction caches to store instructions; one or more L1 caches to cache data; one or more shared local memories (SLMs) to store data, e.g., corresponding to instructions; one or more samplers to sample data; one or more ray tracing units to perform ray tracing operations; one or more geometries to perform operations in geometry pipelines and/or apply geometric transformations to vertices or polygons; one or more rasterizers to describe an image in vector graphics format (e.g., shape) and convert it into a raster image (e.g., a series of pixels, dots, or lines, which when displayed together, create an image that is represented by shapes); one or more a Hierarchical Depth Buffer (Hiz) to buffer data; and/or one or more pixel backends. In at least one embodiment, a slice 1601A-1601N includes a memory fabric, e.g., an L2 cache.

In at least one embodiment, FPUs 1614A-1614N can perform single-precision (32-bit) and half-precision (16-bit) floating point operations, while DPFPUs 1615A-1615N perform double precision (64-bit) floating point operations. In at least one embodiment, ALUs 1616A-1616N can perform variable precision integer operations at 8-bit, 16-bit, and 32-bit precision, and can be configured for mixed precision operations. In at least one embodiment, MPUs 1617A-1617N can also be configured for mixed precision matrix operations, including half-precision floating point and 8-bit integer operations. In at least one embodiment, MPUs 1617-1617N can perform a variety of matrix operations to accelerate machine learning application frameworks, including enabling support for accelerated general matrix to matrix multiplication (GEMM). In at least one embodiment, AFUs 1612A-1612N can perform additional logic operations not supported by floating-point or integer units, including trigonometric operations (e.g., sine, cosiInference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in graphics core 1600 for inferencing or predicting operations based, at least in part, on weight parameters calculated using neural network training operations, neural network functions and/or architectures, or neural network use cases described herein.

In at least one embodiment, graphics core 1600 includes an interconnect and a link fabric sublayer that is attached to a switch and a GPU-GPU bridge that enables multiple graphics processors 1600 (e.g., 8) to be interlinked without glue to each other with load/store units (LSUs), data transfer units, and sync semantics across multiple graphics processors 1600. In at least one embodiment, interconnects include standardized interconnects (e.g., PCIe) or some combination thereof.

In at least one embodiment, graphics core 1600 includes multiple tiles. In at least one embodiment, a tile is an individual die or one or more dies, where individual dies can be connected with an interconnect (e.g., embedded multi-die interconnect bridge (EMIB)). In at least one embodiment, graphics core 1600 includes a compute tile, a memory tile (e.g., where a memory tile can be exclusively accessed by different tiles or different chipsets such as a Rambo tile), substrate tile, a base tile, a HMB tile, a link tile, and EMIB tile, where all tiles are packaged together in graphics core 1600 as part of a GPU. In at least one embodiment, graphics core 1600 can include multiple tiles in a single package (also referred to as a "multi tile package"). In at least one embodiment, a compute tile can have 8 graphics cores 1600, an L1 cache; and a base tile can have a host interface with PCIe 5.0, HBM2e, MDFI, and EMIB, a link tile with 8 links, 8 ports with an embedded switch. In at least one embodiment, tiles are connected with face-to-face (F2F) chip-on-chip bonding through fine-pitched, 36-micron, microbumps (e.g., copper pillars). In at least one embodiment, graphics core 1600 includes memory fabric, which includes memory, and is tile that is accessible by multiple tiles. In at least one embodiment, graphics core 1600 stores, accesses, or loads its own hardware contexts in memory, where a hardware context is a set of data loaded from registers before a process resumes, and where a hardware context can indicate a state of hardware (e.g., state of a GPU).

In at least one embodiment, graphics core 1600 includes serializer/deserializer (SERDES) circuitry that converts a serial data stream to a parallel data stream, or converts a parallel data stream to a serial data stream.

In at least one embodiment, graphics core 1600 includes a high speed coherent unified fabric (GPU to GPU), load/store units, bulk data transfer and sync semantics, and connected GPUs through an embedded switch, where a GPU-GPU bridge is controlled by a controller.

In at least one embodiment, graphics core 1600 performs an API, where said API abstracts hardware of graphics core 1600 and access libraries with instructions to perform math operations (e.g., math kernel library), deep neural network operations (e.g., deep neural network library), vector operations, collective communications, thread building blocks, video processing, data analytics library, and/or ray tracing operations.

In at least one embodiment, one or more neural networks of an inference and/or training logic 615 may be used in the APIs of the graphics core 1600 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

FIG. 16B illustrates a general-purpose processing unit (GPGPU) 1630 that can be configured to enable highly-parallel compute operations to be performed by an array of graphics processing units, in at least one embodiment. In at least one embodiment, GPGPU 1630 can be linked directly to other instances of GPGPU 1630 to create a multi-GPU cluster to improve training speed for deep neural networks. In at least one embodiment, GPGPU 1630 includes a host interface 1632 to enable a connection with a host processor. In at least one embodiment, host interface 1632 is a PCI Express interface. In at least one embodiment, host interface 1632 can be a vendor-specific communications interface or communications fabric. In at least one embodiment, GPGPU 1630 receives commands from a host processor and uses a global scheduler 1634 (which may be referred to as a thread sequencer and/or asynchronous compute engine) to distribute execution threads associated with those commands to a set of compute clusters 1636A-1636H. In at least one embodiment, compute clusters 1636A-1636H share a cache memory 1638. In at least one embodiment, cache memory 1638 can serve as a higher-level cache for cache memories within compute clusters 1636A-1636H.

In at least one embodiment, GPGPU 1630 includes memory 1644A-1644B coupled with compute clusters 1636A-1636H via a set of memory controllers 1642A-1642B (e.g., one or more controllers for HBM2e). In at least one embodiment, memory 1644A-1644B can include various types of memory devices including dynamic random access memory (DRAM) or graphics random access memory, such as synchronous graphics random access memory (SGRAM), including graphics double data rate (GDDR) memory.

In at least one embodiment, compute clusters 1636A-1636H each include a set of graphics cores, such as graphics core 1600 of FIG. 16A, which can include multiple types of integer and floating point logic units that can perform computational operations at a range of precisions including suited for machine learning computations. For example, in at least one embodiment, at least a subset of floating point units in each of compute clusters 1636A-1636H can be configured to perform 16-bit or 32-bit floating point operations, while a different subset of floating point units can be configured to perform 64-bit floating point operations.

In at least one embodiment, multiple instances of GPGPU 1630 can be configured to operate as a compute cluster. In at least one embodiment, communication used by compute clusters 1636A-1636H for synchronization and data exchange varies across embodiments. In at least one embodiment, multiple instances of GPGPU 1630 communicate over host interface 1632. In at least one embodiment, GPGPU 1630 includes an I/O hub 1639 that couples GPGPU 1630 with a GPU link 1640 that enables a direct connection to other instances of GPGPU 1630. In at least one embodiment, GPU link 1640 is coupled to a dedicated GPU-to-GPU bridge that enables communication and synchronization between multiple instances of GPGPU 1630. In at least one embodiment, GPU link 1640 couples with a high-speed interconnect to transmit and receive data to other GPGPUs or parallel processors. In at least one embodiment, multiple instances of GPGPU 1630 are located in separate data processing systems and communicate via a network device that is accessible via host interface 1632. In at least one embodiment GPU link 1640 can be configured to enable a connection to a host processor in addition to or as an alternative to host interface 1632.

In at least one embodiment, GPGPU 1630 can be configured to train neural networks. In at least one embodiment, GPGPU 1630 can be used within an inferencing platform. In at least one embodiment, in which GPGPU 1630 is used for inferencing, GPGPU 1630 may include fewer compute clusters 1636A-1636H relative to when GPGPU 1630 is used for training a neural network. In at least one embodiment, memory technology associated with memory 1644A-1644B may differ between inferencing and training configurations, with higher bandwidth memory technologies devoted to training configurations. In at least one embodiment, an inferencing configuration of GPGPU 1630 can support inferencing specific instructions. For example, in at least one embodiment, an inferencing configuration can provide support for one or more 8-bit integer dot product instructions, which may be used during inferencing operations for deployed neural networks.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in GPGPU 1630 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the GPGU 1630 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 17:
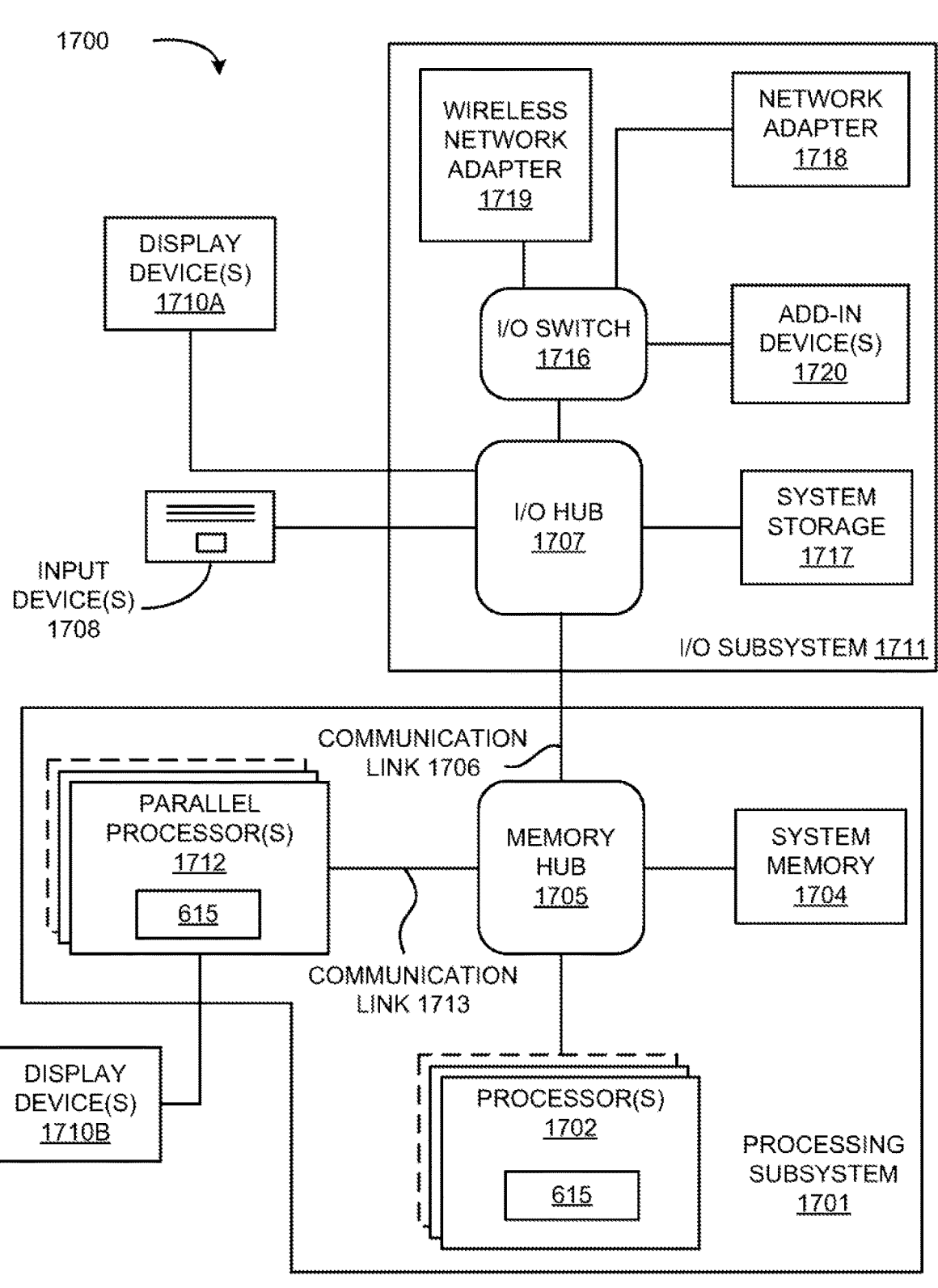
FIG. 17 illustrates a computer system, according to at least one embodiment.

FIG. 17 is a block diagram illustrating a computing system 1700 according to at least one embodiment. In at least one embodiment, computing system 1700 includes a processing subsystem 1701 having one or more processor(s) 1702 and a system memory 1704 communicating via an interconnection path that may include a memory hub 1705. In at least one embodiment, memory hub 1705 may be a separate component within a chipset component or may be integrated within one or more processor(s) 1702. In at least one embodiment, memory hub 1705 couples with an I/O subsystem 1711 via a communication link 1706. In at least one embodiment, I/O subsystem 1711 includes an I/O hub 1707 that can enable computing system 1700 to receive input from one or more input device(s) 1708. In at least one embodiment, I/O hub 1707 can enable a display controller, which may be included in one or more processor(s) 1702, to provide outputs to one or more display device(s) 1710A. In at least one embodiment, one or more display device(s) 1710A coupled with I/O hub 1707 can include a local, internal, or embedded display device.

In at least one embodiment, processing subsystem 1701 includes one or more parallel processor(s) 1712 coupled to memory hub 1705 via a bus or other communication link 1713. In at least one embodiment, communication link 1713 may use one of any number of standards based communication link technologies or protocols, such as, but not limited to PCI Express, or may be a vendor-specific communications interface or communications fabric. In at least one embodiment, one or more parallel processor(s) 1712 form a computationally focused parallel or vector processing system that can include a large number of processing cores and/or processing clusters, such as a many-integrated core (MIC) processor. In at least one embodiment, some or all of parallel processor(s) 1712 form a graphics processing subsystem that can output pixels to one of one or more display device(s) 1710A coupled via I/O Hub 1707. In at least one embodiment, parallel processor(s) 1712 can also include a display controller and display interface (not shown) to enable a direct connection to one or more display device(s) 1710B. In at least one embodiment, parallel processor(s) 1712 include one or more cores, such as graphics cores 1600 discussed herein.

In at least one embodiment, a system storage unit 1714 can connect to I/O hub 1707 to provide a storage mechanism for computing system 1700. In at least one embodiment, an I/O switch 1716 can be used to provide an interface mechanism to enable connections between I/O hub 1707 and other components, such as a network adapter 1718 and/or a wireless network adapter 1719 that may be integrated into platform, and various other devices that can be added via one or more add-in device(s) 1720. In at least one embodiment, network adapter 1718 can be an Ethernet adapter or another wired network adapter. In at least one embodiment, wireless network adapter 1719 can include one or more of a Wi-Fi, Bluetooth, near field communication (NFC), or other network device that includes one or more wireless radios.

In at least one embodiment, computing system 1700 can include other components not explicitly shown, including USB or other port connections, optical storage drives, video capture devices, and like, may also be connected to I/O hub 1707. In at least one embodiment, communication paths interconnecting various components in FIG. 17 may be implemented using any suitable protocols, such as PCI (Peripheral Component Interconnect) based protocols (e.g., PCI-Express), or other bus or point-to-point communication interfaces and/or protocol(s), such as NV-Link high-speed interconnect, or interconnect protocols.

In at least one embodiment, parallel processor(s) 1712 incorporate circuitry optimized for graphics and video processing, including, for example, video output circuitry, and constitutes a graphics processing unit (GPU), e.g., parallel processor(s) 1712 includes graphics core 1600. In at least one embodiment, parallel processor(s) 1712 incorporate circuitry optimized for general purpose processing. In at least embodiment, components of computing system 1700 may be integrated with one or more other system elements on a single integrated circuit. For example, in at least one embodiment, parallel processor(s) 1712, memory hub 1705, processor(s) 1702, and I/O hub 1707 can be integrated into a system on chip (SoC) integrated circuit. In at least one embodiment, components of computing system 1700 can be integrated into a single package to form a system in package (SIP) configuration. In at least one embodiment, at least a portion of components of computing system 1700 can be integrated into a multi-chip module (MCM), which can be interconnected with other multi-chip modules into a modular computing system.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in system FIG. 17 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the system of FIG. 17 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Processors

Figure 18A:
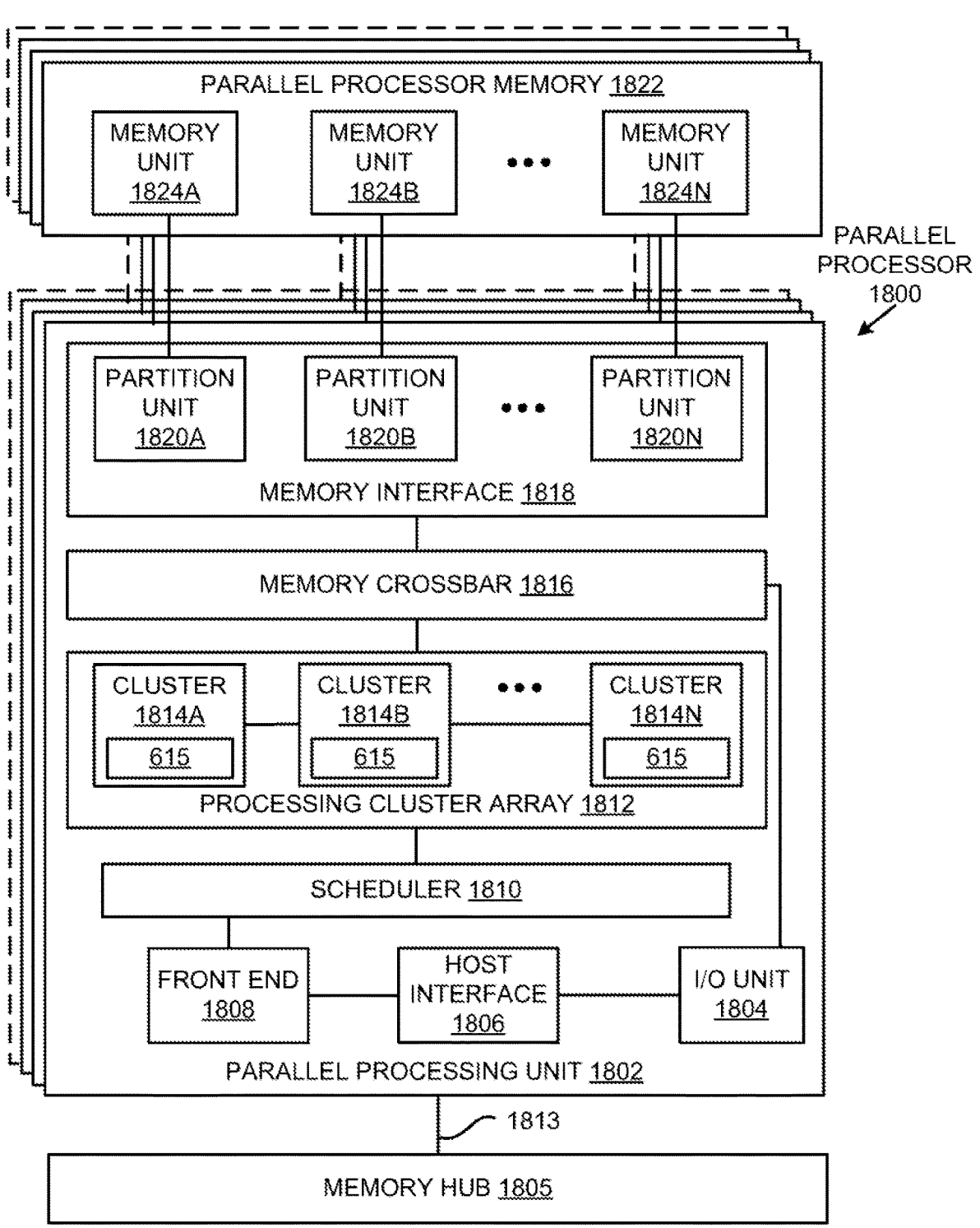
FIG. 18A illustrates a parallel processor, according to at least one embodiment.

FIG. 18A illustrates a parallel processor 1800 according to at least one embodiment. In at least one embodiment, various components of parallel processor 1800 may be implemented using one or more integrated circuit devices, such as programmable processors, application specific integrated circuits (ASICs), or field programmable gate arrays (FPGA). In at least one embodiment, illustrated parallel processor 1800 is a variant of one or more parallel processor(s) 1712 shown in FIG. 17 according to an exemplary embodiment. In at least one embodiment, a parallel processor 1800 includes one or more graphics cores 1600.

In at least one embodiment, parallel processor 1800 includes a parallel processing unit 1802. In at least one embodiment, parallel processing unit 1802 includes an I/O unit 1804 that enables communication with other devices, including other instances of parallel processing unit 1802. In at least one embodiment, I/O unit 1804 may be directly connected to other devices. In at least one embodiment, I/O unit 1804 connects with other devices via use of a hub or switch interface, such as a memory hub 1805. In at least one embodiment, connections between memory hub 1805 and I/O unit 1804 form a communication link 1813. In at least one embodiment, I/O unit 1804 connects with a host interface 1806 and a memory crossbar 1816, where host interface 1806 receives commands directed to performing processing operations and memory crossbar 1816 receives commands directed to performing memory operations.

In at least one embodiment, when host interface 1806 receives a command buffer via I/O unit 1804, host interface 1806 can direct work operations to perform those commands to a front end 1808. In at least one embodiment, front end 1808 couples with a scheduler 1810 (which may be referred to as a sequencer), which is configured to distribute commands or other work items to a processing cluster array 1812. In at least one embodiment, scheduler 1810 ensures that processing cluster array 1812 is properly configured and in a valid state before tasks are distributed to a cluster of processing cluster array 1812. In at least one embodiment, scheduler 1810 is implemented via firmware logic executing on a microcontroller. In at least one embodiment, microcontroller implemented scheduler 1810 is configurable to perform complex scheduling and work distribution operations at coarse and fine granularity, enabling rapid preemption and context switching of threads executing on processing array 1812. In at least one embodiment, host software can prove workloads for scheduling on processing cluster array 1812 via one of multiple graphics processing paths. In at least one embodiment, workloads can then be automatically distributed across processing array cluster 1812 by scheduler 1810 logic within a microcontroller including scheduler 1810.

In at least one embodiment, processing cluster array 1812 can include up to "N" processing clusters (e.g., cluster 1814A, cluster 1814B, through cluster 1814N), where "N" represents a positive integer (which may be a different integer "N" than used in other figures). In at least one embodiment, each cluster 1814A-1814N of processing cluster array 1812 can execute a large number of concurrent threads. In at least one embodiment, scheduler 1810 can allocate work to clusters 1814A-1814N of processing cluster array 1812 using various scheduling and/or work distribution algorithms, which may vary depending on workload arising for each type of program or computation. In at least one embodiment, scheduling can be handled dynamically by scheduler 1810, or can be assisted in part by compiler logic during compilation of program logic configured for execution by processing cluster array 1812. In at least one embodiment, different clusters 1814A-1814N of processing cluster array 1812 can be allocated for processing different types of programs or for performing different types of computations.

In at least one embodiment, processing cluster array 1812 can be configured to perform various types of parallel processing operations. In at least one embodiment, processing cluster array 1812 is configured to perform general-purpose parallel compute operations. For example, in at least one embodiment, processing cluster array 1812 can include logic to execute processing tasks including filtering of video and/or audio data, performing modeling operations, including physics operations, and performing data transformations.

In at least one embodiment, processing cluster array 1812 is configured to perform parallel graphics processing operations. In at least one embodiment, processing cluster array 1812 can include additional logic to support execution of such graphics processing operations, including but not limited to, texture sampling logic to perform texture operations, as well as tessellation logic and other vertex processing logic. In at least one embodiment, processing cluster array 1812 can be configured to execute graphics processing related shader programs such as, but not limited to, vertex shaders, tessellation shaders, geometry shaders, and pixel shaders. In at least one embodiment, parallel processing unit 1802 can transfer data from system memory via I/O unit 1804 for processing. In at least one embodiment, during processing, transferred data can be stored to on-chip memory (e.g., parallel processor memory 1822) during processing, then written back to system memory.

In at least one embodiment, when parallel processing unit 1802 is used to perform graphics processing, scheduler 1810 can be configured to divide a processing workload into approximately equal sized tasks, to better enable distribution of graphics processing operations to multiple clusters 1814A-1814N of processing cluster array 1812. In at least one embodiment, portions of processing cluster array 1812 can be configured to perform different types of processing. For example, in at least one embodiment, a first portion may be configured to perform vertex shading and topology generation, a second portion may be configured to perform tessellation and geometry shading, and a third portion may be configured to perform pixel shading or other screen space operations, to produce a rendered image for display. In at least one embodiment, intermediate data produced by one or more of clusters 1814A-1814N may be stored in buffers to allow intermediate data to be transmitted between clusters 1814A-1814N for further processing.

In at least one embodiment, processing cluster array 1812 can receive processing tasks to be executed via scheduler 1810, which receives commands defining processing tasks from front end 1808. In at least one embodiment, processing tasks can include indices of data to be processed, e.g., surface (patch) data, primitive data, vertex data, and/or pixel data, as well as state parameters and commands defining how data is to be processed (e.g., what program is to be executed). In at least one embodiment, scheduler 1810 may be configured to fetch indices corresponding to tasks or may receive indices from front end 1808. In at least one embodiment, front end 1808 can be configured to ensure processing cluster array 1812 is configured to a valid state before a workload specified by incoming command buffers (e.g., batch-buffers, push buffers, etc.) is initiated.

In at least one embodiment, each of one or more instances of parallel processing unit 1802 can couple with a parallel processor memory 1822. In at least one embodiment, parallel processor memory 1822 can be accessed via memory crossbar 1816, which can receive memory requests from processing cluster array 1812 as well as I/O unit 1804. In at least one embodiment, memory crossbar 1816 can access parallel processor memory 1822 via a memory interface 1818. In at least one embodiment, memory interface 1818 can include multiple partition units (e.g., partition unit 1820A, partition unit 1820B, through partition unit 1820N) that can each couple to a portion (e.g., memory unit) of parallel processor memory 1822. In at least one embodiment, a number of partition units 1820A-1820N is configured to be equal to a number of memory units, such that a first partition unit 1820A has a corresponding first memory unit 1824A, a second partition unit 1820B has a corresponding memory unit 1824B, and an N-th partition unit 1820N has a corresponding N-th memory unit 1824N. In at least one embodiment, a number of partition units 1820A-1820N may not be equal to a number of memory units.

In at least one embodiment, memory units 1824A-1824N can include various types of memory devices, including dynamic random access memory (DRAM) or graphics random access memory, such as synchronous graphics random access memory (SGRAM), including graphics double data rate (GDDR) memory. In at least one embodiment, memory units 1824A-1824N may also include 3D stacked memory, including but not limited to high bandwidth memory (HBM), HBM2e, or HDM3. In at least one embodiment, render targets, such as frame buffers or texture maps may be stored across memory units 1824A-1824N, allowing partition units 1820A-1820N to write portions of each render target in parallel to efficiently use available bandwidth of parallel processor memory 1822. In at least one embodiment, a local instance of parallel processor memory 1822 may be excluded in favor of a unified memory design that utilizes system memory in conjunction with local cache memory.

In at least one embodiment, any one of clusters 1814A-1814N of processing cluster array 1812 can process data that will be written to any of memory units 1824A-1824N within parallel processor memory 1822. In at least one embodiment, memory crossbar 1816 can be configured to transfer an output of each cluster 1814A-1814N to any partition unit 1820A-1820N or to another cluster 1814A-1814N, which can perform additional processing operations on an output. In at least one embodiment, each cluster 1814A-1814N can communicate with memory interface 1818 through memory crossbar 1816 to read from or write to various external memory devices. In at least one embodiment, memory crossbar 1816 has a connection to memory interface 1818 to communicate with I/O unit 1804, as well as a connection to a local instance of parallel processor memory 1822, enabling processing units within different processing clusters 1814A-1814N to communicate with system memory or other memory that is not local to parallel processing unit 1802. In at least one embodiment, memory crossbar 1816 can use virtual channels to separate traffic streams between clusters 1814A-1814N and partition units 1820A-1820N.

In at least one embodiment, multiple instances of parallel processing unit 1802 can be provided on a single add-in card, or multiple add-in cards can be interconnected. In at least one embodiment, different instances of parallel processing unit 1802 can be configured to interoperate even if different instances have different numbers of processing cores, different amounts of local parallel processor memory, and/or other configuration differences. For example, in at least one embodiment, some instances of parallel processing unit 1802 can include higher precision floating point units relative to other instances. In at least one embodiment, systems incorporating one or more instances of parallel processing unit 1802 or parallel processor 1800 can be implemented in a variety of configurations and form factors, including but not limited to desktop, laptop, or handheld personal computers, servers, workstations, game consoles, and/or embedded systems.

Figure 18B:
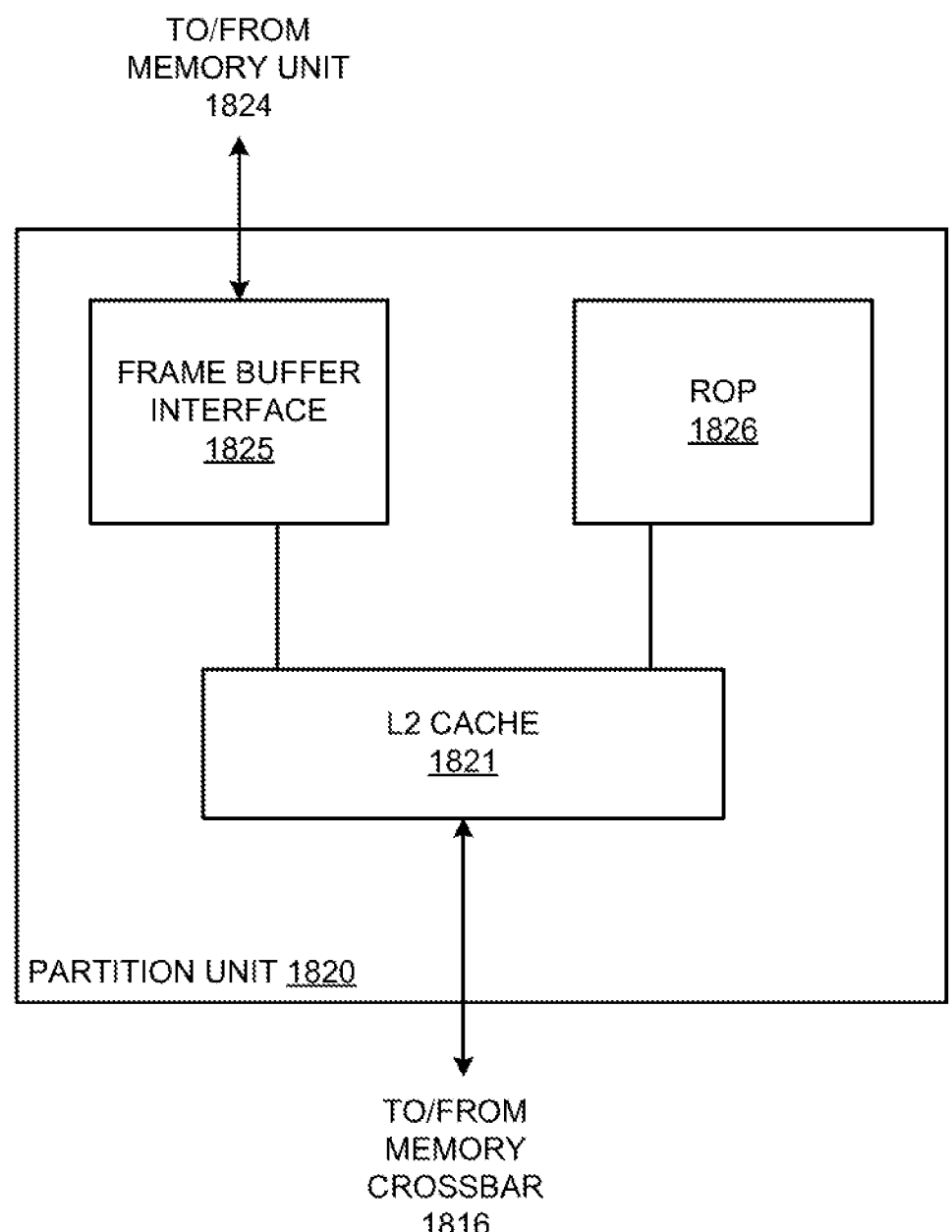
FIG. 18B illustrates a partition unit, according to at least one embodiment.

FIG. 18B is a block diagram of a partition unit 1820 according to at least one embodiment. In at least one embodiment, partition unit 1820 is an instance of one of partition units 1820A-1820N of FIG. 18A. In at least one embodiment, partition unit 1820 includes an L2 cache 1821, a frame buffer interface 1825, and a ROP 1826 (raster operations unit). In at least one embodiment, L2 cache 1821 is a read/write cache that is configured to perform load and store operations received from memory crossbar 1816 and ROP 1826. In at least one embodiment, read misses and urgent write-back requests are output by L2 cache 1821 to frame buffer interface 1825 for processing. In at least one embodiment, updates can also be sent to a frame buffer via frame buffer interface 1825 for processing. In at least one embodiment, frame buffer interface 1825 interfaces with one of memory units in parallel processor memory, such as memory units 1824A-1824N of FIG. 18 (e.g., within parallel processor memory 1822).

In at least one embodiment, ROP 1826 is a processing unit that performs raster operations such as stencil, z test, blending, etc. In at least one embodiment, ROP 1826 then outputs processed graphics data that is stored in graphics memory. In at least one embodiment, ROP 1826 includes compression logic to compress depth or color data that is written to memory and decompress depth or color data that is read from memory. In at least one embodiment, compression logic can be lossless compression logic that makes use of one or more of multiple compression algorithms. In at least one embodiment, a type of compression that is performed by ROP 1826 can vary based on statistical characteristics of data to be compressed. For example, in at least one embodiment, delta color compression is performed on depth and color data on a per-tile basis.

In at least one embodiment, ROP 1826 is included within each processing cluster (e.g., cluster 1814A-1814N of FIG. 18A) instead of within partition unit 1820. In at least one embodiment, read and write requests for pixel data are transmitted over memory crossbar 1816 instead of pixel fragment data. In at least one embodiment, processed graphics data may be displayed on a display device, such as one of one or more display device(s) 1710 of FIG. 17, routed for further processing by processor(s) 1702, or routed for further processing by one of processing entities within parallel processor 1800 of FIG. 18A.

Figure 18C:
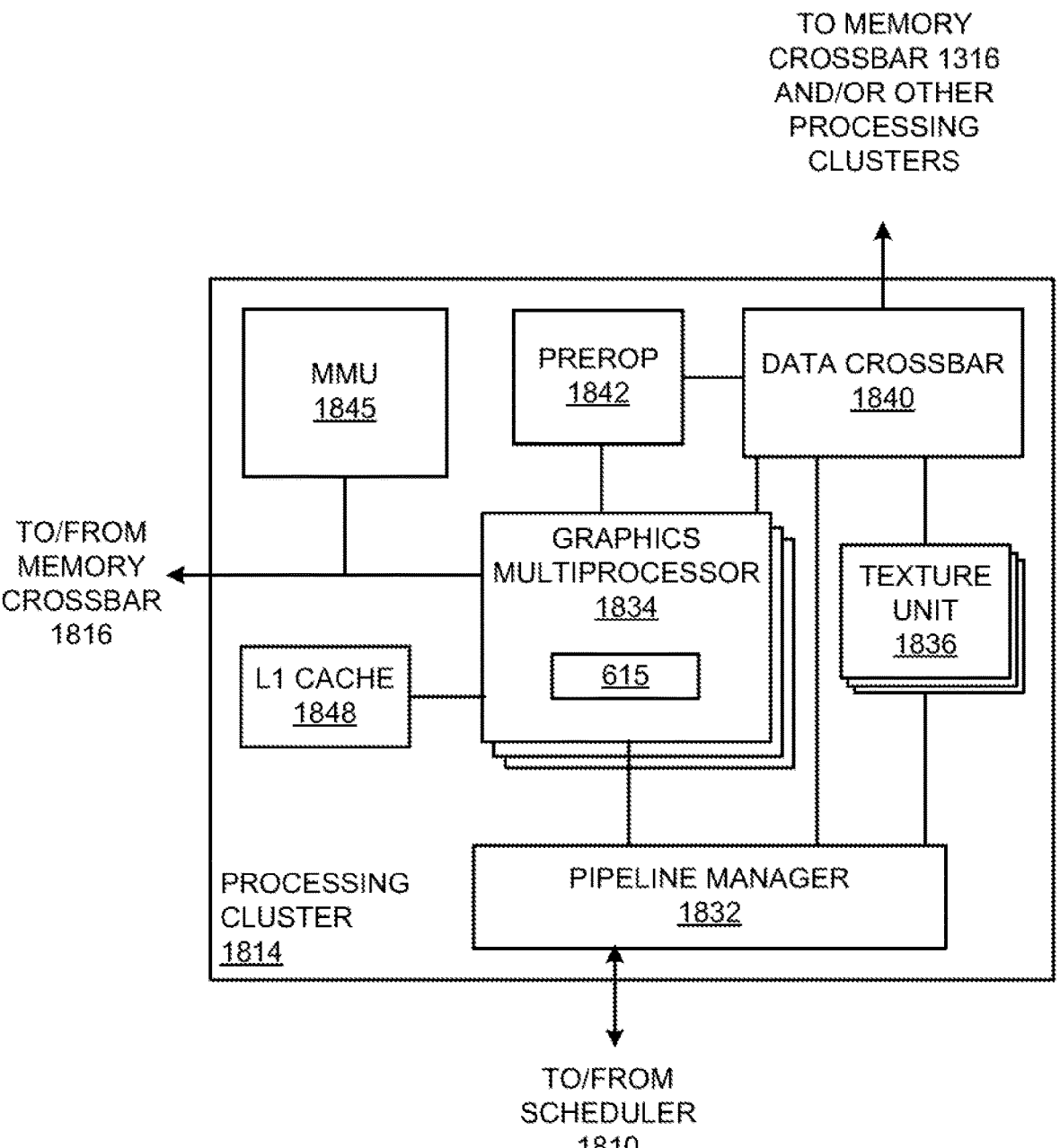
FIG. 18C illustrates a processing cluster, according to at least one embodiment.

FIG. 18C is a block diagram of a processing cluster 1814 within a parallel processing unit according to at least one embodiment. In at least one embodiment, a processing cluster is an instance of one of processing clusters 1814A-1814N of FIG. 18A. In at least one embodiment, processing cluster 1814 can be configured to execute many threads in parallel, where "thread" refers to an instance of a particular program executing on a particular set of input data. In at least one embodiment, single-instruction, multiple-data (SIMD) instruction issue techniques are used to support parallel execution of a large number of threads without providing multiple independent instruction units. In at least one embodiment, single-instruction, multiple-thread (SIMT) techniques are used to support parallel execution of a large number of generally synchronized threads, using a common instruction unit configured to issue instructions to a set of processing engines within each one of processing clusters.

In at least one embodiment, operation of processing cluster 1814 can be controlled via a pipeline manager 1832 that distributes processing tasks to SIMT parallel processors. In at least one embodiment, pipeline manager 1832 receives instructions from scheduler 1810 of FIG. 18A and manages execution of those instructions via a graphics multiprocessor 1834 and/or a texture unit 1836. In at least one embodiment, graphics multiprocessor 1834 is an exemplary instance of a SIMT parallel processor. However, in at least one embodiment, various types of SIMT parallel processors of differing architectures may be included within processing cluster 1814. In at least one embodiment, one or more instances of graphics multiprocessor 1834 can be included within a processing cluster 1814. In at least one embodiment, graphics multiprocessor 1834 can process data and a data crossbar 1840 can be used to distribute processed data to one of multiple possible destinations, including other shader units. In at least one embodiment, pipeline manager 1832 can facilitate distribution of processed data by specifying destinations for processed data to be distributed via data crossbar 1840.

In at least one embodiment, each graphics multiprocessor 1834 within processing cluster 1814 can include an identical set of functional execution logic (e.g., arithmetic logic units, load-store units, etc.). In at least one embodiment, functional execution logic can be configured in a pipelined manner in which new instructions can be issued before previous instructions are complete. In at least one embodiment, functional execution logic supports a variety of operations including integer and floating point arithmetic, comparison operations, Boolean operations, bit-shifting, and computation of various algebraic functions. In at least one embodiment, same functional-unit hardware can be leveraged to perform different operations and any combination of functional units may be present.

In at least one embodiment, instructions transmitted to processing cluster 1814 constitute a thread. In at least one embodiment, a set of threads executing across a set of parallel processing engines is a thread group. In at least one embodiment, a thread group executes a common program on different input data. In at least one embodiment, each thread within a thread group can be assigned to a different processing engine within a graphics multiprocessor 1834. In at least one embodiment, a thread group may include fewer threads than a number of processing engines within graphics multiprocessor 1834. In at least one embodiment, when a thread group includes fewer threads than a number of processing engines, one or more of processing engines may be idle during cycles in which that thread group is being processed. In at least one embodiment, a thread group may also include more threads than a number of processing engines within graphics multiprocessor 1834. In at least one embodiment, when a thread group includes more threads than number of processing engines within graphics multiprocessor 1834, processing can be performed over consecutive clock cycles. In at least one embodiment, multiple thread groups can be executed concurrently on a graphics multiprocessor 1834.

In at least one embodiment, graphics multiprocessor 1834 includes an internal cache memory to perform load and store operations. In at least one embodiment, graphics multiprocessor 1834 can forego an internal cache and use a cache memory (e.g., L1 cache 1848) within processing cluster 1814. In at least one embodiment, each graphics multiprocessor 1834 also has access to L2 caches within partition units (e.g., partition units 1820A-1820N of FIG. 18A) that are shared among all processing clusters 1814 and may be used to transfer data between threads. In at least one embodiment, graphics multiprocessor 1834 may also access off-chip global memory, which can include one or more of local parallel processor memory and/or system memory. In at least one embodiment, any memory external to parallel processing unit 1802 may be used as global memory. In at least one embodiment, processing cluster 1814 includes multiple instances of graphics multiprocessor 1834 and can share common instructions and data, which may be stored in L1 cache 1848.

In at least one embodiment, each processing cluster 1814 may include an MMU 1845 (memory management unit) that is configured to map virtual addresses into physical addresses. In at least one embodiment, one or more instances of MMU 1845 may reside within memory interface 1818 of FIG. 18A. In at least one embodiment, MMU 1845 includes a set of page table entries (PTEs) used to map a virtual address to a physical address of a tile and optionally a cache line index. In at least one embodiment, MMU 1845 may include address translation lookaside buffers (TLB) or caches that may reside within graphics multiprocessor 1834 or L1 1848 cache or processing cluster 1814. In at least one embodiment, a physical address is processed to distribute surface data access locally to allow for efficient request interleaving among partition units. In at least one embodiment, a cache line index may be used to determine whether a request for a cache line is a hit or miss.

In at least one embodiment, a processing cluster 1814 may be configured such that each graphics multiprocessor 1834 is coupled to a texture unit 1836 for performing texture mapping operations, e.g., determining texture sample positions, reading texture data, and filtering texture data. In at least one embodiment, texture data is read from an internal texture L1 cache (not shown) or from an L1 cache within graphics multiprocessor 1834 and is fetched from an L2 cache, local parallel processor memory, or system memory, as needed. In at least one embodiment, each graphics multiprocessor 1834 outputs processed tasks to data crossbar 1840 to provide processed task to another processing cluster 1814 for further processing or to store processed task in an L2 cache, local parallel processor memory, or system memory via memory crossbar 1816. In at least one embodiment, a preROP 1842 (pre-raster operations unit) is configured to receive data from graphics multiprocessor 1834, and direct data to ROP units, which may be located with partition units as described herein (e.g., partition units 1820A-1820N of FIG. 18A). In at least one embodiment, preROP 1842 unit can perform optimizations for color blending, organizing pixel color data, and performing address translations.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in graphics processing cluster 1814 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the graphics processing cluster 1814 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 18D:
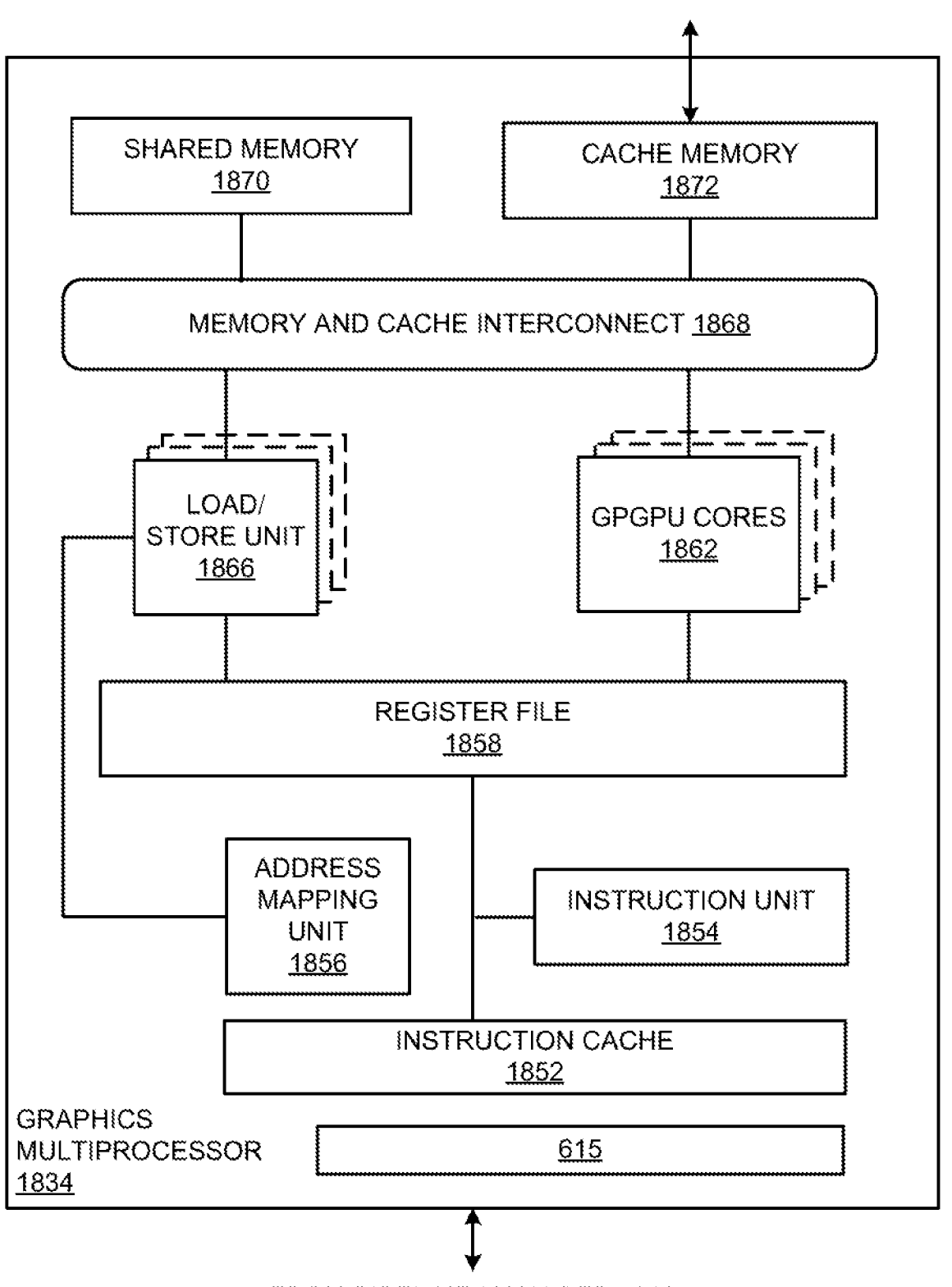
FIG. 18D illustrates a graphics multiprocessor, according to at least one embodiment.

FIG. 18D shows a graphics multiprocessor 1834 according to at least one embodiment. In at least one embodiment, graphics multiprocessor 1834 couples with pipeline manager 1832 of processing cluster 1814. In at least one embodiment, graphics multiprocessor 1834 has an execution pipeline including but not limited to an instruction cache 1852, an instruction unit 1854, an address mapping unit 1856, a register file 1858, one or more general purpose graphics processing unit (GPGPU) cores 1862, and one or more load/store units 1866, where one or more load/store units 1866 can perform load/store operations to load/store instructions corresponding to performing an operation. In at least one embodiment, GPGPU cores 1862 and load/store units 1866 are coupled with cache memory 1872 and shared memory 1870 via a memory and cache interconnect 1868.

In at least one embodiment, instruction cache 1852 receives a stream of instructions to execute from pipeline manager 1832. In at least one embodiment, instructions are cached in instruction cache 1852 and dispatched for execution by an instruction unit 1854. In at least one embodiment, instruction unit 1854 can dispatch instructions as thread groups (e.g., warps, wavefronts, waves), with each thread of thread group assigned to a different execution unit within GPGPU cores 1862. In at least one embodiment, an instruction can access any of a local, shared, or global address space by specifying an address within a unified address space. In at least one embodiment, address mapping unit 1856 can be used to translate addresses in a unified address space into a distinct memory address that can be accessed by load/store units 1866.

In at least one embodiment, register file 1858 provides a set of registers for functional units of graphics multiprocessor 1834. In at least one embodiment, register file 1858 provides temporary storage for operands connected to data paths of functional units (e.g., GPGPU cores 1862, load/store units 1866) of graphics multiprocessor 1834. In at least one embodiment, register file 1858 is divided between each of functional units such that each functional unit is allocated a dedicated portion of register file 1858. In at least one embodiment, register file 1858 is divided between different warps (which may be referred to as wavefronts and/or waves) being executed by graphics multiprocessor 1834.

In at least one embodiment, GPGPU cores 1862 can each include floating point units (FPUs) and/or integer arithmetic logic units (ALUs) that are used to execute instructions of graphics multiprocessor 1834. In at least one embodiment, GPGPU cores 1862 can be similar in architecture or can differ in architecture. In at least one embodiment, a first portion of GPGPU cores 1862 include a single precision FPU and an integer ALU while a second portion of GPGPU cores include a double precision FPU. In at least one embodiment, FPUs can implement IEEE 754-2008 standard floating point arithmetic or enable variable precision floating point arithmetic. In at least one embodiment, graphics multiprocessor 1834 can additionally include one or more fixed function or special function units to perform specific functions such as copy rectangle or pixel blending operations. In at least one embodiment, one or more of GPGPU cores 1862 can also include fixed or special function logic.

In at least one embodiment, GPGPU cores 1862 include SIMD logic capable of performing a single instruction on multiple sets of data. In at least one embodiment, GPGPU cores 1862 can physically execute SIMD4, SIMD8, and SIMD16 instructions and logically execute SIMD1, SIMD2, and SIMD32 instructions. In at least one embodiment, SIMD instructions for GPGPU cores can be generated at compile time by a shader compiler or automatically generated when executing programs written and compiled for single program multiple data (SPMD) or SIMT architectures. In at least one embodiment, multiple threads of a program configured for an SIMT execution model can executed via a single SIMD instruction. For example, in at least one embodiment, eight SIMT threads that perform same or similar operations can be executed in parallel via a single SIMD8 logic unit.

In at least one embodiment, memory and cache interconnect 1868 is an interconnect network that connects each functional unit of graphics multiprocessor 1834 to register file 1858 and to shared memory 1870. In at least one embodiment, memory and cache interconnect 1868 is a crossbar interconnect that allows load/store unit 1866 to implement load and store operations between shared memory 1870 and register file 1858. In at least one embodiment, register file 1858 can operate at a same frequency as GPGPU cores 1862, thus data transfer between GPGPU cores 1862 and register file 1858 can have very low latency. In at least one embodiment, shared memory 1870 can be used to enable communication between threads that execute on functional units within graphics multiprocessor 1834. In at least one embodiment, cache memory 1872 can be used as a data cache for example, to cache texture data communicated between functional units and texture unit 1836. In at least one embodiment, shared memory 1870 can also be used as a program managed cache. In at least one embodiment, threads executing on GPGPU cores 1862 can programmatically store data within shared memory in addition to automatically cached data that is stored within cache memory 1872.

In at least one embodiment, a parallel processor or GPGPU as described herein is communicatively coupled to host/processor cores to accelerate graphics operations, machine-learning operations, pattern analysis operations, and various general purpose GPU (GPGPU) functions. In at least one embodiment, a GPU may be communicatively coupled to host processor/cores over a bus or other interconnect (e.g., a high-speed interconnect such as PCIe or NVLink). In at least one embodiment, a GPU may be integrated on a package or chip as cores and communicatively coupled to cores over an internal processor bus/interconnect internal to a package or chip. In at least one embodiment, regardless a manner in which a GPU is connected, processor cores may allocate work to such GPU in a form of sequences of commands/instructions contained in a work descriptor. In at least one embodiment, that GPU then uses dedicated circuitry/logic for efficiently processing these commands/instructions.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in graphics multiprocessor 1834 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the graphics multiprocessor 1834 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 19:
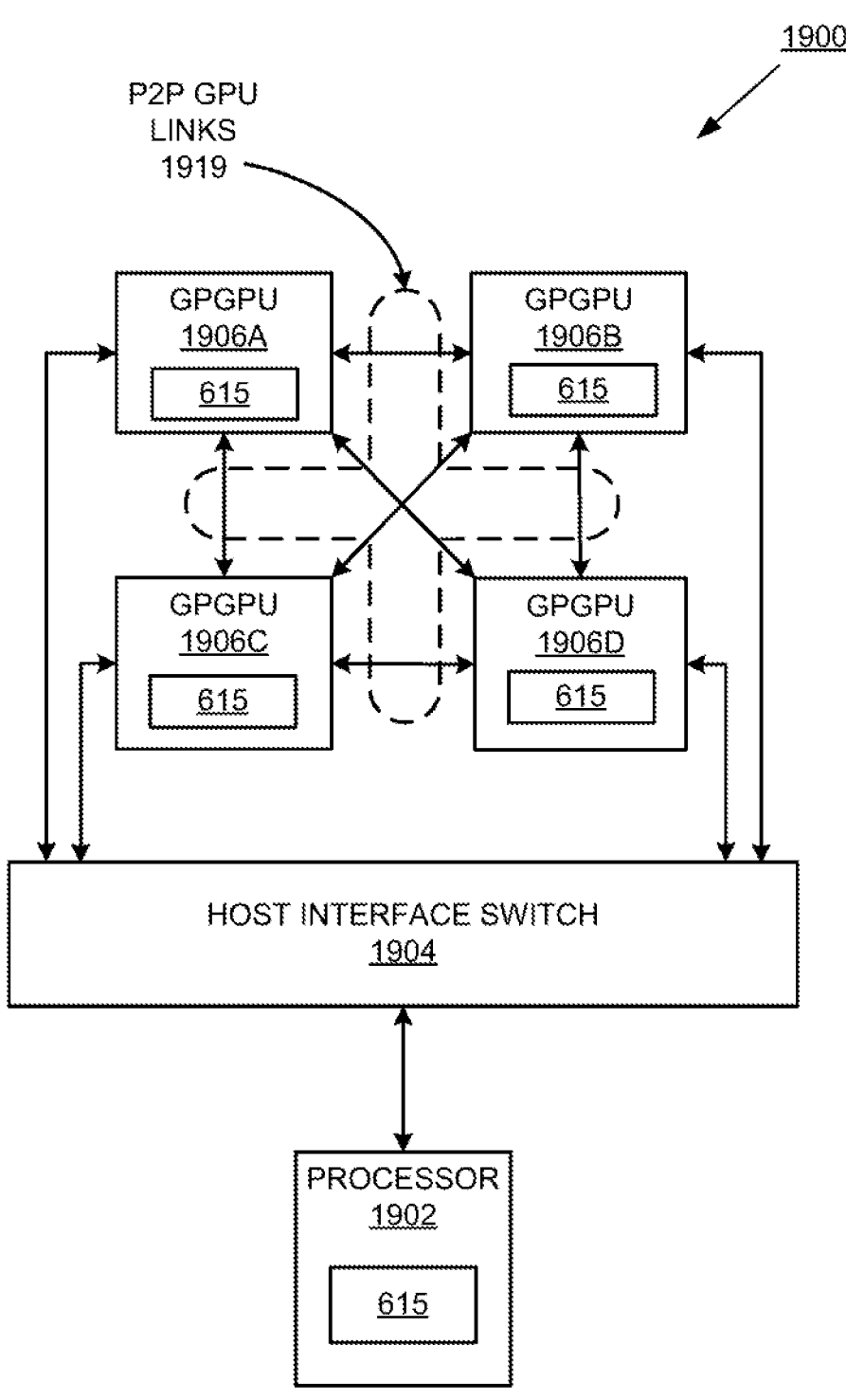
FIG. 19 illustrates a multi-graphics processing unit (GPU) system, according to at least one embodiment.

FIG. 19 illustrates a multi-GPU computing system 1900, according to at least one embodiment. In at least one embodiment, multi-GPU computing system 1900 can include a processor 1902 coupled to multiple general purpose graphics processing units (GPGPUs) 1906A-D via a host interface switch 1904. In at least one embodiment, host interface switch 1904 is a PCI express switch device that couples processor 1902 to a PCI express bus over which processor 1902 can communicate with GPGPUs 1906A-D. In at least one embodiment, GPGPUs 1906A-D can interconnect via a set of high-speed point-to-point GPU-to-GPU links 1916. In at least one embodiment, GPU-to-GPU links 1916 connect to each of GPGPUs 1906A-D via a dedicated GPU link. In at least one embodiment, P2P GPU links 1916 enable direct communication between each of GPGPUs 1906A-D without requiring communication over host interface bus 1904 to which processor 1902 is connected. In at least one embodiment, with GPU-to-GPU traffic directed to P2P GPU links 1916, host interface bus 1904 remains available for system memory access or to communicate with other instances of multi-GPU computing system 1900, for example, via one or more network devices. While in at least one embodiment GPGPUs 1906A-D connect to processor 1902 via host interface switch 1904, in at least one embodiment processor 1902 includes direct support for P2P GPU links 1916 and can connect directly to GPGPUs 1906A-D.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in multi-GPU computing system 1900 for inferencing or predicting operations based, at least in part, on weight parameters calculated using neural network training operations, neural network functions and/or architectures, or neural network use cases described herein.

In at least one embodiment, multi-GPU computing system 1900 includes one or more graphics cores 1600.

In at least one embodiment, one or more neural networks of an inference and/or training logic 615 may be used in the multi-GPU computing system 1900 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 20:
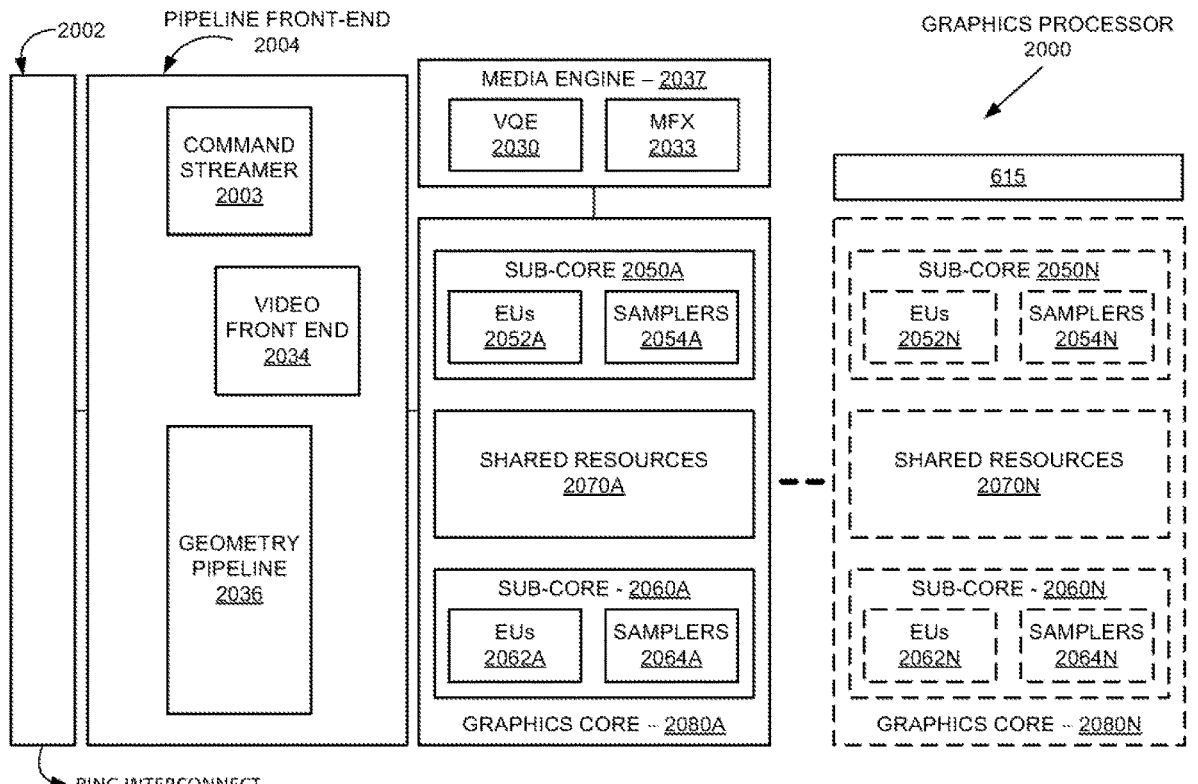
FIG. 20 illustrates a graphics processor, according to at least one embodiment.

FIG. 20 is a block diagram of a graphics processor 2000, according to at least one embodiment. In at least one embodiment, graphics processor 2000 includes a ring interconnect 2002, a pipeline front-end 2004, a media engine 2037, and graphics cores 2080A-2080N. In at least one embodiment, ring interconnect 2002 couples graphics processor 2000 to other processing units, including other graphics processors or one or more general-purpose processor cores. In at least one embodiment, graphics processor 2000 is one of many processors integrated within a multi-core processing system. In at least one embodiment, graphics processor 2000 includes graphics core 1600.

In at least one embodiment, graphics processor 2000 receives batches of commands via ring interconnect 2002. In at least one embodiment, incoming commands are interpreted by a command streamer 2003 in pipeline front-end 2004. In at least one embodiment, graphics processor 2000 includes scalable execution logic to perform 3D geometry processing and media processing via graphics core(s)

2080A-2080N. In at least one embodiment, for 3D geometry processing commands, command streamer 2003 supplies commands to geometry pipeline 2036. In at least one embodiment, for at least some media processing commands, command streamer 2003 supplies commands to a video front end 2034, which couples with media engine 2037. In at least one embodiment, media engine 2037 includes a Video Quality Engine (VQE) 2030 for video and image post-processing and a multi-format encode/decode (MFX) 2033 engine to provide hardware-accelerated media data encoding and decoding. In at least one embodiment, geometry pipeline 2036 and media engine 2037 each generate execution threads for thread execution resources provided by at least one graphics core 2080.

In at least one embodiment, graphics processor 2000 includes scalable thread execution resources featuring graphics cores 2080A-2080N (which can be modular and are sometimes referred to as core slices), each having multiple sub-cores 2050A-50N, 2060A-2060N (sometimes referred to as core sub-slices). In at least one embodiment, graphics processor 2000 can have any number of graphics cores 2080A. In at least one embodiment, graphics processor 2000 includes a graphics core 2080A having at least a first sub-core 2050A and a second sub-core 2060A. In at least one embodiment, graphics processor 2000 is a low power processor with a single sub-core (e.g., 2050A). In at least one embodiment, graphics processor 2000 includes multiple graphics cores 2080A-2080N, each including a set of first sub-cores 2050A-2050N and a set of second sub-cores 2060A-2060N. In at least one embodiment, each sub-core in first sub-cores 2050A-2050N includes at least a first set of execution units 2052A-2052N and media/texture samplers 2054A-2054N. In at least one embodiment, each sub-core in second sub-cores 2060A-2060N includes at least a second set of execution units 2062A-2062N and samplers 2064A-2064N. In at least one embodiment, each sub-core 2050A-2050N, 2060A-2060N shares a set of shared resources 2070A-2070N. In at least one embodiment, shared resources include shared cache memory and pixel operation logic. In at least one embodiment, graphics processor 2000 includes load/store units in pipeline front-end 2004.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, inference and/or training logic 615 may be used in graphics processor 2000 for inferencing or predicting operations based, at least in part, on weight parameters calculated using neural network training operations, neural network functions and/or architectures, or neural network use cases described herein.

In at least one embodiment, one or more neural networks of an inference and/or training logic 615 may be used in the graphics processor 2000 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 21:
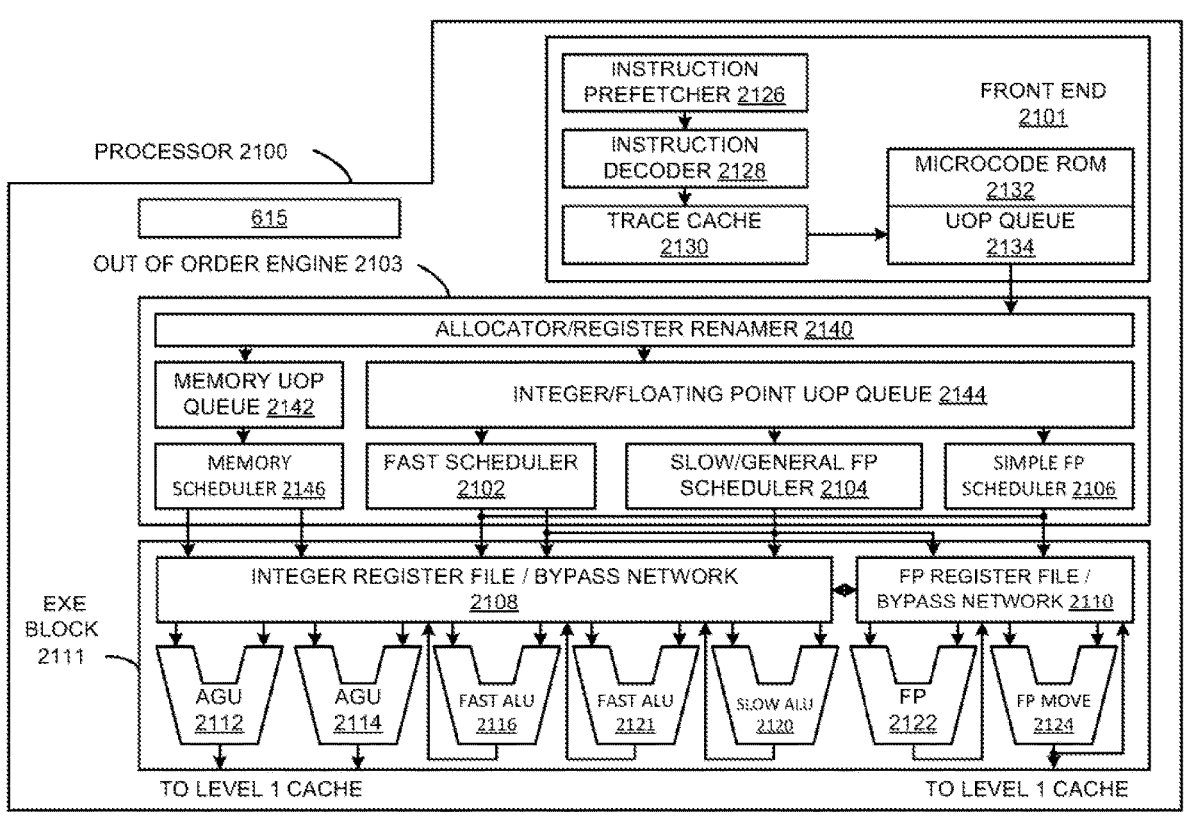
FIG. 21 is a block diagram illustrating a processor micro-architecture for a processor, according to at least one embodiment.

FIG. 21 is a block diagram illustrating micro-architecture for a processor 2100 that may include logic circuits to perform instructions, according to at least one embodiment. In at least one embodiment, processor 2100 may perform instructions, including x86 instructions, ARM instructions, specialized instructions for application-specific integrated circuits (ASICs), etc. In at least one embodiment, processor 2100 may include registers to store packed data, such as 64-bit wide MMX™ registers in microprocessors enabled with MMX technology from Intel Corporation of Santa Clara, Calif. In at least one embodiment, MMX registers, available in both integer and floating point forms, may operate with packed data elements that accompany single instruction, multiple data ("SIMD") and streaming SIMD extensions ("SSE") instructions. In at least one embodiment, 128-bit wide XMM registers relating to SSE2, SSE3, SSE4, AVX, or beyond (referred to generically as "SSEx") technology may hold such packed data operands. In at least one embodiment, processor 2100 may perform instructions to accelerate machine learning or deep learning algorithms, training, or inferencing.

In at least one embodiment, processor 2100 includes an in-order front end ("front end") 2101 to fetch instructions to be executed and prepare instructions to be used later in a processor pipeline. In at least one embodiment, front end 2101 may include several units. In at least one embodiment, an instruction prefetcher 2126 fetches instructions from memory and feeds instructions to an instruction decoder 2128 which in turn decodes or interprets instructions. For example, in at least one embodiment, instruction decoder 2128 decodes a received instruction into one or more operations called "micro-instructions" or "micro-operations" (also called "micro ops" or "uops" or "μ-ops") that a machine may execute. In at least one embodiment, instruction decoder 2128 parses an instruction into an opcode and corresponding data and control fields that may be used by micro-architecture to perform operations in accordance with at least one embodiment. In at least one embodiment, a trace cache 2130 may assemble decoded uops into program ordered sequences or traces in a uop queue 2134 for execution. In at least one embodiment, when trace cache 2130 encounters a complex instruction, a microcode ROM 2132 provides uops needed to complete an operation.

In at least one embodiment, some instructions may be converted into a single micro-op, whereas others need several micro-ops to complete full operation. In at least one embodiment, if more than four micro-ops are needed to complete an instruction, instruction decoder 2128 may access microcode ROM 2132 to perform that instruction. In at least one embodiment, an instruction may be decoded into a small number of micro-ops for processing at instruction decoder 2128. In at least one embodiment, an instruction may be stored within microcode ROM 2132 should a number of micro-ops be needed to accomplish such operation. In at least one embodiment, trace cache 2130 refers to an entry point programmable logic array ("PLA") to determine a correct micro-instruction pointer for reading microcode sequences to complete one or more instructions from microcode ROM 2132 in accordance with at least one embodiment. In at least one embodiment, after microcode ROM 2132 finishes sequencing micro-ops for an instruction, front end 2101 of a machine may resume fetching micro-ops from trace cache 2130.

In at least one embodiment, out-of-order execution engine ("out of order engine") 2103 may prepare instructions for execution. In at least one embodiment, out-of-order execution logic has a number of buffers to smooth out and re-order flow of instructions to optimize performance as they go down a pipeline and get scheduled for execution. In at least one embodiment, out-of-order execution engine 2103 includes, without limitation, an allocator/register renamer 2140, a memory uop queue 2142, an integer/floating point uop queue 2144, a memory scheduler 2146, a fast scheduler 2102, a slow/general floating point scheduler ("slow/general FP scheduler") 2104, and a simple floating point scheduler ("simple FP scheduler") 2106. In at least one embodiment, fast schedule 2102, slow/general floating point scheduler 2104, and simple floating point scheduler 2106 are also collectively referred to herein as "uop schedulers 2102, 2104, 2106." In at least one embodiment, allocator/register renamer 2140 allocates machine buffers and resources that each uop needs in order to execute. In at least one embodiment, allocator/register renamer 2140 renames logic registers onto entries in a register file. In at least one embodiment, allocator/register renamer 2140 also allocates an entry for each uop in one of two uop queues, memory uop queue 2142 for memory operations and integer/floating point uop queue 2144 for non-memory operations, in front of memory scheduler 2146 and uop schedulers 2102, 2104, 2106. In at least one embodiment, uop schedulers 2102, 2104, 2106, determine when a uop is ready to execute based on readiness of their dependent input register operand sources and availability of execution resources uops need to complete their operation. In at least one embodiment, fast scheduler 2102 may schedule on each half of a main clock cycle while slow/general floating point scheduler 2104 and simple floating point scheduler 2106 may schedule once per main processor clock cycle. In at least one embodiment, uop schedulers 2102, 2104, 2106 arbitrate for dispatch ports to schedule uops for execution.

In at least one embodiment, execution block 2111 includes, without limitation, an integer register file/bypass network 2108, a floating point register file/bypass network ("FP register file/bypass network") 2110, address generation units ("AGUs") 2112 and 2114, fast Arithmetic Logic Units (ALUs) ("fast ALUs") 2116 and 2118, a slow Arithmetic Logic Unit ("slow ALU") 2120, a floating point ALU ("FP") 2122, and a floating point move unit ("FP move") 2124. In at least one embodiment, integer register file/bypass network 2108 and floating point register file/bypass network 2110 are also referred to herein as "register files 2108, 2110." In at least one embodiment, AGUSs 2112 and 2114, fast ALUs 2116 and 2118, slow ALU 2120, floating point ALU 2122, and floating point move unit 2124 are also referred to herein as "execution units 2112, 2114, 2116, 2118, 2120, 2122, and 2124." In at least one embodiment, execution block 2111 may include, without limitation, any number (including zero) and type of register files, bypass networks, address generation units, and execution units, in any combination.

In at least one embodiment, register networks 2108, 2110 may be arranged between uop schedulers 2102, 2104, 2106, and execution units 2112, 2114, 2116, 2118, 2120, 2122, and 2124. In at least one embodiment, integer register file/bypass network 2108 performs integer operations. In at least one embodiment, floating point register file/bypass network 2110 performs floating point operations. In at least one embodiment, each of register networks 2108, 2110 may include, without limitation, a bypass network that may bypass or forward just completed results that have not yet been written into a register file to new dependent uops. In at least one embodiment, register networks 2108, 2110 may communicate data with each other. In at least one embodiment, integer register file/bypass network 2108 may include, without limitation, two separate register files, one register file for a low-order thirty-two bits of data and a second register file for a high order thirty-two bits of data. In at least one embodiment, floating point register file/bypass network 2110 may include, without limitation, 128-bit wide entries because floating point instructions typically have operands from 64 to 128 bits in width.

In at least one embodiment, execution units 2112, 2114, 2116, 2118, 2120, 2122, 2124 may execute instructions. In at least one embodiment, register networks 2108, 2110 store integer and floating point data operand values that micro-instructions need to execute. In at least one embodiment, processor 2100 may include, without limitation, any number and combination of execution units 2112, 2114, 2116, 2118, 2120, 2122, 2124. In at least one embodiment, floating point ALU 2122 and floating point move unit 2124, may execute floating point, MMX, SIMD, AVX and SSE, or other operations, including specialized machine learning instructions. In at least one embodiment, floating point ALU 2122 may include, without limitation, a 64-bit by 64-bit floating point divider to execute divide, square root, and remainder micro ops. In at least one embodiment, instructions involving a floating point value may be handled with floating point hardware. In at least one embodiment, ALU operations may be passed to fast ALUs 2116, 2118. In at least one embodiment, fast ALUS 2116, 2118 may execute fast operations with an effective latency of half a clock cycle. In at least one embodiment, most complex integer operations go to slow ALU 2120 as slow ALU 2120 may include, without limitation, integer execution hardware for long-latency type of operations, such as a multiplier, shifts, flag logic, and branch processing. In at least one embodiment, memory load/store operations may be executed by AGUs 2112, 2114. In at least one embodiment, fast ALU 2116, fast ALU 2118, and slow ALU 2120 may perform integer operations on 64-bit data operands. In at least one embodiment, fast ALU 2116, fast ALU 2118, and slow ALU 2120 may be implemented to support a variety of data bit sizes including sixteen, thirty-two, 128, 256, etc. In at least one embodiment, floating point ALU 2122 and floating point move unit 2124 may be implemented to support a range of operands having bits of various widths, such as 128-bit wide packed data operands in conjunction with SIMD and multimedia instructions.

In at least one embodiment, uop schedulers 2102, 2104, 2106 dispatch dependent operations before a parent load has finished executing. In at least one embodiment, as uops may be speculatively scheduled and executed in processor 2100, processor 2100 may also include logic to handle memory misses. In at least one embodiment, if a data load misses in a data cache, there may be dependent operations in flight in a pipeline that have left a scheduler with temporarily incorrect data. In at least one embodiment, a replay mechanism tracks and re-executes instructions that use incorrect data. In at least one embodiment, dependent operations might need to be replayed and independent ones may be allowed to complete. In at least one embodiment, schedulers and a replay mechanism of at least one embodiment of a processor may also be designed to catch instruction sequences for text string comparison operations.

In at least one embodiment, "registers" may refer to on-board processor storage locations that may be used as part of instructions to identify operands. In at least one embodiment, registers may be those that may be usable from outside of a processor (from a programmer's perspective). In at least one embodiment, registers might not be limited to a particular type of circuit. Rather, in at least one embodiment, a register may store data, provide data, and perform functions described herein. In at least one embodiment, registers described herein may be implemented by circuitry within a processor using any number of different techniques, such as dedicated physical registers, dynamically allocated physical registers using register renaming, combinations of dedicated and dynamically allocated physical registers, etc. In at least one embodiment, integer registers store 32-bit integer data. A register file of at least one embodiment also contains eight multimedia SIMD registers for packed data.

In at least one embodiment, processor 2100 or each core of processor 2100 includes one or more prefetchers, one or more fetchers, one or more pre-decoders, one or more decoders to decode data (e.g., instructions), one or more instruction queues to process instructions (e.g., corresponding to operations or API calls), one or more micro-operation ($\mu$OP) cache to store $\mu$OPs, one or more micro-operation ($\mu$OP) queues, an in-order execution engine, one or more load buffers, one or more store buffers, one or more reorder buffers, one or more fill buffers, an out-of-order execution engine, one or more ports, one or more shift and/or shifter units, one or more fused multiply accumulate (FMA) units, one or more load and store units ("LSUs") to perform load of store operations corresponding to loading/storing data (e.g., instructions) to perform an operation (e.g., perform an API, an API call), one or more matrix multiply accumulate (MMA) units, and/or one or more shuffle units to perform any function further described herein with respect to said processor 2100. In at least one embodiment processor 2100 can access, use, perform, or execute instructions corresponding to calling an API.

In at least one embodiment, processor 2100 includes one or more ultra path interconnects (UPIs), e.g., that is a point-to-point processor interconnect; one or more PCIe's; one or more accelerators to accelerate computations or operations; and/or one or more memory controllers. In at least one embodiment, processor 2100 includes a shared last level cache (LLC) that is coupled to one or more memory controllers, which can enable shared memory access across processor cores.

In at least one embodiment, processor 2100 or a core of processor 2100 has a mesh architecture where processor cores, on-chip caches, memory controllers, and I/O controllers are organized in rows and columns, with wires and switches connecting them at each intersection to allow for turns. In at least one embodiment, processor 2100 has a one or more higher memory bandwidths (HMBs, e.g., HMBe) to store data or cache data, e.g., in Double Data Rate 5 Synchronous Dynamic Random-Access Memory (DDR5 SDRAM). In at least one embodiment, one or more components of processor 2100 are interconnected using compute express link (CXL) interconnects. In at least one embodiment, a memory controller uses a "least recently used" (LRU) approach to determine what gets stored in a cache. In at least one embodiment, processor 2100 includes one or more PCIe's (e.g., PCIe 5.0).

Inference and/or training logic 615 are used to perform inferencing and/or training operations associated with one or more embodiments. Details regarding inference and/or training logic 615 are provided herein in conjunction with FIGS. 6A and/or 6B. In at least one embodiment portions or all of inference and/or training logic 615 may be incorporated into execution block 2111 and other memory or registers shown or not shown. For example, in at least one embodiment, training and/or inferencing techniques described herein may use one or more of ALUs illustrated in execution block 2111. Moreover, weight parameters may be stored in on-chip or off-chip memory and/or registers (shown or not shown) that configure ALUs of execution block 2111 to perform one or more machine learning algorithms, neural network architectures, use cases, or training techniques described herein.

In at least one embodiment, one or more neural networks of an inference and/or training logic 615 may be used in the execution block 2111 and in other memory or registers, and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 22:
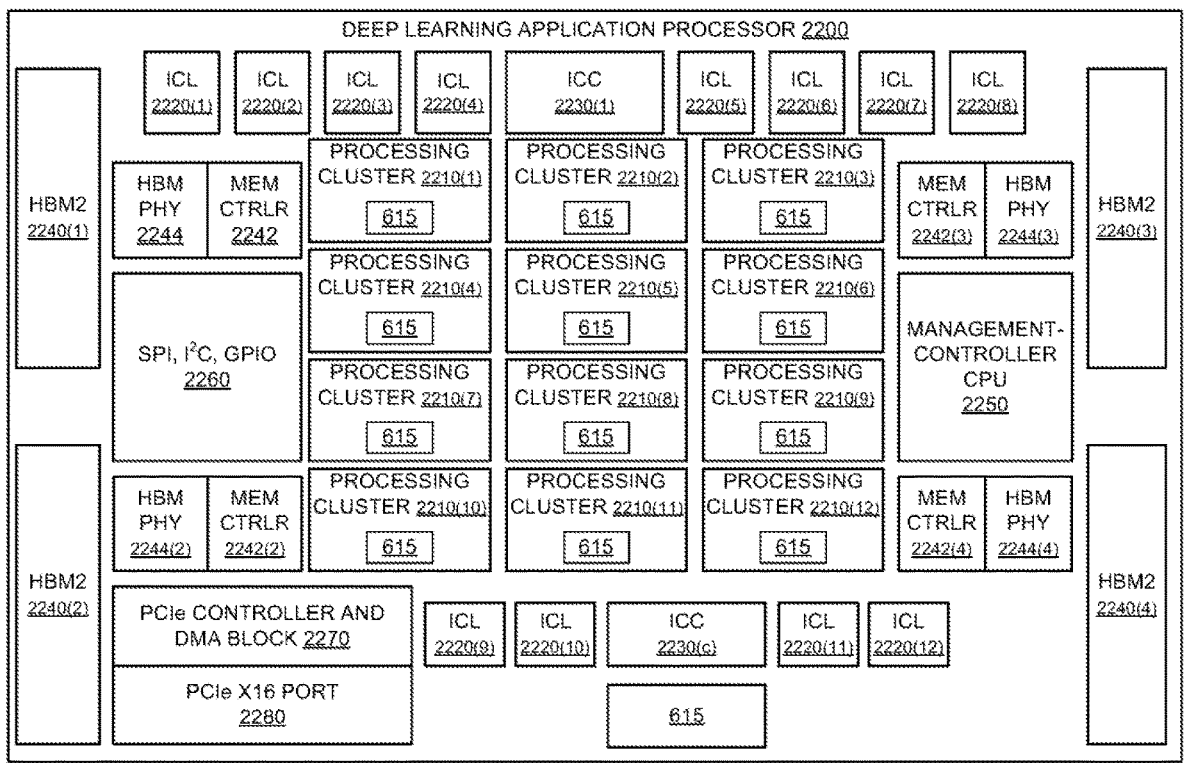
FIG. 22 illustrates a deep learning application processor, according to at least one embodiment.

FIG. 22 illustrates a deep learning application processor 2200, according to at least one embodiment. In at least one embodiment, deep learning application processor 2200 uses instructions that, if executed by deep learning application processor 2200, cause deep learning application processor 2200 to perform some or all of processes and techniques described throughout this disclosure. In at least one embodiment, deep learning application processor 2200 is an application-specific integrated circuit (ASIC). In at least one embodiment, application processor 2200 performs matrix multiply operations either "hard-wired" into hardware as a result of performing one or more instructions or both. In at least one embodiment, deep learning application processor 2200 includes, without limitation, processing clusters 2210 (1)-2210(12), Inter-Chip Links ("ICLs") 2220(1)-2220(12), Inter-Chip Controllers ("ICCs") 2230(1)-2230(2), high-bandwidth memory second generation ("HBM2") 2240(1)-2240(4), memory controllers ("Mem Ctrlrs") 2242(1)-2242(4), high bandwidth memory physical layer ("HBM PHY") 2244(1)-2244(4), a management-controller central processing unit ("management-controller CPU") 2250, a Serial Peripheral Interface, Inter-Integrated Circuit, and General Purpose Input/Output block ("SPI, I$^2$C, GPIO") 2260, a peripheral component interconnect express controller and direct memory access block ("PCIe Controller and DMA") 2270, and a sixteen-lane peripheral component interconnect express port ("PCI Express x 16") 2280.

In at least one embodiment, processing clusters 2210 may perform deep learning operations, including inference or prediction operations based on weight parameters calculated one or more training techniques, including those described herein. In at least one embodiment, each processing cluster 2210 may include, without limitation, any number and type of processors. In at least one embodiment, deep learning application processor 2200 may include any number and type of processing clusters 2200. In at least one embodiment, Inter-Chip Links 2220 are bi-directional. In at least one embodiment, Inter-Chip Links 2220 and Inter-Chip Controllers 2230 enable multiple deep learning application processors 2200 to exchange information, including activation information resulting from performing one or more machine learning algorithms embodied in one or more neural networks. In at least one embodiment, deep learning application processor 2200 may include any number (including zero) and type of ICLs 2220 and ICCs 2230.

In at least one embodiment, HBM2s 2240 provide a total of 32 Gigabytes (GB) of memory. In at least one embodiment, HBM2 2240(*i*) is associated with both memory controller 2242(*i*) and HBM PHY 2244(*i*) where "i" is an arbitrary integer. In at least one embodiment, any number of HBM2s 2240 may provide any type and total amount of high bandwidth memory and may be associated with any number (including zero) and type of memory controllers 2242 and HBM PHYs 2244. In at least one embodiment, SPI, I$^2$C, GPIO 2260, PCIe Controller and DMA 2270, and/or PCIe 2280 may be replaced with any number and type of blocks that enable any number and type of communication standards in any technically feasible fashion.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, deep learning application processor is used to train a machine learning model, such as a neural network, to predict or infer information provided to deep learning application processor 2200. In at least one embodiment, deep learning application processor 2200 is used to infer or predict information based on a trained machine learning model (e.g., neural network) that has been trained by another processor or system or by deep learning application processor 2200. In at least one embodiment, processor 2200 may be used to perform one or more neural network use cases described herein.

In at least one embodiment, one or more neural networks of an inference and/or training logic 615 may be used in the deep learning application processor 2200, and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 23:
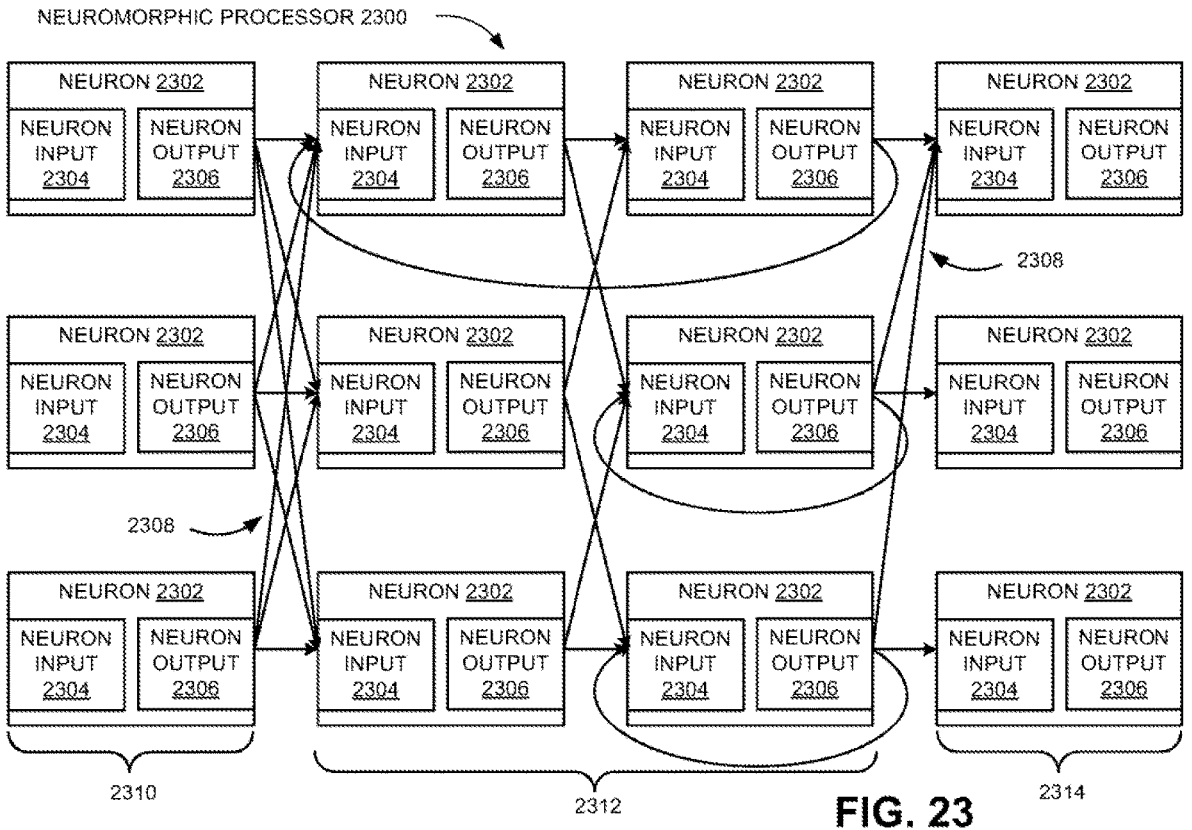
FIG. 23 is a block diagram illustrating an example neuromorphic processor, according to at least one embodiment.

FIG. 23 is a block diagram of a neuromorphic processor 2300, according to at least one embodiment. In at least one embodiment, neuromorphic processor 2300 may receive one or more inputs from sources external to neuromorphic processor 2300. In at least one embodiment, these inputs may be transmitted to one or more neurons 2302 within neuromorphic processor 2300. In at least one embodiment, neurons 2302 and components thereof may be implemented using circuitry or logic, including one or more arithmetic logic units (ALUs). In at least one embodiment, neuromorphic processor 2300 may include, without limitation, thousands or millions of instances of neurons 2302, but any suitable number of neurons 2302 may be used. In at least one embodiment, each instance of neuron 2302 may include a neuron input 2304 and a neuron output 2306. In at least one embodiment, neurons 2302 may generate outputs that may be transmitted to inputs of other instances of neurons 2302. For example, in at least one embodiment, neuron inputs 2304 and neuron outputs 2306 may be interconnected via synapses 2308.

In at least one embodiment, neurons 2302 and synapses 2308 may be interconnected such that neuromorphic processor 2300 operates to process or analyze information received by neuromorphic processor 2300. In at least one embodiment, neurons 2302 may transmit an output pulse (or "fire" or "spike") when inputs received through neuron input 2304 exceed a threshold. In at least one embodiment, neurons 2302 may sum or integrate signals received at neuron inputs 2304. For example, in at least one embodiment, neurons 2302 may be implemented as leaky integrate-and-fire neurons, wherein if a sum (referred to as a "membrane potential") exceeds a threshold value, neuron 2302 may generate an output (or "fire") using a transfer function such as a sigmoid or threshold function. In at least one embodiment, a leaky integrate-and-fire neuron may sum signals received at neuron inputs 2304 into a membrane potential and may also apply a decay factor (or leak) to reduce a membrane potential. In at least one embodiment, a leaky integrate-and-fire neuron may fire if multiple input signals are received at neuron inputs 2304 rapidly enough to exceed a threshold value (i.e., before a membrane potential decays too low to fire). In at least one embodiment, neurons 2302 may be implemented using circuits or logic that receive inputs, integrate inputs into a membrane potential, and decay a membrane potential. In at least one embodiment, inputs may be averaged, or any other suitable transfer function may be used. Furthermore, in at least one embodiment, neurons 2302 may include, without limitation, comparator circuits or logic that generate an output spike at neuron output 2306 when result of applying a transfer function to neuron input 2304 exceeds a threshold. In at least one embodiment, once neuron 2302 fires, it may disregard previously received input information by, for example, resetting a membrane potential to 0 or another suitable default value. In at least one embodiment, once membrane potential is reset to 0, neuron 2302 may resume normal operation after a suitable period of time (or refractory period).

In at least one embodiment, neurons 2302 may be interconnected through synapses 2308. In at least one embodiment, synapses 2308 may operate to transmit signals from an output of a first neuron 2302 to an input of a second neuron 2302. In at least one embodiment, neurons 2302 may transmit information over more than one instance of synapse 2308. In at least one embodiment, one or more instances of neuron output 2306 may be connected, via an instance of synapse 2308, to an instance of neuron input 2304 in same neuron 2302. In at least one embodiment, an instance of neuron 2302 generating an output to be transmitted over an instance of synapse 2308 may be referred to as a "presynaptic neuron" with respect to that instance of synapse 2308. In at least one embodiment, an instance of neuron 2302 receiving an input transmitted over an instance of synapse 2308 may be referred to as a "post-synaptic neuron" with respect to that instance of synapse 2308. Because an instance of neuron 2302 may receive inputs from one or more instances of synapse 2308, and may also transmit outputs over one or more instances of synapse 2308, a single instance of neuron 2302 may therefore be both a "presynaptic neuron" and "post-synaptic neuron," with respect to various instances of synapses 2308, in at least one embodiment.

In at least one embodiment, neurons 2302 may be organized into one or more layers. In at least one embodiment, each instance of neuron 2302 may have one neuron output 2306 that may fan out through one or more synapses 2308 to one or more neuron inputs 2304. In at least one embodiment, neuron outputs 2306 of neurons 2302 in a first layer 2310 may be connected to neuron inputs 2304 of neurons 2302 in a second layer 2312. In at least one embodiment, layer 2310 may be referred to as a "feed-forward layer." In at least one embodiment, each instance of neuron 2302 in an instance of first layer 2310 may fan out to each instance of neuron 2302 in second layer 2312. In at least one embodiment, first layer 2310 may be referred to as a "fully connected feed-forward layer." In at least one embodiment, each instance of neuron 2302 in an instance of second layer 2312 may fan out to fewer than all instances of neuron 2302 in a third layer 2314. In at least one embodiment, second layer 2312 may be referred to as a "sparsely connected feed-forward layer." In at least one embodiment, neurons 2302 in second layer 2312 may fan out to neurons 2302 in multiple other layers, including to neurons 2302 also in second layer 2312. In at least one embodiment, second layer 2312 may be referred to as a "recurrent layer." In at least one embodiment, neuromorphic processor 2300 may include, without limitation, any suitable combination of recurrent layers and feed-forward layers, including, without limitation, both sparsely connected feed-forward layers and fully connected feed-forward layers.

In at least one embodiment, neuromorphic processor 2300 may include, without limitation, a reconfigurable interconnect architecture or dedicated hard-wired interconnects to connect synapse 2308 to neurons 2302. In at least one embodiment, neuromorphic processor 2300 may include, without limitation, circuitry or logic that allows synapses to be allocated to different neurons 2302 as needed based on neural network topology and neuron fan-in/out. For example, in at least one embodiment, synapses 2308 may be connected to neurons 2302 using an interconnect fabric, such as network-on-chip, or with dedicated connections. In at least one embodiment, synapse interconnections and components thereof may be implemented using circuitry or logic.

In at least one embodiment, one or more neural networks of an inference and/or training logic 615 may be used in the neuromorphic processor 2300 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 24:
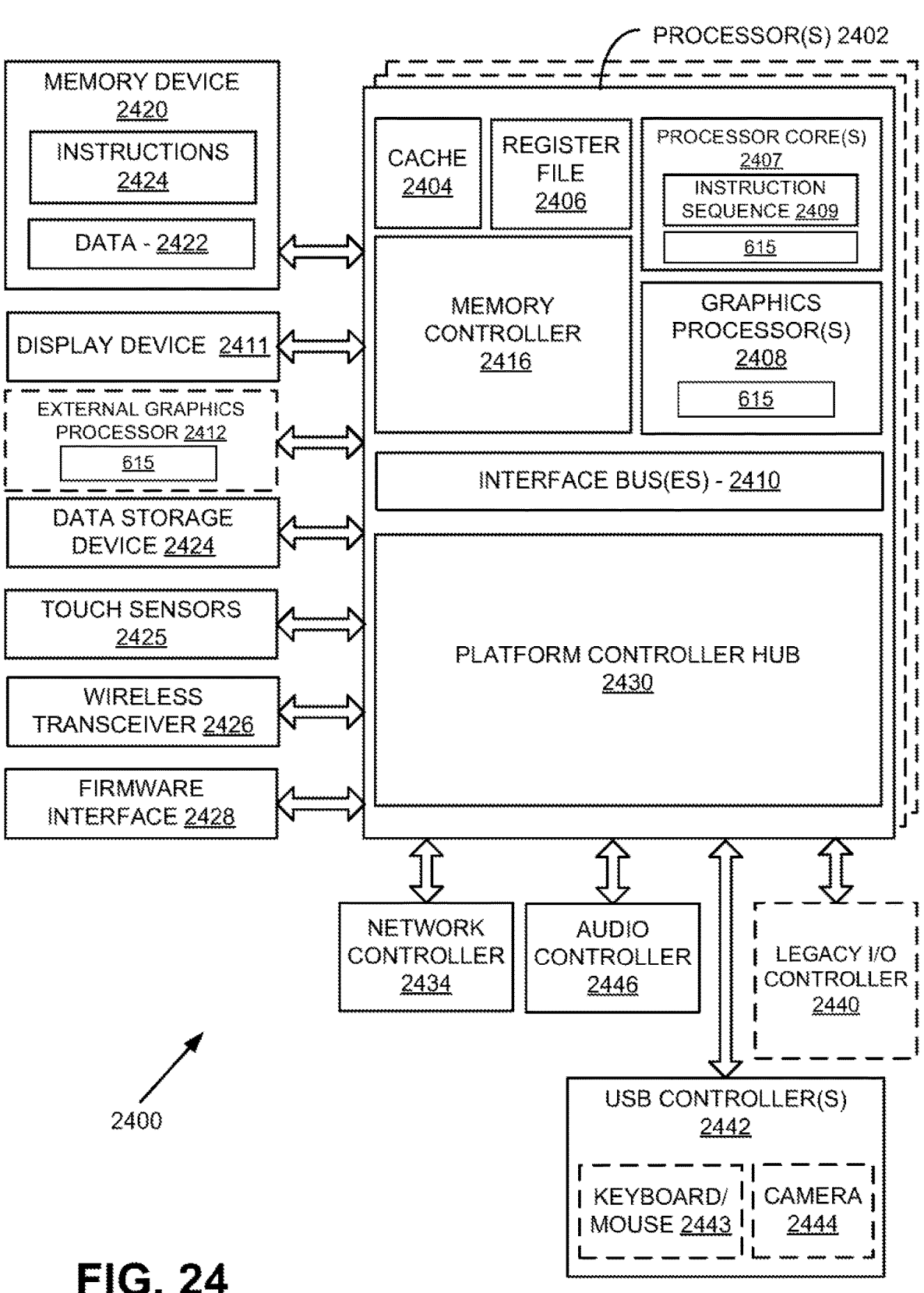
FIG. 24 illustrates at least portions of a graphics processor, according to one or more embodiments.

FIG. 24 is a block diagram of a processing system, according to at least one embodiment. In at least one embodiment, system 2400 includes one or more processors 2402 and one or more graphics processors 2408, and may be a single processor desktop system, a multiprocessor workstation system, or a server system having a large number of processors 2402 or processor cores 2407. In at least one embodiment, system 2400 is a processing platform incorporated within a system-on-a-chip (SoC) integrated circuit for use in mobile, handheld, or embedded devices. In at least one embodiment, one or more graphics processors 2408 include one or more graphics cores 1600.

In at least one embodiment, system 2400 can include, or be incorporated within a server-based gaming platform, a game console, including a game and media console, a mobile gaming console, a handheld game console, or an online game console. In at least one embodiment, system 2400 is a mobile phone, a smart phone, a tablet computing device or a mobile Internet device. In at least one embodiment, processing system 2400 can also include, couple with, or be integrated within a wearable device, such as a smart watch wearable device, a smart eyewear device, an augmented reality device, or a virtual reality device. In at least one embodiment, processing system 2400 is a television or set top box device having one or more processors 2402 and a graphical interface generated by one or more graphics processors 2408.

In at least one embodiment, one or more processors 2402 each include one or more processor cores 2407 to process instructions which, when executed, perform operations for system and user software. In at least one embodiment, each of one or more processor cores 2407 is configured to process a specific instruction sequence 2409. In at least one embodiment, instruction sequence 2409 may facilitate Complex Instruction Set Computing (CISC), Reduced Instruction Set Computing (RISC), or computing via a Very Long Instruction Word (VLIW). In at least one embodiment, processor cores 2407 may each process a different instruction sequence 2409, which may include instructions to facilitate emulation of other instruction sequences. In at least one embodiment, processor core 2407 may also include other processing devices, such a Digital Signal Processor (DSP).

In at least one embodiment, processor 2402 includes a cache memory 2404. In at least one embodiment, processor 2402 can have a single internal cache or multiple levels of internal cache. In at least one embodiment, cache memory is shared among various components of processor 2402. In at least one embodiment, processor 2402 also uses an external cache (e.g., a Level-3 (L3) cache or Last Level Cache (LLC)) (not shown), which may be shared among processor cores 2407 using known cache coherency techniques. In at least one embodiment, a register file 2406 is additionally included in processor 2402, which may include different types of registers for storing different types of data (e.g., integer registers, floating point registers, status registers, and an instruction pointer register). In at least one embodiment, register file 2406 may include general-purpose registers or other registers.

In at least one embodiment, one or more processor(s) 2402 are coupled with one or more interface bus(es) 2410 to transmit communication signals such as address, data, or control signals between processor 2402 and other components in system 2400. In at least one embodiment, interface bus 2410 can be a processor bus, such as a version of a Direct Media Interface (DMI) bus. In at least one embodiment, interface bus 2410 is not limited to a DMI bus, and may include one or more Peripheral Component Interconnect buses (e.g., PCI, PCI Express), memory busses, or other types of interface busses. In at least one embodiment processor(s) 2402 include an integrated memory controller 2416 and a platform controller hub 2430. In at least one embodiment, memory controller 2416 facilitates communication between a memory device and other components of system 2400, while platform controller hub (PCH) 2430 provides connections to I/O devices via a local I/O bus.

In at least one embodiment, a memory device 2420 can be a dynamic random access memory (DRAM) device, a static random access memory (SRAM) device, flash memory device, phase-change memory device, or some other memory device having suitable performance to serve as process memory. In at least one embodiment, memory device 2420 can operate as system memory for system 2400, to store data 2422 and instructions 2421 for use when one or more processors 2402 executes an application or process. In at least one embodiment, memory controller 2416 also couples with an optional external graphics processor 2412, which may communicate with one or more graphics processors 2408 in processors 2402 to perform graphics and media operations. In at least one embodiment, a display device 2411 can connect to processor(s) 2402. In at least one embodiment, display device 2411 can include one or more of an internal display device, as in a mobile electronic device or a laptop device, or an external display device attached via a display interface (e.g., DisplayPort, etc.). In at least one embodiment, display device 2411 can include a head mounted display (HMD) such as a stereoscopic display device for use in virtual reality (VR) applications or augmented reality (AR) applications.

In at least one embodiment, platform controller hub 2430 enables peripherals to connect to memory device 2420 and processor 2402 via a high-speed I/O bus. In at least one embodiment, I/O peripherals include, but are not limited to, an audio controller 2446, a network controller 2434, a firmware interface 2428, a wireless transceiver 2426, touch sensors 2425, a data storage device 2424 (e.g., hard disk drive, flash memory, etc.). In at least one embodiment, data storage device 2424 can connect via a storage interface (e.g., SATA) or via a peripheral bus, such as a Peripheral Component Interconnect bus (e.g., PCI, PCI Express). In at least one embodiment, touch sensors 2425 can include touch screen sensors, pressure sensors, or fingerprint sensors. In at least one embodiment, wireless transceiver 2426 can be a Wi-Fi transceiver, a Bluetooth transceiver, or a mobile network transceiver such as a 3G, 4G, or Long Term Evolution (LTE) transceiver. In at least one embodiment, firmware interface 2428 enables communication with system firmware, and can be, for example, a unified extensible firmware interface (UEFI). In at least one embodiment, network controller 2434 can enable a network connection to a wired network. In at least one embodiment, a high-performance network controller (not shown) couples with interface bus 2410. In at least one embodiment, audio controller 2446 is a multi-channel high definition audio controller. In at least one embodiment, system 2400 includes an optional legacy I/O controller 2440 for coupling legacy (e.g., Personal System 2 (PS/2)) devices to system 2400. In at least one embodiment, platform controller hub 2430 can also connect to one or more Universal Serial Bus (USB) controllers 2442 connect input devices, such as keyboard and mouse 2443 combinations, a camera 2444, or other USB input devices.

In at least one embodiment, an instance of memory controller 2416 and platform controller hub 2430 may be integrated into a discreet external graphics processor, such as external graphics processor 2412. In at least one embodiment, platform controller hub 2430 and/or memory controller 2416 may be external to one or more processor(s) 2402. For example, in at least one embodiment, system 2400 can include an external memory controller 2416 and platform controller hub 2430, which may be configured as a memory controller hub and peripheral controller hub within a system chipset that is in communication with processor(s) 2402.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment portions or all of inference and/or training logic 615 may be incorporated into graphics processor 2408. For example, in at least one embodiment, training and/or inferencing techniques described herein may use one or more of ALUs embodied in a 3D pipeline. Moreover, in at least one embodiment, inferencing and/or training operations described herein may be done using logic other than logic illustrated in FIG. 6A or 6B. In at least one embodiment, weight parameters may be stored in on-chip or off-chip memory and/or registers (shown or not shown) that configure ALUs of graphics processor 2408 to perform one or more machine learning algorithms, neural network architectures, use cases, or training techniques described herein.

In at least one embodiment, one or more neural networks of an inference and/or training logic 615 may be used in the graphics processor 2408 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 25:
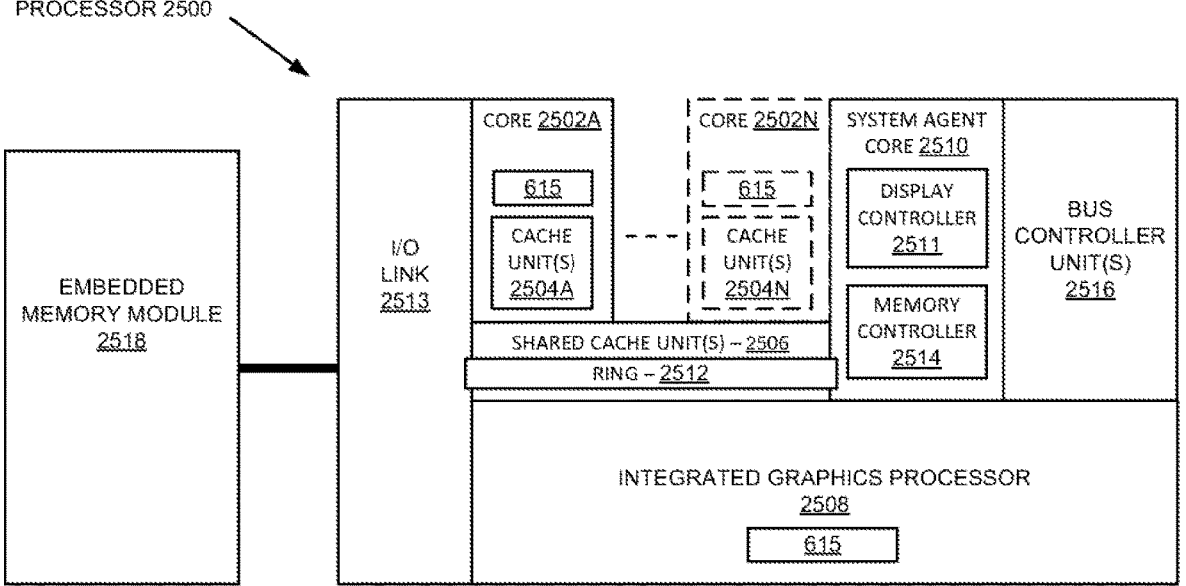
FIG. 25 illustrates at least portions of a graphics processor, according to one or more embodiments.

FIG. 25 is a block diagram of a processor 2500 having one or more processor cores 2502A-2502N, an integrated memory controller 2514, and an integrated graphics processor 2508, according to at least one embodiment. In at least one embodiment, processor 2500 can include additional cores up to and including additional core 2502N represented by dashed lined boxes. In at least one embodiment, each of processor cores 2502A-2502N includes one or more internal cache units 2504A-2504N. In at least one embodiment, each processor core also has access to one or more shared cached units 2506. In at least one embodiment, graphics processor 2508 includes one or more graphics cores 1600.

In at least one embodiment, internal cache units 2504A-2504N and shared cache units 2506 represent a cache memory hierarchy within processor 2500. In at least one embodiment, cache memory units 2504A-2504N may include at least one level of instruction and data cache within each processor core and one or more levels of shared mid-level cache, such as a Level 2 (L2), Level 3 (L3), Level 4 (L4), or other levels of cache, where a highest level of cache before external memory is classified as an LLC. In at least one embodiment, cache coherency logic maintains coherency between various cache units 2506 and 2504A-2504N.

In at least one embodiment, processor 2500 may also include a set of one or more bus controller units 2516 and a system agent core 2510. In at least one embodiment, bus controller units 2516 manage a set of peripheral buses, such as one or more PCI or PCI express busses. In at least one embodiment, system agent core 2510 provides management functionality for various processor components. In at least one embodiment, system agent core 2510 includes one or more integrated memory controllers 2514 to manage access to various external memory devices (not shown).

In at least one embodiment, one or more of processor cores 2502A-2502N include support for simultaneous multi-threading. In at least one embodiment, system agent core 2510 includes components for coordinating and operating cores 2502A-2502N during multi-threaded processing. In at least one embodiment, system agent core 2510 may additionally include a power control unit (PCU), which includes logic and components to regulate one or more power states of processor cores 2502A-2502N and graphics processor 2508.

In at least one embodiment, processor 2500 additionally includes graphics processor 2508 to execute graphics processing operations. In at least one embodiment, graphics processor 2508 couples with shared cache units 2506, and system agent core 2510, including one or more integrated memory controllers 2514. In at least one embodiment, system agent core 2510 also includes a display controller 2511 to drive graphics processor output to one or more coupled displays. In at least one embodiment, display controller 2511 may also be a separate module coupled with graphics processor 2508 via at least one interconnect, or may be integrated within graphics processor 2508.

In at least one embodiment, a ring-based interconnect unit 2512 is used to couple internal components of processor 2500. In at least one embodiment, an alternative interconnect unit may be used, such as a point-to-point interconnect, a switched interconnect, or other techniques. In at least one embodiment, graphics processor 2508 couples with ring interconnect 2512 via an I/O link 2513.

In at least one embodiment, I/O link 2513 represents at least one of multiple varieties of I/O interconnects, including an on package I/O interconnect which facilitates communication between various processor components and a high-performance embedded memory module 2518, such as an eDRAM module. In at least one embodiment, each of processor cores 2502A-2502N and graphics processor 2508 use embedded memory module 2518 as a shared Last Level Cache.

In at least one embodiment, processor cores 2502A-2502N are homogeneous cores executing a common instruction set architecture. In at least one embodiment, processor cores 2502A-2502N are heterogeneous in terms of instruction set architecture (ISA), where one or more of processor cores 2502A-2502N execute a common instruction set, while one or more other cores of processor cores 2502A-2502N executes a subset of a common instruction set or a different instruction set. In at least one embodiment, processor cores 2502A-2502N are heterogeneous in terms of microarchitecture, where one or more cores having a relatively higher power consumption couple with one or more power cores having a lower power consumption. In at least one embodiment, processor 2500 can be implemented on one or more chips or as an SoC integrated circuit.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment portions or all of inference and/or training logic 615 may be incorporated into graphics processor 2508. For example, in at least one embodiment, training and/or inferencing techniques described herein may use one or more of ALUs embodied in a 3D pipeline, graphics core(s) 2502, shared function logic, or other logic in FIG. 25. Moreover, in at least one embodiment, inferencing and/or training operations described herein may be done using logic other than logic illustrated in FIG. 6A or 6B. In at least one embodiment, weight parameters may be stored in on-chip or off-chip memory and/or registers (shown or not shown) that configure ALUs of processor 2500 to perform one or more machine learning algorithms, neural network architectures, use cases, or training techniques described herein.

In at least one embodiment, one or more neural networks of an inference and/or training logic 615 may be used in one or more of ALUs embodied in a 3D pipeline, graphics core(s) 2502, shared function logic, or other logic in FIG. 25, and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 26:
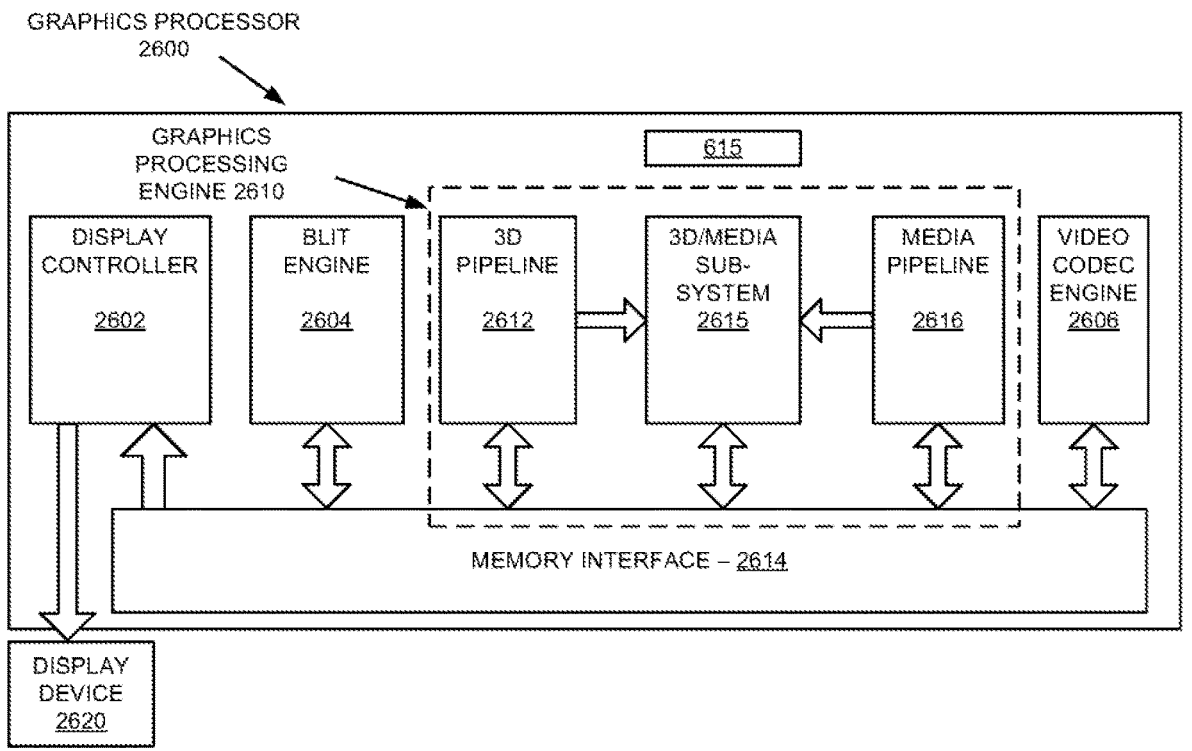
FIG. 26 illustrates at least portions of a graphics processor, according to one or more embodiments.

FIG. 26 is a block diagram of a graphics processor 2600, which may be a discrete graphics processing unit, or may be a graphics processor integrated with a plurality of processing cores. In at least one embodiment, graphics processor 2600 communicates via a memory mapped I/O interface to registers on graphics processor 2600 and with commands placed into memory. In at least one embodiment, graphics processor 2600 includes a memory interface 2614 to access memory. In at least one embodiment, memory interface 2614 is an interface to local memory, one or more internal caches, one or more shared external caches, and/or to system memory. In at least one embodiment, graphics processor 2600 includes graphics core 1600.

In at least one embodiment, graphics processor 2600 also includes a display controller 2602 to drive display output data to a display device 2620. In at least one embodiment, display controller 2602 includes hardware for one or more overlay planes for display device 2620 and composition of multiple layers of video or user interface elements. In at least one embodiment, display device 2620 can be an internal or external display device. In at least one embodiment, display device 2620 is a head mounted display device, such as a virtual reality (VR) display device or an augmented reality (AR) display device. In at least one embodiment, graphics processor 2600 includes a video codec engine 2606 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In at least one embodiment, graphics processor 2600 includes a block image transfer (BLIT) engine 2604 to perform two-dimensional (2D) rasterizer operations including, for example, bit-boundary block transfers. However, in at least one embodiment, 2D graphics operations are performed using one or more components of a graphics processing engine (GPE) 2610. In at least one embodiment, GPE 2610 is a compute engine for performing graphics operations, including three-dimensional (3D) graphics operations and media operations.

In at least one embodiment, GPE 2610 includes a 3D pipeline 2612 for performing 3D operations, such as rendering three-dimensional images and scenes using processing functions that act upon 3D primitive shapes (e.g., rectangle, triangle, etc.). In at least one embodiment, 3D pipeline 2612 includes programmable and fixed function elements that perform various tasks and/or spawn execution threads to a 3D/Media sub-system 2615. While 3D pipeline 2612 can be used to perform media operations, in at least one embodiment, GPE 2610 also includes a media pipeline 2616 that is used to perform media operations, such as video post-processing and image enhancement.

In at least one embodiment, media pipeline 2616 includes fixed function or programmable logic units to perform one or more specialized media operations, such as video decode acceleration, video de-interlacing, and video encode acceleration in place of, or on behalf of, video codec engine 2606. In at least one embodiment, media pipeline 2616 additionally includes a thread spawning unit to spawn threads for execution on 3D/Media sub-system 2615. In at least one embodiment, spawned threads perform computations for media operations on one or more graphics execution units included in 3D/Media sub-system 2615.

In at least one embodiment, 3D/Media subsystem 2615 includes logic for executing threads spawned by 3D pipeline 2612 and media pipeline 2616. In at least one embodiment, 3D pipeline 2612 and media pipeline 2616 send thread execution requests to 3D/Media subsystem 2615, which includes thread dispatch logic for arbitrating and dispatching various requests to available thread execution resources. In at least one embodiment, execution resources include an array of graphics execution units to process 3D and media threads. In at least one embodiment, 3D/Media subsystem 2615 includes one or more internal caches for thread instructions and data. In at least one embodiment, subsystem 2615 also includes shared memory, including registers and addressable memory, to share data between threads and to store output data.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment portions or all of inference and/or training logic 615 may be incorporated into graphics processor 2600. For example, in at least one embodiment, training and/or inferencing techniques described herein may use one or more of ALUs embodied in 3D pipeline 2612. Moreover, in at least one embodiment, inferencing and/or training operations described herein may be done using logic other than logic illustrated in FIG. 6A or 6B. In at least one embodiment, weight parameters may be stored in on-chip or off-chip memory and/or registers (shown or not shown) that configure ALUs of graphics processor 2600 to perform one or more machine learning algorithms, neural network architectures, use cases, or training techniques described herein.

In at least one embodiment, one or more neural networks of an inference and/or training logic 615 may be used in a graphics processor 2600 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 27:
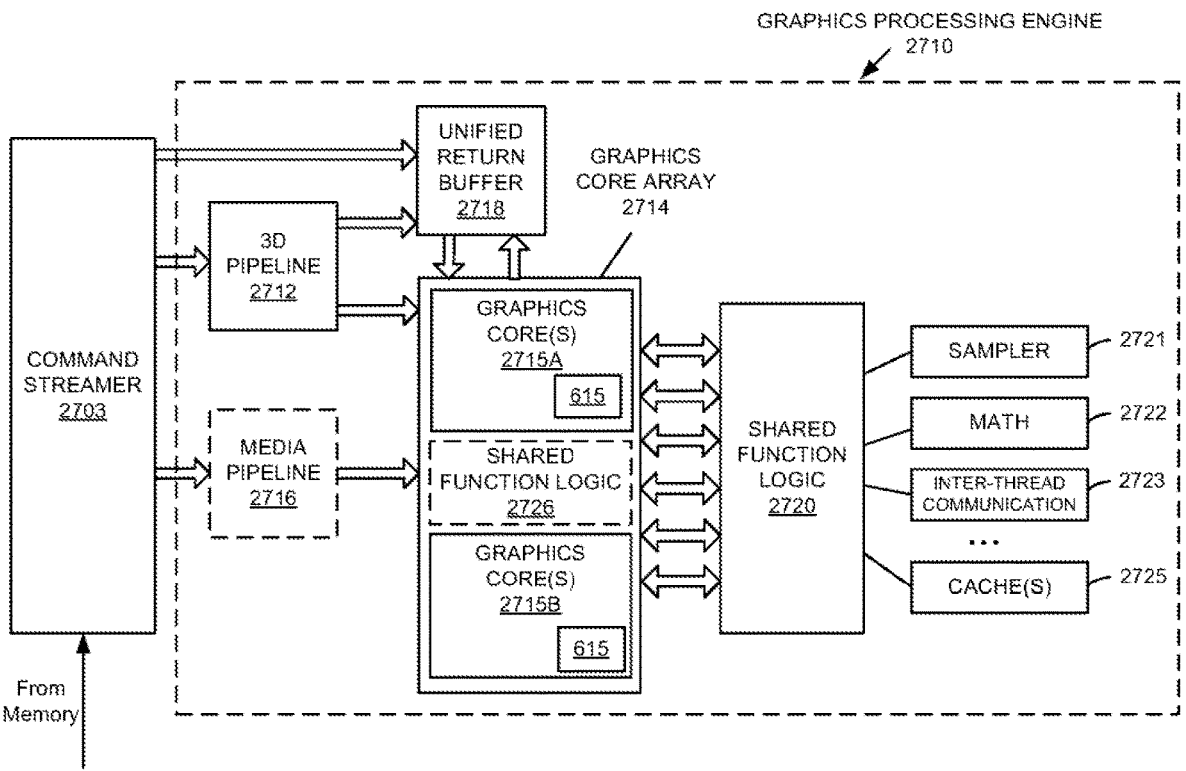
FIG. 27 is a block diagram of a graphics processing engine of a graphics processor in accordance with at least one embodiment.

FIG. 27 is a block diagram of a graphics processing engine 2710 of a graphics processor in accordance with at least one embodiment. In at least one embodiment, graphics processing engine (GPE) 2710 is a version of GPE 2610 shown in FIG. 26. In at least one embodiment, a media pipeline 2716 is optional and may not be explicitly included within GPE 2710. In at least one embodiment, a separate media and/or image processor is coupled to GPE 2710.

In at least one embodiment, GPE 2710 is coupled to or includes a command streamer 2703, which provides a command stream to a 3D pipeline 2712 and/or media pipeline 2716. In at least one embodiment, command streamer 2703 is coupled to memory, which can be system memory, or one or more of internal cache memory and shared cache memory. In at least one embodiment, command streamer 2703 receives commands from memory and sends commands to 3D pipeline 2712 and/or media pipeline 2716. In at least one embodiment, commands are instructions, primitives, or micro-operations fetched from a ring buffer, which stores commands for 3D pipeline 2712 and media pipeline 2716. In at least one embodiment, a ring buffer can additionally include batch command buffers storing batches of multiple commands. In at least one embodiment, commands for 3D pipeline 2712 can also include references to data stored in memory, such as, but not limited to, vertex and geometry data for 3D pipeline 2712 and/or image data and memory objects for media pipeline 2716. In at least one embodiment, 3D pipeline 2712 and media pipeline 2716 process commands and data by performing operations or by dispatching one or more execution threads to a graphics core array 2714. In at least one embodiment, graphics core array 2714 includes one or more blocks of graphics cores (e.g., graphics core(s) 2715A, graphics core(s) 2715B), each block including one or more graphics cores. In at least one embodiment, graphics core(s) 2715A, 2715B may be referred to as execution units ("EUs"). In at least one embodiment, each graphics core includes a set of graphics execution resources that includes general-purpose and graphics specific execution logic to perform graphics and compute operations, as well as fixed function texture processing and/or machine learning and artificial intelligence acceleration logic, including inference and/or training logic 615 in FIG. 6A and FIG. 6B.

In at least one embodiment, 3D pipeline 2712 includes fixed function and programmable logic to process one or more shader programs, such as vertex shaders, geometry shaders, pixel shaders, fragment shaders, compute shaders, or other shader programs, by processing instructions and dispatching execution threads to graphics core array 2714. In at least one embodiment, graphics core array 2714 provides a unified block of execution resources for use in processing shader programs. In at least one embodiment, a multi-purpose execution logic (e.g., execution units) within graphics core(s) 2715A-2715B of graphic core array 2714 includes support for various 3D API shader languages and can execute multiple simultaneous execution threads associated with multiple shaders.

In at least one embodiment, graphics core array 2714 also includes execution logic to perform media functions, such as video and/or image processing. In at least one embodiment, execution units additionally include general-purpose logic that is programmable to perform parallel general-purpose computational operations, in addition to graphics processing operations.

In at least one embodiment, output data generated by threads executing on graphics core array 2714 can output data to memory in a unified return buffer (URB) 2718. In at least one embodiment, URB 2718 can store data for multiple threads. In at least one embodiment, URB 2718 may be used to send data between different threads executing on graphics core array 2714. In at least one embodiment, URB 2718 may additionally be used for synchronization between threads on graphics core array 2714 and fixed function logic within shared function logic 2720.

In at least one embodiment, graphics core array 2714 is scalable, such that graphics core array 2714 includes a variable number of graphics cores, each having a variable number of execution units based on a target power and performance level of GPE 2710. In at least one embodiment, execution resources are dynamically scalable, such that execution resources may be enabled or disabled as needed.

In at least one embodiment, graphics core array 2714 is coupled to shared function logic 2720 that includes multiple resources that are shared between graphics cores in graphics core array 2714. In at least one embodiment, shared functions performed by shared function logic 2720 are embodied in hardware logic units that provide specialized supplemental functionality to graphics core array 2714. In at least one embodiment, shared function logic 2720 includes but is not limited to a sampler unit 2721, a math unit 2722, and inter-thread communication (ITC) logic 2723. In at least one embodiment, one or more cache(s) 2725 are included in, or coupled to, shared function logic 2720.

In at least one embodiment, a shared function is used if demand for a specialized function is insufficient for inclusion within graphics core array 2714. In at least one embodiment, a single instantiation of a specialized function is used in shared function logic 2720 and shared among other execution resources within graphics core array 2714. In at least one embodiment, specific shared functions within shared function logic 2720 that are used extensively by graphics core array 2714 may be included within shared function logic 2726 within graphics core array 2714. In at least one embodiment, shared function logic 2726 within graphics core array 2714 can include some or all logic within shared function logic 2720. In at least one embodiment, all logic elements within shared function logic 2720 may be duplicated within shared function logic 2726 of graphics core array 2714. In at least one embodiment, shared function logic 2720 is excluded in favor of shared function logic 2726 within graphics core array 2714.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment portions or all of inference and/or training logic 615 may be incorporated into graphics processor 2710. For example, in at least one embodiment, training and/or inferencing techniques described herein may use one or more of ALUs embodied in 3D pipeline 2712, graphics core(s) 2715, shared function logic 2726, shared function logic 2720, or other logic in FIG. 27. Moreover, in at least one embodiment, inferencing and/or training operations described herein may be done using logic other than logic illustrated in FIG. 6A or 6B. In at least one embodiment, weight parameters may be stored in on-chip or off-chip memory and/or registers (shown or not shown) that configure ALUs of graphics processor 2710 to perform one or more machine learning algorithms, neural network architectures, use cases, or training techniques described herein.

In at least one embodiment, one or more neural networks of an inference and/or training logic 615 may be used in one or more of ALUs embodied in 3D pipeline 2712, graphics core(s) 2715, shared function logic 2726, shared function logic 2720, or other logic in FIG. 27, and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 28:
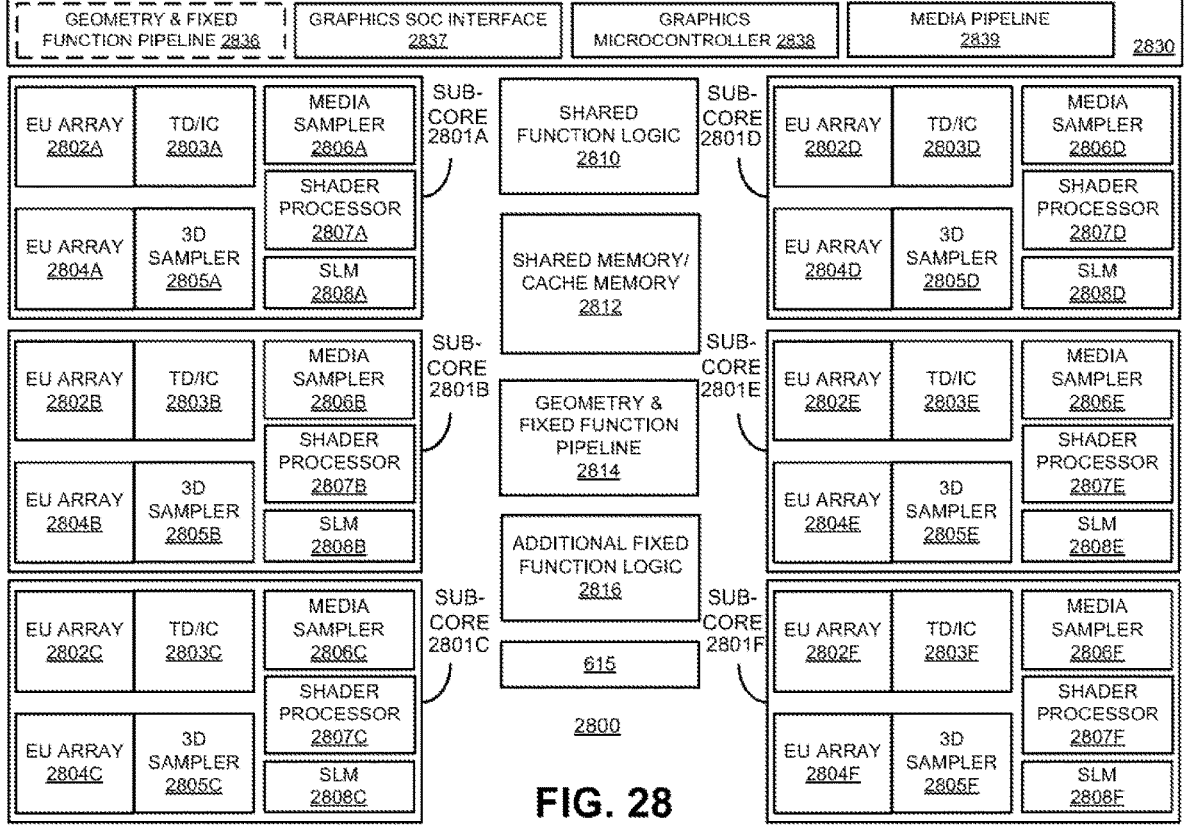
FIG. 28 is a block diagram of at least portions of a graphics processor core, according to at least one embodiment.

FIG. 28 is a block diagram of hardware logic of a graphics processor core 2800, according to at least one embodiment described herein. In at least one embodiment, graphics processor core 2800 includes graphics core 1600. In at least one embodiment, graphics processor core 2800 is included within a graphics core array. In at least one embodiment, graphics processor core 2800, sometimes referred to as a core slice, can be one or multiple graphics cores within a modular graphics processor. In at least one embodiment, graphics processor core 2800 is exemplary of one graphics core slice, and a graphics processor as described herein may include multiple graphics core slices based on target power and performance envelopes. In at least one embodiment, each graphics core 2800 can include a fixed function block 2830 coupled with multiple sub-cores 2801A-2801F, also referred to as sub-slices, that include modular blocks of general-purpose and fixed function logic.

In at least one embodiment, fixed function block 2830 includes a geometry and fixed function pipeline 2836 that can be shared by all sub-cores in graphics processor 2800, for example, in lower performance and/or lower power graphics processor implementations. In at least one embodiment, geometry and fixed function pipeline 2836 includes a 3D fixed function pipeline, a video front-end unit, a thread spawner and thread dispatcher, and a unified return buffer manager, which manages unified return buffers.

In at least one embodiment, fixed function block 2830 also includes a graphics SoC interface 2837, a graphics microcontroller 2838, and a media pipeline 2839. In at least one embodiment, graphics SoC interface 2837 provides an interface between graphics core 2800 and other processor cores within a system on a chip integrated circuit. In at least one embodiment, graphics microcontroller 2838 is a programmable sub-processor that is configurable to manage various functions of graphics processor 2800, including thread dispatch, scheduling, and pre-emption. In at least one embodiment, media pipeline 2839 includes logic to facilitate decoding, encoding, pre-processing, and/or post-processing of multimedia data, including image and video data. In at least one embodiment, media pipeline 2839 implements media operations via requests to compute or sampling logic within sub-cores 2801A-2801F.

In at least one embodiment, SoC interface 2837 enables graphics core 2800 to communicate with general-purpose application processor cores (e.g., CPUs) and/or other components within an SoC, including memory hierarchy elements such as a shared last level cache memory, system RAM, and/or embedded on-chip or on-package DRAM. In at least one embodiment, SoC interface 2837 can also enable communication with fixed function devices within an SoC, such as camera imaging pipelines, and enables use of and/or implements global memory atomics that may be shared between graphics core 2800 and CPUs within an SoC. In at least one embodiment, graphics SoC interface 2837 can also implement power management controls for graphics processor core 2800 and enable an interface between a clock domain of graphics processor core 2800 and other clock domains within an SoC. In at least one embodiment, SoC interface 2837 enables receipt of command buffers from a command streamer and global thread dispatcher that are configured to provide commands and instructions to each of one or more graphics cores within a graphics processor. In at least one embodiment, commands and instructions can be dispatched to media pipeline 2839, when media operations are to be performed, or a geometry and fixed function pipeline (e.g., geometry and fixed function pipeline 2836, and/or a geometry and fixed function pipeline 2814) when graphics processing operations are to be performed.

In at least one embodiment, graphics microcontroller 2838 can be configured to perform various scheduling and management tasks for graphics core 2800. In at least one embodiment, graphics microcontroller 2838 can perform graphics and/or compute workload scheduling on various graphics parallel engines within execution unit (EU) arrays 2802A-2802F, 2804A-2804F within sub-cores 2801A-2801F. In at least one embodiment, host software executing on a CPU core of an SoC including graphics core 2800 can submit workloads to one of multiple graphic processor paths, which invokes a scheduling operation on an appropriate graphics engine. In at least one embodiment, scheduling operations include determining which workload to run next, submitting a workload to a command streamer, pre-empting existing workloads running on an engine, monitoring progress of a workload, and notifying host software when a workload is complete. In at least one embodiment, graphics microcontroller 2838 can also facilitate low-power or idle states for graphics core 2800, providing graphics core 2800 with an ability to save and restore registers within graphics core 2800 across low-power state transitions independently from an operating system and/or graphics driver software on a system.

In at least one embodiment, graphics core 2800 may have greater than or fewer than illustrated sub-cores 2801A-2801F, up to N modular sub-cores. For each set of N sub-cores, in at least one embodiment, graphics core 2800 can also include shared function logic 2810, shared and/or cache memory 2812, geometry/fixed function pipeline 2814, as well as additional fixed function logic 2816 to accelerate various graphics and compute processing operations. In at least one embodiment, shared function logic 2810 can include logic units (e.g., sampler, math, and/or inter-thread communication logic) that can be shared by each N sub-cores within graphics core 2800. In at least one embodiment, shared and/or cache memory 2812 can be a last-level cache for N sub-cores 2801A-2801F within graphics core 2800 and can also serve as shared memory that is accessible by multiple sub-cores. In at least one embodiment, geometry/fixed function pipeline 2814 can be included instead of geometry/fixed function pipeline 2836 within fixed function block 2830 and can include similar logic units.

In at least one embodiment, graphics core 2800 includes additional fixed function logic 2816 that can include various fixed function acceleration logic for use by graphics core 2800. In at least one embodiment, additional fixed function logic 2816 includes an additional geometry pipeline for use in position-only shading. In position-only shading, at least two geometry pipelines exist, whereas in a full geometry pipeline within geometry and fixed function pipelines 2814, 2836, and a cull pipeline, which is an additional geometry pipeline that may be included within additional fixed function logic 2816. In at least one embodiment, a cull pipeline is a trimmed down version of a full geometry pipeline. In at least one embodiment, a full pipeline and a cull pipeline can execute different instances of an application, each instance having a separate context. In at least one embodiment, position only shading can hide long cull runs of discarded triangles, enabling shading to be completed earlier in some instances. For example, in at least one embodiment, cull pipeline logic within additional fixed function logic 2816 can execute position shaders in parallel with a main application and generally generates critical results faster than a full pipeline, as a cull pipeline fetches and shades position attributes of vertices, without performing rasterization and rendering of pixels to a frame buffer. In at least one embodiment, a cull pipeline can use generated critical results to compute visibility information for all triangles without regard to whether those triangles are culled. In at least one embodiment, a full pipeline (which in this instance may be referred to as a replay pipeline) can consume visibility information to skip culled triangles to shade only visible triangles that are finally passed to a rasterization phase.

In at least one embodiment, additional fixed function logic 2816 can also include machine-learning acceleration logic, such as fixed function matrix multiplication logic, for implementations including optimizations for machine learning training or inferencing.

In at least one embodiment, within each graphics sub-core 2801A-2801F includes a set of execution resources that may be used to perform graphics, media, and compute operations in response to requests by graphics pipeline, media pipeline, or shader programs. In at least one embodiment, graphics sub-cores 2801A-2801F include multiple EU arrays 2802A-2802F, 2804A-2804F, thread dispatch and inter-thread communication (TD/IC) logic 2803A-2803F, a 3D (e.g., texture) sampler 2805A-2805F, a media sampler 2806A-2806F, a shader processor 2807A-2807F, and shared local memory (SLM) 2808A-2808F. In at least one embodiment, EU arrays 2802A-2802F, 2804A-2804F each include multiple execution units, which are general-purpose graphics processing units capable of performing floating-point and integer/fixed-point logic operations in service of a graphics, media, or compute operation, including graphics, media, or compute shader programs. In at least one embodiment, TD/IC logic 2803A-2803F performs local thread dispatch and thread control operations for execution units within a sub-core and facilitates communication between threads executing on execution units of a sub-core. In at least one embodiment, 3D samplers 2805A-2805F can read texture or other 3D graphics related data into memory. In at least one embodiment, 3D samplers can read texture data differently based on a configured sample state and texture format associated with a given texture. In at least one embodiment, media samplers 2806A-2806F can perform similar read operations based on a type and format associated with media data. In at least one embodiment, each graphics sub-core 2801A-2801F can alternately include a unified 3D and media sampler. In at least one embodiment, threads executing on execution units within each of sub-cores 2801A-2801F can make use of shared local memory 2808A-2808F within each sub-core, to enable threads executing within a thread group to execute using a common pool of on-chip memory.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, portions or all of inference and/or training logic 615 may be incorporated into graphics processor 2800. For example, in at least one embodiment, training and/or inferencing techniques described herein may use one or more of ALUs embodied in a 3D pipeline, graphics microcontroller 2838, geometry and fixed function pipeline 2814 and 2836, or other logic in FIG. 28. Moreover, in at least one embodiment, inferencing and/or training operations described herein may be done using logic other than logic illustrated in FIG. 6A or 6B. In at least one embodiment, weight parameters may be stored in on-chip or off-chip memory and/or registers (shown or not shown) that configure ALUs of graphics processor 2800 to perform one or more machine learning algorithms, neural network architectures, use cases, or training techniques described herein.

In at least one embodiment, one or more neural networks of an inference and/or training logic 615 may be used in one or more of ALUs embodied in a 3D pipeline, graphics microcontroller 2838, geometry and fixed function pipeline 2814 and 2836, or other logic in FIG. 28, and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 29A:
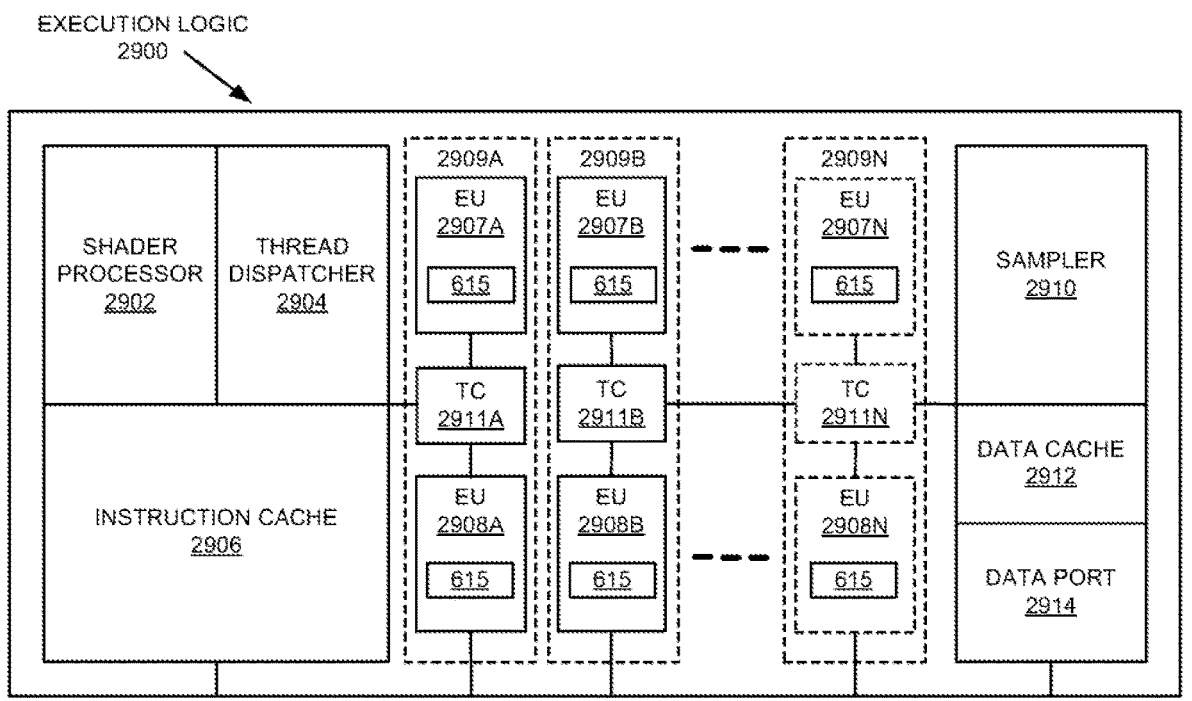
FIGS. 29A, 29B illustrate thread execution logic including an array of processing elements of a graphics processor core according to at least one embodiment.
Figure 29B:
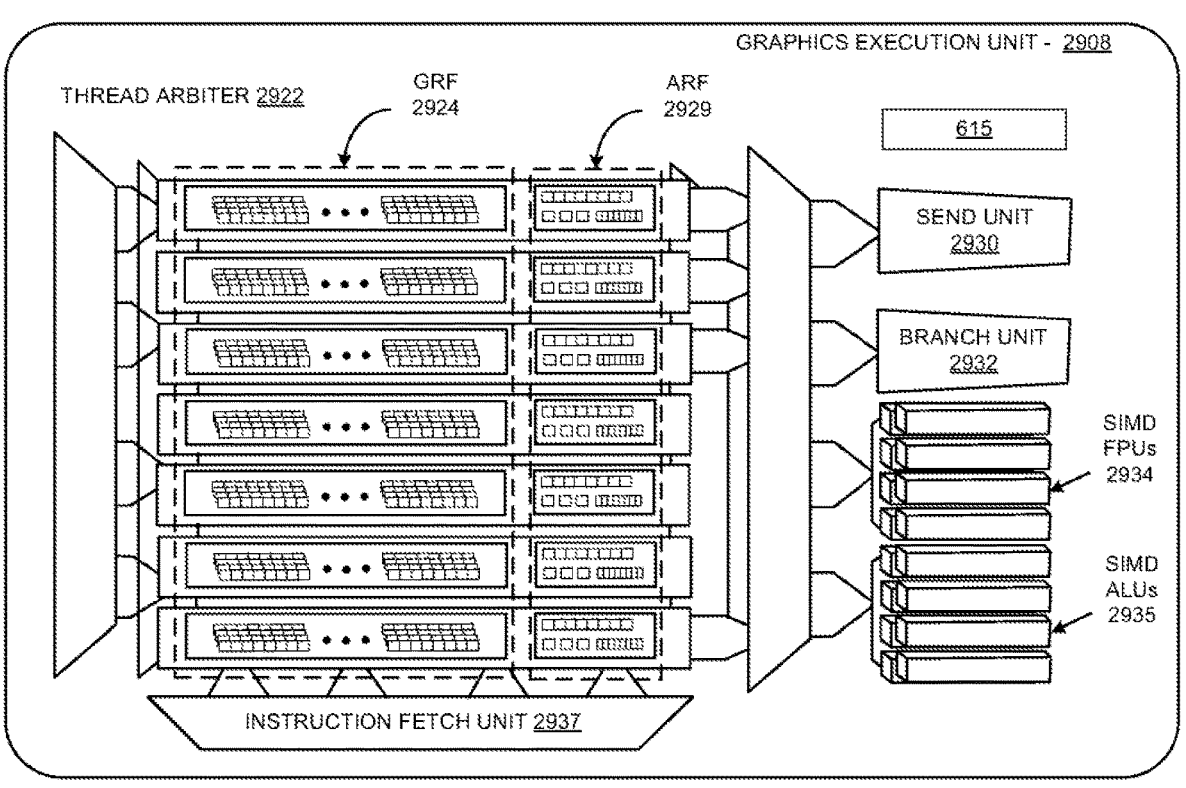

FIGS. 29A-29B illustrate thread execution logic 2900 including an array of processing elements of a graphics processor core according to at least one embodiment. FIG. 29A illustrates at least one embodiment, in which thread execution logic 2900 is used. FIG. 29B illustrates exemplary internal details of a graphics execution unit 2908, according to at least one embodiment.

As illustrated in FIG. 29A, in at least one embodiment, thread execution logic 2900 includes a shader processor 2902, a thread dispatcher 2904, an instruction cache 2906, a scalable execution unit array including a plurality of execution units 2907A-2907N and 2908A-2908N, a sampler 2910, a data cache 2912, and a data port 2914. In at least one embodiment, a scalable execution unit array can dynamically scale by enabling or disabling one or more execution units (e.g., any of execution unit 2908A-N or 2907A-N) based on computational requirements of a workload, for example. In at least one embodiment, scalable execution units are interconnected via an interconnect fabric that links to each execution unit. In at least one embodiment, thread execution logic 2900 includes one or more connections to memory, such as system memory or cache memory, through one or more of instruction cache 2906, data port 2914, sampler 2910, and execution units 2907 or 2908. In at least one embodiment, each execution unit (e.g., 2907A) is a stand-alone programmable general-purpose computational unit that is capable of executing multiple simultaneous hardware threads while processing multiple data elements in parallel for each thread. In at least one embodiment, array of execution units 2907 and/or 2908 is scalable to include any number individual execution units.

In at least one embodiment, execution units 2907 and/or 2908 are primarily used to execute shader programs. In at least one embodiment, shader processor 2902 can process various shader programs and dispatch execution threads associated with shader programs via a thread dispatcher 2904. In at least one embodiment, thread dispatcher 2904 includes logic to arbitrate thread initiation requests from graphics and media pipelines and instantiate requested threads on one or more execution units in execution units 2907 and/or 2908. For example, in at least one embodiment, a geometry pipeline can dispatch vertex, tessellation, or geometry shaders to thread execution logic for processing. In at least one embodiment, thread dispatcher 2904 can also process runtime thread spawning requests from executing shader programs.

In at least one embodiment, execution units 2907 and/or 2908 support an instruction set that includes native support for many standard 3D graphics shader instructions, such that shader programs from graphics libraries (e.g., Direct 3D and OpenGL) are executed with a minimal translation. In at least one embodiment, execution units support vertex and geometry processing (e.g., vertex programs, geometry programs, and/or vertex shaders), pixel processing (e.g., pixel shaders, fragment shaders) and general-purpose processing (e.g., compute and media shaders). In at least one embodiment, each of execution units 2907 and/or 2908, which include one or more arithmetic logic units (ALUs), is capable of multi-issue single instruction multiple data (SIMD) execution and multi-threaded operation enables an efficient execution environment despite higher latency memory accesses. In at least one embodiment, each hardware thread within each execution unit has a dedicated high-bandwidth register file and associated independent thread-state. In at least one embodiment, execution is multi-issue per clock to pipelines capable of integer, single and double precision floating point operations, SIMD branch capability, logical operations, transcendental operations, and other miscellaneous operations. In at least one embodiment, while waiting for data from memory or one of shared functions, dependency logic within execution units 2907 and/or 2908 causes a waiting thread to sleep until requested data has been returned. In at least one embodiment, while an awaiting thread is sleeping, hardware resources may be devoted to processing other threads. For example, in at least one embodiment, during a delay associated with a vertex shader operation, an execution unit can perform operations for a pixel shader, fragment shader, or another type of shader program, including a different vertex shader.

In at least one embodiment, each execution unit in execution units 2907 and/or 2908 operates on arrays of data elements. In at least one embodiment, a number of data elements is an "execution size," or number of channels for an instruction. In at least one embodiment, an execution channel is a logical unit of execution for data element access, masking, and flow control within instructions. In at least one embodiment, a number of channels may be independent of a number of physical arithmetic logic units (ALUs) or floating point units (FPUs) for a particular graphics processor. In at least one embodiment, execution units 2907 and/or 2908 support integer and floating-point data types.

In at least one embodiment, an execution unit instruction set includes SIMD instructions. In at least one embodiment, various data elements can be stored as a packed data type in a register and execution unit will process various elements based on data size of elements. For example, in at least one embodiment, when operating on a 256-bit wide vector, 256 bits of a vector are stored in a register and an execution unit operates on a vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, in at least one embodiment, different vector widths and register sizes are possible.

In at least one embodiment, one or more execution units can be combined into a fused execution unit 2909A-2909N having thread control logic (2911A-2911N) that is common to fused EUs such as execution unit 2907A fused with execution unit 2908A into fused execution unit 2909A. In at least one embodiment, multiple EUs can be fused into an EU group. In at least one embodiment, each EU in a fused EU group can be configured to execute a separate SIMD hardware thread, with a number of EUs in a fused EU group possibly varying according to various embodiments. In at least one embodiment, various SIMD widths can be performed per-EU, including but not limited to SIMD8, SIMD16, and SIMD32. In at least one embodiment, each fused graphics execution unit 2909A-2909N includes at least two execution units. For example, in at least one embodiment, fused execution unit 2909A includes a first EU 2907A, second EU 2908A, and thread control logic 2911A that is common to first EU 2907A and second EU 2908A. In at least one embodiment, thread control logic 2911A controls threads executed on fused graphics execution unit

2909A, allowing each EU within fused execution units 2909A-2909N to execute using a common instruction pointer register.

In at least one embodiment, one or more internal instruction caches (e.g., 2906) are included in thread execution logic 2900 to cache thread instructions for execution units. In at least one embodiment, one or more data caches (e.g., 2912) are included to cache thread data during thread execution. In at least one embodiment, sampler 2910 is included to provide texture sampling for 3D operations and media sampling for media operations. In at least one embodiment, sampler 2910 includes specialized texture or media sampling functionality to process texture or media data during sampling process before providing sampled data to an execution unit.

During execution, in at least one embodiment, graphics and media pipelines send thread initiation requests to thread execution logic 2900 via thread spawning and dispatch logic. In at least one embodiment, once a group of geometric objects has been processed and rasterized into pixel data, pixel processor logic (e.g., pixel shader logic, fragment shader logic, etc.) within shader processor 2902 is invoked to further compute output information and cause results to be written to output surfaces (e.g., color buffers, depth buffers, stencil buffers, etc.). In at least one embodiment, a pixel shader or a fragment shader calculates values of various vertex attributes that are to be interpolated across a rasterized object. In at least one embodiment, pixel processor logic within shader processor 2902 then executes an application programming interface (API)-supplied pixel or fragment shader program. In at least one embodiment, to execute a shader program, shader processor 2902 dispatches threads to an execution unit (e.g., 2908A) via thread dispatcher 2904. In at least one embodiment, shader processor 2902 uses texture sampling logic in sampler 2910 to access texture data in texture maps stored in memory. In at least one embodiment, arithmetic operations on texture data and input geometry data compute pixel color data for each geometric fragment, or discards one or more pixels from further processing.

In at least one embodiment, data port 2914 provides a memory access mechanism for thread execution logic 2900 to output processed data to memory for further processing on a graphics processor output pipeline. In at least one embodiment, data port 2914 includes or couples to one or more cache memories (e.g., data cache 2912) to cache data for memory access via a data port.

As illustrated in FIG. 29B, in at least one embodiment, a graphics execution unit 2908 can include an instruction fetch unit 2937, a general register file array (GRF) 2924, an architectural register file array (ARF) 2926, a thread arbiter 2922, a send unit 2930, a branch unit 2932, a set of SIMD floating point units (FPUs) 2934, and a set of dedicated integer SIMD ALUs 2935. In at least one embodiment, GRF 2924 and ARF 2926 includes a set of general register files and architecture register files associated with each simultaneous hardware thread that may be active in graphics execution unit 2908. In at least one embodiment, per thread architectural state is maintained in ARF 2926, while data used during thread execution is stored in GRF 2924. In at least one embodiment, execution state of each thread, including instruction pointers for each thread, can be held in thread-specific registers in ARF 2926.

In at least one embodiment, graphics execution unit 2908 has an architecture that is a combination of Simultaneous Multi-Threading (SMT) and fine-grained Interleaved Multi-Threading (IMT). In at least one embodiment, architecture has a modular configuration that can be fine-tuned at design time based on a target number of simultaneous threads and number of registers per execution unit, where execution unit resources are divided across logic used to execute multiple simultaneous threads.

In at least one embodiment, graphics execution unit 2908 can co-issue multiple instructions, which may each be different instructions. In at least one embodiment, thread arbiter 2922 of graphics execution unit thread 2908 can dispatch instructions to one of send unit 2930, branch unit 2932, or SIMD FPU(s) 2934 for execution. In at least one embodiment, each execution thread can access 128 general-purpose registers within GRF 2924, where each register can store 32 bytes, accessible as a SIMD 8-element vector of 32-bit data elements. In at least one embodiment, each execution unit thread has access to 4 kilobytes within GRF 2924, although embodiments are not so limited, and greater or fewer register resources may be provided in other embodiments. In at least one embodiment, up to seven threads can execute simultaneously, although a number of threads per execution unit can also vary according to embodiments. In at least one embodiment, in which seven threads may access 4 kilobytes, GRF 2924 can store a total of 28 kilobytes. In at least one embodiment, flexible addressing modes can permit registers to be addressed together to build effectively wider registers or to represent strided rectangular block data structures.

In at least one embodiment, memory operations, sampler operations, and other longer-latency system communications are dispatched via "send" instructions that are executed by message passing to send unit 2930. In at least one embodiment, branch instructions are dispatched to branch unit 2932 to facilitate SIMD divergence and eventual convergence.

In at least one embodiment, graphics execution unit 2908 includes one or more SIMD floating point units (FPU(s)) 2934 to perform floating-point operations. In at least one embodiment, FPU(s) 2934 also support integer computation. In at least one embodiment, FPU(s) 2934 can SIMD execute up to M number of 32-bit floating-point (or integer) operations, or SIMD execute up to 2M 16-bit integer or 16-bit floating-point operations. In at least one embodiment, at least one FPU provides extended math capability to support high-throughput transcendental math functions and double precision 64-bit floating-point. In at least one embodiment, a set of 8-bit integer SIMD ALUs 2935 are also present, and may be specifically optimized to perform operations associated with machine learning computations.

In at least one embodiment, arrays of multiple instances of graphics execution unit 2908 can be instantiated in a graphics sub-core grouping (e.g., a sub-slice). In at least one embodiment, execution unit 2908 can execute instructions across a plurality of execution channels. In at least one embodiment, each thread executed on graphics execution unit 2908 is executed on a different channel.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, portions or all of inference and/or training logic 615 may be incorporated into thread execution logic 2900. Moreover, in at least one embodiment, inferencing and/or training operations described herein may be done using logic other than logic illustrated in FIG. 6A or 6B. In at least one embodiment, weight parameters may be stored in on-chip or off-chip memory and/or registers (shown or not shown) that configure ALUs thread of execution logic 2900 to perform one or more machine learning algorithms, neural network architectures, use cases, or training techniques described herein.

In at least one embodiment, one or more neural networks of an inference and/or training logic 615 may be used in thread execution logic 2900 and may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 30:
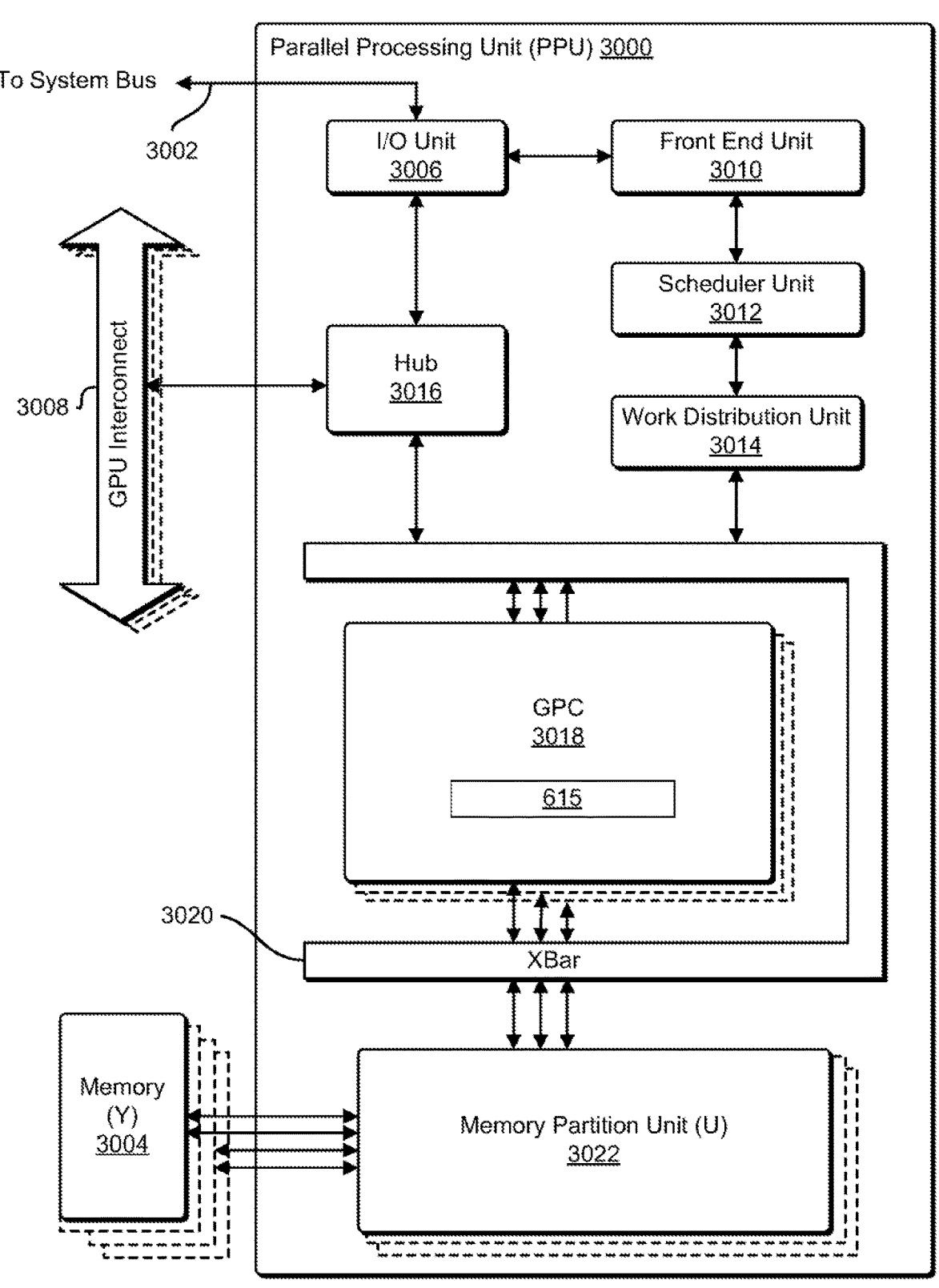
FIG. 30 illustrates a parallel processing unit ("PPU"), according to at least one embodiment.

FIG. 30 illustrates a parallel processing unit ("PPU") 3000, according to at least one embodiment. In at least one embodiment, PPU 3000 is configured with machine-readable code that, if executed by PPU 3000, causes PPU 3000 to perform some or all of processes and techniques described throughout this disclosure. In at least one embodiment, PPU 3000 is a multi-threaded processor that is implemented on one or more integrated circuit devices and that utilizes multithreading as a latency-hiding technique designed to process computer-readable instructions (also referred to as machine-readable instructions or simply instructions) on multiple threads in parallel. In at least one embodiment, PPU 3000 includes one or more graphics cores 1600 In at least one embodiment, a thread refers to a thread of execution and is an instantiation of a set of instructions configured to be executed by PPU 3000. In at least one embodiment, PPU 3000 is a graphics processing unit ("GPU") configured to implement a graphics rendering pipeline for processing three-dimensional ("3D") graphics data in order to generate two-dimensional ("2D") image data for display on a display device such as a liquid crystal display ("LCD") device. In at least one embodiment, PPU 3000 is utilized to perform computations such as linear algebra operations and machine-learning operations. FIG. 30 illustrates an example parallel processor for illustrative purposes only and should be construed as a non-limiting example of processor architectures contemplated within scope of this disclosure and that any suitable processor may be employed to supplement and/or substitute for same.

In at least one embodiment, one or more PPUs 3000 are configured to accelerate High Performance Computing ("HPC"), data center, and machine learning applications. In at least one embodiment, PPU 3000 is configured to accelerate deep learning systems and applications including following non-limiting examples: autonomous vehicle platforms, deep learning, high-accuracy speech, image, text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and more.

In at least one embodiment, PPU 3000 includes, without limitation, an Input/Output ("I/O") unit 3006, a front-end unit 3010, a scheduler (sequencer) unit 3012, a work distribution unit 3014, a hub 3016, a crossbar ("XBar") 3020, one or more general processing clusters ("GPCs") 3018, and one or more partition units ("memory partition units") 3022. In at least one embodiment, PPU 3000 is connected to a host processor or other PPUs 3000 via one or more high-speed GPU interconnects ("GPU interconnects") 3008. In at least one embodiment, PPU 3000 is connected to a host processor or other peripheral devices via a system bus 3002. In at least one embodiment, PPU 3000 is connected to a local memory comprising one or more memory devices ("memory") 3004. In at least one embodiment, memory devices 3004 include, without limitation, one or more dynamic random access memory ("DRAM") devices. In at least one embodiment, one or more DRAM devices are configured and/or configurable as high-bandwidth memory ("HBM") subsystems, with multiple DRAM dies stacked within each device.

In at least one embodiment, high-speed GPU interconnect 3008 may refer to a wire-based multi-lane communications link that is used by systems to scale and include one or more PPUs 3000 combined with one or more central processing units ("CPUs"), supports cache coherence between PPUs 3000 and CPUs, and CPU mastering. In at least one embodiment, data and/or commands are transmitted by high-speed GPU interconnect 3008 through hub 3016 to/from other units of PPU 3000 such as one or more copy engines, video encoders, video decoders, power management units, and other components which may not be explicitly illustrated in FIG. 30.

In at least one embodiment, I/O unit 3006 is configured to transmit and receive communications (e.g., commands, data) from a host processor (not illustrated in FIG. 30) over system bus 3002. In at least one embodiment, I/O unit 3006 communicates with host processor directly via system bus 3002 or through one or more intermediate devices such as a memory bridge. In at least one embodiment, I/O unit 3006 may communicate with one or more other processors, such as one or more of PPUs 3000 via system bus 3002. In at least one embodiment, I/O unit 3006 implements a Peripheral Component Interconnect Express ("PCIe") interface for communications over a PCIe bus. In at least one embodiment, I/O unit 3006 implements interfaces for communicating with external devices.

In at least one embodiment, I/O unit 3006 decodes packets received via system bus 3002. In at least one embodiment, at least some packets represent commands configured to cause PPU 3000 to perform various operations. In at least one embodiment, I/O unit 3006 transmits decoded commands to various other units of PPU 3000 as specified by commands. In at least one embodiment, commands are transmitted to front-end unit 3010 and/or transmitted to hub 3016 or other units of PPU 3000 such as one or more copy engines, a video encoder, a video decoder, a power management unit, etc. (not explicitly illustrated in FIG. 30). In at least one embodiment, I/O unit 3006 is configured to route communications between and among various logical units of PPU 3000.

In at least one embodiment, a program executed by host processor encodes a command stream in a buffer that provides workloads to PPU 3000 for processing. In at least one embodiment, a workload comprises instructions and data to be processed by those instructions. In at least one embodiment, a buffer is a region in a memory that is accessible (e.g., read/write) by both a host processor and PPU 3000—a host interface unit may be configured to access that buffer in a system memory connected to system bus 3002 via memory requests transmitted over system bus 3002 by I/O unit 3006. In at least one embodiment, a host processor writes a command stream to a buffer and then transmits a pointer to a start of a command stream to PPU 3000 such that front-end unit 3010 receives pointers to one or more command streams and manages one or more command streams, reading commands from command streams and forwarding commands to various units of PPU 3000.

In at least one embodiment, front-end unit 3010 is coupled to scheduler unit 3012 (which may be referred to as a sequencer unit, a thread sequencer, and/or an asynchronous compute engine) that conFIGS. various GPCs 3018 to process tasks defined by one or more command streams. In at least one embodiment, scheduler unit 3012 is configured to track state information related to various tasks managed by scheduler unit 3012 where state information may indicate which of GPCs 3018 a task is assigned to, whether task is active or inactive, a priority level associated with task, and so forth. In at least one embodiment, scheduler unit 3012 manages execution of a plurality of tasks on one or more of GPCs 3018.

In at least one embodiment, scheduler unit 3012 is coupled to work distribution unit 3014 that is configured to dispatch tasks for execution on GPCs 3018. In at least one embodiment, work distribution unit 3014 tracks a number of scheduled tasks received from scheduler unit 3012 and work distribution unit 3014 manages a pending task pool and an active task pool for each of GPCs 3018. In at least one embodiment, pending task pool comprises a number of slots (e.g., 32 slots) that contain tasks assigned to be processed by a particular GPC 3018; an active task pool may comprise a number of slots (e.g., 4 slots) for tasks that are actively being processed by GPCs 3018 such that as one of GPCs 3018 completes execution of a task, that task is evicted from that active task pool for GPC 3018 and another task from a pending task pool is selected and scheduled for execution on GPC 3018. In at least one embodiment, if an active task is idle on GPC 3018, such as while waiting for a data dependency to be resolved, then that active task is evicted from GPC 3018 and returned to that pending task pool while another task in that pending task pool is selected and scheduled for execution on GPC 3018.

In at least one embodiment, work distribution unit 3014 communicates with one or more GPCs 3018 via XBar 3020. In at least one embodiment, XBar 3020 is an interconnect network that couples many of units of PPU 3000 to other units of PPU 3000 and can be configured to couple work distribution unit 3014 to a particular GPC 3018. In at least one embodiment, one or more other units of PPU 3000 may also be connected to XBar 3020 via hub 3016.

In at least one embodiment, tasks are managed by scheduler unit 3012 and dispatched to one of GPCs 3018 by work distribution unit 3014. In at least one embodiment, GPC 3018 is configured to process task and generate results. In at least one embodiment, results may be consumed by other tasks within GPC 3018, routed to a different GPC 3018 via XBar 3020, or stored in memory 3004. In at least one embodiment, results can be written to memory 3004 via partition units 3022, which implement a memory interface for reading and writing data to/from memory 3004. In at least one embodiment, results can be transmitted to another PPU or CPU via high-speed GPU interconnect 3008. In at least one embodiment, PPU 3000 includes, without limitation, a number U of partition units 3022 that is equal to a number of separate and distinct memory devices 3004 coupled to PPU 3000, as described in more detail herein in conjunction with FIG. 32.

In at least one embodiment, a host processor executes a driver kernel that implements an application programming interface ("API") that enables one or more applications executing on a host processor to schedule operations for execution on PPU 3000. In at least one embodiment, multiple compute applications are simultaneously executed by PPU 3000 and PPU 3000 provides isolation, quality of service ("QoS"), and independent address spaces for multiple compute applications. In at least one embodiment, an application generates instructions (e.g., in form of API calls) that cause a driver kernel to generate one or more tasks for execution by PPU 3000 and that driver kernel outputs tasks to one or more streams being processed by PPU 3000. In at least one embodiment, each task comprises one or more groups of related threads, which may be referred to as a warp, wavefront, and/or wave. In at least one embodiment, a warp, wavefront, and/or wave comprises a plurality of related threads (e.g., 32 threads) that can be executed in parallel. In at least one embodiment, cooperating threads can refer to a plurality of threads including instructions to perform task and that exchange data through shared memory. In at least one embodiment, threads and cooperating threads are described in more detail in conjunction with FIG. 32.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, deep learning application processor is used to train a machine learning model, such as a neural network, to predict or infer information provided to PPU 3000. In at least one embodiment, deep learning application processor is used to infer or predict information based on a trained machine learning model (e.g., neural network) that has been trained by another processor or system or by PPU 3000. In at least one embodiment, PPU 3000 may be used to perform one or more neural network use cases described herein.

In at least one embodiment, one or more neural networks of an inference and/or training logic 615 may be used in thread execution logic 2900 and provided to a PPU 3000, so that it may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 31:
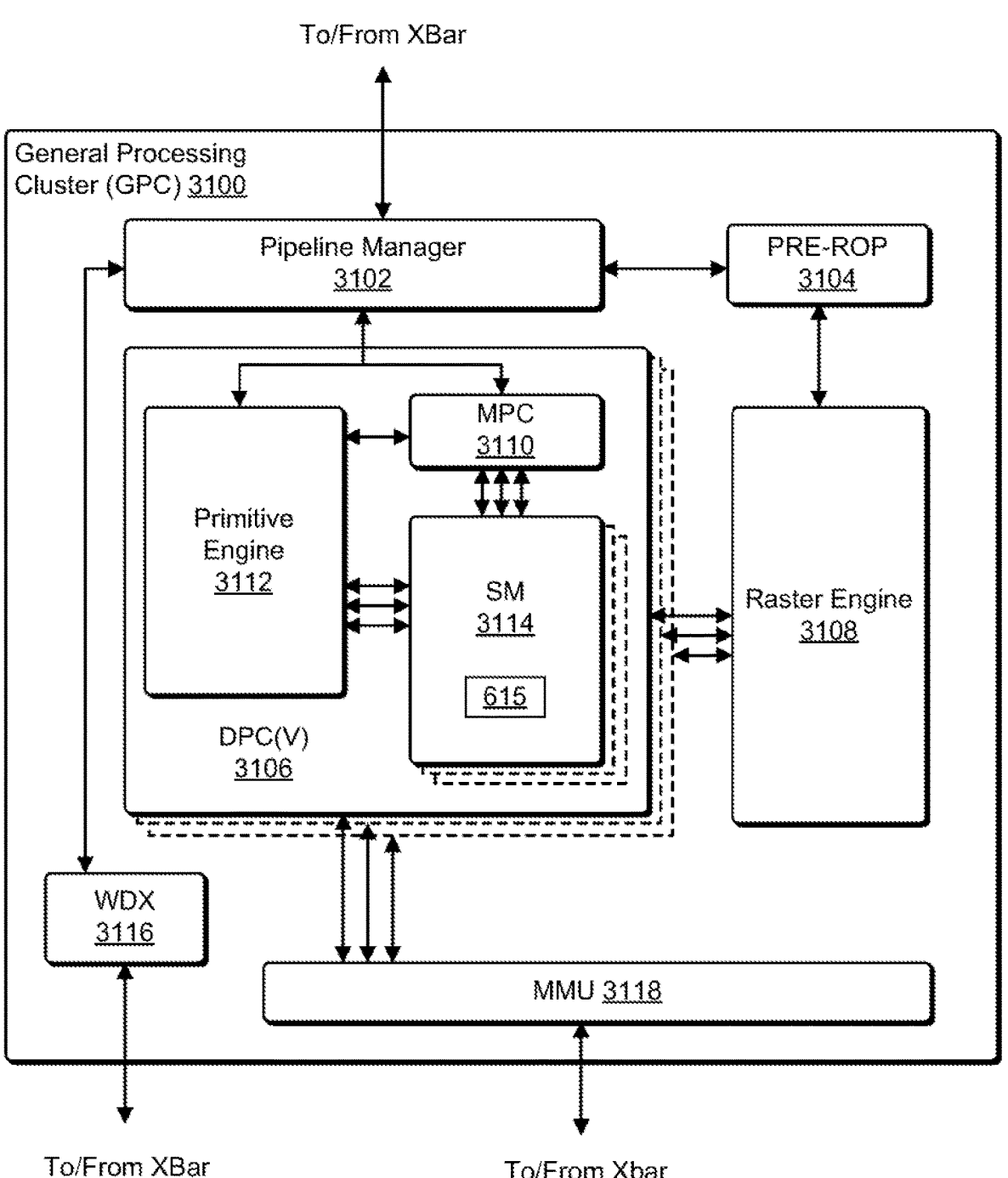
FIG. 31 illustrates a general processing cluster ("GPC"), according to at least one embodiment.

FIG. 31 illustrates a general processing cluster ("GPC") 3100, according to at least one embodiment. In at least one embodiment, GPC 3100 is GPC 3018 of FIG. 30. In at least one embodiment, each GPC 3100 includes, without limitation, a number of hardware units for processing tasks and each GPC 3100 includes, without limitation, a pipeline manager 3102, a pre-raster operations unit ("preROP") 3104, a raster engine 3108, a work distribution crossbar ("WDX") 3116, a memory management unit ("MMU") 3118, one or more Data Processing Clusters ("DPCs") 3106, and any suitable combination of parts.

In at least one embodiment, operation of GPC 3100 is controlled by pipeline manager 3102. In at least one embodiment, pipeline manager 3102 manages configuration of one or more DPCs 3106 for processing tasks allocated to GPC 3100. In at least one embodiment, pipeline manager 3102 conFIGS. at least one of one or more DPCs 3106 to implement at least a portion of a graphics rendering pipeline. In at least one embodiment, DPC 3106 is configured to execute a vertex shader program on a programmable streaming multi-processor ("SM") 3114. In at least one embodiment, pipeline manager 3102 is configured to route packets received from a work distribution unit to appropriate logical units within GPC 3100, in at least one embodiment, and some packets may be routed to fixed function hardware units in preROP 3104 and/or raster engine 3108 while other packets may be routed to DPCs 3106 for processing by a primitive engine 3112 or SM 3114. In at least one embodiment, pipeline manager 3102 conFIGS. at least one of DPCs 3106 to implement a neural network model and/or a computing pipeline.

In at least one embodiment, preROP unit 3104 is configured, in at least one embodiment, to route data generated by raster engine 3108 and DPCs 3106 to a Raster Operations ("ROP") unit in partition unit 3022, described in more detail above in conjunction with FIG. 30. In at least one embodiment, preROP unit 3104 is configured to perform optimizations for color blending, organize pixel data, perform address translations, and more. In at least one embodiment, raster engine 3108 includes, without limitation, a number of fixed function hardware units configured to perform various raster operations, in at least one embodiment, and raster engine 3108 includes, without limitation, a setup engine, a coarse raster engine, a culling engine, a clipping engine, a fine raster engine, a tile coalescing engine, and any suitable combination thereof. In at least one embodiment, setup engine receives transformed vertices and generates plane equations associated with geometric primitive defined by vertices; plane equations are transmitted to a coarse raster engine to generate coverage information (e.g., an x, y coverage mask for a tile) for primitive; output of a coarse raster engine is transmitted to a culling engine where fragments associated with a primitive that fail a z-test are culled, and transmitted to a clipping engine where fragments lying outside a viewing frustum are clipped. In at least one embodiment, fragments that survive clipping and culling are passed to a fine raster engine to generate attributes for pixel fragments based on plane equations generated by a setup engine. In at least one embodiment, an output of raster engine 3108 comprises fragments to be processed by any suitable entity, such as by a fragment shader implemented within DPC 3106.

In at least one embodiment, each DPC 3106 included in GPC 3100 comprises, without limitation, an M-Pipe Controller ("MPC") 3110; primitive engine 3112; one or more SMs 3114; and any suitable combination thereof. In at least one embodiment, MPC 3110 controls operation of DPC 3106, routing packets received from pipeline manager 3102 to appropriate units in DPC 3106. In at least one embodiment, packets associated with a vertex are routed to primitive engine 3112, which is configured to fetch vertex attributes associated with a vertex from memory; in contrast, packets associated with a shader program may be transmitted to SM 3114.

In at least one embodiment, SM 3114 comprises, without limitation, a programmable streaming processor that is configured to process tasks represented by a number of threads. In at least one embodiment, SM 3114 is multi-threaded and configured to execute a plurality of threads (e.g., 32 threads) from a particular group of threads concurrently and implements a Single-Instruction, Multiple-Data ("SIMD") architecture where each thread in a group of threads (e.g., a warp, wavefront, wave) is configured to process a different set of data based on same set of instructions. In at least one embodiment, all threads in group of threads execute a common set of instructions. In at least one embodiment, SM 3114 implements a Single-Instruction, Multiple Thread ("SIMT") architecture wherein each thread in a group of threads is configured to process a different set of data based on that common set of instructions, but where individual threads in a group of threads are allowed to diverge during execution. In at least one embodiment, a program counter, call stack, and execution state is maintained for each warp (which may be referred to as wavefronts and/or waves), enabling concurrency between warps and serial execution within warps when threads within a warp diverge. In another embodiment, a program counter, call stack, and execution state is maintained for each individual thread, enabling equal concurrency between all threads, within and between warps. In at least one embodiment, execution state is maintained for each individual thread and threads executing common instructions may be converged and executed in parallel for better efficiency. At least one embodiment of SM 3114 is described in more detail herein.

In at least one embodiment, MMU 3118 provides an interface between GPC 3100 and a memory partition unit (e.g., partition unit 3022 of FIG. 30) and MMU 3118 provides translation of virtual addresses into physical addresses, memory protection, and arbitration of memory requests. In at least one embodiment, MMU 3118 provides one or more translation lookaside buffers ("TLBs") for performing translation of virtual addresses into physical addresses in memory.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, deep learning application processor is used to train a machine learning model, such as a neural network, to predict or infer information provided to GPC 3100. In at least one embodiment, GPC 3100 is used to infer or predict information based on a trained machine learning model (e.g., neural network) that has been trained by another processor or system or by GPC 3100. In at least one embodiment, GPC 3100 may be used to perform one or more neural network use cases described herein.

In at least one embodiment, one or more neural networks of an inference and/or training logic 615 may be used in GPC 3100, so that it may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 32:
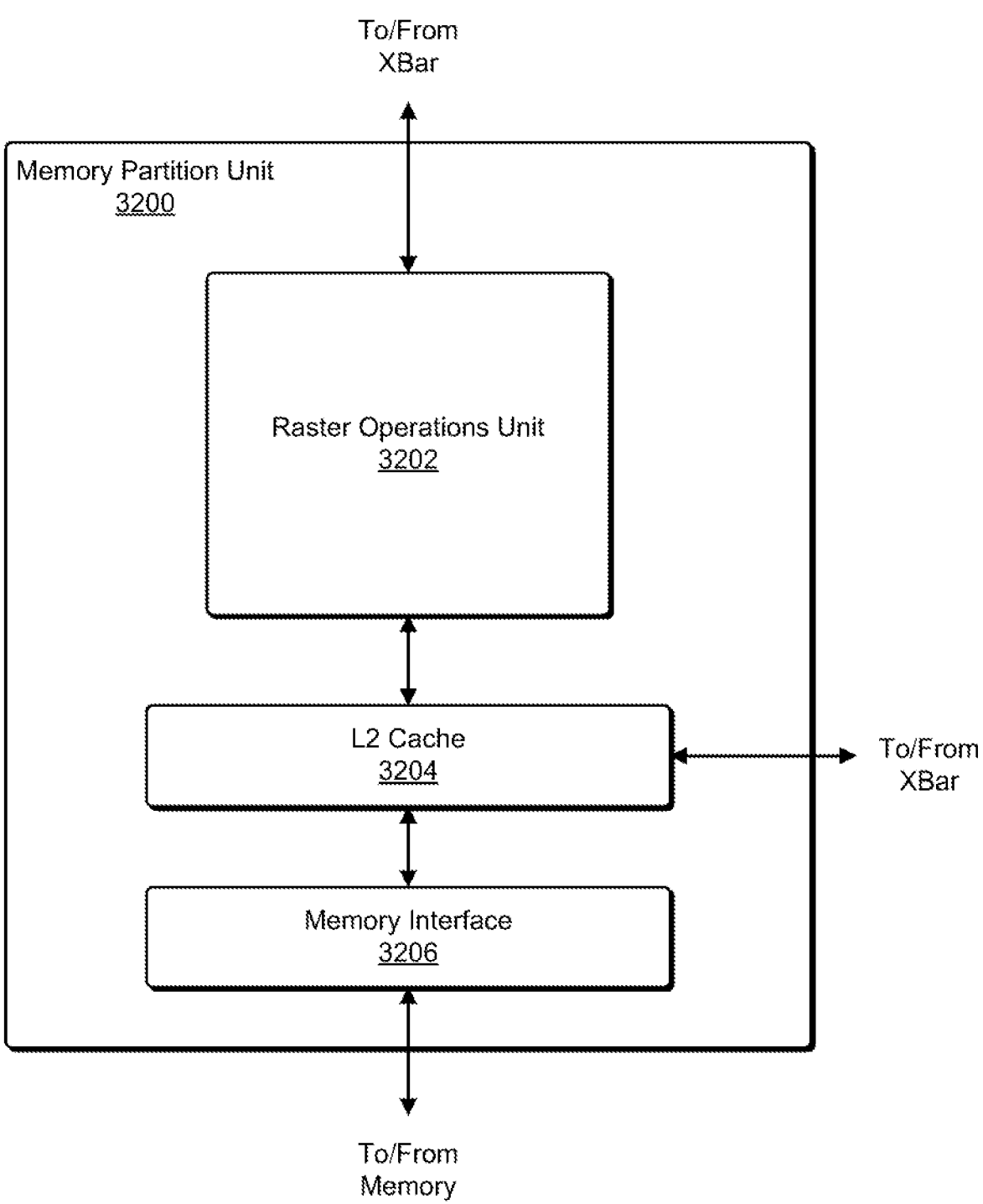
FIG. 32 illustrates a memory partition unit of a parallel processing unit ("PPU"), according to at least one embodiment.

FIG. 32 illustrates a memory partition unit 3200 of a parallel processing unit ("PPU"), in accordance with at least one embodiment. In at least one embodiment, memory partition unit 3200 includes, without limitation, a Raster Operations ("ROP") unit 3202, a level two ("L2") cache 3204, a memory interface 3206, and any suitable combination thereof. In at least one embodiment, memory interface 3206 is coupled to memory. In at least one embodiment, memory interface 3206 may implement 32, 64, 128, 1024-bit data buses, or like, for high-speed data transfer. In at least one embodiment, PPU incorporates U memory interfaces 3206 where U is a positive integer, with one memory interface 3206 per pair of partition units 3200, where each pair of partition units 3200 is connected to a corresponding memory device. For example, in at least one embodiment, PPU may be connected to up to Y memory devices, such as high bandwidth memory stacks or graphics double-data-rate, version 5, synchronous dynamic random access memory ("GDDR5 SDRAM").

In at least one embodiment, memory interface 3206 implements a high bandwidth memory second generation ("HBM2") memory interface and Y equals half of U. In at least one embodiment, HBM2 memory stacks are located on a physical package with a PPU, providing substantial power and area savings compared with conventional GDDR5 SDRAM systems. In at least one embodiment, each HBM2 stack includes, without limitation, four memory dies with Y=4, with each HBM2 stack including two 128-bit channels per die for a total of 8 channels and a data bus width of 1024 bits. In at least one embodiment, that memory supports Single-Error Correcting Double-Error Detecting ("SECDED") Error Correction Code ("ECC") to protect data. In at least one embodiment, ECC can provide higher reliability for compute applications that are sensitive to data corruption.

In at least one embodiment, PPU implements a multi-level memory hierarchy. In at least one embodiment, memory partition unit 3200 supports a unified memory to provide a single unified virtual address space for central processing unit ("CPU") and PPU memory, enabling data sharing between virtual memory systems. In at least one embodiment frequency of accesses by a PPU to a memory located on other processors is traced to ensure that memory pages are moved to physical memory of PPU that is accessing pages more frequently. In at least one embodiment, high-speed GPU interconnect 3008 supports address translation services allowing PPU to directly access a CPU's page tables and providing full access to CPU memory by a PPU.

In at least one embodiment, copy engines transfer data between multiple PPUs or between PPUs and CPUs. In at least one embodiment, copy engines can generate page faults for addresses that are not mapped into page tables and memory partition unit 3200 then services page faults, mapping addresses into page table, after which copy engine performs a transfer. In at least one embodiment, memory is pinned (i.e., non-pageable) for multiple copy engine operations between multiple processors, substantially reducing available memory. In at least one embodiment, with hardware page faulting, addresses can be passed to copy engines without regard as to whether memory pages are resident, and a copy process is transparent.

Data from memory 3004 of FIG. 30 or other system memory is fetched by memory partition unit 3200 and stored in L2 cache 3204, which is located on-chip and is shared between various GPCs, in accordance with at least one embodiment. Each memory partition unit 3200, in at least one embodiment, includes, without limitation, at least a portion of L2 cache associated with a corresponding memory device. In at least one embodiment, lower level caches are implemented in various units within GPCs. In at least one embodiment, each of SMs 3114 in FIG. 31 may implement a Level 1 ("L1") cache wherein that L1 cache is private memory that is dedicated to a particular SM 3114 and data from L2 cache 3204 is fetched and stored in each L1 cache for processing in functional units of SMs 3114. In at least one embodiment, L2 cache 3204 is coupled to memory interface 3206 and XBar 3020 shown in FIG. 30.

ROP unit 3202 performs graphics raster operations related to pixel color, such as color compression, pixel blending, and more, in at least one embodiment. ROP unit 3202, in at least one embodiment, implements depth testing in conjunction with raster engine 3108, receiving a depth for a sample location associated with a pixel fragment from a culling engine of raster engine 3108. In at least one embodiment, depth is tested against a corresponding depth in a depth buffer for a sample location associated with a fragment. In at least one embodiment, if that fragment passes that depth test for that sample location, then ROP unit 3202 updates depth buffer and transmits a result of that depth test to raster engine 3108. It will be appreciated that a number of partition units 3200 may be different than a number of GPCs and, therefore, each ROP unit 3202 can, in at least one embodiment, be coupled to each GPC. In at least one embodiment, ROP unit 3202 tracks packets received from different GPCs and determines whether a result generated by ROP unit 3202 is to be routed to through XBar 3020.

Figure 33:
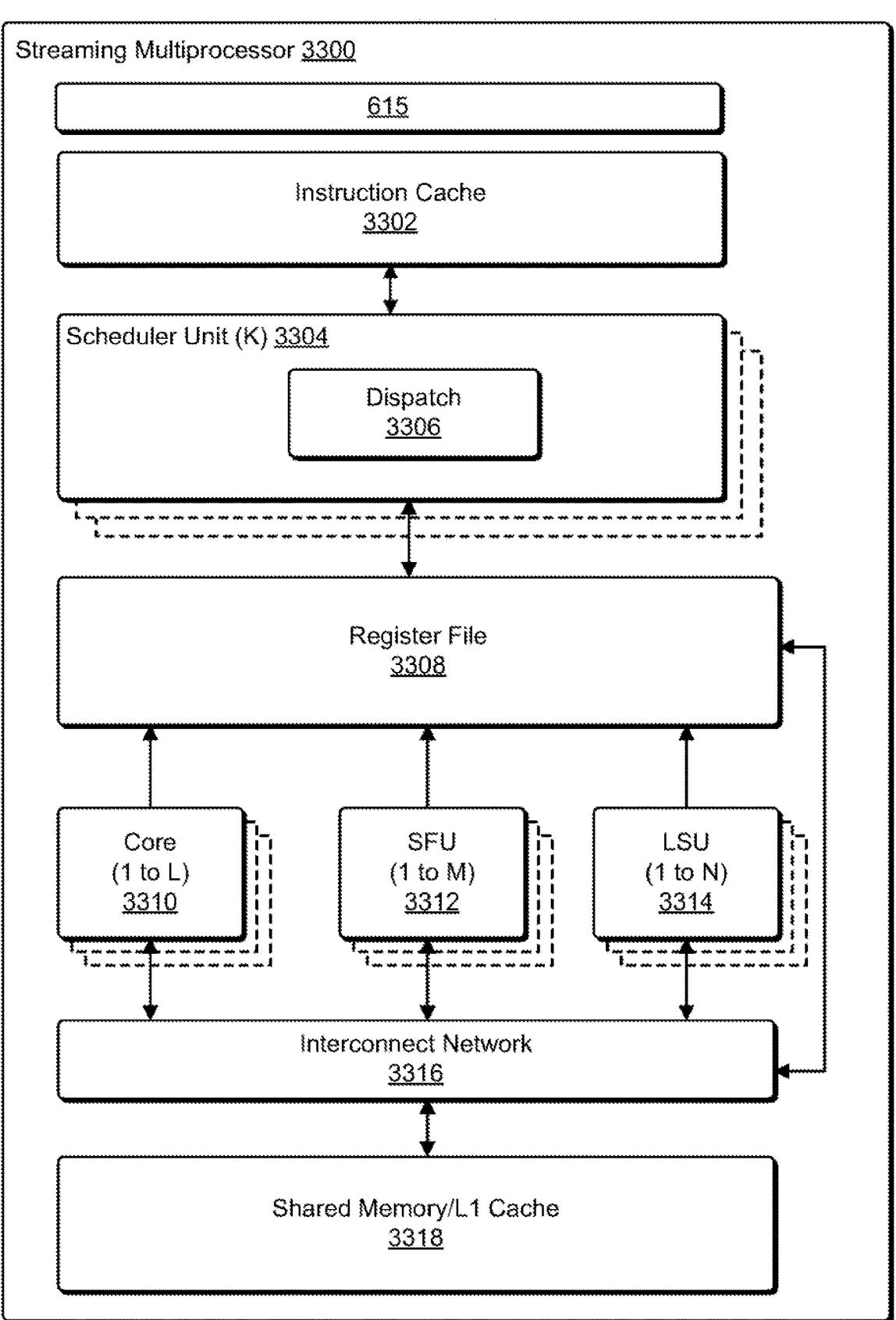
FIG. 33 illustrates a streaming multi-processor, according to at least one embodiment.

FIG. 33 illustrates a streaming multi-processor ("SM") 3300, according to at least one embodiment. In at least one embodiment, SM 3300 is SM of FIG. 31. In at least one embodiment, SM 3300 includes, without limitation, an instruction cache 3302, one or more scheduler units 3304 (which may be referred to as sequencer units), a register file 3308, one or more processing cores ("cores") 3310, one or more special function units ("SFUs") 3312, one or more load/store units ("LSUs") 3314, an interconnect network 3316, a shared memory/level one ("L1") cache 3318, and/or any suitable combination thereof. In at least one embodiment, LSUs 3314 perform load of store operations corresponding to loading/storing data (e.g., instructions) to perform an operation (e.g., perform an API, an API call).

In at least one embodiment, a work distribution unit dispatches tasks for execution on general processing clusters ("GPCs") of parallel processing units ("PPUs") and each task is allocated to a particular Data Processing Cluster ("DPC") within a GPC and, if a task is associated with a shader program, that task is allocated to one of SMs 3300 (which may be referred to as CUs and/or slices). In at least one embodiment, scheduler unit 3304 (which may be referred to as a sequencer and/or asynchronous compute engine) receives tasks from a work distribution unit and manages instruction scheduling for one or more thread blocks assigned to SM 3300. In at least one embodiment, scheduler unit 3304 schedules thread blocks for execution as warps (which may be referred to as wavefronts and/or waves) of parallel threads, wherein each thread block is allocated at least one warp. In at least one embodiment, each warp executes threads. In at least one embodiment, scheduler unit 3304 manages a plurality of different thread blocks, allocating warps to different thread blocks and then dispatching instructions from plurality of different cooperative groups to various functional units (e.g., processing cores 3310, SFUs 3312, and LSUs 3314) during each clock cycle.

In at least one embodiment, Cooperative Groups (which may also be referred to as wavefronts and/or waves) may refer to a programming model for organizing groups of communicating threads that allows developers to express granularity at which threads are communicating, enabling expression of richer, more efficient parallel decompositions. In at least one embodiment, cooperative launch APIs support synchronization amongst thread blocks for execution of parallel algorithms. In at least one embodiment, applications of conventional programming models provide a single, simple construct for synchronizing cooperating threads: a barrier across all threads of a thread block (e.g., syncthreads( ) function). However, in at least one embodiment, programmers may define groups of threads at smaller than thread block granularities and synchronize within defined groups to enable greater performance, design flexibility, and software reuse in form of collective group-wide function interfaces. In at least one embodiment, Cooperative Groups enables programmers to define groups of threads explicitly at sub-block (i.e., as small as a single thread) and multi-block granularities, and to perform collective operations such as synchronization on threads in a cooperative group. In at least one embodiment, that programming model supports clean composition across software boundaries, so that libraries and utility functions can synchronize safely within their local context without having to make assumptions about convergence. In at least one embodiment, Cooperative Groups primitives enable new patterns of cooperative parallelism, including, without limitation, producer-consumer parallelism, opportunistic parallelism, and global synchronization across an entire grid of thread blocks.

In at least one embodiment, a dispatch unit 3306 is configured to transmit instructions to one or more functional units and scheduler unit 3304 and includes, without limitation, two dispatch units 3306 that enable two different instructions from a common warp to be dispatched during each clock cycle. In at least one embodiment, each scheduler unit 3304 includes a single dispatch unit 3306 or additional dispatch units 3306.

In at least one embodiment, each SM 3300 (which may be referred to as a CU and/or slice), in at least one embodiment, includes, without limitation, register file 3308 that provides a set of registers for functional units of SM 3300. In at least one embodiment, register file 3308 is divided between each functional unit such that each functional unit is allocated a dedicated portion of register file 3308. In at least one embodiment, register file 3308 is divided between different warps being executed by SM 3300 and register file 3308 provides temporary storage for operands connected to data paths of functional units. In at least one embodiment, each SM 3300 comprises, without limitation, a plurality of L processing cores 3310, where L is a positive integer. In at least one embodiment, SM 3300 includes, without limitation, a large number (e.g., 128 or more) of distinct processing cores 3310. In at least one embodiment, each processing core 3310 includes, without limitation, a fully-pipelined, single-precision, double-precision, and/or mixed precision processing unit that includes, without limitation, a floating point arithmetic logic unit and an integer arithmetic logic unit. In at least one embodiment, floating point arithmetic logic units implement IEEE 754-2008 standard for floating point arithmetic. In at least one embodiment, processing cores 3310 include, without limitation, 64 single-precision (32-bit) floating point cores, 64 integer cores, 32 double-precision (64-bit) floating point cores, and 8 tensor cores.

Tensor cores are configured to perform matrix operations in accordance with at least one embodiment. In at least one embodiment, one or more tensor cores are included in processing cores 3310. In at least one embodiment, tensor cores are configured to perform deep learning matrix arithmetic, such as convolution operations for neural network training and inferencing. In at least one embodiment, each tensor core operates on a 4×4 matrix and performs a matrix multiply and accumulate operation, D=A×B+C, where A, B, C, and D are 4×4 matrices.

In at least one embodiment, matrix multiply inputs A and B are 16-bit floating point matrices and accumulation matrices C and D are 16-bit floating point or 32-bit floating point matrices. In at least one embodiment, tensor cores operate on 16-bit floating point input data with 32-bit floating point accumulation. In at least one embodiment, 16-bit floating point multiply uses 64 operations and results in a full precision product that is then accumulated using 32-bit floating point addition with other intermediate products for a 4×4×4 matrix multiply. Tensor cores are used to perform much larger two-dimensional or higher dimensional matrix operations, built up from these smaller elements, in at least one embodiment. In at least one embodiment, an API, such as a CUDA 9 C++ API, exposes specialized matrix load, matrix multiply and accumulate, and matrix store operations to efficiently use tensor cores from a CUDA-C++ program. In at least one embodiment, at a CUDA level, a warp-level interface assumes 16×16 size matrices spanning all 32 threads of warp (which may be referred to as a wavefront and/or wave).

In at least one embodiment, each SM 3300 comprises, without limitation, M SFUs 3312 that perform special functions (e.g., attribute evaluation, reciprocal square root, and like). In at least one embodiment, SFUs 3312 include, without limitation, a tree traversal unit configured to traverse a hierarchical tree data structure. In at least one embodiment, SFUs 3312 include, without limitation, a texture unit configured to perform texture map filtering operations. In at least one embodiment, texture units are configured to load texture maps (e.g., a 2D array of texels) from memory and sample texture maps to produce sampled texture values for use in shader programs executed by SM 3300. In at least one embodiment, texture maps are stored in shared memory/L1 cache 3318. In at least one embodiment, texture units implement texture operations such as filtering operations using mip-maps (e.g., texture maps of varying levels of detail), in accordance with at least one embodiment. In at least one embodiment, each SM 3300 includes, without limitation, two texture units.

Each SM 3300 comprises, without limitation, N LSUs 3314 that implement load and store operations between shared memory/L1 cache 3318 and register file 3308, in at least one embodiment. Interconnect network 3316 connects each functional unit to register file 3308 and LSU 3314 to register file 3308 and shared memory/L1 cache 3318 in at least one embodiment. In at least one embodiment, interconnect network 3316 is a crossbar that can be configured to connect any functional units to any registers in register file 3308 and connect LSUs 3314 to register file 3308 and memory locations in shared memory/L1 cache 3318.

In at least one embodiment, shared memory/L1 cache 3318 is an array of on-chip memory that allows for data storage and communication between SM 3300 and primitive engine and between threads in SM 3300, in at least one embodiment. In at least one embodiment, shared memory/L1 cache 3318 comprises, without limitation, 128 KB of storage capacity and is in a path from SM 3300 to a partition unit. In at least one embodiment, shared memory/L1 cache 3318, in at least one embodiment, is used to cache reads and writes. In at least one embodiment, one or more of shared memory/L1 cache 3318, L2 cache, and memory are backing stores.

Combining data cache and shared memory functionality into a single memory block provides improved performance for both types of memory accesses, in at least one embodiment. In at least one embodiment, capacity is used or is usable as a cache by programs that do not use shared memory, such as if shared memory is configured to use half of a capacity, and texture and load/store operations can use remaining capacity. Integration within shared memory/L1 cache 3318 enables shared memory/L1 cache 3318 to function as a high-throughput conduit for streaming data while simultaneously providing high-bandwidth and low-latency access to frequently reused data, in accordance with at least one embodiment. In at least one embodiment, when configured for general purpose parallel computation, a simpler configuration can be used compared with graphics processing. In at least one embodiment, fixed function graphics processing units are bypassed, creating a much simpler programming model. In a general purpose parallel computation configuration, a work distribution unit assigns and distributes blocks of threads directly to DPCs, in at least one embodiment. In at least one embodiment, threads in a block execute a common program, using a unique thread ID in calculation to ensure each thread generates unique results, using SM 3300 to execute program and perform calculations, shared memory/L1 cache 3318 to communicate between threads, and LSU 3314 to read and write global memory through shared memory/L1 cache 3318 and memory partition unit. In at least one embodiment, when configured for general purpose parallel computation, SM 3300 writes commands that scheduler unit 3304 can use to launch new work on DPCs.

In at least one embodiment, a PPU is included in or coupled to a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, and more. In at least one embodiment, a PPU is embodied on a single semiconductor substrate. In at least one embodiment, a PPU is included in a system-on-a-chip ("SoC") along with one or more other devices such as additional PPUs, memory, a reduced instruction set computer ("RISC") CPU, a memory management unit ("MMU"), a digital-to-analog converter ("DAC"), and like.

In at least one embodiment, a PPU may be included on a graphics card that includes one or more memory devices. In at least one embodiment, that graphics card may be configured to interface with a PCIe slot on a motherboard of a desktop computer. In at least one embodiment, that PPU may be an integrated graphics processing unit ("iGPU") included in chipset of a motherboard.

Inference and/or training logic 615 are used to perform inferencing and/or training operations associated with one or more embodiments. Details regarding inference and/or training logic 615 are provided herein in conjunction with FIGS. 6A and/or 6B. In at least one embodiment, deep learning application processor is used to train a machine learning model, such as a neural network, to predict or infer information provided to SM 3300. In at least one embodiment, SM 3300 is used to infer or predict information based on a trained machine learning model (e.g., neural network) that has been trained by another processor or system or by SM 3300. In at least one embodiment, SM 3300 may be used to perform one or more neural network use cases described herein.

In at least one embodiment, one or more neural networks of an inference and/or training logic 615 may be used in SM 3300, so that it may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Embodiments are disclosed related a virtualized computing platform for advanced computing, such as image inferencing and image processing in medical applications. Without limitation, embodiments may include radiography, magnetic resonance imaging (MRI), nuclear medicine, ultrasound, sonography, elastography, photoacoustic imaging, tomography, echocardiography, functional near-infrared spectroscopy, and magnetic particle imaging, or a combination thereof. In at least one embodiment, a virtualized computing platform and associated processes described herein may additionally or alternatively be used, without limitation, in forensic science analysis, sub-surface detection and imaging (e.g., oil exploration, archaeology, paleontology, etc.), topography, oceanography, geology, osteology, meteorology, intelligent area or object tracking and monitoring, sensor data processing (e.g., RADAR, SONAR, LIDAR, etc.), and/or genomics and gene sequencing.

Figure 34:
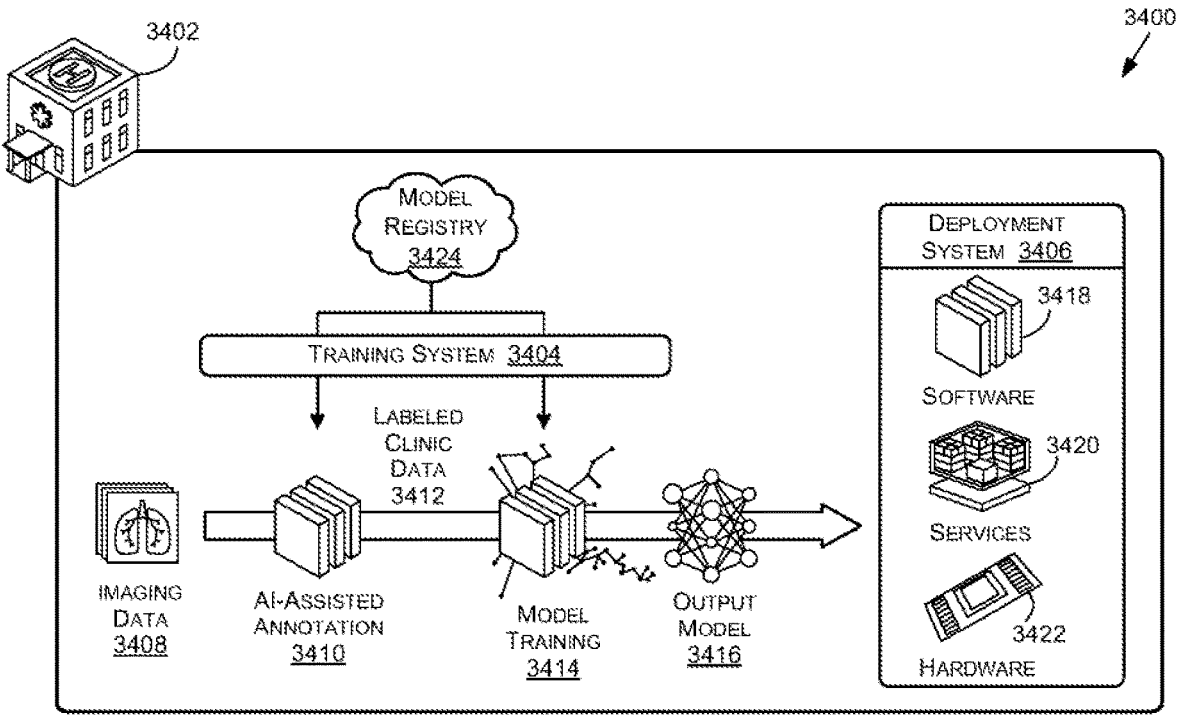
FIG. 34 is an example data flow diagram for an advanced computing pipeline, in accordance with at least one embodiment.

With reference to FIG. 34, FIG. 34 is an example data flow diagram for a process 3400 of generating and deploying an image processing and inferencing pipeline, in accordance with at least one embodiment. In at least one embodiment, process 3400 may be deployed for use with imaging devices, processing devices, genomics devices, gene sequencing devices, radiology devices, and/or other device types at one or more facilities 3402, such as medical facilities, hospitals, healthcare institutes, clinics, research or diagnostic labs, etc. In at least one embodiment, process 3400 may be deployed to perform genomics analysis and inferencing on sequencing data. Examples of genomic analyses that may be performed using systems and processes described herein include, without limitation, variant calling, mutation detection, and gene expression quantification.

In at least one embodiment, process 3400 may be executed within a training system 3404 and/or a deployment system 3406. In at least one embodiment, training system 3404 may be used to perform training, deployment, and implementation of machine learning models (e.g., neural networks, object detection algorithms, computer vision algorithms, etc.) for use in deployment system 3406. In at least one embodiment, deployment system 3406 may be configured to offload processing and compute resources among a distributed computing environment to reduce infrastructure requirements at facility 3402. In at least one embodiment, deployment system 3406 may provide a streamlined platform for selecting, customizing, and implementing virtual instruments for use with imaging devices (e.g., Mill, CT Scan, X-Ray, Ultrasound, etc.) or sequencing devices at facility 3402. In at least one embodiment, virtual instruments may include software-defined applications for performing one or more processing operations with respect to imaging data generated by imaging devices, sequencing devices, radiology devices, and/or other device types. In at least one embodiment, one or more applications in a pipeline may use or call upon services (e.g., inference, visualization, compute, AI, etc.) of deployment system 3406 during execution of applications.

In at least one embodiment, some of applications used in advanced processing and inferencing pipelines may use machine learning models or other AI to perform one or more processing steps. In at least one embodiment, machine learning models may be trained at facility 3402 using data 3408 (such as imaging data) generated at facility 3402 (and stored on one or more picture archiving and communication system (PACS) servers at facility 3402), may be trained using imaging or sequencing data 3408 from another facility or facilities (e.g., a different hospital, lab, clinic, etc.), or a combination thereof. In at least one embodiment, training system 3404 may be used to provide applications, services, and/or other resources for generating working, deployable machine learning models for deployment system 3406.

In at least one embodiment, a model registry 3424 may be backed by object storage that may support versioning and object metadata. In at least one embodiment, object storage may be accessible through, for example, a cloud storage (e.g., a cloud 3526 of FIG. 35) compatible application programming interface (API) from within a cloud platform. In at least one embodiment, machine learning models within model registry 3424 may uploaded, listed, modified, or deleted by developers or partners of a system interacting with an API. In at least one embodiment, an API may provide access to methods that allow users with appropriate credentials to associate models with applications, such that models may be executed as part of execution of containerized instantiations of applications.

In at least one embodiment, a training pipeline 3504 (FIG. 35) may include a scenario where facility 3402 is training their own machine learning model, or has an existing machine learning model that needs to be optimized or updated. In at least one embodiment, imaging data 3408 generated by imaging device(s), sequencing devices, and/or other device types may be received. In at least one embodiment, once imaging data 3408 is received, AI-assisted annotation 3410 may be used to aid in generating annotations corresponding to imaging data 3408 to be used as ground truth data for a machine learning model. In at least one embodiment, AI-assisted annotation 3410 may include one or more machine learning models (e.g., convolutional neural networks (CNNs)) that may be trained to generate annotations corresponding to certain types of imaging data 3408 (e.g., from certain devices) and/or certain types of anomalies in imaging data 3408. In at least one embodiment, AI-assisted annotations 3410 may then be used directly, or may be adjusted or fine-tuned using an annotation tool (e.g., by a researcher, a clinician, a doctor, a scientist, etc.), to generate ground truth data. In at least one embodiment, in some examples, labeled clinic data 3412 (e.g., annotations provided by a clinician, doctor, scientist, technician, etc.) may be used as ground truth data for training a machine learning model. In at least one embodiment, AI-assisted annotations 3410, labeled clinic data 3412, or a combination thereof may be used as ground truth data for training a machine learning model. In at least one embodiment, a trained machine learning model may be referred to as an output model 3416, and may be used by deployment system 3406, as described herein.

In at least one embodiment, training pipeline 3504 (FIG. 35) may include a scenario where facility 3402 needs a machine learning model for use in performing one or more processing tasks for one or more applications in deployment system 3406, but facility 3402 may not currently have such a machine learning model (or may not have a model that is optimized, efficient, or effective for such purposes). In at least one embodiment, an existing machine learning model may be selected from model registry 3424. In at least one embodiment, model registry 3424 may include machine learning models trained to perform a variety of different inference tasks on imaging data. In at least one embodiment, machine learning models in model registry 3424 may have been trained on imaging data from different facilities than facility 3402 (e.g., facilities remotely located). In at least one embodiment, machine learning models may have been trained on imaging data from one location, two locations, or any number of locations. In at least one embodiment, when being trained on imaging data from a specific location, training may take place at that location, or at least in a manner that protects confidentiality of imaging data or restricts imaging data from being transferred off-premises (e.g., to comply with HIPAA regulations, privacy regulations, etc.). In at least one embodiment, once a model is trained—or partially trained—at one location, a machine learning model may be added to model registry 3424. In at least one embodiment, a machine learning model may then be retrained, or updated, at any number of other facilities, and a retrained or updated model may be made available in model registry 3424. In at least one embodiment, a machine learning model may then be selected from model registry 3424—and referred to as output model 3416—and may be used in deployment system 3406 to perform one or more processing tasks for one or more applications of a deployment system.

In at least one embodiment, training pipeline 3504 (FIG. 35) may be used in a scenario that includes facility 3402 requiring a machine learning model for use in performing one or more processing tasks for one or more applications in deployment system 3406, but facility 3402 may not currently have such a machine learning model (or may not have a model that is optimized, efficient, or effective for such purposes). In at least one embodiment, a machine learning model selected from model registry 3424 might not be fine-tuned or optimized for imaging data 3408 generated at facility 3402 because of differences in populations, genetic variations, robustness of training data used to train a machine learning model, diversity in anomalies of training data, and/or other issues with training data. In at least one embodiment, AI-assisted annotation 3410 may be used to aid in generating annotations corresponding to imaging data 3408 to be used as ground truth data for retraining or updating a machine learning model. In at least one embodiment, labeled clinic data 3412 (e.g., annotations provided by a clinician, doctor, scientist, etc.) may be used as ground truth data for training a machine learning model. In at least one embodiment, retraining or updating a machine learning model may be referred to as model training 3414. In at least one embodiment, model training 3414—e.g., AI-assisted annotations 3410, labeled clinic data 3412, or a combination thereof—may be used as ground truth data for retraining or updating a machine learning model.

In at least one embodiment, deployment system 3406 may include software 3418, services 3420, hardware 3422, and/or other components, features, and functionality. In at least one embodiment, deployment system 3406 may include a software "stack," such that software 3418 may be built on top of services 3420 and may use services 3420 to perform some or all of processing tasks, and services 3420 and software 3418 may be built on top of hardware 3422 and use hardware 3422 to execute processing, storage, and/or other compute tasks of deployment system 3406.

In at least one embodiment, software 3418 may include any number of different containers, where each container may execute an instantiation of an application. In at least one embodiment, each application may perform one or more processing tasks in an advanced processing and inferencing pipeline (e.g., inferencing, object detection, feature detection, segmentation, image enhancement, calibration, etc.). In at least one embodiment, for each type of imaging device (e.g., CT, MM, X-Ray, ultrasound, sonography, echocardiography, etc.), sequencing device, radiology device, genomics device, etc., there may be any number of containers that may perform a data processing task with respect to imaging data 3408 (or other data types, such as those described herein) generated by a device. In at least one embodiment, an advanced processing and inferencing pipeline may be defined based on selections of different containers that are desired or required for processing imaging data 3408, in addition to containers that receive and configure imaging data for use by each container and/or for use by facility 3402 after processing through a pipeline (e.g., to convert outputs back to a usable data type, such as digital imaging and communications in medicine (DICOM) data, radiology information system (RIS) data, clinical information system (CIS) data, remote procedure call (RPC) data, data substantially compliant with a representation state transfer (REST) interface, data substantially compliant with a file-based interface, and/or raw data, for storage and display at facility 3402). In at least one embodiment, a combination of containers within software 3418 (e.g., that make up a pipeline) may be referred to as a virtual instrument (as described in more detail herein), and a virtual instrument may leverage services 3420 and hardware 3422 to execute some or all processing tasks of applications instantiated in containers.

In at least one embodiment, a data processing pipeline may receive input data (e.g., imaging data 3408) in a DICOM, RIS, CIS, REST compliant, RPC, raw, and/or other format in response to an inference request (e.g., a request from a user of deployment system 3406, such as a clinician, a doctor, a radiologist, etc.). In at least one embodiment, input data may be representative of one or more images, video, and/or other data representations generated by one or more imaging devices, sequencing devices, radiology devices, genomics devices, and/or other device types. In at least one embodiment, data may undergo pre-processing as part of data processing pipeline to prepare data for processing by one or more applications. In at least one embodiment, post-processing may be performed on an output of one or more inferencing tasks or other processing tasks of a pipeline to prepare an output data for a next application and/or to prepare output data for transmission and/or use by a user (e.g., as a response to an inference request). In at least one embodiment, inferencing tasks may be performed by one or more machine learning models, such as trained or deployed neural networks, which may include output models 3416 of training system 3404.

In at least one embodiment, tasks of data processing pipeline may be encapsulated in a container(s) that each represent a discrete, fully functional instantiation of an application and virtualized computing environment that is able to reference machine learning models. In at least one embodiment, containers or applications may be published into a private (e.g., limited access) area of a container registry (described in more detail herein), and trained or deployed models may be stored in model registry 3424 and associated with one or more applications. In at least one embodiment, images of applications (e.g., container images) may be available in a container registry, and once selected by a user from a container registry for deployment in a pipeline, an image may be used to generate a container for an instantiation of an application for use by a user's system.

In at least one embodiment, developers (e.g., software developers, clinicians, doctors, etc.) may develop, publish, and store applications (e.g., as containers) for performing image processing and/or inferencing on supplied data. In at least one embodiment, development, publishing, and/or storing may be performed using a software development kit (SDK) associated with a system (e.g., to ensure that an application and/or container developed is compliant with or compatible with a system). In at least one embodiment, an application that is developed may be tested locally (e.g., at a first facility, on data from a first facility) with an SDK which may support at least some of services 3420 as a system (e.g., system 3500 of FIG. 35). In at least one embodiment, because DICOM objects may contain anywhere from one to hundreds of images or other data types, and due to a variation in data, a developer may be responsible for managing (e.g., setting constructs for, building pre-processing into an application, etc.) extraction and preparation of incoming DICOM data. In at least one embodiment, once validated by system 3500 (e.g., for accuracy, safety, patient privacy, etc.), an application may be available in a container registry for selection and/or implementation by a user (e.g., a hospital, clinic, lab, healthcare provider, etc.) to perform one or more processing tasks with respect to data at a facility (e.g., a second facility) of a user.

Figure 35:
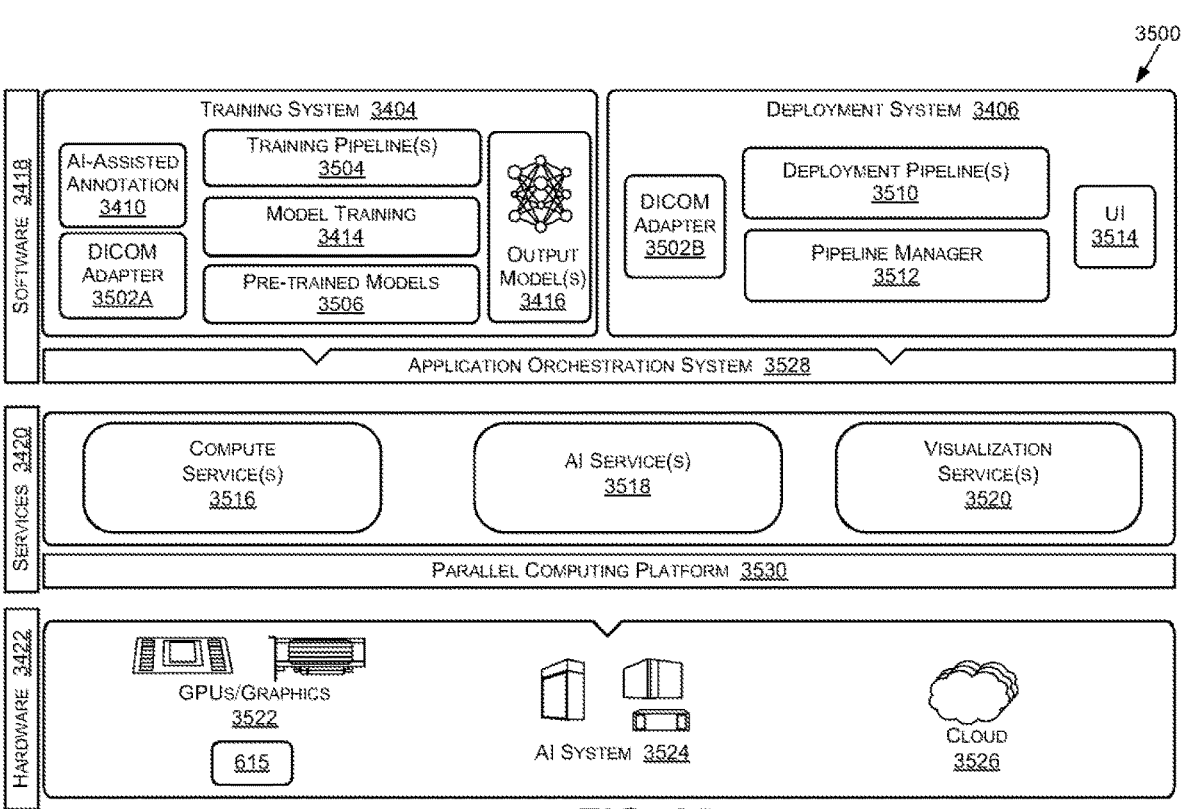
FIG. 35 is a system diagram for an example system for training, adapting, instantiating and deploying machine learning models in an advanced computing pipeline, in accordance with at least one embodiment.

In at least one embodiment, developers may then share applications or containers through a network for access and use by users of a system (e.g., system 3500 of FIG. 35). In at least one embodiment, completed and validated applications or containers may be stored in a container registry and associated machine learning models may be stored in model registry 3424. In at least one embodiment, a requesting entity (e.g., a user at a medical facility)—who provides an inference or image processing request—may browse a container registry and/or model registry 3424 for an application, container, dataset, machine learning model, etc., select a desired combination of elements for inclusion in data processing pipeline, and submit an imaging processing request. In at least one embodiment, a request may include input data (and associated patient data, in some examples) that is necessary to perform a request, and/or may include a selection of application(s) and/or machine learning models to be executed in processing a request. In at least one embodiment, a request may then be passed to one or more components of deployment system 3406 (e.g., a cloud) to perform processing of data processing pipeline. In at least one embodiment, processing by deployment system 3406 may include referencing selected elements (e.g., applications, containers, models, etc.) from a container registry and/or model registry 3424. In at least one embodiment, once results are generated by a pipeline, results may be returned to a user for reference (e.g., for viewing in a viewing application suite executing on a local, on-premises workstation or terminal). In at least one embodiment, a radiologist may receive results from an data processing pipeline including any number of application and/or containers, where results may include anomaly detection in X-rays, CT scans, MRIs, etc.

In at least one embodiment, to aid in processing or execution of applications or containers in pipelines, services 3420 may be leveraged. In at least one embodiment, services 3420 may include compute services, artificial intelligence (AI) services, visualization services, and/or other service types. In at least one embodiment, services 3420 may provide functionality that is common to one or more applications in software 3418, so functionality may be abstracted to a service that may be called upon or leveraged by applications. In at least one embodiment, functionality provided by services 3420 may run dynamically and more efficiently, while also scaling well by allowing applications to process data in parallel (e.g., using a parallel computing platform 3530 (FIG. 35)). In at least one embodiment, rather than each application that shares a same functionality offered by a service 3420 being required to have a respective instance of service 3420, service 3420 may be shared between and among various applications. In at least one embodiment, services may include an inference server or engine that may be used for executing detection or segmentation tasks, as non-limiting examples. In at least one embodiment, a model training service may be included that may provide machine learning model training and/or retraining capabilities. In at least one embodiment, a data augmentation service may further be included that may provide GPU accelerated data (e.g., DICOM, RIS, CIS, REST compliant, RPC, raw, etc.) extraction, resizing, scaling, and/or other augmentation. In at least one embodiment, a visualization service may be used that may add image rendering effects—such as ray-tracing, rasterization, denoising, sharpening, etc.—to add realism to two-dimensional (2D) and/or three-dimensional (3D) models. In at least one embodiment, virtual instrument services may be included that provide for beam-forming, segmentation, inferencing, imaging, and/or support for other applications within pipelines of virtual instruments.

In at least one embodiment, where a service 3420 includes an AI service (e.g., an inference service), one or more machine learning models associated with an application for anomaly detection (e.g., tumors, growth abnormalities, scarring, etc.) may be executed by calling upon (e.g., as an API call) an inference service (e.g., an inference server) to execute machine learning model(s), or processing thereof, as part of application execution. In at least one embodiment, where another application includes one or more machine learning models for segmentation tasks, an application may call upon an inference service to execute machine learning models for performing one or more of processing operations associated with segmentation tasks. In at least one embodiment, software 3418 implementing advanced processing and inferencing pipeline that includes segmentation application and anomaly detection application may be streamlined because each application may call upon a same inference service to perform one or more inferencing tasks.

In at least one embodiment, hardware 3422 may include GPUs, CPUs, graphics cards, an AI/deep learning system (e.g., an AI supercomputer, such as NVIDIA's DGX supercomputer system), a cloud platform, or a combination thereof. In at least one embodiment, different types of hardware 3422 may be used to provide efficient, purpose-built support for software 3418 and services 3420 in deployment system 3406. In at least one embodiment, use of GPU processing may be implemented for processing locally (e.g., at facility 3402), within an AI/deep learning system, in a cloud system, and/or in other processing components of deployment system 3406 to improve efficiency, accuracy, and efficacy of image processing, image reconstruction, segmentation, MRI exams, stroke or heart attack detection (e.g., in real-time), image quality in rendering, etc. In at least one embodiment, a facility may include imaging devices, genomics devices, sequencing devices, and/or other device types on-premises that may leverage GPUs to generate imaging data representative of a subject's anatomy.

In at least one embodiment, software 3418 and/or services 3420 may be optimized for GPU processing with respect to deep learning, machine learning, and/or high-performance computing, as non-limiting examples. In at least one embodiment, at least some of computing environment of deployment system 3406 and/or training system 3404 may be executed in a datacenter one or more supercomputers or high performance computing systems, with GPU optimized software (e.g., hardware and software combination of NVIDIA's DGX system). In at least one embodiment, datacenters may be compliant with provisions of HIPAA, such that receipt, processing, and transmission of imaging data and/or other patient data is securely handled with respect to privacy of patient data. In at least one embodiment, hardware 3422 may include any number of GPUs that may be called upon to perform processing of data in parallel, as described herein. In at least one embodiment, cloud platform may further include GPU processing for GPU-optimized execution of deep learning tasks, machine learning tasks, or other computing tasks. In at least one embodiment, cloud platform (e.g., NVIDIA's NGC) may be executed using an AI/deep learning supercomputer(s) and/or GPU-optimized software (e.g., as provided on NVIDIA's DGX systems) as a hardware abstraction and scaling platform. In at least one embodiment, cloud platform may integrate an application container clustering system or orchestration system (e.g., KUBERNETES) on multiple GPUs to enable seamless scaling and load balancing.

In at least one embodiment, one or more neural networks of an inference and/or training logic 615 may be used in deployment system 3406, so that it may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

FIG. 35 is a system diagram for an example system 3500 for generating and deploying an imaging deployment pipeline, in accordance with at least one embodiment. In at least one embodiment, system 3500 may be used to implement process 3400 of FIG. 34 and/or other processes including advanced processing and inferencing pipelines. In at least one embodiment, system 3500 may include training system 3404 and deployment system 3406. In at least one embodiment, training system 3404 and deployment system 3406 may be implemented using software 3418, services 3420, and/or hardware 3422, as described herein.

In at least one embodiment, system 3500 (e.g., training system 3404 and/or deployment system 3406) may implemented in a cloud computing environment (e.g., using cloud 3526). In at least one embodiment, system 3500 may be implemented locally with respect to a healthcare services facility, or as a combination of both cloud and local computing resources. In at least one embodiment, in embodiments where cloud computing is implemented, patient data may be separated from, or unprocessed by, by one or more components of system 3500 that would render processing non-compliant with HIPAA and/or other data handling and privacy regulations or laws. In at least one embodiment, access to APIs in cloud 3526 may be restricted to authorized users through enacted security measures or protocols. In at least one embodiment, a security protocol may include web tokens that may be signed by an authentication (e.g., AuthN, AuthZ, Gluecon, etc.) service and may carry appropriate authorization. In at least one embodiment, APIs of virtual instruments (described herein), or other instantiations of system 3500, may be restricted to a set of public IPs that have been vetted or authorized for interaction.

In at least one embodiment, various components of system 3500 may communicate between and among one another using any of a variety of different network types, including but not limited to local area networks (LANs) and/or wide area networks (WANs) via wired and/or wireless communication protocols. In at least one embodiment, communication between facilities and components of system 3500 (e.g., for transmitting inference requests, for receiving results of inference requests, etc.) may be communicated over a data bus or data busses, wireless data protocols (Wi-Fi), wired data protocols (e.g., Ethernet), etc.

In at least one embodiment, training system 3404 may execute training pipelines 3504, similar to those described herein with respect to FIG. 34. In at least one embodiment, where one or more machine learning models are to be used in deployment pipelines 3510 by deployment system 3406, training pipelines 3504 may be used to train or retrain one or more (e.g., pre-trained) models, and/or implement one or more of pre-trained models 3506 (e.g., without a need for retraining or updating). In at least one embodiment, as a result of training pipelines 3504, output model(s) 3416 may be generated. In at least one embodiment, training pipelines 3504 may include any number of processing steps, such as but not limited to imaging data (or other input data) conversion or adaption (e.g., using DICOM adapter 3502A to convert DICOM images to another format suitable for processing by respective machine learning models, such as Neuroimaging Informatics Technology Initiative (NIfTI) format), AI-assisted annotation 3410, labeling or annotating of imaging data 3408 to generate labeled clinic data 3412, model selection from a model registry, model training 3414, training, retraining, or updating models, and/or other processing steps. In at least one embodiment, for different machine learning models used by deployment system 3406, different training pipelines 3504 may be used. In at least one embodiment, training pipeline 3504 similar to a first example described with respect to FIG. 34 may be used for a first machine learning model, training pipeline 3504 similar to a second example described with respect to FIG. 34 may be used for a second machine learning model, and training pipeline 3504 similar to a third example described with respect to FIG. 34 may be used for a third machine learning model. In at least one embodiment, any combination of tasks within training system 3404 may be used depending on what is required for each respective machine learning model. In at least one embodiment, one or more of machine learning models may already be trained and ready for deployment so machine learning models may not undergo any processing by training system 3404, and may be implemented by deployment system 3406.

In at least one embodiment, output model(s) 3416 and/or pre-trained model(s) 3506 may include any types of machine learning models depending on implementation or embodiment. In at least one embodiment, and without limitation, machine learning models used by system 3500 may include machine learning model(s) using linear regression, logistic regression, decision trees, support vector machines (SVM), Naïve Bayes, k-nearest neighbor (Knn), K means clustering, random forest, dimensionality reduction algorithms, gradient boosting algorithms, neural networks (e.g., auto-encoders, convolutional, recurrent, perceptrons, Long/Short Term Memory (LSTM), Hopfield, Boltzmann, deep belief, deconvolutional, generative adversarial, liquid state machine, etc.), and/or other types of machine learning models.

In at least one embodiment, training pipelines 3504 may include AI-assisted annotation, as described in more detail herein with respect to at least FIG. 38B. In at least one embodiment, labeled clinic data 3412 (e.g., traditional annotation) may be generated by any number of techniques. In at least one embodiment, labels or other annotations may be generated within a drawing program (e.g., an annotation program), a computer aided design (CAD) program, a labeling program, another type of program suitable for generating annotations or labels for ground truth, and/or may be hand drawn, in some examples. In at least one embodiment, ground truth data may be synthetically produced (e.g., generated from computer models or renderings), real produced (e.g., designed and produced from real-world data), machine-automated (e.g., using feature analysis and learning to extract features from data and then generate labels), human annotated (e.g., labeler, or annotation expert, defines location of labels), and/or a combination thereof. In at least one embodiment, for each instance of imaging data 3408 (or other data type used by machine learning models), there may be corresponding ground truth data generated by training system 3404. In at least one embodiment, AI-assisted annotation may be performed as part of deployment pipelines 3510; either in addition to, or in lieu of AI-assisted annotation included in training pipelines 3504. In at least one embodiment, system 3500 may include a multi-layer platform that may include a software layer (e.g., software 3418) of diagnostic applications (or other application types) that may perform one or more medical imaging and diagnostic functions. In at least one embodiment, system 3500 may be communicatively coupled to (e.g., via encrypted links) PACS server networks of one or more facilities. In at least one embodiment, system 3500 may be configured to access and referenced data (e.g., DICOM data, RIS data, raw data, CIS data, REST compliant data, RPC data, raw data, etc.) from PACS servers (e.g., via a DICOM adapter 3502, or another data type adapter such as RIS, CIS, REST compliant, RPC, raw, etc.) to perform operations, such as training machine learning models, deploying machine learning models, image processing, inferencing, and/or other operations.

In at least one embodiment, a software layer may be implemented as a secure, encrypted, and/or authenticated API through which applications or containers may be invoked (e.g., called) from an external environment(s) (e.g., facility 3402). In at least one embodiment, applications may then call or execute one or more services 3420 for performing compute, AI, or visualization tasks associated with respective applications, and software 3418 and/or services 3420 may leverage hardware 3422 to perform processing tasks in an effective and efficient manner.

In at least one embodiment, deployment system 3406 may execute deployment pipelines 3510. In at least one embodiment, deployment pipelines 3510 may include any number of applications that may be sequentially, non-sequentially, or otherwise applied to imaging data (and/or other data types) generated by imaging devices, sequencing devices, genomics devices, etc.—including AI-assisted annotation, as described above. In at least one embodiment, as described herein, a deployment pipeline 3510 for an individual device may be referred to as a virtual instrument for a device (e.g., a virtual ultrasound instrument, a virtual CT scan instrument, a virtual sequencing instrument, etc.). In at least one embodiment, for a single device, there may be more than one deployment pipeline 3510 depending on information desired from data generated by a device. In at least one embodiment, where detections of anomalies are desired from an MRI machine, there may be a first deployment pipeline 3510, and where image enhancement is desired from output of an MRI machine, there may be a second deployment pipeline 3510.

In at least one embodiment, applications available for deployment pipelines 3510 may include any application that may be used for performing processing tasks on imaging data or other data from devices. In at least one embodiment, different applications may be responsible for image enhancement, segmentation, reconstruction, anomaly detection, object detection, feature detection, treatment planning, dosimetry, beam planning (or other radiation treatment procedures), and/or other analysis, image processing, or inferencing tasks. In at least one embodiment, deployment system 3406 may define constructs for each of applications, such that users of deployment system 3406 (e.g., medical facilities, labs, clinics, etc.) may understand constructs and adapt applications for implementation within their respective facility. In at least one embodiment, an application for image reconstruction may be selected for inclusion in deployment pipeline 3510, but data type generated by an imaging device may be different from a data type used within an application. In at least one embodiment, DICOM adapter 3502B (and/or a DICOM reader) or another data type adapter or reader (e.g., RIS, CIS, REST compliant, RPC, raw, etc.) may be used within deployment pipeline 3510 to convert data to a form useable by an application within deployment system 3406. In at least one embodiment, access to DICOM, RIS, CIS, REST compliant, RPC, raw, and/or other data type libraries may be accumulated and pre-processed, including decoding, extracting, and/or performing any convolutions, color corrections, sharpness, gamma, and/or other augmentations to data. In at least one embodiment, DICOM, RIS, CIS, REST compliant, RPC, and/or raw data may be unordered and a pre-pass may be executed to organize or sort collected data. In at least one embodiment, because various applications may share common image operations, in some embodiments, a data augmentation library (e.g., as one of services 3420) may be used to accelerate these operations. In at least one embodiment, to avoid bottlenecks of conventional processing approaches that rely on CPU processing, parallel computing platform 3530 may be used for GPU acceleration of these processing tasks.

In at least one embodiment, an image reconstruction application may include a processing task that includes use of a machine learning model. In at least one embodiment, a user may desire to use their own machine learning model, or to select a machine learning model from model registry 3424. In at least one embodiment, a user may implement their own machine learning model or select a machine learning model for inclusion in an application for performing a processing task. In at least one embodiment, applications may be selectable and customizable, and by defining constructs of applications, deployment and implementation of applications for a particular user are presented as a more seamless user experience. In at least one embodiment, by leveraging other features of system 3500—such as services 3420 and hardware 3422—deployment pipelines 3510 may be even more user friendly, provide for easier integration, and produce more accurate, efficient, and timely results.

In at least one embodiment, deployment system 3406 may include a user interface 3514 (e.g., a graphical user interface, a web interface, etc.) that may be used to select applications for inclusion in deployment pipeline(s) 3510, arrange applications, modify or change applications or parameters or constructs thereof, use and interact with deployment pipeline(s) 3510 during set-up and/or deployment, and/or to otherwise interact with deployment system 3406. In at least one embodiment, although not illustrated with respect to training system 3404, user interface 3514 (or a different user interface) may be used for selecting models for use in deployment system 3406, for selecting models for training, or retraining, in training system 3404, and/or for otherwise interacting with training system 3404.

In at least one embodiment, pipeline manager 3512 may be used, in addition to an application orchestration system 3528, to manage interaction between applications or containers of deployment pipeline(s) 3510 and services 3420 and/or hardware 3422. In at least one embodiment, pipeline manager 3512 may be configured to facilitate interactions from application to application, from application to service 3420, and/or from application or service to hardware 3422. In at least one embodiment, although illustrated as included in software 3418, this is not intended to be limiting, and in some examples (e.g., as illustrated in FIG. 36) pipeline manager 3512 may be included in services 3420. In at least one embodiment, application orchestration system 3528 (e.g., Kubernetes, DOCKER, etc.) may include a container orchestration system that may group applications into containers as logical units for coordination, management, scaling, and deployment. In at least one embodiment, by associating applications from deployment pipeline(s) 3510 (e.g., a reconstruction application, a segmentation application, etc.) with individual containers, each application may execute in a self-contained environment (e.g., at a kernel level) to increase speed and efficiency.

In at least one embodiment, each application and/or container (or image thereof) may be individually developed, modified, and deployed (e.g., a first user or developer may develop, modify, and deploy a first application and a second user or developer may develop, modify, and deploy a second application separate from a first user or developer), which may allow for focus on, and attention to, a task of a single application and/or container(s) without being hindered by tasks of another application(s) or container(s). In at least one embodiment, communication, and cooperation between different containers or applications may be aided by pipeline manager 3512 and application orchestration system 3528. In at least one embodiment, so long as an expected input and/or output of each container or application is known by a system (e.g., based on constructs of applications or containers), application orchestration system 3528 and/or pipeline manager 3512 may facilitate communication among and between, and sharing of resources among and between, each of applications or containers. In at least one embodiment, because one or more of applications or containers in deployment pipeline(s) 3510 may share same services and resources, application orchestration system 3528 may orchestrate, load balance, and determine sharing of services or resources between and among various applications or containers. In at least one embodiment, a scheduler may be used to track resource requirements of applications or containers, current usage or planned usage of these resources, and resource availability. In at least one embodiment, a scheduler may thus allocate resources to different applications and distribute resources between and among applications in view of requirements and availability of a system. In some examples, a scheduler (and/or other component of application orchestration system 3528 such as a sequencer and/or asynchronous compute engine) may determine resource availability and distribution based on constraints imposed on a system (e.g., user constraints), such as quality of service (QoS), urgency of need for data outputs (e.g., to determine whether to execute real-time processing or delayed processing), etc.

In at least one embodiment, services 3420 leveraged by and shared by applications or containers in deployment system 3406 may include compute services 3516, AI services 3518, visualization services 3520, and/or other service types. In at least one embodiment, applications may call (e.g., execute) one or more of services 3420 to perform processing operations for an application. In at least one embodiment, compute services 3516 may be leveraged by applications to perform super-computing or other high-performance computing (HPC) tasks. In at least one embodiment, compute service(s) 3516 may be leveraged to perform parallel processing (e.g., using a parallel computing platform 3530) for processing data through one or more of applications and/or one or more tasks of a single application, substantially simultaneously. In at least one embodiment, parallel computing platform 3530 (e.g., NVIDIA's CUDA) may enable general purpose computing on GPUs (GPGPU) (e.g., GPUs 3522). In at least one embodiment, a software layer of parallel computing platform 3530 may provide access to virtual instruction sets and parallel computational elements of GPUs, for execution of compute kernels. In at least one embodiment, parallel computing platform 3530 may include memory and, in some embodiments, a memory may be shared between and among multiple containers, and/or between and among different processing tasks within a single container. In at least one embodiment, inter-process communication (IPC) calls may be generated for multiple containers and/or for multiple processes within a container to use same data from a shared segment of memory of parallel computing platform 3530 (e.g., where multiple different stages of an application or multiple applications are processing same information). In at least one embodiment, rather than making a copy of data and moving data to different locations in memory (e.g., a read/write operation), same data in same location of a memory may be used for any number of processing tasks (e.g., at a same time, at different times, etc.). In at least one embodiment, as data is used to generate new data as a result of processing, this information of a new location of data may be stored and shared between various applications. In at least one embodiment, location of data and a location of updated or modified data may be part of a definition of how a payload is understood within containers.

In at least one embodiment, AI services 3518 may be leveraged to perform inferencing services for executing machine learning model(s) associated with applications (e.g., tasked with performing one or more processing tasks of an application). In at least one embodiment, AI services 3518 may leverage AI system 3524 to execute machine learning model(s) (e.g., neural networks, such as CNNs) for segmentation, reconstruction, object detection, feature detection, classification, and/or other inferencing tasks. In at least one embodiment, applications of deployment pipeline(s) 3510 may use one or more of output models 3416 from training system 3404 and/or other models of applications to perform inferencing on imaging data (e.g., DICOM data, RIS data, CIS data, REST compliant data, RPC data, raw data, etc.). In at least one embodiment, two or more examples of inferencing using application orchestration system 3528 (e.g., a scheduler, sequencer, and/or asynchronous compute engine) may be available. In at least one embodiment, a first category may include a high priority/low latency path that may achieve higher service level agreements, such as for performing inference on urgent requests during an emergency, or for a radiologist during diagnosis. In at least one embodiment, a second category may include a standard priority path that may be used for requests that may be non-urgent or where analysis may be performed at a later time. In at least one embodiment, application orchestration system 3528 may distribute resources (e.g., services

3420 and/or hardware 3422) based on priority paths for different inferencing tasks of AI services 3518.

In at least one embodiment, shared storage may be mounted to AI services 3518 within system 3500. In at least one embodiment, shared storage may operate as a cache (or other storage device type) and may be used to process inference requests from applications. In at least one embodiment, when an inference request is submitted, a request may be received by a set of API instances of deployment system 3406, and one or more instances may be selected (e.g., for best fit, for load balancing, etc.) to process a request. In at least one embodiment, to process a request, a request may be entered into a database, a machine learning model may be located from model registry 3424 if not already in a cache, a validation step may ensure appropriate machine learning model is loaded into a cache (e.g., shared storage), and/or a copy of a model may be saved to a cache. In at least one embodiment, a scheduler (e.g., of pipeline manager 3512) may be used to launch an application that is referenced in a request if an application is not already running or if there are not enough instances of an application. In at least one embodiment, if an inference server is not already launched to execute a model, an inference server may be launched. In at least one embodiment, any number of inference servers may be launched per model. In at least one embodiment, in a pull model, in which inference servers are clustered, models may be cached whenever load balancing is advantageous. In at least one embodiment, inference servers may be statically loaded in corresponding, distributed servers.

In at least one embodiment, inferencing may be performed using an inference server that runs in a container. In at least one embodiment, an instance of an inference server may be associated with a model (and optionally a plurality of versions of a model). In at least one embodiment, if an instance of an inference server does not exist when a request to perform inferencing on a model is received, a new instance may be loaded. In at least one embodiment, when starting an inference server, a model may be passed to an inference server such that a same container may be used to serve different models so long as inference server is running as a different instance.

In at least one embodiment, during application execution, an inference request for a given application may be received, and a container (e.g., hosting an instance of an inference server) may be loaded (if not already), and a start procedure may be called. In at least one embodiment, pre-processing logic in a container may load, decode, and/or perform any additional pre-processing on incoming data (e.g., using a CPU(s) and/or GPU(s)). In at least one embodiment, once data is prepared for inference, a container may perform inferencing as necessary on data. In at least one embodiment, this may include a single inference call on one image (e.g., a hand X-ray), or may require inference on hundreds of images (e.g., a chest CT). In at least one embodiment, an application may summarize results before completing, which may include, without limitation, a single confidence score, pixel level-segmentation, voxel-level segmentation, generating a visualization, or generating text to summarize findings. In at least one embodiment, different models or applications may be assigned different priorities. For example, some models may have a real-time (TAT less than one minute) priority while others may have lower priority (e.g., TAT less than 10 minutes). In at least one embodiment, model execution times may be measured from requesting institution or entity and may include partner network traversal time, as well as execution on an inference service.

In at least one embodiment, transfer of requests between services 3420 and inference applications may be hidden behind a software development kit (SDK), and robust transport may be provide through a queue. In at least one embodiment, a request will be placed in a queue via an API for an individual application/tenant ID combination and an SDK will pull a request from a queue and give a request to an application. In at least one embodiment, a name of a queue may be provided in an environment from where an SDK will pick it up. In at least one embodiment, asynchronous communication through a queue may be useful as it may allow any instance of an application to pick up work as it becomes available. In at least one embodiment, results may be transferred back through a queue, to ensure no data is lost. In at least one embodiment, queues may also provide an ability to segment work, as highest priority work may go to a queue with most instances of an application connected to it, while lowest priority work may go to a queue with a single instance connected to it that processes tasks in an order received. In at least one embodiment, an application may run on a GPU-accelerated instance generated in cloud 3526, and an inference service may perform inferencing on a GPU.

In at least one embodiment, visualization services 3520 may be leveraged to generate visualizations for viewing outputs of applications and/or deployment pipeline(s) 3510. In at least one embodiment, GPUs 3522 may be leveraged by visualization services 3520 to generate visualizations. In at least one embodiment, rendering effects, such as ray-tracing, may be implemented by visualization services 3520 to generate higher quality visualizations. In at least one embodiment, visualizations may include, without limitation, 2D image renderings, 3D volume renderings, 3D volume reconstruction, 2D tomographic slices, virtual reality displays, augmented reality displays, etc. In at least one embodiment, virtualized environments may be used to generate a virtual interactive display or environment (e.g., a virtual environment) for interaction by users of a system (e.g., doctors, nurses, radiologists, etc.). In at least one embodiment, visualization services 3520 may include an internal visualizer, cinematics, and/or other rendering or image processing capabilities or functionality (e.g., ray tracing, rasterization, internal optics, etc.).

In at least one embodiment, hardware 3422 may include GPUs 3522, AI system 3524, cloud 3526, and/or any other hardware used for executing training system 3404 and/or deployment system 3406. In at least one embodiment, GPUs 3522 (e.g., NVIDIA's TESLA and/or QUADRO GPUs) may include any number of GPUs that may be used for executing processing tasks of compute services 3516, AI services 3518, visualization services 3520, other services, and/or any of features or functionality of software 3418. For example, with respect to AI services 3518, GPUs 3522 may be used to perform pre-processing on imaging data (or other data types used by machine learning models), post-processing on outputs of machine learning models, and/or to perform inferencing (e.g., to execute machine learning models). In at least one embodiment, cloud 3526, AI system 3524, and/or other components of system 3500 may use GPUs 3522. In at least one embodiment, cloud 3526 may include a GPU-optimized platform for deep learning tasks. In at least one embodiment, AI system 3524 may use GPUs, and cloud 3526—or at least a portion tasked with deep learning or inferencing—may be executed using one or more AI systems 3524. As such, although hardware 3422 is illustrated as discrete components, this is not intended to be limiting, and any components of hardware 3422 may be combined with, or leveraged by, any other components of hardware 3422.

In at least one embodiment, AI system 3524 may include a purpose-built computing system (e.g., a super-computer or an HPC) configured for inferencing, deep learning, machine learning, and/or other artificial intelligence tasks. In at least one embodiment, AI system 3524 (e.g., NVIDIA's DGX) may include GPU-optimized software (e.g., a software stack) that may be executed using a plurality of GPUs 3522, in addition to CPUs, RAM, storage, and/or other components, features, or functionality. In at least one embodiment, one or more AI systems 3524 may be implemented in cloud 3526 (e.g., in a data center) for performing some or all of AI-based processing tasks of system 3500.

In at least one embodiment, cloud 3526 may include a GPU-accelerated infrastructure (e.g., NVIDIA's NGC) that may provide a GPU-optimized platform for executing processing tasks of system 3500. In at least one embodiment, cloud 3526 may include an AI system(s) 3524 for performing one or more of AI-based tasks of system 3500 (e.g., as a hardware abstraction and scaling platform). In at least one embodiment, cloud 3526 may integrate with application orchestration system 3528 leveraging multiple GPUs to enable seamless scaling and load balancing between and among applications and services 3420. In at least one embodiment, cloud 3526 may tasked with executing at least some of services 3420 of system 3500, including compute services 3516, AI services 3518, and/or visualization services 3520, as described herein. In at least one embodiment, cloud 3526 may perform small and large batch inference (e.g., executing NVIDIA's TENSOR RT), provide an accelerated parallel computing API and platform 3530 (e.g., NVIDIA's CUDA), execute application orchestration system 3528 (e.g., KUBERNETES), provide a graphics rendering API and platform (e.g., for ray-tracing, 2D graphics, 3D graphics, and/or other rendering techniques to produce higher quality cinematics), and/or may provide other functionality for system 3500.

In at least one embodiment, in an effort to preserve patient confidentiality (e.g., where patient data or records are to be used off-premises), cloud 3526 may include a registry—such as a deep learning container registry. In at least one embodiment, a registry may store containers for instantiations of applications that may perform pre-processing, post-processing, or other processing tasks on patient data. In at least one embodiment, cloud 3526 may receive data that includes patient data as well as sensor data in containers, perform requested processing for just sensor data in those containers, and then forward a resultant output and/or visualizations to appropriate parties and/or devices (e.g., on-premises medical devices used for visualization or diagnoses), all without having to extract, store, or otherwise access patient data. In at least one embodiment, confidentiality of patient data is preserved in compliance with HIPAA and/or other data regulations.

In at least one embodiment, one or more neural networks of an inference and/or training logic 615 may be used in cloud 3526, so that it may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 36A:
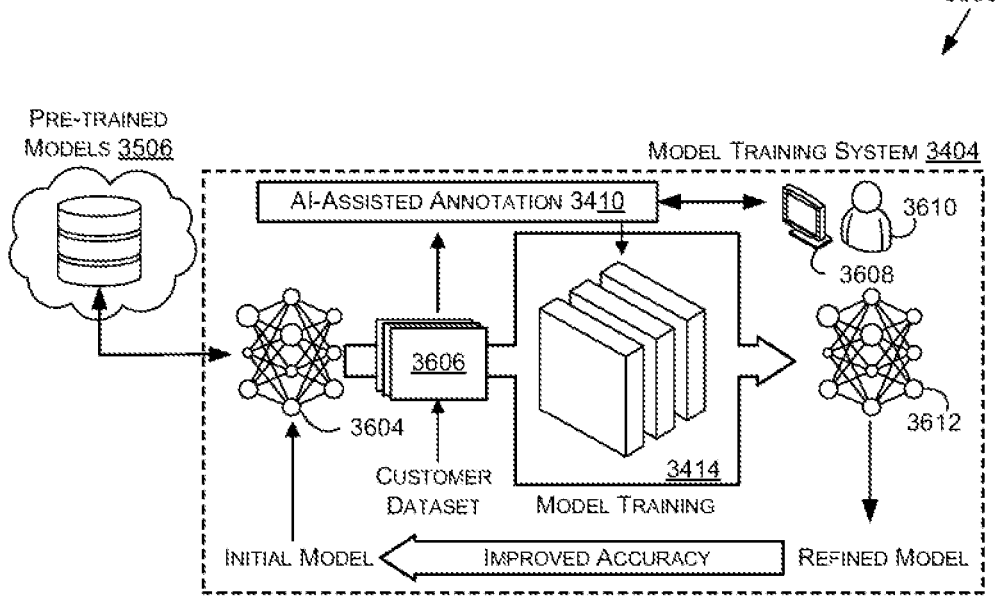
FIG. 36A illustrates a data flow diagram for a process to train a machine learning model, in accordance with at least one embodiment.

FIG. 36A illustrates a data flow diagram for a process 3600 to train, retrain, or update a machine learning model, in accordance with at least one embodiment. In at least one embodiment, process 3600 may be executed using, as a non-limiting example, system 3500 of FIG. 35. In at least one embodiment, process 3600 may leverage services 3420 and/or hardware 3422 of system 3500, as described herein. In at least one embodiment, refined models 3612 generated by process 3600 may be executed by deployment system 3406 for one or more containerized applications in deployment pipelines 3510.

In at least one embodiment, model training 3414 may include retraining or updating an initial model 3604 (e.g., a pre-trained model) using new training data (e.g., new input data, such as customer dataset 3606, and/or new ground truth data associated with input data). In at least one embodiment, to retrain, or update, initial model 3604, output or loss layer(s) of initial model 3604 may be reset, or deleted, and/or replaced with an updated or new output or loss layer(s). In at least one embodiment, initial model 3604 may have previously fine-tuned parameters (e.g., weights and/or biases) that remain from prior training, so training or retraining 3414 may not take as long or require as much processing as training a model from scratch. In at least one embodiment, during model training 3414, by having reset or replaced output or loss layer(s) of initial model 3604, parameters may be updated and re-tuned for a new data set based on loss calculations associated with accuracy of output or loss layer(s) at generating predictions on new, customer dataset 3606 (e.g., image data 3408 of FIG. 34).

In at least one embodiment, pre-trained models 3506 may be stored in a data store, or registry (e.g., model registry 3424 of FIG. 34). In at least one embodiment, pre-trained models 3506 may have been trained, at least in part, at one or more facilities other than a facility executing process 3600. In at least one embodiment, to protect privacy and rights of patients, subjects, or clients of different facilities, pre-trained models 3506 may have been trained, on-premise, using customer or patient data generated on-premise. In at least one embodiment, pre-trained models 3506 may be trained using cloud 3526 and/or other hardware 3422, but confidential, privacy protected patient data may not be transferred to, used by, or accessible to any components of cloud 3526 (or other off premise hardware). In at least one embodiment, where a pre-trained model 3506 is trained at using patient data from more than one facility, pre-trained model 3506 may have been individually trained for each facility prior to being trained on patient or customer data from another facility. In at least one embodiment, such as where a customer or patient data has been released of privacy concerns (e.g., by waiver, for experimental use, etc.), or where a customer or patient data is included in a public data set, a customer or patient data from any number of facilities may be used to train pre-trained model 3506 on-premise and/or off premise, such as in a datacenter or other cloud computing infrastructure.

In at least one embodiment, when selecting applications for use in deployment pipelines 3510, a user may also select machine learning models to be used for specific applications. In at least one embodiment, a user may not have a model for use, so a user may select a pre-trained model 3506 to use with an application. In at least one embodiment, pre-trained model 3506 may not be optimized for generating accurate results on customer dataset 3606 of a facility of a user (e.g., based on patient diversity, demographics, types of medical imaging devices used, etc.). In at least one embodiment, prior to deploying pre-trained model 3506 into deployment pipeline 3510 for use with an application(s), pre-trained model 3506 may be updated, retrained, and/or fine-tuned for use at a respective facility.

In at least one embodiment, a user may select pre-trained model 3506 that is to be updated, retrained, and/or fine-tuned, and pre-trained model 3506 may be referred to as initial model 3604 for training system 3404 within process 3600. In at least one embodiment, customer dataset 3606 (e.g., imaging data, genomics data, sequencing data, or other data types generated by devices at a facility) may be used to perform model training 3414 (which may include, without limitation, transfer learning) on initial model 3604 to generate refined model 3612. In at least one embodiment, ground truth data corresponding to customer dataset 3606 may be generated by training system 3404. In at least one embodiment, ground truth data may be generated, at least in part, by clinicians, scientists, doctors, practitioners, at a facility (e.g., as labeled clinic data 3412 of FIG. 34).

In at least one embodiment, AI-assisted annotation 3410 may be used in some examples to generate ground truth data. In at least one embodiment, AI-assisted annotation 3410 (e.g., implemented using an AI-assisted annotation SDK) may leverage machine learning models (e.g., neural networks) to generate suggested or predicted ground truth data for a customer dataset. In at least one embodiment, user 3610 may use annotation tools within a user interface (a graphical user interface (GUI)) on computing device 3608.

In at least one embodiment, user 3610 may interact with a GUI via computing device 3608 to edit or fine-tune annotations or auto-annotations. In at least one embodiment, a polygon editing feature may be used to move vertices of a polygon to more accurate or fine-tuned locations.

In at least one embodiment, once customer dataset 3606 has associated ground truth data, ground truth data (e.g., from AI-assisted annotation, manual labeling, etc.) may be used by during model training 3414 to generate refined model 3612. In at least one embodiment, customer dataset 3606 may be applied to initial model 3604 any number of times, and ground truth data may be used to update parameters of initial model 3604 until an acceptable level of accuracy is attained for refined model 3612. In at least one embodiment, once refined model 3612 is generated, refined model 3612 may be deployed within one or more deployment pipelines 3510 at a facility for performing one or more processing tasks with respect to medical imaging data.

In at least one embodiment, refined model 3612 may be uploaded to pre-trained models 3506 in model registry 3424 to be selected by another facility. In at least one embodiment, his process may be completed at any number of facilities such that refined model 3612 may be further refined on new datasets any number of times to generate a more universal model.

In at least one embodiment, one or more neural networks of an inference and/or training logic 615 may be used in refined model 3612, so that it may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

Figure 36B:
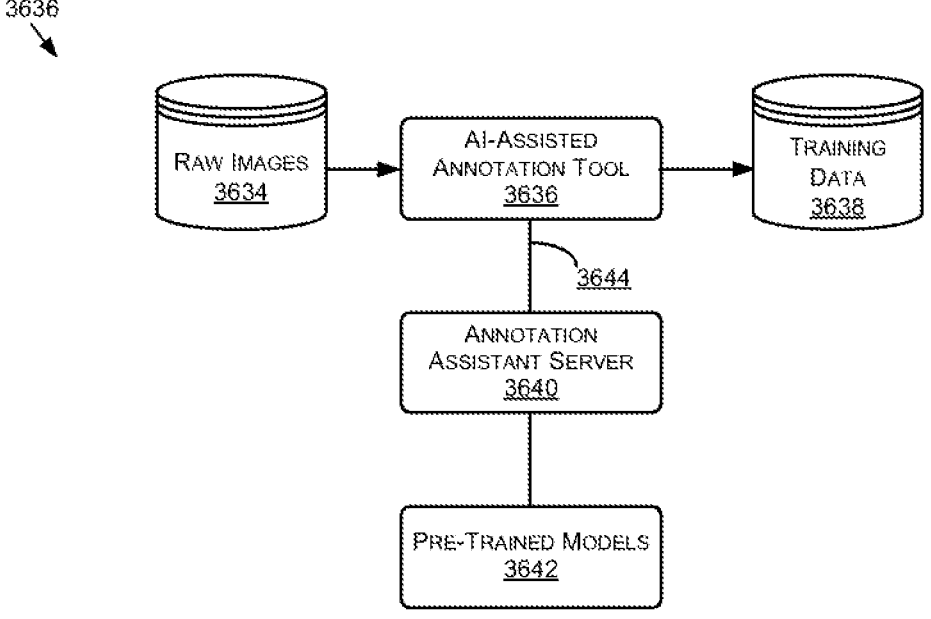
FIG. 36B is an example illustration of a client-server architecture to enhance annotation tools with pre-trained annotation models, in accordance with at least one embodiment.

FIG. 36B is an example illustration of a client-server architecture 3632 to enhance annotation tools with pre-trained annotation models, in accordance with at least one embodiment. In at least one embodiment, AI-assisted annotation tools 3636 may be instantiated based on a client-server architecture 3632. In at least one embodiment, annotation tools 3636 in imaging applications may aid radiologists, for example, identify organs and abnormalities. In at least one embodiment, imaging applications may include software tools that help user 3610 to identify, as a non-limiting example, a few extreme points on a particular organ of interest in raw images 3634 (e.g., in a 3D MRI or CT scan) and receive auto-annotated results for all 2D slices of a particular organ. In at least one embodiment, results may be stored in a data store as training data 3636 and used as (for example and without limitation) ground truth data for training. In at least one embodiment, when computing device 3608 sends extreme points for AI-assisted annotation 3410, a deep learning model, for example, may receive this data as input and return inference results of a segmented organ or abnormality. In at least one embodiment, pre-instantiated annotation tools, such as AI-Assisted Annotation Tool 3636B in FIG. 36B, may be enhanced by making API calls (e.g., API Call 3644) to a server, such as an Annotation Assistant Server 3640 that may include a set of pre-trained models 3642 stored in an annotation model registry, for example. In at least one embodiment, an annotation model registry may store pre-trained models 3642 (e.g., machine learning models, such as deep learning models) that are pre-trained to perform AI-assisted annotation on a particular organ or abnormality. In at least one embodiment, these models may be further updated by using training pipelines 3504. In at least one embodiment, pre-installed annotation tools may be improved over time as new labeled clinic data 3412 is added.

Inference and/or training logic 615 are used to perform inferencing and/or training operations associated with one or more embodiments. Details regarding inference and/or training logic 615 are provided herein in conjunction with FIGS. 6A and/or 6B.

In at least one embodiment, one or more neural networks of an inference and/or training logic 615 may be used in a client-server architecture 3632, so that it may be configured to receive sensor inputs from multiple sensors 356 (in FIG. 3) and may be trained to infer a physical or chemical property of a first coolant or a second coolant. In at least one embodiment, such inference may be to a change in a physical or a chemical property of a coolant. In at least one embodiment, sensor inputs may be correlated to classes of different physical and chemical properties of each type of a coolant. In at least one embodiment, a new sensor input classifying within a class of such different physical and chemical properties may indicate a physical or a chemical property, or a change thereof, for a coolant.

In at least one embodiment, a single semiconductor platform may refer to a sole unitary semiconductor-based integrated circuit or chip. In at least one embodiment, multi-chip modules may be used with increased connectivity which simulate on-chip operation, and make substantial improvements over utilizing a conventional central processing unit ("CPU") and bus implementation. In at least one embodiment, various modules may also be situated separately or in various combinations of semiconductor platforms per desires of user.

In at least one embodiment, referring back to FIG. 11, computer programs in form of machine-readable executable code or computer control logic algorithms are stored in main memory 1104 and/or secondary storage. Computer programs, if executed by one or more processors, enable system 1100 to perform various functions in accordance with at least one embodiment. In at least one embodiment, memory 1104, storage, and/or any other storage are possible examples of computer-readable media. In at least one embodiment, secondary storage may refer to any suitable storage device or system such as a hard disk drive and/or a removable storage drive, representing a floppy disk drive, a magnetic tape drive, a compact disk drive, digital versatile disk ("DVD") drive, recording device, universal serial bus ("USB") flash memory, etc. In at least one embodiment, architecture and/or functionality of various previous FIGS. are implemented in context of CPU 1102, parallel processing system 1112, an integrated circuit capable of at least a portion of capabilities of both CPU 1102, parallel processing system 1112, a chipset (e.g., a group of integrated circuits designed to work and sold as a unit for performing related functions, etc.), and/or any suitable combination of integrated circuit(s).

In at least one embodiment, architecture and/or functionality of various previous FIGS. are implemented in context of a general computer system, a circuit board system, a game console system dedicated for entertainment purposes, an application-specific system, and more. In at least one embodiment, computer system 1100 may take form of a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, a mobile phone device, a television, workstation, game consoles, embedded system, and/or any other type of logic.

In at least one embodiment, parallel processing system 1112 includes, without limitation, a plurality of parallel processing units ("PPUs") 1114 and associated memories 1116. In at least one embodiment, PPUs 1114 are connected to a host processor or other peripheral devices via an interconnect 1118 and a switch 1120 or multiplexer. In at least one embodiment, parallel processing system 1112 distributes computational tasks across PPUs 1114 which can be parallelizable—for example, as part of distribution of computational tasks across multiple graphics processing unit ("GPU") thread blocks. In at least one embodiment, memory is shared and accessible (e.g., for read and/or write access) across some or all of PPUs 1114, although such shared memory may incur performance penalties relative to use of local memory and registers resident to a PPU 1114. In at least one embodiment, operation of PPUs 1114 is synchronized through use of a command such as _syncthreads( ) wherein all threads in a block (e.g., executed across multiple PPUs 1114) to reach a certain point of execution of code before proceeding.

In at least one embodiment, one or more techniques described herein utilize a oneAPI programming model. In at least one embodiment, a oneAPI programming model refers to a programming model for interacting with various compute accelerator architectures. In at least one embodiment, oneAPI refers to an application programming interface (API) designed to interact with various compute accelerator architectures. In at least one embodiment, a oneAPI programming model utilizes a DPC++ programming language. In at least one embodiment, a DPC++ programming language refers to a high-level language for data parallel programming productivity. In at least one embodiment, a DPC++ programming language is based at least in part on C and/or C++ programming languages. In at least one embodiment, a oneAPI programming model is a programming model such as those developed by Intel Corporation of Santa Clara, CA.

In at least one embodiment, oneAPI and/or oneAPI programming model is utilized to interact with various accelerator, GPU, processor, and/or variations thereof, architectures. In at least one embodiment, oneAPI includes a set of libraries that implement various functionalities. In at least one embodiment, oneAPI includes at least a oneAPI DPC++ library, a oneAPI math kernel library, a oneAPI data analytics library, a oneAPI deep neural network library, a oneAPI collective communications library, a oneAPI threading building blocks library, a oneAPI video processing library, and/or variations thereof.

In at least one embodiment, a oneAPI DPC++ library, also referred to as oneDPL, is a library that implements algorithms and functions to accelerate DPC++ kernel programming. In at least one embodiment, oneDPL implements one or more standard template library (STL) functions. In at least one embodiment, oneDPL implements one or more parallel STL functions. In at least one embodiment, oneDPL provides a set of library classes and functions such as parallel algorithms, iterators, function object classes, range-based API, and/or variations thereof. In at least one embodiment, oneDPL implements one or more classes and/or functions of a C++ standard library. In at least one embodiment, oneDPL implements one or more random number generator functions.

In at least one embodiment, a oneAPI math kernel library, also referred to as oneMKL, is a library that implements various optimized and parallelized routines for various mathematical functions and/or operations. In at least one embodiment, oneMKL implements one or more basic linear algebra subprograms (BLAS) and/or linear algebra package (LAPACK) dense linear algebra routines. In at least one embodiment, oneMKL implements one or more sparse BLAS linear algebra routines. In at least one embodiment, oneMKL implements one or more random number generators (RNGs). In at least one embodiment, oneMKL implements one or more vector mathematics (VM) routines for mathematical operations on vectors. In at least one embodiment, oneMKL implements one or more Fast Fourier Transform (FFT) functions.

In at least one embodiment, a oneAPI data analytics library, also referred to as oneDAL, is a library that implements various data analysis applications and distributed computations. In at least one embodiment, oneDAL implements various algorithms for preprocessing, transformation, analysis, modeling, validation, and decision making for data analytics, in batch, online, and distributed processing modes of computation. In at least one embodiment, oneDAL implements various C++ and/or Java APIs and various connectors to one or more data sources. In at least one embodiment, oneDAL implements DPC++ API extensions to a traditional C++ interface and enables GPU usage for various algorithms.

In at least one embodiment, a oneAPI deep neural network library, also referred to as oneDNN, is a library that implements various deep learning functions. In at least one embodiment, oneDNN implements various neural network, machine learning, and deep learning functions, algorithms, and/or variations thereof.

In at least one embodiment, a oneAPI collective communications library, also referred to as oneCCL, is a library that implements various applications for deep learning and machine learning workloads. In at least one embodiment, oneCCL is built upon lower-level communication middleware, such as message passing interface (MPI) and libfabrics. In at least one embodiment, oneCCL enables a set of deep learning specific optimizations, such as prioritization, persistent operations, out of order executions, and/or variations thereof. In at least one embodiment, oneCCL implements various CPU and GPU functions.

In at least one embodiment, a oneAPI threading building blocks library, also referred to as oneTBB, is a library that implements various parallelized processes for various applications. In at least one embodiment, oneTBB is utilized for task-based, shared parallel programming on a host. In at least one embodiment, oneTBB implements generic parallel algorithms. In at least one embodiment, oneTBB implements concurrent containers. In at least one embodiment, oneTBB implements a scalable memory allocator. In at least one embodiment, oneTBB implements a work-stealing task scheduler. In at least one embodiment, oneTBB implements low-level synchronization primitives. In at least one embodiment, oneTBB is compiler-independent and usable on various processors, such as GPUs, PPUs, CPUs, and/or variations thereof.

In at least one embodiment, a oneAPI video processing library, also referred to as oneVPL, is a library that is utilized for accelerating video processing in one or more applications. In at least one embodiment, oneVPL implements various video decoding, encoding, and processing functions. In at least one embodiment, oneVPL implements various functions for media pipelines on CPUs, GPUs, and other accelerators. In at least one embodiment, oneVPL implements device discovery and selection in media centric and video analytics workloads. In at least one embodiment, oneVPL implements API primitives for zero-copy buffer sharing.

In at least one embodiment, a oneAPI programming model utilizes a DPC++ programming language. In at least one embodiment, a DPC++ programming language is a programming language that includes, without limitation, functionally similar versions of CUDA mechanisms to define device code and distinguish between device code and host code. In at least one embodiment, a DPC++ programming language may include a subset of functionality of a CUDA programming language. In at least one embodiment, one or more CUDA programming model operations are performed using a oneAPI programming model using a DPC++ programming language.

In at least one embodiment, any application programming interface (API) described herein is compiled into one or more instructions, operations, or any other signal by a compiler, interpreter, or other software tool. In at least one embodiment, compilation comprises generating one or more machine-executable instructions, operations, or other signals from source code. In at least one embodiment, an API compiled into one or more instructions, operations, or other signals, when performed, causes one or more processors such as graphics processors 2600, graphics cores 1600, parallel processor 1800, processor 2100, processor core 2100, or any other logic circuit further described herein to perform one or more computing operations.

It should be noted that, while example embodiments described herein may relate to a CUDA programming model, techniques described herein can be utilized with any suitable programming model, such HIP, oneAPI, and/or variations thereof.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. In at least one embodiment, use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). In at least one embodiment, number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. In at least one embodiment, set of non-transitory computer-readable storage media comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—for example, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

In at least one embodiment, an arithmetic logic unit is a set of combinational logic circuitry that takes one or more inputs to produce a result. In at least one embodiment, an arithmetic logic unit is used by a processor to implement mathematical operation such as addition, subtraction, or multiplication. In at least one embodiment, an arithmetic logic unit is used to implement logical operations such as logical AND/OR or XOR. In at least one embodiment, an arithmetic logic unit is stateless, and made from physical switching components such as semiconductor transistors arranged to form logical gates. In at least one embodiment, an arithmetic logic unit may operate internally as a stateful logic circuit with an associated clock. In at least one embodiment, an arithmetic logic unit may be constructed as an asynchronous logic circuit with an internal state not maintained in an associated register set. In at least one embodiment, an arithmetic logic unit is used by a processor to combine operands stored in one or more registers of the processor and produce an output that can be stored by the processor in another register or a memory location.

In at least one embodiment, as a result of processing an instruction retrieved by the processor, the processor presents one or more inputs or operands to an arithmetic logic unit, causing the arithmetic logic unit to produce a result based at least in part on an instruction code provided to inputs of the arithmetic logic unit. In at least one embodiment, the instruction codes provided by the processor to the ALU are based at least in part on the instruction executed by the processor. In at least one embodiment combinational logic in the ALU processes the inputs and produces an output which is placed on a bus within the processor. In at least one embodiment, the processor selects a destination register, memory location, output device, or output storage location on the output bus so that clocking the processor causes the results produced by the ALU to be sent to the desired location.

In the scope of this application, the term arithmetic logic unit, or ALU, is used to refer to any computational logic circuit that processes operands to produce a result. For example, in the present document, the term ALU can refer to a floating point unit, a DSP, a tensor core, a shader core, a coprocessor, or a CPU.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. In at least one embodiment, process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or interprocess communication mechanism.

Although descriptions herein set forth example implementations of described techniques, other architectures may be used to implement described functionality, and are intended to be within scope of this disclosure. Furthermore, although specific distributions of responsibilities may be defined above for purposes of description, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A datacenter cooling system, comprising:
a first glycol-based coolant and a second glycol-based coolant, wherein the second glycol-based coolant is different from the first glycol-based coolant;
a first coolant distribution unit (CDU) remote from a first datacenter rack, wherein the first CDU is configured to provide the first glycol-based coolant based in part on a first type of coolant to be provided to the first datacenter rack;
a first modular in rack coolant distribution unit (IRCDU) disposed in the first datacenter rack, the first modular IRCDU comprising first components calibrated to the first glycol-based coolant, the first modular IRCDU being configured to receive the first glycol-based coolant from the first CDU via a first plug-in connection disposed within the first datacenter rack and to distribute the first glycol-based coolant to a first rack manifold of the first datacenter rack; and
a second modular IRCDU disposed in a second datacenter rack, the second modular IRCDU comprising second components calibrated to the second glycol-based coolant, the second modular IRCDU being configured to receive the second glycol-based coolant from a second CDU remote from the second datacenter rack via a second plug-in connection disposed within the second datacenter rack based in part on a second type of coolant to be provided to the second datacenter rack, and the second modular IRCDU to distribute the second glycol-based coolant to a second rack manifold of the second datacenter rack, wherein the first and second modular IRCDUs are interchangeable via the first plug-in connection and the second plug-in connection.

2. The datacenter cooling system of claim 1, further comprising:
at least one processor to be associated with a plurality of flow controllers of the first modular IRCDU and the second modular IRCDU, the at least one processor to determine a cooling requirement associated with at least one computing device and to cause one or more of the plurality of flow controllers to distribute the first coolant or the second coolant for one or more cold plates associated with the cooling requirement.

3. The datacenter cooling system of claim 1, further comprising:
at least one processor to be associated with a plurality of ingredient canisters comprising different coolant ingredients, individual ones of the different coolant ingredients to be calibrated to the first glycol-based coolant or the second glycol-based coolant.

4. The datacenter cooling system of claim 1, further comprising:
at least one processor to be associated with a plurality of ingredient canisters comprising different coolant ingredients calibrated for the first glycol-based coolant or the second glycol-based coolant and to be located in the first modular IRCDU or the second modular IRCDU, the at least one processor to determine a chemical or physical property of the first glycol-based coolant or the second glycol-based coolant and to dispense an individual one of the different coolant ingredients to the first glycol-based coolant or the second glycol-based coolant.

5. The datacenter cooling system of claim 1, further comprising:
a plurality of first sensors within the first modular IRCDU and a plurality of second sensors within the second modular IRCDU, the plurality of first sensors calibrated to the first glycol-based coolant and the plurality of second sensors calibrated to the second glycol-based coolant to enable determination of a chemical or physical property of the first glycol-based coolant or the second glycol-based coolant.

6. The datacenter cooling system of claim 5, further comprising:
at least one processor to receive sensor inputs from the plurality of first sensors and the plurality of second sensors, the at least one processor to determine the chemical or physical property of the first glycol-based coolant or the second glycol-based coolant and to dispense an individual one of different coolant ingredients, from one or more first ingredient canisters of the first modular IRCDU to the first glycol-based coolant or from one or more of second ingredient canisters for the second glycol-based coolant.

7. The datacenter cooling system of claim 6, further comprising:
one or more neural networks to receive the sensor inputs and to infer the chemical or physical property of the first glycol-based coolant or the second glycol-based coolant.

8. The datacenter cooling system of claim 5, further comprising:
at least one processor to receive sensor inputs from the plurality of first sensors and from the plurality of second sensors, the at least one processor to determine the chemical or physical property of the first glycol-based coolant or the second glycol-based coolant and to enable a flow rate for the first glycol-based coolant or the second glycol-based coolant in response to a cooling requirement associated with at least one cold plate.

9. The datacenter cooling system of claim 1, further comprising:

a plurality of first sensors in the first modular IRCDU and a plurality of second sensors in the second modular IRCDU, the plurality of first sensors calibrated for first chemical and physical properties of the first glycol-based coolant and the plurality of second sensors second calibrated for second chemical and physical properties of the second glycol-based coolant.

10. The datacenter cooling system of claim 9, wherein the first chemical and physical properties and the second chemical and physical properties comprise one or more of: a pH property, a composition, a viscosity, a specific gravity, a specific heat, a reserve alkalinity, a freezing point, a boiling point, and a density.

11. The datacenter cooling system of claim 1, further comprising:

a plurality of modular IRCDUs, wherein the plurality of modular IRCDUs comprises at least the first modular IRCDU and the second modular IRCDU.

\* \* \* \* \*